(12) United States Patent
Tamaki et al.

(10) Patent No.: US 7,951,307 B2
(45) Date of Patent: *May 31, 2011

(54) OXYNITRIDE PHOSPHOR AND PRODUCTION PROCESS THEREOF, AND LIGHT-EMITTING DEVICE USING OXYNITRIDE PHOSPHOR

(75) Inventors: Hiroto Tamaki, Anan (JP); Suguru Takashima, Anan (JP); Masatoshi Kameshima, Anan (JP); Takahiro Naitou, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/662,747

(22) Filed: May 3, 2010

(65) Prior Publication Data

US 2010/0289404 A1 Nov. 18, 2010

Related U.S. Application Data

(62) Division of application No. 10/531,085, filed as application No. PCT/JP03/013157 on Oct. 15, 2003, now Pat. No. 7,794,624.

(30) Foreign Application Priority Data

| Oct. 16, 2002 | (JP) | 2002-301636 |
| Oct. 16, 2002 | (JP) | 2002-301637 |
| Dec. 27, 2002 | (JP) | 2002-381025 |
| Feb. 5, 2003 | (JP) | 2003-028610 |
| Feb. 5, 2003 | (JP) | 2003-028611 |
| Mar. 14, 2003 | (JP) | 2003-070043 |

(51) Int. Cl.
*C09K 11/55* (2006.01)
*C09K 11/59* (2006.01)
*H01L 33/00* (2010.01)

(52) U.S. Cl. .................. 252/301.4 F; 313/503; 313/486; 313/487; 257/96

(58) Field of Classification Search ............ 252/301.4 F; 313/503, 486, 487; 257/98
See application file for complete search history.

(56) References Cited

U.S. PATENT DOCUMENTS

| 4,716,335 A | 12/1987 | Schutten et al. |
| 6,682,663 B2 | 1/2004 | Botty et al. |
| 6,717,353 B1 | 4/2004 | Mueller et al. |

(Continued)

FOREIGN PATENT DOCUMENTS

EP 0 155 047 A1 9/1985

(Continued)

OTHER PUBLICATIONS

International Search Report of PCT/JP03/13157 mailed Feb. 3, 2004.

(Continued)

*Primary Examiner* — C. Melissa Koslow
(74) *Attorney, Agent, or Firm* — Nixon & Vanderhye P.C.

(57) ABSTRACT

An oxynitride phosphor consisting of a crystal containing at least one or more of Group II elements selected from the group consisting of Be, Mg, Ca, Sr, Ba and Zn, at least one or more of Group IV elements selected from the group consisting of C, Si, Ge, Sn, Ti, Zr and Hf, and a rare earth element being an activator R, thereby providing a phosphor which is excited by an excitation light source at an ultraviolet to visible light region and which has a blue green to yellow luminescence color that is wavelength converted.

16 Claims, 71 Drawing Sheets

U.S. PATENT DOCUMENTS

| | | | |
|---|---|---|---|
| 6,717,355 | B2 | 4/2004 | Takahashi et al. |
| 7,061,024 | B2 | 6/2006 | Schmidt et al. |
| 7,351,356 | B2 | 4/2008 | Delsing et al. |
| 7,794,624 | B2 * | 9/2010 | Tamaki et al. .......... 252/301.4 F |
| 2002/0043926 | A1 | 4/2002 | Takahashi et al. |
| 2005/0205845 | A1 | 9/2005 | Delsing et al. |
| 2006/0033081 | A1 | 2/2006 | Hintzen et al. |
| 2007/0132360 | A1 | 6/2007 | Hildenbrand et al. |

FOREIGN PATENT DOCUMENTS

| | | | |
|---|---|---|---|
| EP | 0 206 393 | | 6/1986 |
| EP | 0 206 389 | | 12/1986 |
| EP | 1 264 873 | A2 | 6/2002 |
| EP | 1 278 250 | A2 | 1/2003 |
| EP | 1 296 376 | A2 | 3/2003 |
| EP | 1 296 383 | A2 | 3/2003 |
| EP | 1471583 | | 10/2004 |
| JP | 60-206889 | | 10/1985 |
| JP | 61-283680 | | 12/1986 |
| JP | 61-283681 | | 12/1986 |
| JP | 2001-214162 | | 8/2001 |
| JP | 2002-76434 | | 3/2002 |
| JP | 2002-363554 | | 12/2002 |
| JP | 2003-124527 | | 4/2003 |
| JP | 2003-203504 | | 7/2003 |
| JP | 2003-206481 | | 7/2003 |
| JP | 2003-336059 | | 11/2003 |
| JP | 2004-10786 | | 1/2004 |
| JP | 2006-097034 | | 4/2006 |
| WO | WO 01/39574 | | 6/2001 |
| WO | WO 2004/030109 | * | 4/2004 |

OTHER PUBLICATIONS

Office Action issued by the State Intellectual Property Office of People's Republic of China on Nov. 3, 2006 in Application No. 200380101648.8.
Partial English translation of Office Action issued Jan. 20, 2009 in corresponding JP Application No. 2003-028611.
English translation of Office Action issued on Jan. 20, 2009 in corresponding JP Application No. 2003-028610.
Partial English translation of Office Action issued Sep. 29, 2009 in corresponding JP Application No. 2003-070043.
European Search Report issued in European Appln. No. 03754118 (Jun. 8, 2010).
Office Action issued in U.S. Appl. No. 12/662,746 (Oct. 6, 2010).
Office Action issued in U.S. Appl. No. 10/531,085 (Nov. 29, 2007), now US Patent No. 7,794,624.
Office Action issued in U.S. Appl. No. 10/531,085 (Jul. 18, 2008), now US Patent No. 7,794,624.
Office Action issued in U.S. Appl. No. 10/531,085 (Jan. 28, 2009), now US Patent No. 7,794,624.
Office Action issued in U.S. Appl. No. 10/531,085 (Jul. 27, 2009), now US Patent No. 7,794,624.
Office Action issued in U.S. Appl. No. 10/531,085 (Dec. 16, 2009), now US Patent No. 7,794,624.
Office Action issued in U.S. Appl. No. 12/805,323 (Oct. 8, 2010).

* cited by examiner

OXYNITRIDE PHOSPHOR AND PRODUCTION PROCESS THEREOF, AND LIGHT-EMITTING DEVICE USING OXYNITRIDE PHOSPHOR

CROSS REFERENCE TO RELATED APPLICATIONS

This application is a divisional application of U.S. application Ser. No. 10/531,085, filed Apr. 11, 2005, now U.S. Pat. No. 7,794,624, which is the US national phase of international application PCT/JP2003/013157, filed Oct. 15, 2003, which designated the U.S. and claims benefit of JP 2002-301636; JP 2002-301637; JP 2002-381025; JP 2003-28610; JP 2003-28611; JP 2003-70043, dated Oct. 16, 2002; Oct. 16, 2002; Dec. 27, 2002; Feb. 5, 2003; Feb. 5, 2003; and Mar. 14, 2003, the entire content of which is hereby incorporated by reference.

BACKGROUND OF THE INVENTION

1. Field of the Invention

The present invention relates to a phosphor which emit a light by being excited by light, electromagnetic waves such as X-rays, electron beam, and specifically, relates to a light-emitting device for usual illuminations such as a fluorescent lamp, illuminations mounted on a car, back lights for liquid crystal, displays and the like. Specifically, the present invention relates to a white color and multi-color light-emitting device using a semiconductor light-emitting element.

2. Description of the Related Art

A light-emitting device using light-emitting elements is a small size and superior in electric power efficiency, and emits fresh color. Further, said light-emitting elements have characteristics that there is no fear of a burnt-out light bulb because of a semiconductor element and they are superior in initial drive property and resistant in vibration and the repetition of on-off lighting. Since the light-emitting elements have such superior characteristics, a light-emitting device using semiconductor light-emitting elements such as an LED and a LD has been utilized as various light sources.

There is developed a light-emitting device which emits a luminescence color different from the light of the light-emitting elements by partially or wholly converting the wavelength of the light of the light-emitting elements and mixing said wavelength-converted light with the light of light-emitting elements not subjected to wavelength conversion to release light.

Among these light-emitting devices, a white color light-emitting device has been required in wide fields such as usual illuminations such as a phosphorescent lamp, illuminations mounted on a car, displays and back lights for liquid crystal. Further, there is required a light-emitting device having various color tastes such as a pastel color by combining a semiconductor light-emitting element and a phosphor.

The luminescence color of a light-emitting device using a white color semiconductor light-emitting element is obtained by the theory of color mixture. Blue light released from a light-emitting element is irradiated in a phosphor layer, then repeats absorption and scattering several times in the layer, and then, is released to outside. On the other hand, the blue light absorbed in the phosphor works as an excitation light source and emits yellow fluorescent light. The mixture of the yellow light and the blue light is visualized as white to human eyes.

For example, a blue color light-emitting element is used as the light-emitting element, and a phosphor is thinly coated on the surface of said blue color light-emitting element. Said light-emitting element is a blue color light-emitting device using an InGaN-base material. Further, the phosphor uses a YAG-base phosphor represented by the composition formula of $(Y,Gd)_3(Al,Ga)_5O_{12}$:Ce.

However, a white color light-emitting device equipped with the blue color light-emitting element and the YAG-base phosphor emits white color light formed by the color mixture of blue light nearby 460 nm and yellow green light nearby 565 nm, but luminescence intensity nearby 500 nm is insufficient.

Further, there has been recently reported a white color light-emitting device combining a phosphor which emits blue light and a YAG-base phosphor which emits yellow light using light-emitting elements of visible light at a short wavelength side region. In this case, the YAG-base phosphor which emits yellow light is hardly excited by light of visible light at the short wavelength side region and does not emit light. Accordingly, a blue color-base phosphor is excited by said light-emitting element to emit blue light. Then, the YAG-base phosphor is excited by said blue light to emit yellow light. Thus, white color light is emitted by the color mixture of the blue light of the blue color-base phosphor with the yellow light of the YAG-base phosphor.

Various phosphors are developed as the phosphor used in said light-emitting device.

For example, an oxide-base phosphor using a rare earth metal element for a luminescence center has been widely known, and a portion of the phosphor is already practically used. However, a nitride phosphor and an oxynitride phosphor are seldom studied, and a study report is scarcely reported. For example, there is an oxynitride glass phosphor which is represented by Si—O—N, Mg—Si—O—N, Ca—Al—Si—O—N and the like (JP-A-2001-214162: hereinafter, referred to as the patent literature 1). Further, there is an oxynitride glass phosphor represented by Ca—Al—Si—O—N in which Eu was activated (JP-A-2002-76434: hereinafter, referred to as the patent literature 2).

However, conventional phosphors have low luminescence brightness and are insufficient for being used for a light-emitting device. In a light-emitting device using light-emitting elements at a near ultraviolet region as an excitation light source, there is used double step excitation that a blue light-base phosphor is excited by said light-emitting elements and the YAG-base phosphor is excited by said excited light, therefore while light having high efficiency is hardly obtained. Accordingly, there is desired a phosphor emitting green light to yellow light whose wavelength was directly converted by light of visible light at a short wavelength side region.

Further, a white color light-emitting device combining a phosphor and a light-emitting element of visible light at a short wavelength side region is not produced yet and the light-emitting device practically used is not commercially available. Accordingly, a phosphor which efficiently emits light at a short wavelength side region of visible light is desired.

Further, the above-mentioned oxynitride phosphors and the like described in the patent literatures 1 and 2 have low luminescence brightness and are insufficient for being used for the light-emitting device. Further, since the oxynitride glass phosphor is a glass body, it is hardly processed in general.

SUMMARY OF THE INVENTION

Accordingly, an object of the present invention is to provide a phosphor which is excited by an excitation light source at an ultraviolet to visible light region and which has a blue green to yellow luminescence color that is wavelength converted, and to provide a light-emitting device using thereof. Further, the purpose of the present invention is to provide a light-emitting device having high luminescence efficiency and being superior in reproducibility.

Further, the purpose of the present invention is to provide a phosphor in which the color tone is easily adjusted and to provide a light-emitting device using thereof.

In order to achieve the above-mentioned purposes, the first oxynitride phosphor related to the present invention is characterized in consisting of a crystal containing at least one or more of Group II elements selected from the group consisting of Be, Mg, Ca, Sr, Ba and Zn, at least one or more of Group IV elements selected from the group consisting of C, Si, Ge, Sn, Ti, Zr and Hf, and a rare earth element being an activator, R.

The first oxynitride phosphor related to the present invention has high luminescence brightness because it is a crystal in which elements are arranged according to a fixed rule, and has superior properties as a phosphor. Further, the first oxynitride phosphor related to the present invention can realize a desired luminescence spectrum at a blue green to yellow region by selecting its composition.

Wherein the oxynitride means a structure in which nitrogen is taken into an oxide, and an amorphous oxynitride glass has been conventionally known as its typical example.

In the first oxynitride phosphor related to the present invention, in order to realize higher brilliance, the fore-mentioned Group II elements in which Ba is essential are one or more selected from the group consisting of Ca, Sr, Ba and Zn, the fore-mentioned Group IV elements in which Si is essential are one or more selected from the group consisting of C, Si, Ge, Sn, Ti, Zr and Hf, and the activator, R contains preferably Eu.

The first oxynitride phosphor containing Ba, Si and Eu has a luminescence spectrum having a luminescence peak at a blue green to green region, and has extremely high luminescence efficiency and superior temperature properties.

Further, in this case, the content of the fore-mentioned activator, R is preferably a molar ratio of the fore-mentioned Group II element:the fore-mentioned R=1:0.005 to 1:0.15 based on the fore-mentioned Group II element, in order to further realize high brightness, and the luminescence efficiency can be most highly enhanced at the composition.

In fore-mentioned first oxynitride phosphor, there is obtained a phosphor which is efficiently excited by light from an excitation light source and has a luminescence color at a blue green to yellow region, by containing O and N in the composition and setting the weight ratio of said O and said N so that N is within a range of 0.2 to 2.1 per 1 of O.

The second oxynitride phosphor related to the present invention is characterized in being represented by the general formula, $L_X M_Y O_Z N_{(2/3)X+(4/3)Y-(2/3)Z)}$:R or $L_X M_Y Q_T O_Z N_{(2/3)X+(4/3)Y+T-(2/3)Z)}$:R (L is at least one or more of Group II elements selected from the group consisting of Be, Mg, Ca, Sr, Ba and Zn. M is at least one or more of Group IV elements selected from the group consisting of C, Si, Ge, Sn, Ti, Zr and Hf. Q is at least one or more of Group III elements selected from the group consisting of B, Al, Ga and In. O is an oxygen element. N is a nitrogen element. R is a rare earth element. $0.5<X<1.5$, $1.5<Y<2.5$, $0<T<0.5$, and $1.5<Z<2.5$).

The second oxynitride phosphor related to the present invention which was thus composed contains a crystal in which elements are at least partially arranged according to a fixed rule, light is efficiently emitted from the crystal, and the phosphor has superior luminescent properties. Further, since the luminescent portion of the second oxynitride phosphor is not a glass body (amorphous) but a crystal, it can reproduce stable properties, and its production and processing are easy. Further, in the above-mentioned general formula, a crystal phase being the luminescent portion can be comparatively easily formed by setting the fore-mentioned X, Y and Z within the above-mentioned range, and a phosphor having good luminescence efficiency can be provided.

The second oxynitride phosphor related to the present invention is excited by light in a range from near ultraviolet to a short wavelength side region of visible light and has a luminescence spectrum having a luminescence peak at a blue green to yellow region. Further, the second oxynitride phosphor has the same stability or more in comparison with a YAG-base phosphor.

Hereat, the second oxynitride phosphor related to the present invention results also occasionally in a loss of nitrogen, and the general formula in that case is represented by $L_X M_Y O_Z N_{((2/3)X+(4/3)Y-(2/3)Z-\alpha)}$:R or $L_X M_Y Q_T O_Z N_{((2/3)X+(4/3)Y+T-(2/3)Z-\alpha)}$:R ($R \leq \alpha < 1$). Further, the nearer to zero the a is, the better the crystallinity of a crystal phase is, therefore the luminescence brightness is enhanced.

Further, in the second oxynitride phosphor related to the present invention, the fore-mentioned L in which Ba is essential is at least one or more of Group II elements selected from the group consisting of Ca, Sr, Ba and Zn, M in which Si is essential is at least one or more of Group IV elements selected from the group consisting of C, Si, Ge, Sn, Ti, Zr and Hf, and Eu is preferably contained as the activator, R, in order to realize the higher brightness.

Thus, the second oxynitride phosphor containing Ba, Si and Eu has a luminescence spectrum having a luminescence peak at a blue green to green region.

The fore-mentioned X, the fore-mentioned Y and the fore-mentioned Z are preferably X=1, Y=2, and Z=2. The more crystalline phases are formed at said composition, their crystallinity can be bettered, and the luminescence efficiency can be enhanced.

Thus, the second oxynitride phosphor related to the present invention has a crystal (a crystalline phase) at least partially, and the crystal is preferably contained by 50% by weight or more, and more preferably by 80% by weight or more. Namely, the crystalline phases are a principal luminescent portion, and when the portion of the crystalline phases being the luminescent portion is 50% by weight or more, luminescence with good efficiency is obtained. Thus, the more the crystalline phases are, the higher the luminescence brightness can be enhanced. Further, when the portion of the crystalline phases is much, its production and processing come to be easy.

The fore-mentioned crystals in the first and second oxynitride phosphors of the present invention have the unit lattice of the orthorhombic system according to a structural analysis by the X-ray diffraction pattern of the fore-mentioned phosphors, and it is grasped that they belong to the orthorhombic system.

The rare earth metal element represented by the fore-mentioned R is preferably Eu in order to obtain high luminescence efficiency, and when Eu and other rare earth elements are used, Eu is preferably 50% by weight or more among R, and more preferably 70% by weight or more in order to obtain high luminescence efficiency.

The first and second oxynitride phosphors related to the present invention are excited by light from an excitation light source having a luminescence peak wavelength at 490 nm or less, and have luminescence spectra having luminescence peak wavelengths at a longer wavelength side than the fore-mentioned luminescence peak wavelength. Namely, the first and second oxynitride phosphors are excited by light from an excitation light source having a luminescence peak wavelength at 490 nm or less, and luminescence with good efficiency is obtained. The excitation light source for exciting the first and second oxynitride phosphors related to the present invention has preferably a luminescence peak wavelength at 240 to 470 nm, and more preferably a luminescence peak wavelength at 350 to 410 nm.

The fore-mentioned first and second oxynitride phosphors are efficiently excited by light from the excitation light source having a luminescence peak wavelength at 350 nm or more, and further 360 nm or more.

Further, when the fore-mentioned first and second oxynitride phosphors contain Ba, Si and Eu, they are effectively excited by light from the excitation light source having a luminescence peak wavelength at 360 nm to 480 nm, and can efficiently emit light having luminescence spectra having luminescence peak wavelengths at a longer wavelength side than the fore-mentioned luminescence peak wavelength.

Namely, when the fore-mentioned oxynitride phosphors contain Ba, Si and Eu, those having luminescence peak wavelengths at 240 to 480 nm can be used as the excitation light source, but the excitation light source having a luminescence peak wavelength at 360 to 480 nm is preferably used. In particular, it is preferable to use the excitation light source having a luminescence peak wavelength at 380 to 420 nm or 450 to 470 nm which is used in a semiconductor light-emitting element.

As described above, the luminescence spectra of the first and second oxynitride phosphors related to the present invention can be set at a blue green to yellow region. Further, even if the YAG-base phosphor having a luminescence peak wavelength at a yellow region is excited using excitation light in a range from near ultraviolet to a short wavelength side region of visible light (for example, excitation light having a wavelength nearby 400 nm), it emits hardly light, but the first and second oxynitride phosphors related to the present invention exhibit high luminescence efficiency by the excitation light at said region. Additionally, when blue light is also used as the excitation light source, they exhibit high luminescence efficiency.

In the present specification, the blue green to yellow red region is represented according to JIS Z8110. Specifically, the blue green to yellow red region means a range of 485 to 610 nm.

The first and second oxynitride phosphors can have the excitation spectra in which luminescence intensity by light of 370 nm is higher than luminescence intensity by light of 500 nm. When they are set thus, the phosphors excited by light at an ultraviolet region exhibit higher brightness than the phosphors excited by light at a blue region. The use of light-emitting elements at an ultraviolet region can constitute a light-emitting device which can exhibit higher luminescence efficiency than the use of light-emitting elements at a blue region.

When the first and second oxynitride phosphors contain Ba, Si and Eu, a light-emitting element nearby 460 nm can have the excitation spectra having higher intensity than that nearby 350 nm, and there can be constituted the light-emitting device comprising a combination with a light-emitting element which emits visible light of a comparative short wavelength.

The first and second oxynitride phosphors have preferably 2 or more of Group II elements selected from the group consisting of Be, Mg, Ca, Sr, Ba and Zn, and luminescence properties such as the color tone, luminescence brightness and quantum efficiency can be varied thereby to realize desired luminescence properties.

When the first and second oxynitride phosphors contain Sr and Ca, a molar ratio of Sr to Ca is preferably S:Ca=6:4 to 9:1. Further, when the oxynitride phosphors contain Sr and Ba, a molar ratio of Sr to Ba is preferably Sr:Ba=6:4 to 9:1. Further, when the fore-mentioned first and second oxynitride phosphors contain Ca and Ba, a molar ratio of Ca to Ba is preferably Ca:Ba=6:4 to 9:1. The oxynitride phosphors having various color tones can be produced by selecting the combination and further selecting the composition ratio within the above-mentioned range. Further, the luminescence efficiency can be improved by selecting it within said range.

In the first and second oxynitride phosphors related to the present invention, the luminescence peak wavelength and color tone can be set by the addition amount of the fore-mentioned activator R.

Namely, the first and second oxynitride phosphors related to the present invention can shift the luminescence peak wavelength to a short wavelength side or a long wavelength side by controlling the addition amount of the activator, R, and additionally adjust the color tone.

When the luminescence peak wavelength and the color tone are varied by the addition amount of the fore-mentioned activator R, the portion of Group II elements contained in the fore-mentioned oxynitride phosphors is substituted with the fore-mentioned activator R, therefore the amount of the fore-mentioned activator R is preferably adjusted within a range of the molar ratio of (a mix amount of the fore-mentioned Group II elements and the fore-mentioned activator R):(the amount of the fore-mentioned activator R)=1:0.001 to 1:0.8 based on the mix amount of the fore-mentioned Group II elements and the fore-mentioned activator R. The color tone can be varied while keeping the high luminescence brightness by selecting it within said range. When Sr is used for the fore-mentioned Group II element, in particular, when the oxynitride phosphors related to the present invention are irradiated using an excitation light source nearby 400 nm, the addition amount of the activator R is preferably (a mix amount of the fore-mentioned Group II elements and the fore-mentioned activator R):(the amount of the fore-mentioned activator R)=1:0.01 to 1:0.2. Further, when the oxynitride phosphors related to the present invention are irradiated using an excitation light source nearby 460 nm, the addition amount of the activator R is preferably (a mix amount of the fore-mentioned Group II elements and the fore-mentioned activator R):(the amount of the fore-mentioned activator R)=1:0.02 to 1:0.26. When Ca is used for the fore-mentioned Group II element, in particular, when the oxynitride phosphors related to the present invention are irradiated using an excitation light source nearby 400 nm, the addition amount of the activator, R is preferably (a mix amount of the fore-mentioned Group II elements and the fore-mentioned activator, R):(the amount of the fore-mentioned activator, R)=1:0.01 to 1:0.5. Further, when the oxynitride phosphors related to the present invention are irradiated using an excitation light source nearby 460 nm, the addition amount of the activator, R is preferably (a mix amount of the fore-mentioned Group II elements and the fore-mentioned activator, R):(the amount of the fore-mentioned activator, R)=1:0.01 to 1:0.7. Because the oxynitride phosphors having high luminescence brightness can be provided by selecting it within said range. Further, the color tone x is shifted to a right direction and the color tone y is shifted to a down direction by increasing the content of the activator, R in a chromaticity coordinate. The color tone can be varied thereby.

The production process of the oxynitride phosphors related to the present invention is characterized in having the first step that materials containing the nitride of L (L is at least one or more of Group II elements selected from the group consisting of Be, Mg, Ca, Sr, Ba and Zn, the nitride of M (M is at least one or more of Group IV elements selected from the group consisting of C, Si, Ge, Sn, Ti, Zr and Hf), the oxide of M, and the oxide of R (R is a rare earth element) are mixed, and the second step that the mixture obtained from the first step is calcinated.

The phosphors easily produced and processed can be provided by the production process of the oxynitride phosphors related to the present invention. Further, the phosphors with extremely good stability can be provided. Hereat, Li, Na, K, Rb, Cs, Mn, Re, Cu, Ag, Au and the like may be contained in the mother body of the oxynitride phosphors prepared by the production steps of the present production process or the present production process. Provided that, the above-mentioned Li, Na, K and the like are preferably 1000 ppm or less based on the weight of the oxynitride phosphors. More preferably, it is preferably 100 ppm or less. Because the high luminescence efficiency can be kept so far as it is within said range. Further, luminescence properties can be adjusted by enlarging the particle sizes of the appropriate amount of Li, Na, K and the like, enhancing the luminescence brightness, and the like, and once in a while, properties are occasionally improved. These Li, Na, K and the like may be contained in the raw material composition. Because the above-mentioned Li, Na, K and the like are scattered at the calcination step in the production steps of the oxynitride phosphors, and hardly contained in said composition. Further, other elements may be contained to a degree which does not damage the properties.

In the present production process, the nitride of R is preferably used in place of the fore-mentioned oxide of R, or together with the fore-mentioned oxide of R. The oxynitride phosphors with the high luminescence brightness can be provided thereby.

In the fore-mentioned first step, Q (Q is at least one of more of Group III elements selected from the group consisting of B, Al, Ga and In) is further preferably mixed. The particle diameter is enlarged thereby, and the improvement of the luminescence brightness can be designed.

In the production process of the oxynitride phosphors related to the present invention, the fore-mentioned nitride of L, the fore-mentioned nitride of M and the fore-mentioned oxide of M are preferably adjusted at molar ratios of 0.5<the nitride of L<1.5, 0.25<the nitride of M<1.75 and 2.25<the oxide of M<3.75. The oxynitride phosphors with the composition of $L_XM_YO_ZN_{(2/3)X+(4/3)Y-(2/3)Z}$:R or $L_XM_YQ_TO_ZN_{(2/3)X+(4/3)Y+T-(2/3)Z}$:R can be provided thereby.

At least the portion of the raw material comprising the fore-mentioned nitride of L is preferably substituted with at least either of the oxide of R and the nitride of R. The oxynitride phosphors with the high luminescence efficiency can be provided thereby.

The third oxynitride phosphor related to the present invention is an oxynitride phosphor produced by the production process of the fore-mentioned oxynitride phosphors.

As described above, the first to third oxynitride phosphors related to the present invention have technical meanings that the phosphors which are excited by light in a range from near ultraviolet to a short wavelength side region of visible light and emit light at a blue green to yellow region can provided and the light-emitting device with extremely good luminescence efficiency can be provided by being combined with an appropriate excitation light source.

Namely, even if the YAG-base phosphor having the luminescence peak wavelength at a yellow system is emitted using the ultraviolet or near ultraviolet excitation light, it hardly emits light, but the oxynitride phosphors related to the present invention emit light by the excitation light in a range from ultraviolet to a short wavelength side region of visible light, and exhibit the high luminescence efficiency.

Wherein the range from ultraviolet to the short wavelength side region of visible light is not specifically limited, but means a region of 240 to 500 nm or less. In particular, a range of 290 to 470 nm is preferable. A range of 340 to 410 nm is more preferable.

Further, according to the present invention, there can be provided the crystalline oxynitride phosphors which can be easily produced and processed. Further, there can be provided the oxynitride phosphors excellent in stability and reproducibility. Further, the new production process of the oxynitride phosphors can be provided.

Further, the oxynitride phosphors containing Ba, Si and Eu related to the present invention can provide phosphors with extremely good luminescence efficiency which are excited by light in a range from near ultraviolet to a short wavelength side region of visible light and emit light at a blue green to green region.

Further, the first light-emitting device related to the present invention is a light-emitting device having an excitation light source and a phosphor converting the wavelength of at least the portion of light from said excitation light source, wherein the oxynitride phosphors having the luminescence peak wavelength at a blue green to yellow region are contained in the fore-mentioned phosphor. According to the first light-emitting device, the light-emitting device having high luminescence efficiency can be provided.

Further, the second light-emitting device related to the present invention is a light-emitting device having an excitation light source which has a luminescence wavelength at a short wavelength region from ultraviolet to visible light and a phosphor which absorbs at least the portion of light from said excitation light source, converts the wavelength and has a luminescence color different from the luminescence color of the fore-mentioned excitation light source, wherein the oxynitride phosphors having the luminescence peak wavelength at a blue green to green region in which Ba is essential are contained in the fore-mentioned phosphor. According to this, the light-emitting device having high luminescence efficiency and excellent in color rendering can be provided. Further, the portion of light from the excitation light source having a luminescence wavelength at a short wavelength region from ultraviolet to visible light and the portion of light from the oxynitride phosphor having the luminescence peak wavelength at a blue green to green region become color mixture light to be able to provide the light-emitting device having a luminescence color at a blue purple to green region.

Further, in the first and second light-emitting devices related to the present invention, the fore-mentioned oxynitride phosphors are preferably either of the first to third oxynitride phosphors related to the present invention.

Further, there can be provided the light-emitting device having a desired color tone in which the luminescence peak wavelength and color tone are different can be provided by using the first to third oxynitride phosphors in which the luminescence peak wavelength and color tone were adjusted by the addition amount of the activator, R.

In the first and second light-emitting devices, the first to third oxynitride phosphors are excited by the excitation light source in a range from near ultraviolet to a short wavelength side region of visible light and absorb the portion of light from the excitation light source. The oxynitride phosphors which absorb said light and are excited carry out the wavelength conversion (the emission of light having a wavelength different from light absorbed). Said light whose wavelength was converted has a luminescence peak wavelength at a blue green to yellow region. Namely, the fore-mentioned first to third oxynitride phosphors absorb the portion of light from light-emitting elements and emit light having luminescence spectra having luminescence peak wavelengths at a blue green to yellow region. Further, said first to third oxynitride phosphors have high luminescence efficiency, extremely efficiently convert the wavelengths of light from light-emitting elements, and can emit light. Further, there can be also provided the light-emitting device having an intermediate color between the luminescence color of the light-emitting elements and the luminescence color of the oxynitride phosphors by the color mixture of light from the light-emitting elements with light from the first to third oxynitride phosphors.

When the fore-mentioned first to third oxynitride phosphors contain O and N and the weight ratio of said O to said N is N of 0.2 to 2.1 based on 1 of O, they are efficiently excited by the light-emitting elements at near ultraviolet and the like.

The aforementioned excitation light source has preferably at least one or more of luminescence peak wavelengths in a range from ultraviolet to a short wavelength side region of visible light. Because the luminescence efficiency of the fore-mentioned phosphors can be enhanced by using the excitation light source having said range. In particular, the excitation light sources having the luminescence peak wavelengths at 240 to 470 nm are preferably used, and among these, the excitation light sources having the luminescence peak wavelengths at 350 to 410 nm are preferably used.

The fore-mentioned excitation light source is preferably light-emitting elements. Namely, the light-emitting elements are small size, have good electric power efficiency, and emit bright color light. Further, said light-emitting elements have no fear of a burnt-out light bulb because of a semiconductor element. Further, they have characteristics that they are superior in initial drive property and resistant in vibration and the repetition of on-off lighting. Accordingly, it is preferable in the present invention to combine the light-emitting elements with the oxynitride phosphors.

The luminescent layer of the fore-mentioned light-emitting elements has preferably a nitride semiconductor containing In. The light-emitting elements release light having the luminescence peak wavelengths at 350 to 410 nm, and the fore-mentioned oxynitride phosphors are efficiently excited by the light from said light-emitting elements to exhibit a fixed luminescence color. Since the luminescence with high intensity is obtained by being excited by light nearby 350 to 410 nm, the light-emitting elements at said wavelength region are suitable. Further, since the light-emitting elements can make the width of the luminescence spectra narrow, the oxynitride phosphors can be efficiently excited, and light substantially having no color tone change can be released from the light-emitting device.

The first and second light-emitting devices related to the present invention may include the second phosphor together with the fore-mentioned oxynitride phosphors as the fore-mentioned phosphor. The second phosphor in the present invention preferably carries out the wavelength conversion of at least the portion of light from the fore-mentioned excitation light sources and the fore-mentioned oxynitride phosphors. Thus, there can be provided the light-emitting device having a luminescence color at a visible light region by the color mixture of the light from the fore-mentioned excitation light sources, the fore-mentioned oxynitride phosphors and light from the second phosphor. The light-emitting device thus constituted can release a desired luminescence color so far as it is within a wavelength region from the luminescence color of the excitation light sources to the luminescence color of the oxynitride phosphors or the luminescence color of the second phosphor.

The second phosphor may have at least one or more of the luminescence peak wavelengths from a blue region to green, yellow and red regions in order to realize a desired luminescence color (the luminescence color as the light-emitting device). In particular, various luminescence colors can be realized by combining three primary colors of the green color of the oxynitride phosphors which were excited by the excitation light sources having the luminescence peak wavelengths in a range from ultraviolet to a short wavelength side region of visible light, with the blue color and red color of the second phosphor. Further, the light-emitting device may be a light-emitting device comprising the combination of 2 kinds of colors such as a green color with red color and a green color with yellow color.

The fore-mentioned second phosphor is preferably at least one or more selected from an alkali earth halogen apatite phosphor, an alkali earth metal borate halogen phosphor, an alkali earth metal aluminate phosphor, an alkali earth silicate, an alkali earth sulfide, an alkali earth thiogallate, an alkali earth silicone nitride, and a germanic acid salt which are mainly activated by elements such as the Lanthanide series element such as Eu and a transition metal-base element such as Mn; or a rare earth aluminate and a rare earth silicate which are mainly activated by the Lanthanide series element such as Ce; an organic and organic complex which are mainly activated by elements such as the Lanthanide series element such as Eu. The light-emitting device having the high luminescence brightness and high luminescence efficiency such as quantum efficiency can be provided thereby. Further, the light-emitting device having good color rendering can be provided. Provided that the second phosphor is not limited by the above descriptions, and can use phosphors which emit light having various color tastes.

The light-emitting device containing the fore-mentioned second phosphor releases preferably light by mixing at least 2 or more of lights among the portion of the light from the fore-mentioned excitation light source, the light from the fore-mentioned oxynitride phosphor and the light from the fore-mentioned second phosphor. The luminescence color of the light-emitting device is adjusted thereby, and a desired luminescence color can be released. In particular, when the light-emitting elements which emit light at an ultraviolet region are used, the luminescence color at the ultraviolet region can be hardly viewed by human eyes. Accordingly, the luminescence color by mixing the light from the fore-mentioned oxynitride phosphor and the light from the fore-mentioned second phosphor is exhibited. Since said luminescence color is determined only by the phosphor, the adjustment of the luminescence color is extremely carried out easily. Wherein the phosphor is represented as the second phosphor, but the second phosphor is not limited to only one kind, and several kinds of phosphors may be contained. The finer chromaticity adjustment is possible by containing several kinds of phosphors. Further, in particular, when the light-emitting elements at a short wavelength region from ultraviolet to visible light are used, the lights from said light-emitting elements are little felt as a color taste for human eyes, therefore the deviation of chromaticity caused by production deviation can be lessened.

The luminescence color of the light-emitting device containing the fore-mentioned second phosphor can be set at an intermediate luminescence color from the peak wavelength which the fore-mentioned excitation light source has, to the peak wavelength which the fore-mentioned oxynitride phosphors have, or the peak wavelength which the fore-mentioned second phosphor has. The excitation light source has the luminescence spectrum at a shorter wavelength side than the oxynitride phosphors or the second phosphor, and has high energy. The light-emitting device containing the fore-mentioned second phosphor can release the luminescence color from the high energy region to the low energy region of the oxynitride phosphors and the second phosphor. In particular, it exhibits the luminescence color from the luminescence peak wavelength of light-emitting elements to the first luminescence peak wavelength of the oxynitride phosphors, or the second luminescence peak wave which the second phosphor has. For example, when the luminescence peak wavelength of the light-emitting elements is situated at a blue region, the luminescence peak wavelength of the oxynitride phosphors excited is situated at a green region, and the luminescence peak wavelength of the second phosphor excited is situated at a red region, a white luminescence color can be exhibited by the color mixture of three colors. As a different example, when the luminescence peak wavelength of the light-emitting elements is situated at an ultraviolet region, the luminescence peak wavelength of the oxynitride phosphors excited is situated at a green region, and the luminescence peak wavelengths of the second phosphor excited are situated at yellow and red regions, a slightly yellowish white luminescence color and a multi-color base luminescence color can be realized. The luminescence color from a color taste nearby the luminescence color of the oxynitride phosphors, to a color taste nearby the luminescence color of the second phosphor can be realized by changing the compounding amount of the oxynitride phosphors and the second phosphor. Further, when the second phosphor has 2 or more of the luminescence peak wavelengths, there is realized the light-emitting device exhibiting a luminescence color between the luminescence peak wavelength which the light-emitting elements have, the luminescence peak wavelength which the oxynitride phosphors have, and 2 or more of the luminescence peak wavelengths which the second phosphor has. The second phosphor is not only used alone, but also 2 or more can be used in combination. Not only a light-emitting device emitting white light but also a light-emitting device emitting light with various color tastes such as a pastel color have been recently desired. According to the light-emitting device of the present invention, there can be provided the light-emitting device having a desired color taste by variously combining the oxynitride phosphors which emit green light, the phosphor which emits red light, and the phosphor which emits blue light. In the light-emitting device related to the present invention, various color tastes can be realized not only by a process of changing the kind of phosphors, but also by a process of changing the compounding ratio of phosphors combined, a process of changing the coating process of phosphors on an excitation light source, a process of adjusting the lighting time of an excitation light source, and the like.

When a white color system is selected as the fore-mentioned intermediate luminescence color, it is preferable a white color nearby the locus of black body radiation in particular. The white color base light-emitting device can be used for various uses such as illuminations, the back light of liquid crystal and displays.

The fore-mentioned light-emitting device has preferably the luminescence spectrum having one or more of the luminescence peak wavelengths at least at 430 to 500 nm and 500 to 730 nm. There can be provided the light-emitting device which emits light having a desired color taste by combining blue light, green light and red light. Accordingly, the color rendering can be improved by combining several phosphors. In case of the same white color luminescence, there exist also a yellowish white color and a bluish white color. Accordingly, the light-emitting device has the luminescence spectrum having the luminescence peak wavelength within the above-mentioned range.

As described above, the light-emitting device related to the present invention has technical meanings that the oxynitride phosphors which are excited by the light-emitting elements at an ultraviolet to visible light region and in which the wavelength is converted are used and an excellent light-emitting device can be provided. Said oxynitride phosphors have high luminescence efficiency and are stable phosphors with high reproducibility. Further, the light-emitting device has a technical meaning that a light-emitting device having a desired luminescence color by combining the light-emitting elements, the oxynitride phosphors and the second phosphor can be provided.

Further, in the present specification, the relation between the wavelength range of light and the color name of single light is in accordance with JIS Z8110. Specifically, 380 to 455 nm is a blue purple color, 455 to 485 nm is a blue color, 485 to 495 nm is a blue green color, 495 to 548 nm is a green color, 548 to 573 nm is a yellow green color, 573 to 584 nm is a yellow color, 584 to 610 nm is a yellow red color, and 610 to 780 nm is a red color.

Further, the second light-emitting device related to the present invention is preferably a light-emitting device having a luminescence spectrum having at least one or more of the luminescence peak wavelengths at 360 to 485 nm, 485 to 548 nm and 548 to 730 nm. There can be provided the light-emitting device which emits light with a desired color taste by combining a blue color, a green color, a red color and the like which are three primary colors. Further, the color rendering can be improved by combining several phosphors. Because in case of the same white color luminescence, there exist also a yellowish white color and a bluish white color.

The fore-mentioned second light-emitting device is preferably a light-emitting device having a luminescence spectrum having at least one or more of the luminescence peak wavelengths at 360 to 485 nm and 485 to 548 nm. For example, there can be obtained the light-emitting device which emits white light by combining a blue light-emitting element and a YAG-base phosphor, but light nearby 500 nm is insufficient. Accordingly, there can be provided the light-emitting device having excellent color rendering by containing the oxynitride phosphor which emits light nearby 500 nm.

The fore-mentioned second light-emitting device is preferably the average rendering index (Ra) of 80 or more. The light-emitting device having excellent color rendering can be provided thereby. In particular, the light-emitting device whose specific color rendering (R9) was improved can be provided.

As described above, a bright luminescence color can be realized by the first and second light-emitting devices related to the present invention. In particular, the oxynitride phosphor exhibits a luminescence color at a blue green to yellow region by the light from the light-emitting element having ultraviolet light. Further, there can be provided the light-emitting device having excellent luminescence properties by changing the composition ratio of the oxynitride phosphor. Further, there can be provided the light-emitting device having high luminescence efficiency and excellent reproducibility. Further, the color tone can be changed by changing the compounding ratio of the activator, R (in particular, Eu). Further, there can be provided the oxynitride phosphor having excellent luminescence brightness and quantum efficiency by changing the compounding ratio of Eu. Accordingly, the present invention has an extremely important technical meaning that the light-emitting device described above can be provided.

Further, according to the second light-emitting device related to the present invention, there can be provided the light-emitting device which emits bright blue to green light. Further, there can be produced the light-emitting device which combined said oxynitride phosphor, the YAG-base phosphor being the second phosphor, and the blue light-emitting element. There can be provided the light-emitting device having excellent color rendering and extremely high luminescence efficiency, thereby. With respect to said color rendering, the specific color rendering index (R9) which exhibits a red color is improved in particular.

DESCRIPTION OF THE PREFERRED EMBODIMENTS

Figure 1:
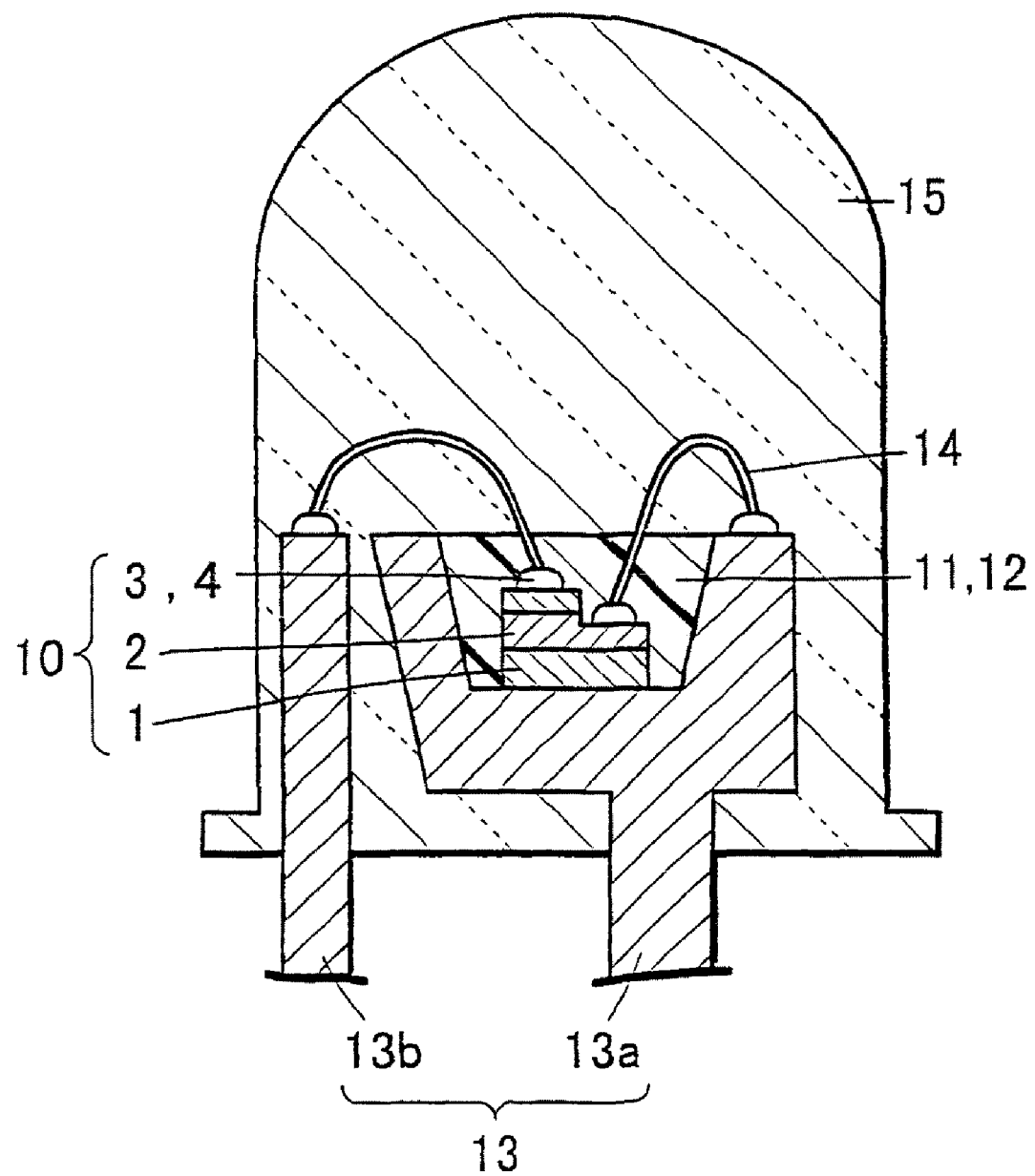
FIG. 1 is a view showing the cannonball type light-emitting device 1 of Embodiment 2 related to the present invention.

The light-emitting device related to the present invention and the oxynitride phosphor used for said light-emitting device, and the production process are illustrated below using the modes of operation and Examples. Provided that the present invention is not limited to embodiments and examples.

Embodiment 1

Embodiment 1 relates to the oxynitride phosphor which is suitable for being used in combination with a light-emitting element, in particular, a nitride semiconductor element, and the phosphor is a phosphor which is excited by the light of a nitride semiconductor light-emitting element and generates light having a wavelength different from the light from the light-emitting element.

The oxynitride phosphor related to Embodiment 1 uses a rare earth element, and is a phosphor comprising an oxynitride phosphor crystal containing at least one or more of Group II elements selected from the group consisting of Be, Mg, Ca, Sr, Ba and Zn, and at least one or more of Group IV elements selected from the group consisting of C, Si, Ge, Sn, Ti, Zr and Hf.

Wherein the oxynitride phosphor crystal is an oxynitride phosphor comprising, for example, crystal which belongs to the orthorhombic system and is shown in the later-mentioned examples.

The combination of Group II elements and Group IV elements described in the above description is arbitrary, but the combinations below are preferably used.

The oxynitride phosphor of Embodiment 1 is represented by the general formula of $L_X M_Y O_Z N_{(2/3)X+(4/3)Y-(2/3)Z}$:R, or $L_X M_Y Q_T O_Z N_{(2/3)X+(4/3)Y+T-(2/3)Z}$:R.

Wherein L is at least one or more of Group II elements selected from the group consisting of Be, Mg, Ca, Sr, Ba and Zn. M is at least one or more of Group IV elements selected from the group consisting of C, Si, Ge, Sn, Ti, Zr and Hf. Q is at least one or more of Group III elements selected from the group consisting of B, Al, Ga and In. O is an oxygen element. N is a nitrogen element. R is a rare earth element. $0.5<X<1.5$, $1.5<Y<2.5$, $0<T<0.5$, and $1.5<Z<2.5$.

The oxynitride phosphor which is represented by the general formula can contain the crystal in which elements are at least partially arranged according to a fixed rule, and light having high brightness is efficiently emitted from the crystal. In the above-mentioned general formula, a crystal phase being the luminescent portion can be comparatively easily formed by setting as $0.5<X<1.5$, $1.5<Y<2.5$, $0<T<0.5$, and $1.5<Z<2.5$, and the phosphor having good luminescence efficiency and high brightness can be provided.

Further, in the above-mentioned general formula, X, Y and Z are preferably X=1, Y=2, and Z=2. The more crystalline phases are formed at said composition, its crystallinity can be bettered, and the luminescence efficiency and brightness can be enhanced. The proportion of crystals (crystalline phases) contained in the oxynitride phosphor of Embodiment 1 is preferably 50% by weight or more and more preferably 80% by weight or more.

Further, when the proportion of crystals contained is desired to be set at a fixed value in order to adjust the luminescence brightness and the like, it can be also adjusted by the values of X, Y and Z in the above-mentioned general formula.

However, the above-mentioned range is a preferable range, and the present invention is not limited to the above-mentioned range.

Specifically, in the oxynitride phosphor of the present invention, there are contained oxynitride phosphors represented by $CaSi_2O_2N_2$:Eu, $SrSi_2O_2N_2$:Eu, $BaSi_2O_2N_2$:Eu, $ZnSi_2O_2N_2$:Eu, $CaGe_2O_2N_2$, Eu, $SrGe_2O_2N_2$:Eu $BaGe_2O_2N_2$:Eu, $ZnGe_2O_2N_2$:Eu, $Ca_{0.5}Sr_{0.5}Si_2O_2N_2$:Eu, $Ca_{0.5}Ba_{0.5}Si_2O_2N_2$:Eu, $Ca_{0.5}Zn_{0.5}Si_2O_2N_2$:Eu, $Ca_{0.5}Be_{0.5}Si_2O_2N_2$:Eu, $Sr_{0.5}Ba_{0.5}Si_2O_2N_2$:Eu, $Ca_{0.8}Mg_{0.2}Si_2O_2N_2$:Eu, $Sr_{0.8}Mg_{0.2}Si_2O_2N_2$:Eu, $Ca_{0.5}Mg_{0.5}Si_2O_2N_2$:Eu, $Sr_{0.5}Mg_{0.5}Si_2O_2N_2$:Eu, $CaSi_2B_{0.1}O_2N_2$:Eu, $SrSi_2B_{0.1}O_2N_2$:Eu, $BaSi_2B_{0.1}O_2N_2$:Eu, $ZnSi_2B_{0.1}O_2N_2$:Eu, $CaGe_2B_{0.01}O_2N_2$:Eu, $SrGe_2G_{0.01}O_2N_2$:Eu, $BaGe_2In_{0.01}O_2N_2$:Eu, $ZnGe_2Al_{0.05}O_2N_2$:Eu, $Ca_{0.5}Sr_{0.5}Si_2B_{0.3}O_2N_2$:Eu, $CaSi_{2.5}O_{1.5}N_3$:Eu, $SrSi_{2.5}O_{1.5}N_3$:Eu, $BaSi_{2.5}O_{1.5}N_3$:Eu, $Ca_{0.5}Ba_{0.5}Si_{2.5}O_{1.5}N_3$:Eu, $Ca_{0.5}Sr_{0.5}Si_{2.5}O_{1.5}N_3$:Eu, $Ca_{1.5}Si_{2.5}O_{2.5}N_{2.7}$:Eu, $Sr_{1.5}Si_{2.5}O_{2.5}N_{2.7}$:Eu, $Ba_{1.5}Si_{2.5}O_{2.5}N_{2.7}$:Eu, $Ca_{1.0}Ba_{0.5}Si_{2.5}O_{1.5}N_3$:Eu, $Ca_{1.0}Sr_{0.5}Si_{2.5}O_{1.5}N_3$:Eu, $Ca_{0.5}Si_{1.5}O_{1.5}N_{1.7}$:Eu, $Sr_{0.5}Si_{1.5}O_{1.5}N_{1.7}$:Eu, $Ba_{0.5}Si_{1.5}O_{1.5}N_{1.7}$:Eu, $Ca_{0.3}Ba_{0.2}Si_{2.5}O_{1.5}N_3$:Eu, $Ca_{0.2}Sr_{0.3}Si_{2.5}O_{1.5}N_3$:Eu and the like.

Further, as shown here, the oxynitride phosphor of Embodiment 1 can change a ratio of O to N, and the color tone and brightness can be adjusted by changing the ratio. Further, a molar ratio of cation to anion which is shown by (L+M)/(O+N) can be also changed, and the luminescence spectrum and intensity can be finely adjusted thereby. This can be carried out, for example, by carrying out treatment such as vacuum and removing N and O, but the present invention is not limited to this process. In the composition of the oxynitride phosphor, there may be contained at least one or more of Li, Na, K, Rb, Cs, Mn, Re, Cu, Ag and Au, and the brightness and luminescence efficiency such as quantum efficiency can be adjusted by adding these. Further, other elements may be contained so far as the properties are not damaged.

The portion of Group II elements contained in the oxynitride phosphor is substituted with the activator R. The amount of the fore-mentioned the activator R is preferably in molar ratio of (a mix amount of the fore-mentioned Group II elements and the fore-mentioned activator, R):(the amount of the fore-mentioned activator, R)=1:0.001 to 1:0.8 based on a mix amount of the fore-mentioned Group II elements and the fore-mentioned activator, R.

Further, L is at least one or more of Group II elements selected from the group consisting of Be, Mg, Ca, Sr, Ba and Zn. In the present invention, L may be single bodies such as Ca and Sr, and may comprise the combination of a plural number of elements such as Ca and Sr, Ca and Ba, Sr and Ba, and Ca and Mg. Further, when L is the combination of plural number of elements, the composition ratio can be varied. For example, the compounding ratio can be varied for the mixture of Sr and Ca, if necessary.

In particular, L is preferably at least one or more of Group II elements selected from the group consisting of Mg, Ca, Sr, Ba and Zn in which either of Ca, Sr and Ba is essential.

M is at least one or more of Group IV elements selected from the group consisting of C, Si, Ge, Sn, Ti, Zr and Hf. M may be also single bodies such as Si and Ge, and may comprise the combination of a plural number of elements such as Si and Ge, and Si and C. In the present invention, the above-mentioned Group IV elements can be used but Si and Ge are preferably used. The phosphor having good crystallinity and low cost can be provided using Si and Ge.

In particular, M is preferably at least one or more of Group IV elements selected from the group consisting of C, Si, Ge, Sn, Ti, Zr and Hf in which Si is essential.

R is rare earth elements. Specifically, R is one or 2 or more elements selected from La, Ce, Pr, Nd, Sm, Eu, Gd, Tb, Dy, Ho, Er, Tm, Yb and Lu. In the present invention, Eu is preferably used among these rare earth elements. Further, Eu and at least one or more elements selected from rare earth elements may be contained. In that case, Eu is preferably contained by 50% by weight or more as R, and more preferably 70% by weight or more. Namely, the activator R is preferably at least one or more elements selected from the group consisting of La, Ce, Pr, Nd, Sm, Eu, Gd, Tb, Dy, Ho, Er, Tm, Yb and Lu in which Eu is essential. Because elements other than Eu acts as a co-activator.

In Embodiment 1, europium Eu being the rare earth elements is used as a luminescence center. Europium has mainly a divalent and trivalent energy levels. The phosphor of Embodiment 1 uses $Eu^{2+}$ as the activator for an alkali earth metal silicone nitride being the mother body. $Eu^{2+}$ is easily oxidized and commercially available as the composition of $Eu_2O_3$ in general.

Further, in the present specification, the phosphor using Eu being a typical example as the luminescence center is occasionally illustrated, but the present invention is not limited to this.

L and M of the main components can be also used as compounds thereof as the mother material. These L and M of the main components can be used as metals, oxides, imides, amides, nitrides, and various salts. Further, the elements of L and M of the main components may be preliminarily mixed to be used.

Q is at least one or more of Group III elements selected from the group consisting of B, Al, Ga and In. Q is also used as metals, oxides, imides, amides, nitrides, and various salts. For example, they are $B_2O_6$, $H_3BO_3$, $Al_2O_3$, $Al(NO_3)_3 \cdot 9H_2O$, AlN, $GaCl_3$, $InCl_3$ and the like.

The nitride of L, the nitride of M and the oxide of M are mixed as the mother body materials. The oxide of Eu is mixed with said mother body materials as the activator. These are weighed so as to be the desired phosphor composition, and mixed until being homogeneous. In particular, the nitride of L, the nitride of M and the oxide of M in the mother body materials are preferably mixed at molar ratios of 0.5<the nitride of L<1.5, 0.25<the nitride of M<1.75, and 2.25<the oxide of M<3.75. Namely, the fixed amounts of these mother body materials are weighed and mixed so as to be the composition ratio of $L_XM_YO_ZN_{((2/3)X+Y-(2/3)Z-\alpha)}$:R or $L_XM_YQ_TO_ZN_{((2/3)X+Y+T-(2/3)Z-\alpha)}$:R.

(Production Process of Oxynitride Phosphor)

Then, the production process of the oxynitride phosphor related to Embodiment 1, $CaSi_2O_2N_2$:Eu is illustrated. Further, the present invention is not limited to the production processes below.

Firstly, the nitride of Ca, the nitride of Si, the oxide of Si and the oxide of Eu are prepared. As these raw materials, those purified are preferably used, but those commercially available may be used.

1. Preparation of Nitride of Ca

Firstly, Ca of a raw material is crushed. The Ca of a raw material is preferably used as a single body, but compounds such as an imide compound, an amide compound and CaO can be also used. Further, the Ca of a raw material may be those containing B, Ga and the like. The crushing of the Ca of a raw material is carried out in a globe box in argon atmosphere. It is preferable that the mean particle diameter of Ca obtained by the crushing is about 0.1 μm to 15 μm, but is not limited to this range. The purity of Ca is preferably 2N or more, but is not limited to this range.

Then, the Ca of a raw material crushed is nitrided in nitrogen atmosphere. The nitride of Ca can be obtained by nitriding the Ca crushed at a temperature of 600 to 900° C. for about 5 hours in nitrogen atmosphere. The reaction is shown in Formula 1.

$$3Ca + N_2 \rightarrow Ca_3N_2 \qquad \text{[Formula 1]}$$

As the nitride of Ca, it is needless to say that those with high purity are preferable. As the nitride of Ca, those commercially available can be also used.

Then the nitride of Ca is crushed. The crushing of the nitride of Ca is carried out in a globe box in argon atmosphere or in nitrogen atmosphere.

2. Preparation of Nitride of Si

Firstly, the Si of a raw material is crushed. The Si of a raw material is preferably used as a single body, but a nitride compound, an imide compound, an amide compound and the like can be also used. For example, they are $Si_3N_4$, $Si(NH_2)_2$, $Mg_2Si$, $Ca_2Si$, SiC and the like. The purity of the Si of a raw material is preferably 3N or more, but B, Ga and the like may be contained. The crushing of Si of a raw material is carried out in a globe box in argon atmosphere or in nitrogen atmosphere, in like manner as the Ca of a raw material. It is preferable that the mean particle diameter of the Si compound is about 0.1 μm to 15 μm.

The Si of a raw material is nitrided in nitrogen atmosphere. Silicon, Si is also nitrided at a temperature of 800 to 1200° C. for about 5 hours in nitrogen atmosphere to obtain silicon nitride. The reaction formula is shown in Formula 2.

$$3Si+2N_2 \rightarrow Si_3N_4 \quad \text{[Formula 2]}$$

It is needless to say that the silicon nitride used in the present invention is preferably those having high purity. Further, those which are commercially available can be also used.

Then, the nitride of Si is crushed.

3. Preparation of Oxide of Si

As $SiO_2$ being the oxide of Si, those which are commercially available are used (Silicon Dioxide 99.9%, 190-09072, manufactured by Wako Pure Chemicals Industries, Ltd.).

Raw materials (the nitride of Ca, the nitride of Si, the oxide of Si, and the oxide of Eu) which were purified or produced as above are weighed so as to be a fixed molar amount.

Then, the weighed raw materials are mixed.

Then, the mixture of the nitride of Ca, the nitride of Si, the oxide of Si, and the oxide of Eu is calcined at about 1500° C. in ammonia atmosphere. The calcined mixture is charged in a crucible to be calcined.

The oxynitride phosphor represented by $CaSi_2O_2N_2$:Eu can be obtained by mixing and calcination. The reaction formula of the basic constituting elements by the calcination is shown in Formula 3.

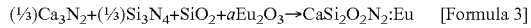

$$(1/3)Ca_3N_2+(1/3)Si_3N_4+SiO_2+aEu_2O_3 \rightarrow CaSi_2O_2N_2:Eu \quad \text{[Formula 3]}$$

However, the composition is a typical composition deduced from the compounding ratio, and has adequate properties which are worthwhile for practical use, around the ratio. Further, the composition of the objective phosphors can be changed by changing the compounding ratio of the respective raw materials.

The calcination can use a tube furnace, a small size furnace, a high frequency furnace and a metal furnace and the like. The calcination temperature is not specifically limited. The calcination is preferably carried out at a temperature of 1200 to 1700° C., and a calcination temperature of 1400 to 1700° C. is more preferable. It is preferable to carry out the calcination of the raw materials of the phosphor using a crucible made of boron nitride (BN) material and a boat. A crucible made of alumina ($Al_2O_3$) material can be also used in addition to the crucible made of boron nitride material.

Further, reductive atmosphere is inactive gas atmospheres such as nitrogen atmosphere, nitrogen-hydrogen atmosphere, ammonia atmosphere and argon atmosphere, etc.

The objective oxynitride phosphor can be obtained by using the above production process.

Further, the oxynitride phosphor represented by $Ca_XSi_YB_TO_ZN_{((2/3)X+Y+T-(2/3)Z-\alpha)}$:Eu which contains B can be produced as below.

A B compound, $H_3BO_3$ is preliminarily mixed with the oxide of Eu in dry condition. Europium oxide is used as the Eu compound, but metal europium, europium nitride and the like can be also used in like manner as the fore-mentioned other constitution elements. Additionally, an imide compound, a amide compound and the like can be used as the Eu compound. Europium oxide is preferably those having high purity, but those commercially available can be also used. A B compound is mixed in a dry process but a wet mixing can be also carried out.

The production process of the oxynitride phosphor is illustrated exemplifying the B compound $H_3BO_3$. However, there are Li, K, Na and the like as the component constituting elements other than B, and as these compounds, for example, there can be used $LiOH.H_2O$, $Na_2CO_3$, $K_2CO_3$, RbCl, CsCl, $Mg(NO_3)_2$, $CaCl_2.6H_2O$, $SrCl_2.6H_2O$, $BaCl_2.2H_2O$, $TiOSO_4.H_2O$, $ZrO(NO_3)_2$, $HfCl_4$, $MnO_2$, $ReCl_5$, $Cu(CH_3COO)_2.H_2O$, $AgNO_3$, $HAuCl_4.4H_2O$, $Zn(NO_3)_2.6H_2O$, $GeO_2$, $Sn(CH_3COO)_2$ and the like.

A mixture of Eu and B is crushed. The mean particle diameter of the mixture of Eu and B after the crushing is preferably about 0.1 μm to 15 μm.

After the above-mentioned crushing, the nitride of Ca, the nitride of Si, the oxide of Si, and the oxide of Eu containing B are mixed in like manner as the fore-mentioned production steps of $CaSi_2O_2N_2$:Eu. After said mixing, calcination is carried out and the objective oxynitride phosphor can be obtained.

The above oxynitride phosphors of Embodiment 1 have stability equal to or more than the YAG-base phosphor, and further have the characteristics below.

(1) The oxynitride phosphors of Embodiment 1 can set a desired luminescence color within a comparative wide range from a blue green region to a yellow red region by selecting the composition and composition ratio, and can widely adjust the color tone, luminescence brightness, quantum efficiency and the like.

For example, the color tone, luminescence brightness and quantum efficiency can be adjusted by changing the ratio using 2 or more of Group II elements.

(2) Although the YAG-base phosphor hardly emits light by excitation by light at a visible region from ultraviolet to short wavelength, the oxynitride phosphors of Embodiment 1 obtains high luminescence efficiency by excitation by light at a visible region from ultraviolet to short wavelength.

Namely, there can be provided the phosphor which is suitable for combination with a light-emitting element emitting light at a visible region from ultraviolet to short wavelength by the oxynitride phosphors of Embodiment 1.

(3) Since the oxynitride phosphor is crystalline, it can be easily produced as powder or particles, therefore its treatment and processing are easy.

Embodiment 2

FIG. 1 is a section view showing the constitution of the light-emitting device of Embodiment 2 related to the present invention, and the present light-emitting device has at least a light-emitting element and the first phosphor converting the wavelength of at least the portion of light from said light-emitting element. Hereat, in particular, the light-emitting device of Embodiment 2 is characterized in using the oxynitride phosphors of Embodiment 1 as the first phosphor.

Further, in the present specification, the relation between the name of color and the chromaticity coordinate is according to JIS Z 8110.

In the light-emitting device of Embodiment 2, a light-emitting element 10 is composed of a sapphire substrate 1, a semiconductor layer 2 formed on the sapphire substrate 1, and positive and negative electrodes 3, 4 formed on the semiconductor layer 2. The light-emitting element 10 is die-bonded in the cup of the lead frame 13a, and the positive and negative electrodes are respectively connected with the lead frame 13a and the lead frame 13b by the electro-conductive wire 14. Further, the coating member 12 containing the phosphor 11 is formed in the cup of the lead frame 13a so as to cover the light-emitting element 10. Further, the mold member 15 is formed so as to cover the whole of the lead frame 13a and the lead frame 13b in which the coating member containing the light-emitting element and the phosphor 11 was provided.

In the light-emitting device of Embodiment 2, the semiconductor layer 2 of the light-emitting element 10 comprises a plural number of layers including a luminescent layer (not illustrated), and the composition of the luminescent layer is adjusted so that the luminescence peak wavelength becomes 500 nm or less at an ultraviolet to blue region. Further, the positive and negative electrodes 3, 4 are formed on the same plane side of said semiconductor layer 2.

The light-emitting device of Embodiment 2 is prepared below.

Firstly, the light-emitting element 10 is set in a die bonder, and face-up is carried out for the lead frame 13a to be die-bonded (adhered). After the die-bonding, the lead frames 13 are transferred to a wire bonder, the negative electrode 3 of the light-emitting element is wire-bonded by a gold wire with the lead frame 13a which was provided in the cup, and the positive electrode 3 is wire-bonded with another lead frame 13b.

Then, it is transferred to a mold equipment, and the phosphor 11 and the coating member 12 are injected in the cup of the lead frames 13 with the dispenser of the mold equipment. At this time, the phosphor 11 and the coating member 12 are preliminarily mixed at a fixed proportion homogeneously.

After coating, the lead frames 13 are immersed in a mold frame where the mold member 15 was preliminarily injected, then the mold frame is removed and a resin is cured to prepare the cannonball type light-emitting device which is shown in FIG. 1.

The respective constituting members of the light-emitting device of Embodiment 2 are specifically illustrated below.
(Phosphor 11)

The phosphor 11 includes the oxynitride phosphors of Embodiment 1. Further, those combining the oxynitride phosphors and the second phosphor can be used as the phosphor 11.
(Light-Emitting Element 10)

In Embodiment 2, the light-emitting element 10 is preferably a semiconductor light-emitting element having a luminescent layer which emits light with a wavelength which can excite the oxynitride phosphor efficiently. As the material of the semiconductor light-emitting element, there can be mentioned various semiconductors such as BN, SiC, ZnSe, GaN, InGaN, InAlGaN, AlGaN, BAlGaN and BInAlGaN. Further, a luminescence center can be also made by containing Si, Zn and the like in these elements as impurity elements. As the semiconductor material which can efficiently emit light at a short wavelength region among an ultraviolet region and a visible light region which can efficiently excite the phosphor 11 (oxynitride phosphor), there can be preferably mentioned nitride semiconductors (for example, a nitride semiconductor containing Al and Ga, $In_XAl_YGa_{1-X-Y}N$, $0 \leq X$, $0 \leq Y$, $X+Y \leq 1$ as a nitride semiconductor containing In and Ga).

Further, as the structure of the semiconductor light-emitting element, there are preferably mentioned semiconductors having a homo structure, a hetero structure or a double hetero structure having an MIS junction, a PIN junction, a p-n junction and the like. A luminescence wavelength can be variously selected by the material of semiconductor layers and mix crystal ratio. Further, output power can be also further improved by making a single quantum well structure and a multi quantum well structure in which a semiconductor activating layer was formed to be a thin film which generates quantum effect.

When the light-emitting element 10 is composed of the nitride semiconductor, there are preferably used a substrate comprising materials such as sapphire, spinel, SiC, Si, ZnO, GaAs and GaN. The sapphire substrate is preferably used for forming the nitride semiconductor having good crystallinity by mass production. The nitride semiconductor can be formed on the sapphire substrate using a HVPE process, a MOCVD process and the like. Specifically, an amorphous buffer layer in which GaN, AlN, GaAlN and the like were grown at a low temperature is formed on the sapphire substrate, and the nitride semiconductor having a p-n junction is formed thereon.

The preparation example of the light-emitting element capable of efficiently emitting light at an ultraviolet region which has a p-n junction using the nitride semiconductor is as below.

Firstly, $SiO_2$ is formed in a stripe form about perpendicular to an orientation flat face of a sapphire substrate on the buffer layer. Then, ELOG (Epitaxial Lateral Over Grows GaN) growth of GaN is carried out on it using an HVPE process. Successively, the first contact layer formed with n-GaN, the first clad layer formed with n-AlGaN, active layers having a multi quantum well structure which laminated a plural number of layers of the well layers of InAlGaN and the barrier layers of AlGaN, the second clad layer formed with p-AlGaN, and the second contact layer formed with formed with p-GaN are laminated in order by the MOCVD process. Thus, the nitride semiconductor light-emitting element having a double hetero structure is prepared.

Further, the semiconductor laser element which can be utilized for the present invention can be prepared by making the active layer be ridge stripe form, sandwiching it with guide layers, and providing the edge face of a resonator.

Further, the nitride semiconductor exhibits an n-type conductivity in a condition in which impurities are not doped, but Si, Ge, Se, Te, C and the like are appropriately introduced as an n-type dopants in order to form an n-type nitride semiconductor having a desired carrier levels for purposes of improving the luminescence efficiency and the like. On the other hand, when a p-type nitride semiconductor is formed, Zn, Mg, Be, Ca, Sr, Ba and the like which are p-type dopants are preferably doped. Further, since the nitride semiconductor is hardly converted to p-type only by doping the p-type dopants, it is preferable to lower the resistance by heating with a furnace, plasma irradiation and the like after introducing the p-type dopants. When the sapphire substrate is not removed, the portion of the first contact layer is exposed by etching from a p-type side to the surface of the first contact layer, and electrodes are respectively formed on the respective contact layers. Then, the light-emitting elements comprising the nitride semiconductor (for example, the nitride semiconductor light-emitting element having a structure shown in FIG. 1) are prepared by cutting in a chip shape from the semiconductor wafer.

When the phosphor 11 is fixed around the surface of the light-emitting element 10 in the light-emitting device of Embodiment 2, a resin (a transparent resin) is preferably utilized for forming in good mass productivity. In this case, when both of the relation with the luminescence wavelength of the phosphor 11 and the deterioration protection of the transparent resin are considered, the light-emitting element 10 having a luminescence spectrum at an ultraviolet region, whose luminescence peak wavelength is 360 nm or more and 420 nm or less, or 450 nm or more and 470 nm or less, is preferably used.

Hereat, the semiconductor light-emitting element 10 used in Embodiment 2 is preferably adjusted so that the sheet resistance Rn of an n-type contact layer in which impurity levels are $10^{17}$ to $10^{20}/cm^3$ and the sheet resistance Rp of a transparent p-type electrode become the relation of the sheet resistance of $Rp \geq Rn$. The n-type contact layer is preferably formed at a film thickness of 3 to 10 μm and more preferably 4 to 6 μm, and the sheet resistance Rn is estimated to be 10 to 15Ω/□. Accordingly, it is preferable to set the thickness so that the sheet resistance Rp of the transparent p-type electrode is 10 to 15Ω/□. Specifically, the transparent p-type electrode may be formed at a thin film thickness of 150 μm or less.

Further, when the transparent p-electrode is formed by one kind selected from a group of gold and platinum and a multilayered film or alloy comprising at least one kind of other elements, stability and reproducibility are improved by adjusting the sheet resistance of the transparent p-electrode by the content of gold or platinum element contained. Since gold or a metal element has a high absorption coefficient at the wavelength of the semiconductor light-emitting element used for the present invention, the lesser the amount of gold or platinum element contained in the transparent p-electrode is, the better the transparency is. A conventional semiconductor light-emitting element had the relation of the sheet resistance of $Rp \leq Rn$, but since it is $Rp \geq Rn$ in Embodiment 2, the transparent p-electrode is formed in a thinner film in comparison with a conventional one. The thin film forming can be easily attained by reducing the amount of gold or platinum element.

As described above, the semiconductor light-emitting element used for the present invention has preferably the relation of $Rp \geq Rn$ for the sheet resistance $Rn\Omega/\square$ of n-contact layer and the sheet resistance $Rn\Omega/\square$ of the transparent p-electrode. However, since it is difficult to measure Rn after preparing the semiconductor light-emitting element 10, it is substantially impossible to know the relation of Rp and Rn, but it is possible to know what relation exists between Rp and Rn from the condition of light intensity distribution at light emission.

When the transparent p-electrode and n-contact layer have the relation of $Rp \geq Rn$, it is preferable to provide a p-side pedestal electrode having an extended conduction portion in contact with the fore-mentioned transparent p-electrode, therefore the external quantum efficiency can be further improved. The shape and direction of the extended conduction portion is not limited, and when the extended conduction portion is a linear shape, an area obstructing light is preferably reduced, but the shape may be a mesh shape. The shape may be a curve, a lattice, a branch and a hook other than the linear shape. Hereat, since the shading effect is increased in proportion to the total area of the p-side pedestal electrode, it is preferable to design the line width and length of the extended conduction portion so that the shading effect does not exceeds the luminescence increasing effect.

As described above, not only a light-emitting element emitting ultraviolet light, but also a light-emitting element emitting blue light can be also used as the light-emitting element 10 in Embodiment 2. The light-emitting element 10 emitting blue light is also preferably Group III nitride compound light-emitting element. For example, such light-emitting element 10 has a laminated structure in which an Si undoped n-GaN layer, an n-contact layer comprising Si-doped n-GaN, an undoped n-GaN layer, a luminescent layer having a multi quantum well structure (the multi quantum well structure of GaN barrier layer/InGaN well layer), a p-clad layer comprising Mg-doped p-GaN, and a p-contact layer comprising Mg-doped p-GaN are laminated in order on a sapphire substrate through GaN buffer layer. Further, electrodes are formed as below. Provided that the light-emitting elements different from the constitution can be also used.

A p-Ohmic electrode is formed almost all over the surface on the p-contact layer, and a p-pad electrode is formed on the portion of the p-ohmic electrode.

Further, the undoped GaN layer is removed from the p-contact layer by etching, the portion of the n-contact layer is exposed, and the n-electrode is formed on the exposed portion.

Further, the luminescent layer having a multi quantum well structure was used in Embodiment, but the present invention is not limited to this. For example, it may be a single quantum well structure utilizing InGaN, and GaN to which Si, Zn and the like were doped may be utilized.

Further, in the luminescent layer of the light-emitting element 10, the main luminescence peak wavelength can be varied within a range of 420 nm to 490 nm by changing the content of In. Further, the luminescence peak wavelength is not limited to the above-mentioned range, and those having the luminescence peak wavelength the luminescence peak wavelength at 360 to 550 nm can be also used.

(Coating Member 12)

The coating member 12 (transparent material) is provided in the cup of the lead frames 13, and used by being mixed with the phosphor 11. As the specific material of the coating member 12, there are used transparent resins excellent in temperature property and weather resistance such as an epoxy resin, a urea resin and a silicone resin; silica sol, glass, an inorganic binder and the like. Further, a dispersant, barium titanate, titanium oxide, aluminum oxide and the like may be contained together with the phosphor. Further, a light stabilizer and a coloring agent may be contained.

(Lead Frame 13)

The lead frame 13 is constituted by the mount lead 13a and the inner lead 13b.

The mount lead 13a arranges the light-emitting element 10. The upper part of the mount lead 13a is a cup shape, and the light-emitting element 10 is die-bonded in the cup. The light-emitting element 10 is covered in the cup with the fore-mentioned phosphor 11 and the fore-mentioned coating member 12. Further, a plural number of the light-emitting elements 10 are arranged in the cup, and the mount lead 13a can be utilized as a common electrode of the plural number of the light-emitting elements 10. In this case, an adequate electroconductivity and the connecting property of the electroconductive wire 14 are required. The die bonding (adhesion) of the light-emitting element 10 with the cup of the mount lead 13a can be carried out by a thermosetting resin and the like. As the thermosetting resin, an epoxy resin, an acryl resin, an imide resin and the like are mentioned. Further, it is die-bonded with the mount lead 13a by the face down light-emitting element 10 and the like, and an Ag paste, a carbon paste, a metal bump and the like can be used for carrying out electric connection. Further, an inorganic binder can be also used.

The inner lead 13b is electrically connected with the electroconductive wire 14 which is extended from the electrode 3 of the light-emitting elements 10 which were arranged on the mount lead 13a. The inner lead 13b is preferably arranged at a position which is separated from the mount lead 13a for preventing a short circuit with the mount lead 13a. When a plural number of the light-emitting elements 10 are arranged on the mount lead 13a, a constitution in which the respective wires are not mutually connected is required. The inner lead 13b uses preferably the similar material as that of the mount lead 13a, and iron, copper, copper with iron, gold, platinum, silver and the like can be used.

(Electroconductive Wire)

The electroconductive wire 14 connects electrically the electrode 3 of the light-emitting elements 10 with the lead frame 13. The electroconductive wire 14 is preferably those having good ohmic property, mechanical connecting property and heat conductivity with the electrode 3. The specific material of the electroconductive wire 14 is preferably metals such as gold, copper, platinum, aluminum and the like, and alloys thereof, etc.

(Coating Member 12)

The phosphor 11 can be adhered using various coating members (binder) such as the resins of organic materials and glass of inorganic materials. The coating member 12 has occasionally a role as a binder for fixing the phosphor 11 on the light-emitting element 10, the window portion 107 and the like. When an organic substance is used as the coating member (binder), as the specific material, there are preferably used transparent resins excellent in weather resistance such as an epoxy resin, an acryl resin and a silicone resin. When a silicone is used, it is preferable because it is superior in reliability and the dispersibility of the phosphor 11 can be improved.

Further, when an inorganic substance having the similar thermal expansion coefficient as the window portion 107 is used as the coating member 12 (binder), it is preferable because the phosphor 108 can be adhered on the fore-mentioned window portion 107. As the specific processes, there can be used a sedimentation process, a sol-gel process, a spray process and the like. For example, silanol ($Si(OEt)_3OH$) and ethanol are mixed with the phosphors 11 and 108 to form a slurry, the slurry is vomited from a nozzle, then the mixture is heated at 300° C. for 3 hours to convert silanol into $SiO_2$, and the phosphor can be fixed on a desired position.

Further, the binding agent being an inorganic substance can be also used as the coating members (binder) 12 and 109. The binding agent is a so-called low melting point glass and fine particles, and preferably absorbs little radiation at an ultraviolet to visible region and is extremely stable in the coating members (binders) 12 and 109.

When the phosphor having large particle diameters is adhered with the coating members (binders) 12 and 109, there are preferably used binding agents in which particles are ultra fine powder even if its melting point is high, such as for example, silica sol, alumina, or alkali earth metal pyrophosphate and phosphate having a fine particle size which is obtained by a sedimentation process. These binding agents can be used alone or they are mutually mixed to be used.

Hereat, the coating process of the above-mentioned binding agent is described. In order to sufficiently enhance binding effect, the binding agent is preferably crushing in a vehicle in wet condition to prepare a slurry, and used as a binding agent slurry. The fore-mentioned vehicle is a highly viscous solution which is obtained by dissolving a small amount of an adhesive binding agent in an organic solvent or deionized water. For example, an organic-base vehicle is obtained by containing 1% by weight of nitrocellulose being the adhesive binding agent based on butyl acetate being an organic solvent.

The phosphors 11 and 108 are contained in the binding agent slurry thus obtained to prepare a coating solution. As the addition amount of the slurry in the coating solution, the total amount of the binding agent in the slurry can be 1 to 3% by weight based on the phosphor amount in the coating solution. It is preferable that the addition amount of the binding agent is little in order to suppress the lowering of a beam retention rate.

The fore-mentioned coating solution is coated on the back face of the fore-mentioned window portion 107. Then, warm wind or hot wind is blown to dry it. Finally, baking is carried out at a temperature of 400° C. to 700° C. to disperse the fore-mentioned vehicle. Thus, the phosphor layer is adhered on a desired position with the binding agent.

(Mold Member)

The mold member 15 is provided for protecting the light-emitting elements 10, the phosphor 11, the coating member 12, the lead frame 13, the electroconductive wire 14 and the like from the external. The mold member 15 has purposes of expanding the angle of visibility, reducing the directionality from the light-emitting elements 10, and focusing and scattering luminescence in addition to the purpose of protection from the external. In order to attain the purposes, the mold member can be formed in a desired shape. Further, the mold member 15 may be a convex lens shape, a concave lens shape, additionally, a structure in which a plural number of layers were laminated. As the specific material of the mold member 15, there can be used materials excellent in transmission property, weather resistance and temperature property such as an epoxy resin, a urea resin, a silicone resin, a silica sol, a glass, and the like. A dispersant, a coloring agent, an ultraviolet absorbent and a phosphor be contained in the mold member 15. As the dispersant, barium titanate, titanium oxide, aluminum oxide and the like are preferable. The same material is preferably used for reducing the repulsion of the coating member 12 with the material and for considering a refractive index.

According to the light-emitting device of Embodiment 2 which was constituted above, a light-emitting device having various luminescence colors can be realized.

For example, in the light-emitting device of Embodiment 2, the light-emitting device having the same luminescence color as the luminescence color of the oxynitride phosphor can be realized by combining an ultraviolet light-emitting element with the oxynitride phosphor.

Further, the light-emitting device having a luminescence color between (intermediate) the luminescence color of a light-emitting element and the luminescence color of the oxynitride phosphor can be realized by combining a blue light-emitting element with the oxynitride phosphor.

Further, the light-emitting device of Embodiment 2 can realize a light-emitting device having various color tones because the oxynitride phosphor related to the present invention can adjust the luminescence color, luminescence brightness and the like at a wide range.

Furthermore, the light-emitting device of Embodiment 2 can provide a light-emitting device having the high brightness and high luminescence efficiency because the oxynitride phosphor related to the present invention can emit light having high brightness and the luminescence efficiency is high.

Embodiment 3

Figure 2:
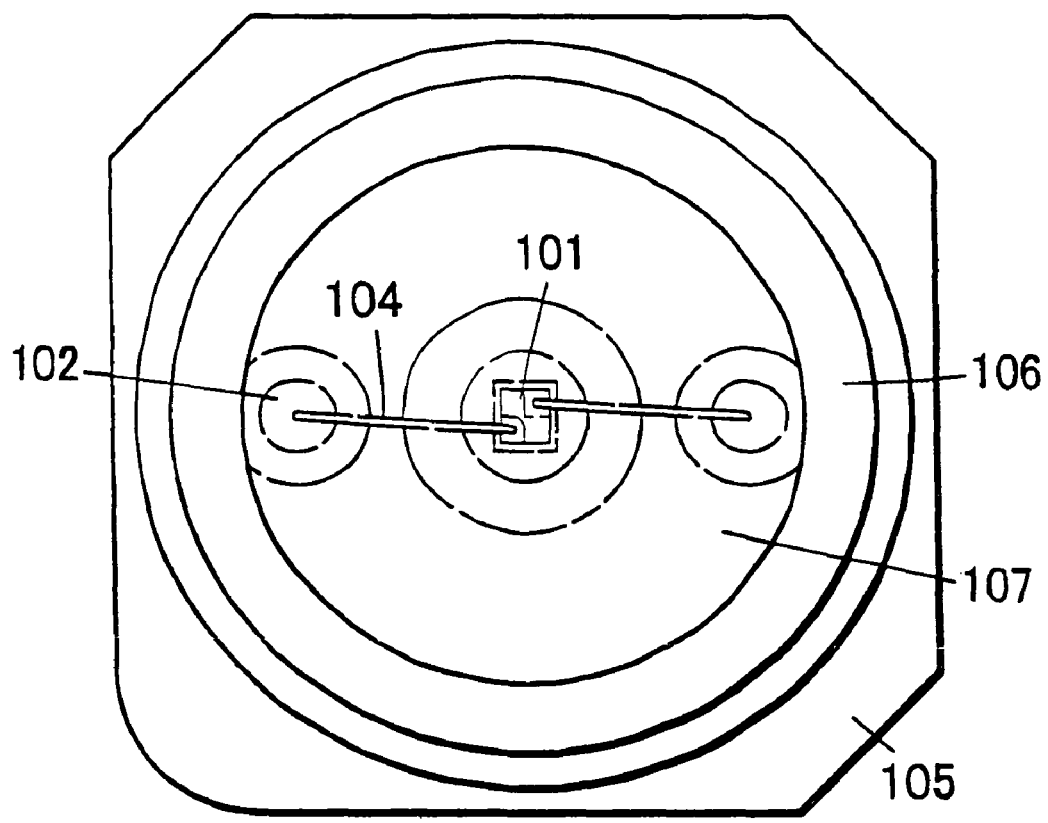
FIG. 2A is a plane view showing the surface mounting type light-emitting device of Embodiment 3 related to the present invention.
FIG. 2B is a section view showing the surface mounting type light-emitting device of Embodiment 3 related to the present invention.
Figure 2:
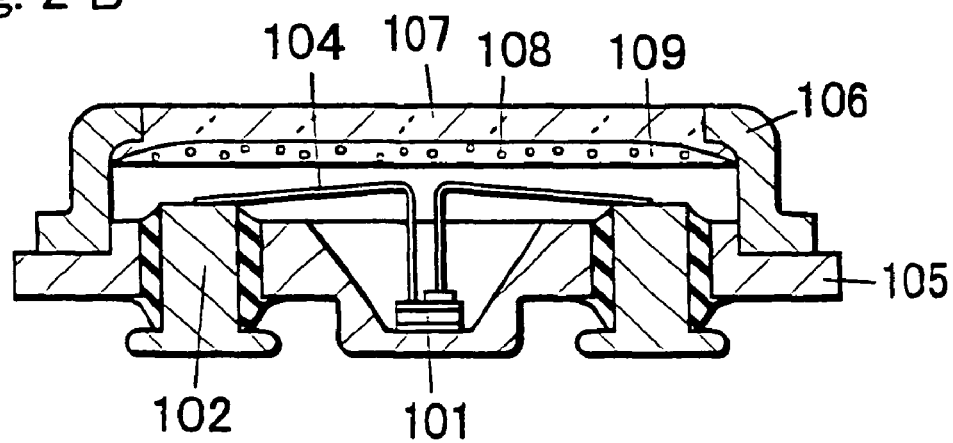

FIG. 2 is a plane view showing the surface mounting type light-emitting device of Embodiment 3 related to the present invention (FIG. 2A and a section view (FIG. 2B)). The light-emitting device of Embodiment 3 is a surface mounting type light-emitting device. In the light-emitting device of Embodiment 3, a nitride semiconductor light-emitting element which emits light at an ultraviolet region can be used as the light-emitting element 101, and a nitride semiconductor light-emitting element which emits light at a blue region can be also used. Further, the specific constitution is similar as the light-emitting element of Embodiment 2.

Hereat, the light-emitting element 101 which emits light at an ultraviolet region is illustrated as an example. In Embodiment 3, the light-emitting element 101 is a nitride semiconductor light-emitting element which has an InGaN semiconductor whose luminescence peak wavelength is about 370 nm as a luminescent layer. The more specific LED element structure has a structure in which a luminescent layer having a single quantum well structure including an n-GaN layer being an undoped nitride semiconductor, a GaN layer in which an Si doped n-electrode is formed to be an n-contact layer, an n-GaN layer being an undoped nitride semiconductor, an n-AlGaN layer being a nitride semiconductor and an InGaN well layer was laminated on a sapphire substrate. An AlGaN layer as an Mg doped p-clad layer and a GaN layer being an Mg doped p-contact layer are laminated in order on the luminescent layer. Further, a buffer layer which was obtained by growing a GaN layer at low temperature is formed on a sapphire substrate. Further, the p-semiconductor is annealed at 400° C. or more after coating. In the above-mentioned laminated structure, the surfaces of the respective p-n-contact layers are exposed on the nitride semiconductor on the sapphire substrate by etching at the same face side. An n-electrode is formed in a belt shape on the n-contact layer exposed, and a transparent p-electrode comprising a metal thin film is formed on almost the whole surface of the residual p-contact layer. Further, a pedestal electrode is formed on the transparent p-electrode in parallel with the n-electrode using a spattering process.

In Embodiment 3, there is used the package 105 made of kovar having a concave portion at a central part and comprising a base portion in which the lead electrode 102 made of kovar was inserted to be fixed in insulating hermetic seal at the both sides of the fore-mentioned concave portion. An Ni/Ag layer is provided on the surfaces of the fore-mentioned package 105 and the lead electrode 102. The above-mentioned light-emitting element 101 is die-bonded in the concave portion of the package 105 with an Ag—Sn alloy. All of the constitution members of the light-emitting device can be made by inorganic substances by composing thus, therefore even if the luminescence released from the light-emitting element 101 was at an ultraviolet region or a visible light short wavelength region, the light-emitting device having greatly high reliability is obtained.

Then, the respective electrodes of the light-emitting element 101 die-bonded are electrically connected with the respective lead electrodes 102 exposed from the bottom face of the package concave portion, with the Ag wire 104 respectively. After sufficiently removing moisture in the package concave portion, it is sealed with the lid 106 made of kovar which has the glass window portion 107 at a central portion to carry out seam welding. The phosphor 108 containing $CaSi_2O_2N_2$:Eu, $(Y_{0.8}Gd_{0.2})_3Al_5O_{12}$:Ce and the like is preliminarily contained in a slurry consisting of 90% by weight of nitrocellulose and 10% by weight of γ-alumina, the mixture is coated on the back face of the transparent window portion 107 of the lid 106, and the color conversion member is constituted by curing by heating at 220° C. for 30 minutes. When light is emitted from the light-emitting device thus formed, there can be prepared a light-emitting diode which can emit white light at high brightness. There can be prepared the light-emitting device which adjusts extremely easily chromaticity and is excellent in productivity and reliability, thereby. The respective constitutions of the present invention are specifically illustrated.

Further, when an inorganic substance having the similar thermal expansion coefficient as the window portion 107 is used as the coating member 12 (binder), it is preferable because the phosphor 108 can be adhered on the fore-mentioned window portion 107. As the adhering processes, there can be used a sedimentation process, a sol-gel process, a spray process and the like. For example, silanol $(Si(OEt)_3OH)$ and ethanol are mixed with the phosphor 108 to form a slurry, said slurry is vomited from a nozzle, then the mixture is heated at 300° C. for 3 hours to convert silanol into $SiO_2$, and the phosphor can be fixed on a desired position.

Further, the binding agent being an inorganic substance can be also used as the coating member (binder) 109. The binding agent is a so-called low melting point glass and fine particles, and preferably absorbs little radiation at an ultraviolet to visible region and is extremely stable in the coating member (binder) 109.

The light-emitting device of Embodiment 3 which was constituted above has the similar action effect as Embodiment 2.

Embodiment 4

The light-emitting device of Embodiment 4 is a light-emitting device in which the second phosphor is contained together with the oxynitride phosphor as the phosphors 11 and 108 in the light-emitting device of Embodiment 2 or 3.

The second phosphor is preferably at least one or more selected from an alkali earth halogen apatite phosphor, an alkali earth metal borate halogen phosphor, an alkali earth metal aluminate phosphor, an alkali earth silicate, an alkali earth sulfide, an alkali earth thiogallate, an alkali earth silicone nitride, and a germanic acid salt which are mainly activated by elements such as the Lanthanide series element such as Eu and a transition metal-base element such as Mn; or a rare earth aluminate and a rare earth silicate which are mainly activated by the Lanthanide series element such as Ce; an organic and organic complex which are mainly activated by elements such as the Lanthanide series element such as Eu. As the specific example, phosphors below can be mentioned, but the present invention is not limited to these.

As the alkali earth halogen apatite phosphor which is mainly activated by elements such as the Lanthanide series element such as Eu and a transition metal-base element such as Mn, there are $M_5(PO_4)_3X$:R (M is at least one or more selected from Sr, Ca, Ba, Mg and Zn. X is at least one or more selected from F, Cl, Br and I. R is at least one or more of Eu, Mn, and Eu and Mn.) and the like.

As the alkali earth metal borate halogen phosphor, there are $M_2B_5O_9X$:R (M is at least one or more selected from Sr, Ca, Ba, Mg and Zn. X is at least one or more selected from F, Cl, Br and I. R is at least one or more of Eu, Mn, and Eu and Mn.) and the like.

As the alkali earth metal aluminate phosphor, there are $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (R is at least one or more of Eu, Mn, and Eu and Mn.) and the like.

As the alkali earth sulfide phosphor, there are $La_2O_2S$:Eu, $Y_2O_2S$:Eu, $Gd_2O_2S$:Eu and the like.

As the rare earth aluminate phosphor which is mainly activated by the Lanthanide series element such as Ce, there are YAG-base phosphors represented by the composition formulae of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$:Ce; and the like.

As other phosphors, there are ZnS:Eu, $Zn_2GeO_4$:Mn, $MGa_2S_4$:Eu (M is at least one or more selected from Sr, Ca, Ba, Mg and Zn. X is at least one or more selected from F, Cl, Br and I.) and the like. Further, there are also $M_2Si_5N_8$:Eu, $MSi_7N_{10}$:Eu, $M_{1.8}Si_5O_{0.2}N_8$:Eu, $M_{0.8}Si_7O_{0.1}N_{10}$:Eu (M is at least one or more selected from Sr, Ca, Ba, Mg and Zn.) and the like.

The above-mentioned second phosphor can contain one or more selected from Tb, Cu, Ag, Au, Cr, Nd, Dy, Co, Ni and Ti, in place of Eu, or in addition to Eu if necessary.

Further, phosphors other than the above-mentioned phosphors which have the similar performances and effects can be also used.

As these second phosphors, there can be used phosphors which have luminescence spectra at a red color, a green color and a blue color by the excitation light of the light-emitting elements 10 and 101, and additionally, there can be also used phosphors which have luminescence spectra at a yellow color, a blue green color and an orange color which are intermediate colors. There can be produced the light-emitting device having various luminescence colors by using these second phosphors in combination with the first phosphor.

For example, there can be provided the light-emitting device with good color rendering which emits white light by using the phosphors 11 and 108 comprising $CaSi_2O_2N_2$:Eu or $SrSi_2O_2N_2$:Eu being the first phosphor which emits green to yellow light, $(Sr, Ca)_5(PO_4)_3Cl$:Eu being the second phosphor which emits blue light, and $(Ca, Sr)_2Si_5N_8$:Eu. Because red, blue and green which are three primary colors of color are used, therefore a desired white light can be realized only by changing the compounding ratio of the first phosphor and the second phosphor.

In particular, when light nearby 460 nm as an excitation light source is irradiated to the oxynitride phosphor and the second phosphor, the oxynitride phosphor emits light around 500 nm. There can be provided the white color light-emitting device with good color rendering, thereby.

The particle diameter of the above-mentioned phosphors 11 and 108 is preferably 1 μm to 20 μm, more preferably 2 μm to 8 μm, and preferably 5 μm to 8 μm in particular. A phosphor having a particle diameter of 2 μm or less is apt to form aggregates. On the other hand, a phosphor having a particle diameter of 5 μm to 8 μm has the high absorption rate and conversion efficiency of light. Thus, the mass productivity of the light-emitting device is improved by containing the phosphors having a large particle diameter which have optically superior properties.

Wherein the particle diameter means the mean particle diameter obtained by an air transmission process. Specifically, a sample by 1 $cm^3$ is weighed under environments of a temperature of 25° C. and a humidity of 70% and packed in an exclusive use tubular container, then dry air at fixed pressure is flown, and a specific surface area is read from differential pressure to obtain a value converted to the mean particle diameter. The mean particle diameter of the phosphors used in the present invention is preferably 2 μm to 8 μm. Further, the phosphor having the value of the mean particle diameter is preferably contained in high frequency. Further, those whose particle size distribution is narrow are preferable, and those having fine particles with 2 μm or less are preferable in particular. Thus, the light-emitting device suppressing color unevenness and having good color tone is obtained by using phosphors having the little unevenness of the particle diameter and particle size distribution.

The position of arranging the phosphor 108 in the light-emitting device of FIG. 2 can be arranged at various positions in the positional relation with the light-emitting element 101. For example, the phosphor 108 can be contained in a mold material coating the light-emitting element 101. Further, the light-emitting element 101 and the phosphor 108 may be arranged at an interval, and the phosphor 108 may be directly mounted on the upper part of the light-emitting element 101.

The light-emitting device of Embodiment 4 which was constituted above has the similar effect as the light-emitting device of Embodiment 2, and additionally, has effects below.

Namely, in the light-emitting device of Embodiment 4, the light-emitting device having a luminescence color by the color mixture of the luminescence of the oxynitride phosphor and the luminescence of the second phosphor, or the light-emitting device having a luminescence color by the color mixture of the luminescence of a light-emitting element (a light-emitting element emitting visible light), the luminescence of the oxynitride phosphor and the luminescence of the second phosphor can be realized by using the second phosphor in addition to the oxynitride phosphor.

Further, in the light-emitting device of Embodiment 4, the adjustment of the luminescence color, luminescence brightness and the like comes to be possible by changing the kind of the second phosphor and the ratio to the oxynitride phosphor, and the more kind of the color tones than the modes of operation 2 and 3 can be realized.

Embodiment 5

Figure 31:
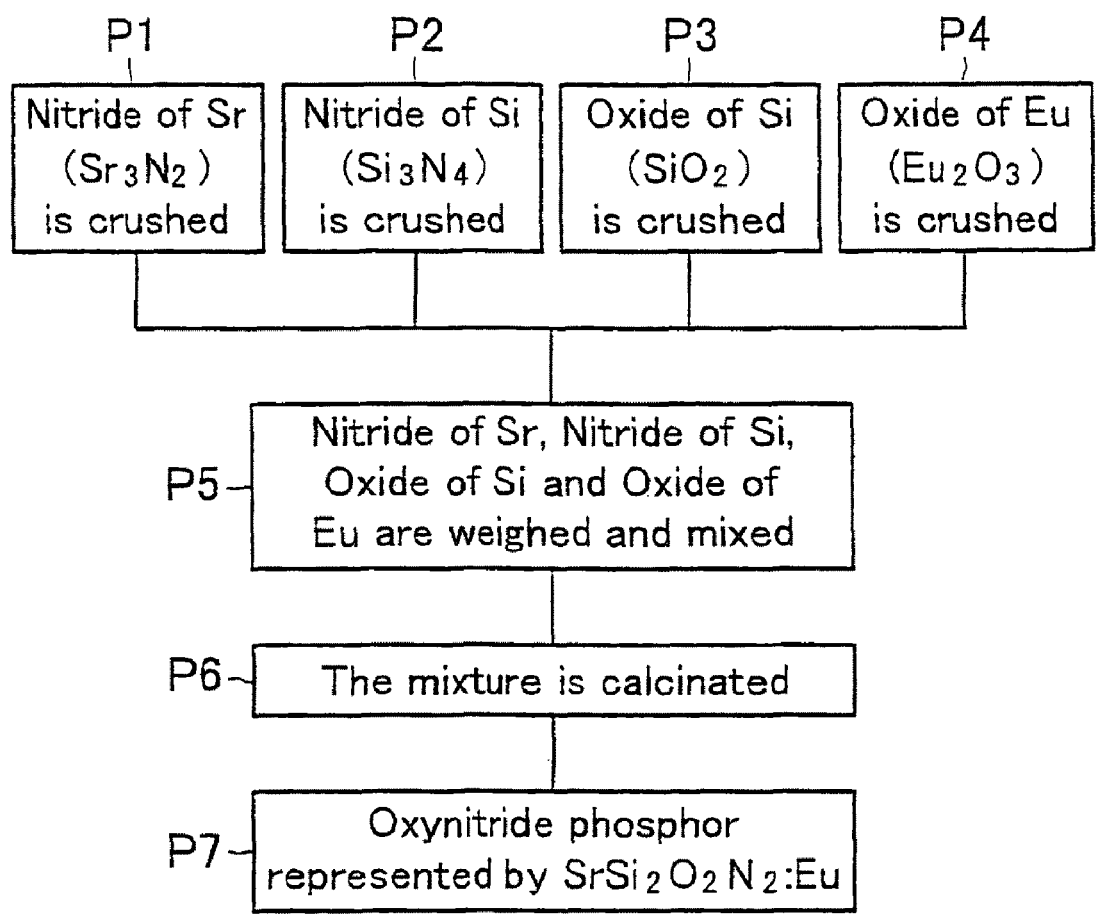
FIG. 31 is a process chart showing the production process of the oxynitride phosphor.

Embodiment 5 related to the present invention is the production process of the oxynitride phosphor represented by $SrSi_2O_2N_2$:Eu, and FIG. 31 is a process chart showing the production process of the oxynitride phosphor of Embodiment 5.

In the present production process, firstly, the nitride of Sr, the nitride of Si, the oxide of Si and the oxide of Eu are prepared. As these raw materials, those purified are preferably used, but those commercially available may be used. Specifically, the oxynitride phosphor is produced by the process below.

$Sr_3N_2$ as a nitride is used for the Sr of a raw material. As the raw material, compounds such as an imide compound, an amide compound, SrO and the like can be also used, and Sr single body can be used. Further, the Sr of a raw material may be those containing B, Ga and the like.

The nitride of Sr, $Sr_3N_2$ is crushed (P1).

$Sr_3N_4$ is used as the nitride of Si being a raw material. As the raw material, other nitride compound, an imide compound, an amide compound and the like can be also used, and an Si single body can be also used. For example, they are $Si(NH_2)_2$, $Mg_2Si$, $Ca_2Si$, SiC and the like. The purity of the Si of a raw material is preferably 3N or more, but B, Ga and the like may be contained.

The nitride of Si, $Si_3N_4$ is crushed (P2).

$SiO_2$ is used as the oxide of Si of a raw material. Hereat, those which are commercially available are used (Silicon Dioxide 99.9%, 190-09072, manufactured by Wako Pure Chemicals Industries, Ltd.).

Oxide of Si, $SiO_2$ is crushed (P3).

The oxide of Eu, $Eu_2O_3$ is used for a raw material. The single body of Eu is preferably used as the raw material, but a nitride compound, an imide compound, an amide compound and the like can be used. In particular, an europium nitride is preferably used in addition to an europium oxide. Because oxygen or nitrogen is contained in a product.

Oxide of Eu, $Eu_2O_3$ is crushed (P4)

After crushing the respective raw materials, the fixed molar amount of the nitride of Sr, $Sr_3N_2$, the nitride of Si, $Si_3N_4$, the oxide of Si, $SiO_2$, and the oxide of Eu, $Eu_2O_3$ are weighed so as to be a fixed compounding ratio, and mixed (P5).

Then, the mixture of the nitride of Sr, the nitride of Si, the oxide of Si, and the oxide of Eu is calcinated (P6). Said mixture is charged in a crucible and calcination is carried out.

The oxynitride phosphor represented by $SrSi_2O_2N_2$:Eu can be obtained by mixing and calcination (P7). The reaction formula of the oxynitride phosphor by the calcination is shown in Formula 4.

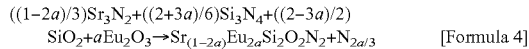

$$((1-2a)/3)Sr_3N_2+((2+3a)/6)Si_3N_4+((2-3a)/2)SiO_2+aEu_2O_3 \rightarrow Sr_{(1-2a)}Eu_{2a}Si_2O_2N_2+N_{2a/3}$$ [Formula 4]

However, the composition is a typical composition deduced by the compounding ratio, and has adequate properties which are sufficiently worthwhile for practical use, around the ratio. Further, the composition of the objective phosphors can be changed by changing the compounding ratio of the respective raw materials.

The calcination temperature is not specifically limited. The calcination is preferably carried out at a temperature of 1200 to 2000° C., and a calcination temperature of 1400 to 2000° C. is more preferable. It is preferable to carry out the calcination of the raw materials of the phosphor 11 using a crucible made of boron nitride (BN) material and a boat. A crucible made of alumina ($Al_2O_3$) material can be also used in addition to the crucible made of the boron nitride material.

Further, the calcination is preferably carried out in reductive atmosphere. The reductive atmosphere is inactive gas atmospheres such as nitrogen atmosphere, nitrogen-hydrogen atmosphere, ammonia atmosphere and argon atmosphere, etc.

The objective oxynitride phosphor can be obtained by using the above production process.

Further, the oxynitride phosphor represented by $Sr_XSi_YB_TO_ZN_{(2/3)X+Y+T-(2/3)Z-\alpha}$:Eu which contains B can be produced as below.

A B compound, $H_3BO_3$ is preliminarily mixed with the oxide of Eu in dry condition. Europium oxide is used as the Eu compound, but metal europium, europium nitride and the like can be also used in like manner as the fore-mentioned other constitution elements. Additionally, an imide compound, a amide compound and the like can be used as the Eu of a raw material. Europium oxide is preferably those having high purity, but those commercially available can be also used. A B compound is mixed in a dry process but a wet mixing can be also carried out.

The production process of the oxynitride phosphor is illustrated exemplifying the B compound $H_3BO_3$. However, there are Li, K, Na and the like as the component constituting elements other than B, and as these compounds, for example, there can be used $LiOH \cdot H_2O$, $Na_2CO_3$, $K_2CO_3$, RbCl, CsCl, $Mg(NO_3)_2$, $CaCl_2 \cdot 6H_2O$, $SrCl_2 \cdot 6H_2O$, $BaCl_2 \cdot 2H_2O$, $TiOSO_4 \cdot H_2O$, $ZrO(NO_3)_2$, $HfCl_4$, $MnO_2$, $ReCl_5$, $Cu(CH_3COO)_2 \cdot H_2O$, $AgNO_3$, $HAuCl_4 \cdot 4H_2O$, $Zn(NO_3)_2 \cdot 6H_2O$, $GeO_2$, $Sn(CH_3COO)_2$ and the like.

A mixture of Eu and B is crushed. The mean particle diameter of the mixture of Eu and B after the crushing is preferably about 0.1 μm to 15 μm.

After carrying out the above-mentioned crushing, the nitride of Sr, the nitride of Si, the oxide of Si, and the oxide of Eu containing B are mixed in like manner as the fore-mentioned production steps of $SrSi_2O_2N_2$:Eu. After said mixing, calcination is carried out and the objective oxynitride phosphor can be obtained.

Embodiment 6

The phosphor of Embodiment 6 related to the present invention relates to an oxynitride phosphor which is suitable for being used in combination with a light-emitting element, in particular, a nitride semiconductor element, and the phosphor is a phosphor in which Ba, Si and Eu are essential in the oxynitride phosphor of Embodiment 1.

Namely, the oxynitride phosphor related to Embodiment 6 uses at least one or more of rare earth elements in which Eu is essential as an activator, and contains at least one or more of Group II elements selected from the group consisting of Ca, Sr, Ba and Zn in which Ba is essential, and at least one or more of Group IV elements selected from the group consisting of C, Si, Ge, Sn, Ti, Zr and Hf in which Si is essential. The combination of said elements is arbitrary but the phosphor having the composition below is preferable.

The oxynitride phosphor of Embodiment 6 is represented by the general formula of $L_XM_YO_ZN_{(2/3)X+(4/3)Y-(2/3)Z}$:R, or $L_XM_YQ_TO_ZN_{(2/3)X+(4/3)Y+T-(2/3)Z}$:R (wherein L is at least one or more of Group II elements selected from the group consisting of Ca, Sr, Ba and Zn in which Ba is essential. M is at least one or more of Group IV elements selected from the group consisting of C, Si, Ge, Sn, Ti, Zr and Hf in which Si is essential. Q is at least one or more of Group III elements selected from the group consisting of B, Al, Ga and In. O is an oxygen element. N is a nitrogen element. R is at least one or more of rare earth elements in which Eu is essential.). Further, the phosphor of Embodiment 6 exhibits high brightness within ranges of 0.5<X<1.5, 1.5<Y<2.5, 0<T<0.5, and 1.5<Z<2.5 in like manner as Embodiment 1. Further, among the general formula, the fore-mentioned X, the fore-mentioned Y and the fore-mentioned Z are preferably 0.8<X<1.2, 1.8<Y<2.2, 0<T<0.5, and 1.7<Z<2.2, and in particular, the oxynitride phosphor in which the fore-mentioned X, the fore-mentioned Y and the fore-mentioned Z are represented by X=1, Y=2, and Z=2 is preferable because it exhibits high brightness. However, the present invention is not limited to the above-mentioned ranges. Specifically, as the oxynitride phosphor of Embodiment 6, there are mentioned $BaSi_{1.8}Ge_{0.2}O_2O_2N_2$:Eu, $BaSi_{1.9}Ge_{0.1}O_2N_2$:Eu, $BaSi_{1.8}C_{0.2}O_2N_2$:Eu, $BaSi_{1.9}C_{0.1}O_2N_2$:Eu, $BaSi_{1.8}Ti_{0.2}O_2N_2$:Eu, $BaSi_{1.9}Ti_{0.1}O_2N_2$:Eu, $BaSi_{1.8}Sn_{0.2}O_2N_2$:Eu, $BaSi_{1.9}Sn_{0.1}O_2N_2$:Eu, $Ba_{0.9}Ca_{0.1}Si_2O_2N_2$:Eu, $Ba_{0.9}Sr_{0.1}Si_2O_2N_2$:Eu, $Ba_{0.9}Zn_{0.1}Si_2O_2N_2$:Eu, $Ba_{0.9}Ca_{0.1}Si_{1.8}Ge_{0.2}O_2N_2$:Eu, $Ba_{0.9}Sr_{0.1}Si_{1.8}Ge_{0.2}O_2N_2$:Eu and the like.

Further, the present oxynitride phosphor can adjust the color tone and brightness by changing a ratio of O to N in like manner as Embodiment 1. Further, the luminescence spectrum and intensity can be finely adjusted also by changing a molar ratio of cation to anion which is shown by (L+M)/(O+N). This can be carried out, for example, by carrying out treatment such as vacuum and removing N and O, but the present invention is not limited to these processes. In the composition of the oxynitride phosphor, there may be contained at least one or more of Li, Na, K, Rb, Cs, Mn, Re, Cu, Ag and Au. The brightness and luminescence efficiency such as quantum efficiency can be adjusted by adding these. Further, other elements may be contained so far as the properties are not damaged.

L is at least one or more of Group II elements selected from the group consisting of Be, Mg, Ca, Sr, Ba and Zn in which Ba is essential. Namely, Ba may be used alone, but various combinations such as Ba and Ca, Ba and Sr, and Ba, Ca and Sr can be changed. The mixture of Group II elements can vary the compounding ratio, if necessary.

M is at least one or more of Group IV elements selected from the group consisting of C, Si, Ge, Sn, Ti, Zr and Hf in which Si is essential. M may also use Si as a single body, and can change various combinations such as Si and Ge, and Si and C. Because the phosphor having good crystallinity and low cost can be provided using Si.

R is one or more of the rare earth elements in which Eu is essential. Specifically, the rare earth elements are La, Ce, Pr, Nd, Sm, Eu, Gd, Tb, Dy, Ho, Er, Tm, Yb and Lu. Eu may be used alone among these rare earth elements, but those containing Eu and at least one or more of elements selected from the rare earth elements can be also used. Because elements other than Eu act as a co-activator. As R, Eu is preferably contained by 70% by weight or more. In particular, R is a molar ratio of Group II element:R=1:0.005 to 1:0.15.

Europium Eu being the rare earth element is used as a luminescence center. The present invention is illustrated using only Eu, but is not limited to this, and those which were co-augmented with Eu can be used. Europium has mainly a divalent and trivalent energy levels. The phosphor of the present invention uses $Eu^{2+}$ as the activator for an alkali earth metal silicone nitride being the mother body. $Eu^{2+}$ is easily oxidized and commercially available as the composition of trivalent $Eu_2O_3$ in general.

L and M of the main components can be also used as respective compounds thereof as the mother material. These L and M of the main components can be used as metals, oxides, imides, amides, nitrides, and various salts. Further, the elements of L and M of the main components may be preliminarily mixed to be used.

Q is at least one of more of Group III elements selected from the group consisting of B, Al, Ga and In. Q is also used as metals, oxides, imides, amides, nitrides, and various salts. For example, they are $B_2O_6$, $H_3BO_3$, $Al_2O_3$, $Al(NO_3)_3 \cdot 9H_2O$, AlN, $GaCl_3$, $InCl_3$ and the like.

The oxynitride phosphor of Embodiment 6 can be prepared as below.

Firstly, the nitride of L, the nitride of M and the oxide of M are mixed as the mother body materials. The oxide of Eu is mixed with said mother body materials as the activator. These are weighed so as to be the desired amount, and mixed until being homogeneous. In particular, the nitride of L, the nitride of M and the oxide of M in said mother body materials are preferably mixed at molar ratios of 0.5<the nitride of L<1.5, 0.25<the nitride of M<1.75, and 2.25<the oxide of M<3.75. The fixed amounts of these mother body materials are weighed and mixed so as to be the composition ratio of $L_XM_YO_ZN_{((2/3)X+Y-(2/3)Z-\alpha)}$:R or $L_XM_YQ_TO_ZN_{((2/3)X+Y+T-(2/3)Z-\alpha)}$:R.

(Example of More Specific Production Process of Oxynitride Phosphor of Embodiment 6)

Figure 62:
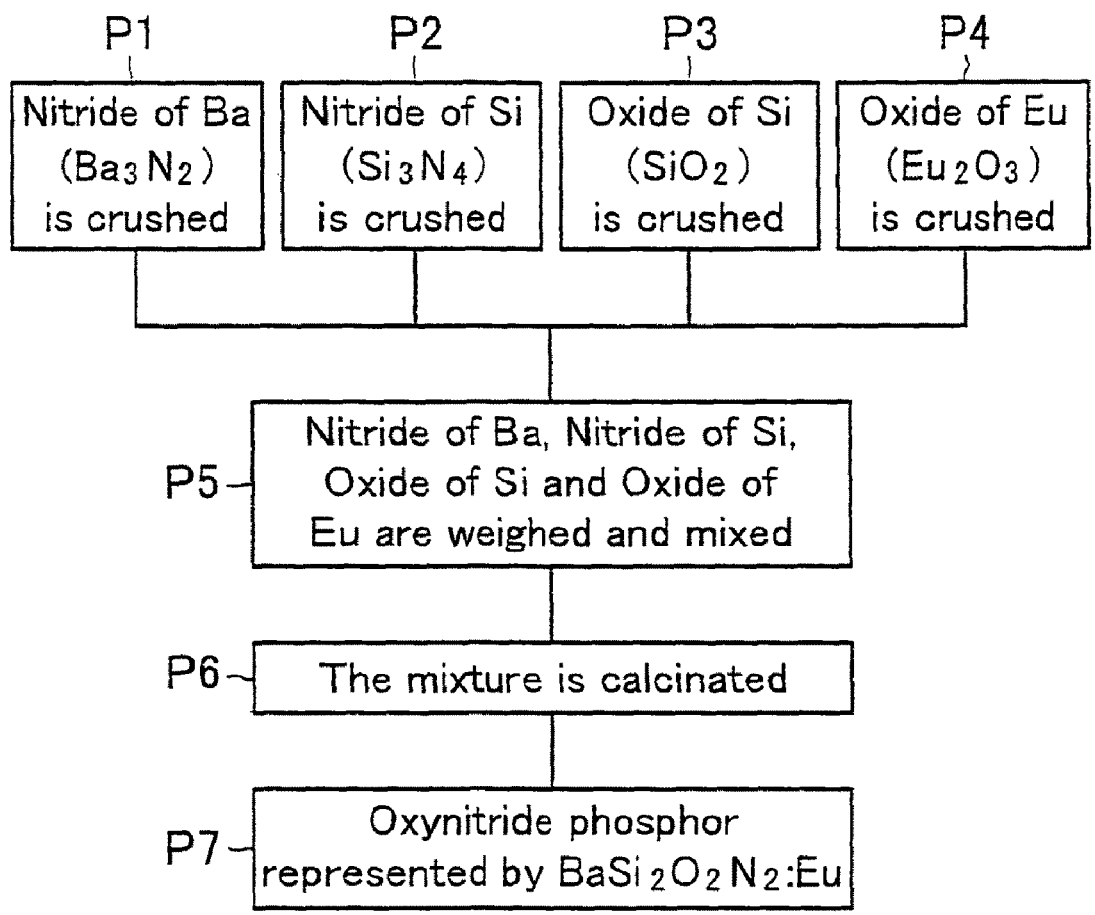
FIG. 62 is a process chart showing the production process of the oxynitride phosphor.

Then, the production process of the oxynitride phosphor, $BaSi_2O_2N_2$:Eu related to Embodiment 6 is illustrated, but the present invention is not limited to the production processes below. FIG. 62 is a process chart showing the production process of the oxynitride phosphor of Embodiment 6.

Firstly, in the present process, the nitride of Ba, the nitride of Si, the oxide of Si and the oxide of Eu are prepared. As these raw materials, those purified are preferably used, but those commercially available may be used.

1. Nitride of Ba $Ba_3N_2$ is used as the nitride of Ba of a raw material. Compounds such as an imide compound, an amide compound and BaO can be also used as the raw material, and the single body of Ba can be also used. Further, the Ba of a raw material may be those containing B, Ga and the like.

The nitride of Ba, $Ba_3N_2$, is crushed (P1).

2. Nitride of Si $Si_3N_4$ is used as the nitride of Si of a raw material. As the raw material, a nitride compound, an imide compound, an amide compound and the like can be also used, and the single body of Si can be also used. For example, they are $Si_3N_4$, $Si(NH_2)_2$, $Mg_2Si$, $Ca_2Si$, SiC and the like. The purity of the Si of a raw material is preferably 3N or more, but B, Ga and the like may be contained.

The nitride of Si, $Si_3N_4$, is crushed (P2).

3. Oxide of Si $SiO_2$ is used as the oxide of Si of a raw material. Hereat, those which are commercially available are used (Silicon Dioxide 99.9%, 190-09072, manufactured by Wako Pure Chemicals Industries, Ltd.).

The oxide of Si, $SiO_2$, is crushed (P3).

4. Oxide of Eu $Eu_2O_3$ is used as the oxide of Eu of a raw material. As the raw material, a nitride compound, an imide compound, an amide compound and the like can be also used, and the single body of Eu can be also used. Europium nitride other than europium oxide is preferably used. Because oxygen or nitrogen is contained in a product.

The oxide of Eu, $Eu_2O_3$, is crushed (P4).

The above-mentioned nitride of Ba, $Ba_3N_2$, which was crushed, the nitride of Si, $Si_3N_4$, the oxide of Si, $SiO_2$, and the oxide of Eu, $Eu_2O_3$ are weighed and mixed (P5). The above-mentioned raw materials are weighed so as to be a fixed compounding ratio.

Then, the mixture of the nitride of Ba, the nitride of Si, the oxide of Si, and the oxide of Eu is calcined (P6). Said mixture is charged in a crucible to be calcined.

The oxynitride phosphor represented by $BaSi_2O_2N_2$:Eu can be obtained by mixing and calcination (P7). The reaction formula of the basic constituting elements by the calcination is shown in Formula 5.

$$(\tfrac{1}{3})Ba_3N_2+(\tfrac{1}{3})Si_3N_4+SiO_2+aEu_2O_3 \rightarrow BaSi_2O_2N_2{:}Eu \quad \text{[Formula 5]}$$

However, the composition is a typical composition deduced from the compounding ratio, and has adequate properties which are worthwhile for practical use, around the ratio. Further, the composition of the objective phosphors can be changed by changing the compounding ratio of the respective raw materials.

The calcination temperature is not specifically limited. The calcination is preferably carried out at a temperature of 1200 to 1700° C., and a calcination temperature of 1400 to 1700° C. is more preferable. It is preferable to carry out the calcination of the raw materials of the phosphor 11 using a crucible made of boron nitride (BN) material and a boat. A crucible made of alumina ($Al_2O_3$) material can be also used in addition to the crucible made of boron nitride material.

Further, the calcination is preferably carried out in reductive atmosphere. The reductive atmosphere is inactive gas atmospheres such as nitrogen atmosphere, nitrogen-hydrogen atmosphere, ammonia atmosphere and argon atmosphere, etc.

The objective oxynitride phosphor of Embodiment 6 can be obtained by using the above production process.

Further, the oxynitride phosphor represented by $Ba_XSi_YB_TO_ZN_{((2/3)X+Y+T-(2/3)Z-\alpha)}$:Eu can be produced as below.

An Eu oxide is preliminarily mixed with a B compound, $H_3BO_3$ in dry condition. Europium oxide is used as the Eu compound, but metal europium, europium nitride and the like can be also used in like manner as the fore-mentioned other constitution elements. Additionally, an imide compound, an amide compound and the like can be used as the Eu compound. Europium oxide is preferably those having high purity, but those commercially available can be also used. A B compound is mixed in a dry process but a wet mixing can be also carried out.

The production process of the oxynitride phosphor is illustrated exemplifying the B compound $H_3BO_3$. However, there are Li, K, Na and the like as the component constituting elements other than B, and as these compounds, for example, there can be used $LiOH.H_2O$, $Na_2CO_3$, $K_2CO_3$, RbCl, CsCl, $Mg(NO_3)_2$, $CaCl_2.6H_2O$, $SrCl_2.6H_2O$, $BaCl_2.2H_2O$, $TiOSO_4.H_2O$, $ZrO(NO_3)_2$, $HfCl_4$, $MnO_2$, $ReCl_5$, $Cu(CH_3COO)_2.H_2O$, $AgNO_3$, $HAuCl_4.4H_2O$, $Zn(NO_3)_2.6H_2O$, $GeO_2$, $Sn(CH_3COO)_2$ and the like.

A mixture of Eu and B is crushed. The mean particle diameter of the mixture of Eu and B after the crushing is preferably about 0.1 μm to 15 μm.

After the above-mentioned crushing, the nitride of Ba, the nitride of Si, the oxide of Si, and the oxide of Eu containing B are mixed in like manner as the fore-mentioned production steps of $BaSi_2O_2N_2$:Eu. After said mixing, calcination is carried out and the objective oxynitride phosphor can be obtained.

The above oxynitride phosphors of Embodiment 6 which are constituted above have stability equal to or more than a YAG-base phosphor, and further have the similar action and effect as Embodiment 1.

Further, the oxynitride phosphors of Embodiment 6 can select the composition and composition ratio so as to have the luminescence spectrum which has the luminescence peak in a blue green region to a green region, can realize high luminescence brightness and luminescence efficiency within the range in particular, and can widely adjust the color tone, quantum efficiency and the like.

EXAMPLES

The phosphors and the light-emitting device related to the present invention are illustrated below according to examples, but not limited to these examples.

Further, temperature properties are shown by a relative brightness in which the luminescence brightness at 25° C. is 100%. Further, the particle diameter shows the fore-mentioned particle diameter, and is a value obtained by an air transmission process called as F.S.S.S.No. (Fisher Sub Sieve Sizer's No.).

Examples 1 to 27 are examples related to the oxynitride phosphor related to Embodiment 1.

Examples 1 to 5

Table 1 shows the properties of the oxynitride phosphors of Examples 1 to 5 related to the present invention.

Figure 3:
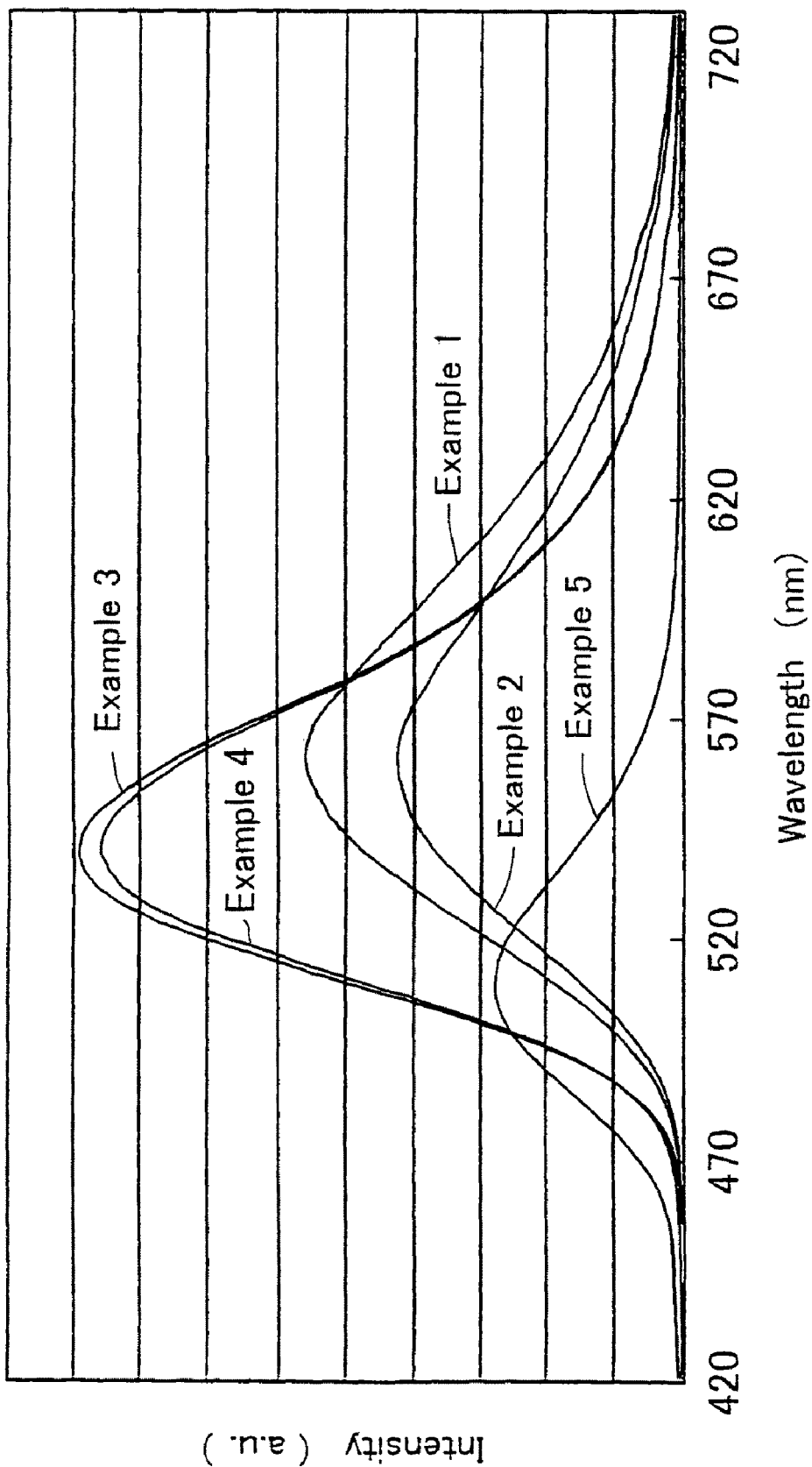
FIG. 3 is a chart showing the luminescence spectra when the oxynitride phosphors of Examples 1 to 5 were excited at Ex=400 nm.
Figure 4:
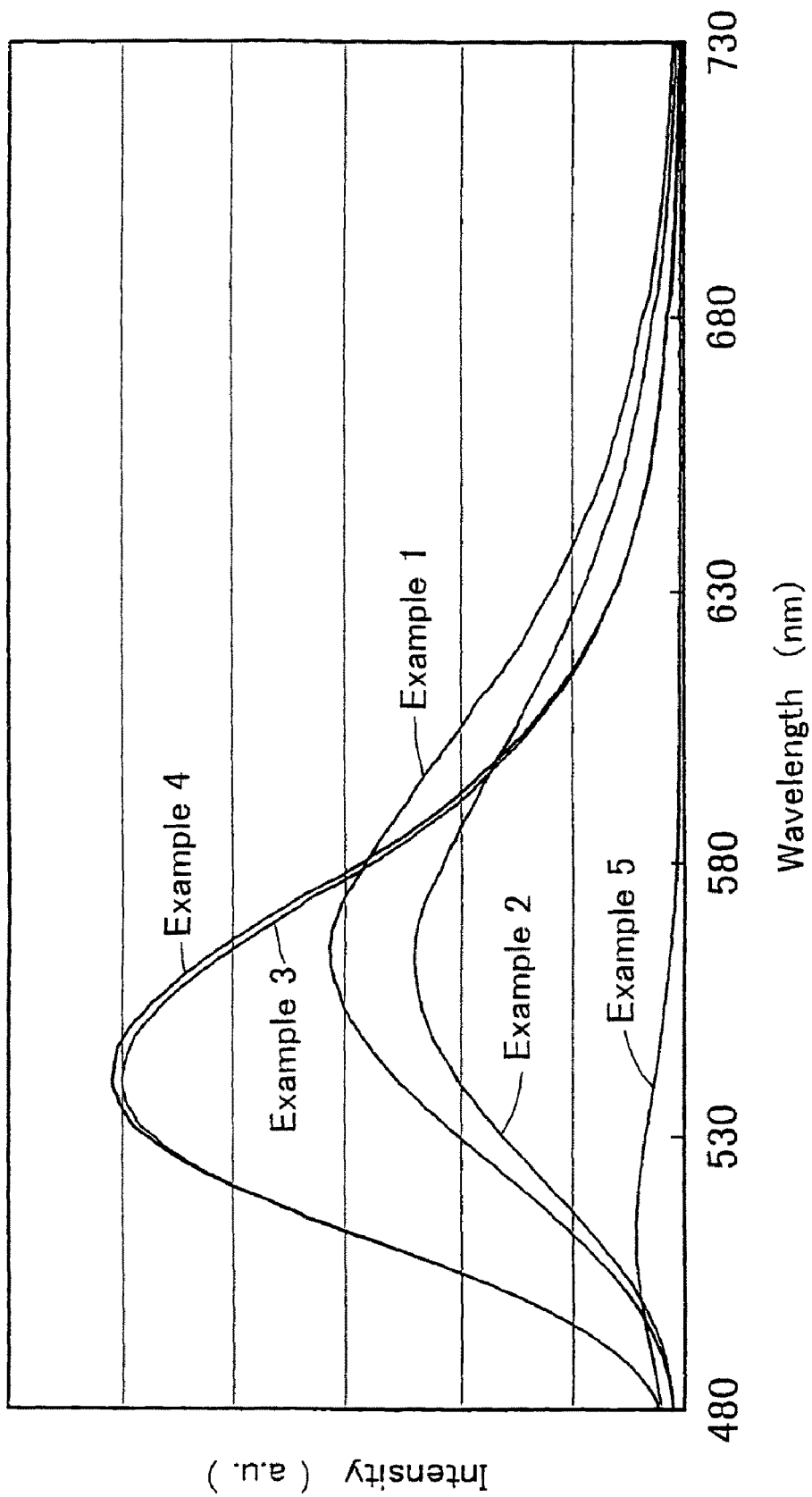
FIG. 4 is a chart showing the luminescence spectra when the oxynitride phosphors of Examples 1 to 5 were excited at Ex=460 nm.
Figure 5:
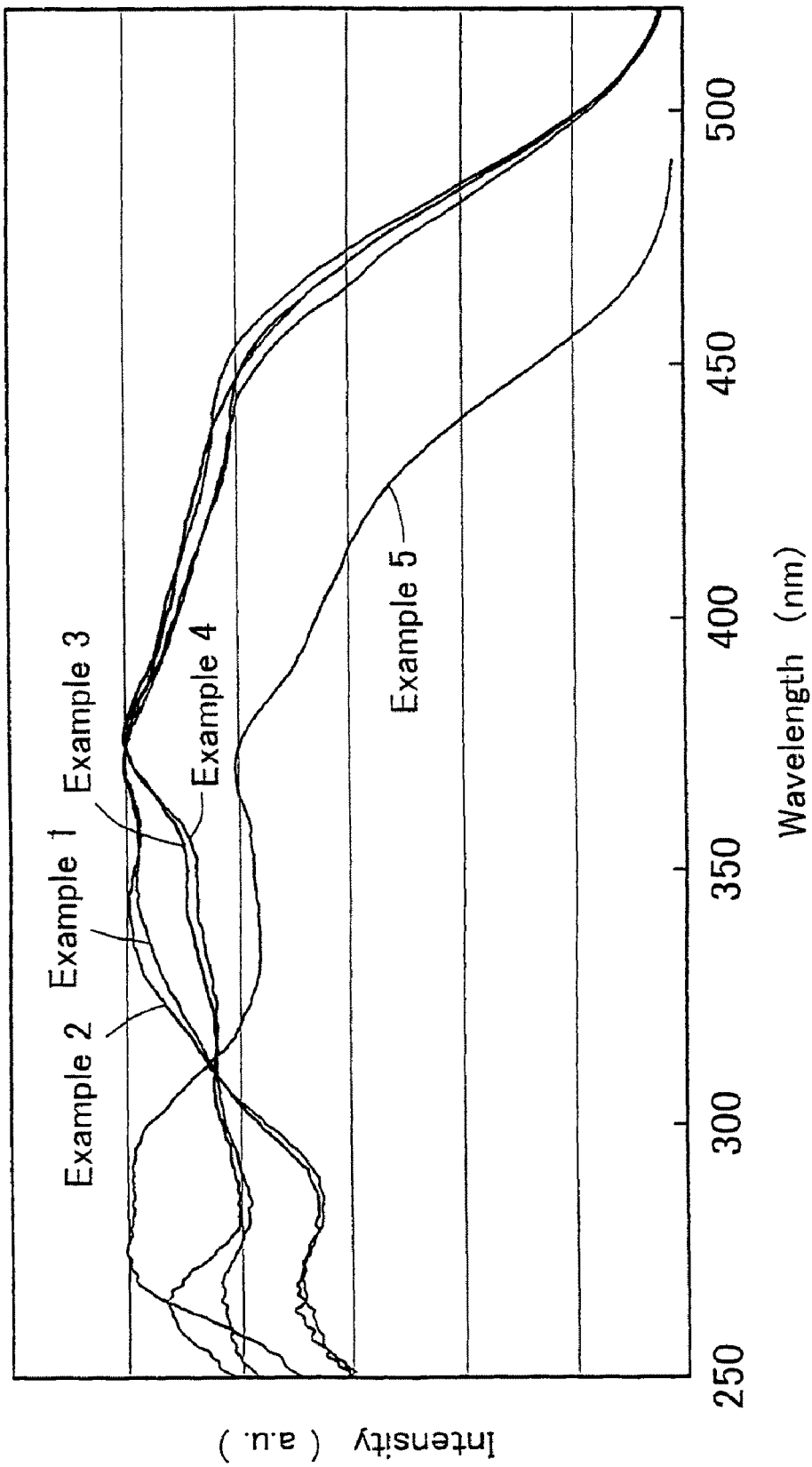
FIG. 5 is a chart showing the excitation spectra of the oxynitride phosphors of Examples 1 to 5.
Figure 6:
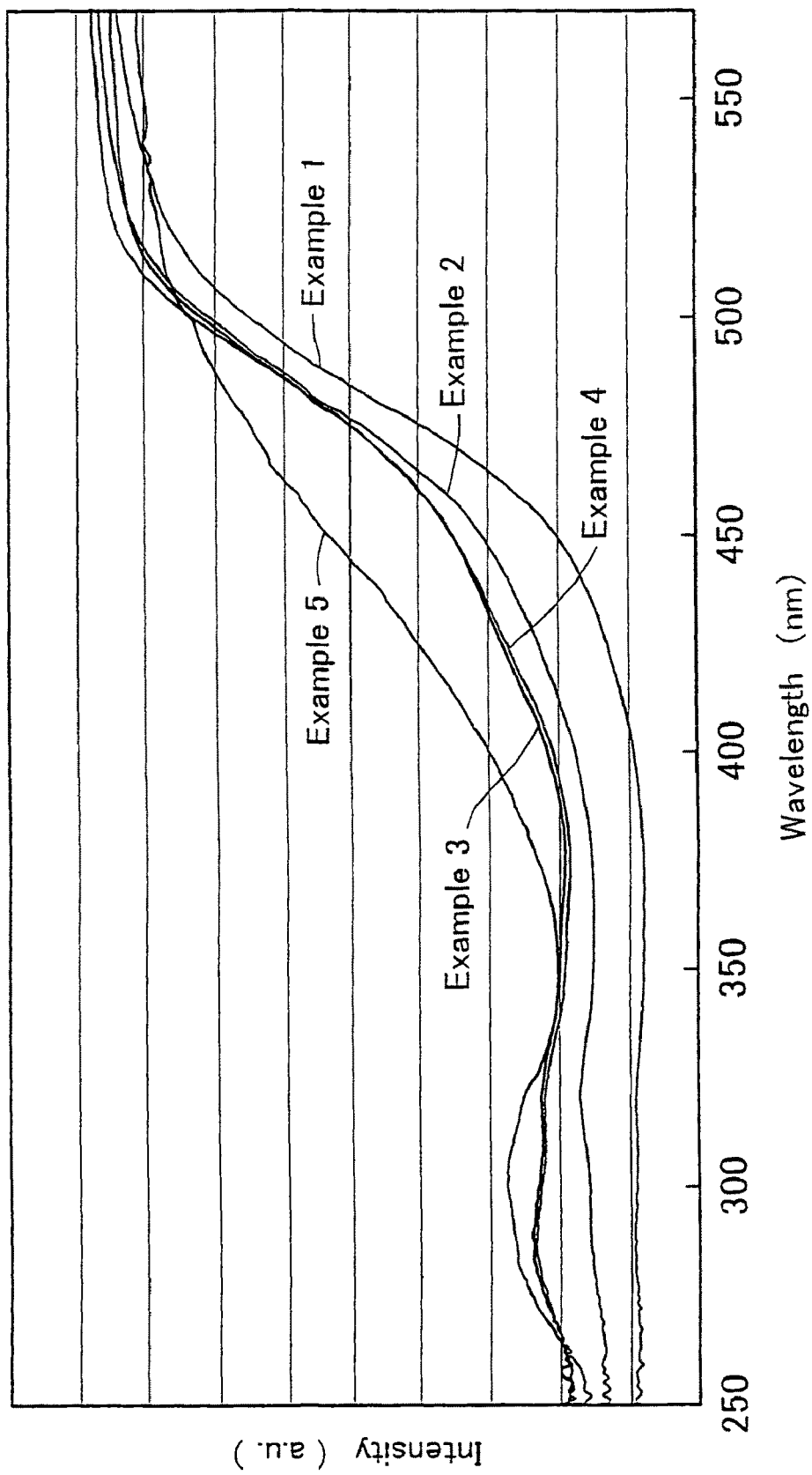
FIG. 6 is a chart showing the reflection spectra of the oxynitride phosphors of Examples 1 to 5.
Figure 7:
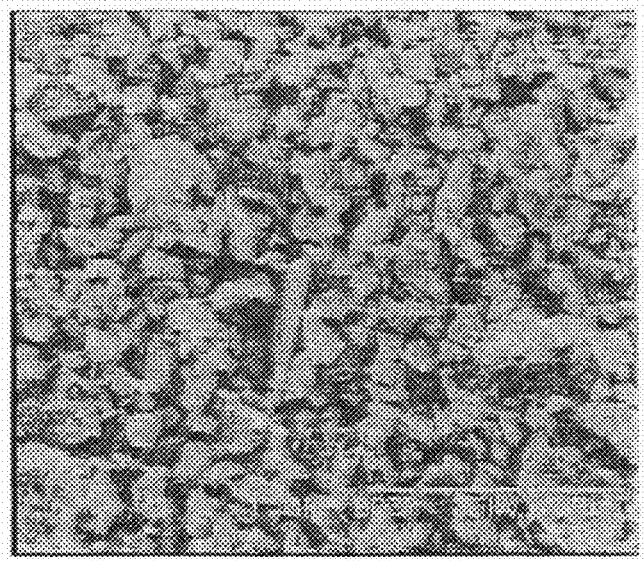
FIG. 7 is an SEM photo photographing the oxynitride phosphor of Example 1.
Figure 7:
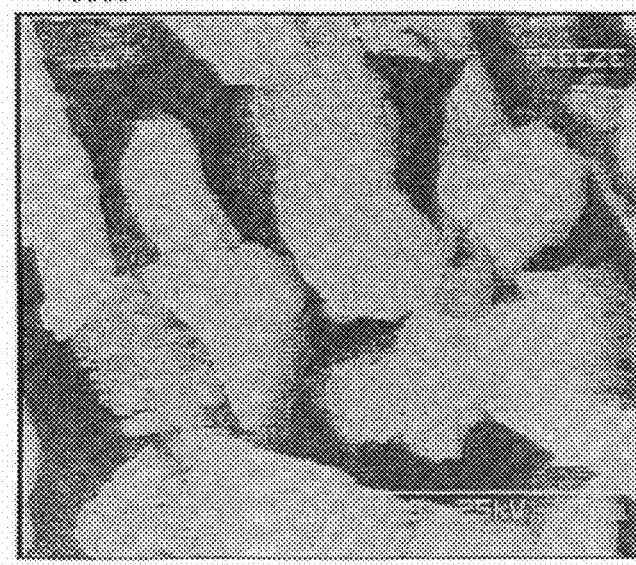

Further, FIG. 3 is a chart showing luminescence spectra when the nitride phosphors of Examples 1 to 5 were excited at Ex=400 nm. FIG. 4 is a chart showing the luminescence spectra when the oxynitride phosphors of Examples 1 to 5 were excited at Ex=460 nm. FIG. 5 is a chart showing the excitation spectra of the oxynitride phosphors of Examples 1 to 5. FIG. 6 is a chart showing the reflection spectra of the oxynitride phosphors of Examples 1 to 5. FIG. 7 is an SEM (scanning electron microscope) photo photographing the oxynitride phosphor of Example 1. Hereat, the name of a color and chromaticity are according to JIS Z8110.

TABLE 1

| | Ex = 400 nm | | | |
|---|---|---|---|---|
| | Color tone X | Color tone Y | Peak wavelength (nm) | Particle diameter (μm) |
| Example 1 | 0.434 | 0.543 | 561 | 3.5 |
| Example 2 | 0.433 | 0.543 | 561 | 4.0 |
| Example 3 | 0.349 | 0.608 | 539 | 4.0 |
| Example 4 | 0.352 | 0.604 | 539 | 3.5 |
| Example 5 | 0.182 | 0.55 | 509 | 3.5 |

| | Ex = 460 nm | | |
|---|---|---|---|
| | Color tone X | Color tone Y | Peak wavelength (nm) |
| Example 1 | 0.437 | 0.545 | 564 |
| Example 2 | 0.434 | 0.546 | 564 |
| Example 3 | 0.347 | 0.616 | 540 |
| Example 4 | 0.351 | 0.614 | 540 |
| Example 5 | 0.214 | 0.623 | 510 |

Example 1 is the oxynitride phosphor represented by $CaSi_2O_2N_2$:Eu. Example 2 is the oxynitride phosphor represented by $Ca_{0.90}Mg_{0.10}Si_2O_2N_2$:Eu. Example 3 is the oxynitride phosphor represented by $SrSi_2O_2N_2$:Eu. Example 4 is the oxynitride phosphor represented by $Sr_{0.90}Mg_{0.10}Si_2O_2N_2$:Eu. Example 5 is the oxynitride phosphor represented by $BaSi_2O_2N_2$:Eu.

In Examples 1 to 5, $Ca_3N_2$, $Si_3N_4$, $SiO_2$ and $Eu_2O_3$ were used as the raw materials, and after crushing these raw materials at 0.1 to 3.0 μm, treatment was respectively carried out below.

Example 1

Firstly, compounds are weighed below.
$Ca_3N_2$: 6.01 g
$Si_3N_4$: 5.99 g
$SiO_2$: 7.36 g
$Eu_2O_3$: 0.66 g After weighing the above-mentioned amounts, $Ca_3N_2$, $Si_3N_4$, $SiO_2$ and $Eu_2O_3$ were mixed under nitrogen atmosphere in a glove box until uniformity. The concentration of Eu is 0.43% by mol in Examples 1 to 5.

In Example 1, the mix ratio (molar ratio) of the raw materials is $Ca_3N_2:Si_3N_4:SiO_2:Eu_2O_3=1:0.51:3.02:0.046$. 6.01 g of $Ca_3N_2$ (molecular weight=148.3), 5.99 g of $Si_3N_4$ (molecular weight=140.3), 7.36 g of $SiO_2$ (molecular weight=60.09) and 0.66 g of $Eu_2O_3$ (molecular weight=352.0) were weighed so as to be the mixing ratio, and mixed.

The above-mentioned compounds were mixed, the mixture was charged in a boron nitride crucible in ammonia atmosphere, and calcination was carried out at about 1500° C. for about 5 hours.

The objective oxynitride phosphor was obtained thereby. The theoretical composition of the oxynitride phosphor obtained is $CaSi_2O_2N_2$:Eu.

When the % by weight of O and N in the oxynitride phosphor of Example 1 was measured, O and N were contained by 19.3% by weight and 14.5% by weight respectively. The weight ratio of O to N is O:N=1:0.75.

The calcination of the oxynitride phosphor related to Examples is carried out in ammonia atmosphere using a boron nitride crucible. A crucible made of a metal is not preferably used for the crucible. When the crucible made of a metal is used, it is considered that the crucible is eroded and it causes the lowering of luminescence properties. Accordingly, it is preferable to use a crucible made of ceramics such as alumina.

Example 2 is the oxynitride phosphor in which the portion of Ca was substituted with Mg. Example 2 used magnesium nitride, $Mg_3N_2$ (MG102PB 98%, manufactured by High Purity Chemicals Co.) (molecular weight=101.0), and the under-mentioned amounts of crushed powders were weighed so that the mixing ratio (molar ratio) of the raw materials is $Ca_3N_2:Mg_3N_2:Si_3N_4:SiO_2:Eu_2O_3=1:0.12:0.57:3.37:0.052$.
$Ca_3N_2$: 5.44 g
$Mg_3N_2$: 0.43 g
$Si_3N_4$: 6.05 g
$SiO_2$: 7.43 g
$Eu_2O_3$: 0.67 g Further, said raw materials were mixed and calcination was carried out under the same conditions as Example 1.

Example 3 is the oxynitride phosphor in which Ca of Example 1 was substituted with Sr. Example 3 used strontium nitride, $Sr_3N_4$ (molecular weight=290.9), and the under-mentioned amounts of crushed powders were weighed so that the mixing ratio (molar ratio) of the raw materials is $Sr_3N_2:Si_3N_4:SiO_2:Eu_2O_3=1:0.51:3.02:0.046$.
$Sr_3N_2$: 9.14 g
$Si_3N_4$: 4.65 g
$SiO_2$: 5.71 g
$Eu_2O_3$: 0.51 g Example 3 mixed said raw materials were mixed and carried out calcination under the same conditions as Example 1.

When the % by weight of O and N in the oxynitride phosphor of Example 3 was measured, O and N were contained by 15.3% by weight and 11.2% by weight respectively in the total amount. The weight ratio of O to N is O:N=1:0.73.

Example 4 is the oxynitride phosphor in which Ca of Example 2 was substituted with Sr. In Example 4, the under-mentioned amounts of crushed powders were weighed so that the mixing ratio (molar ratio) of the raw materials is $Sr_3N_2:Mg_3N_2:Si_3N_4:SiO_2:Eu_2O_3=1:0.12:0.57:3.37:0.052$.
$Sr_3N_2$: 8.46 g
$Mg_3N_2$: 0.34 g
$Si_3N_4$: 4.80 g
$SiO_2$: 5.89 g
$Eu_2O_3$: 0.53 g Said raw materials were mixed and calcination was carried out under the same conditions as Example 1.

Example 5 is the oxynitride phosphor in which Ca of Example 1 was substituted with Ba. Example 5 used barium nitride, $Ba_3N_2$ (molecular weight=316.6), and the under-mentioned amounts of crushed powders were weighed so that the mixing ratio (molar ratio) of the raw materials is $Ba_3N_2:Si_3N_4:SiO_2:Eu_2O_3=1:0.76:0.22:0.033$.
$Ba_3N_2$: 11.2 g
$Si_3N_4$: 3.77 g
$SiO_2$: 4.63 g
$Eu_2O_3$: 0.42 g Said raw materials were mixed and calcination was carried out under the same conditions as Example 1.

Any of the calcined products of Examples 1 to 5 is crystalline powder or particles. The particle diameter was about 1 to 5 μm.

The measurement of the excitation spectra of the oxynitride phosphors of Examples 1 to 5 was carried out. As a result of the measurement, they are strongly excited at a shorter wavelength side than 490 nm.

The oxynitride phosphors of Examples 1 to 5 were excited by Ex=460 nm. Since Ex=460 nm is a wavelength often used in a blue light-emitting element, excitation was carried out at said wavelength region. As a result, the oxynitride phosphor of Example 1 has a luminescence color at a yellow region of color tone, x=0.437 and color tone y=0.545. The oxynitride phosphor of Example 4 has a luminescence color at a yellow region of color tone, x=0.351 and color tone, y=0.614. Any of the oxynitride phosphors of Examples 1 to 5 exhibited higher luminescence efficiency than a conventional phosphor.

The oxynitride phosphors of Examples 1 to 5 were excited by Ex=400 nm. The oxynitride phosphor of Example 1 has a luminescence color at a yellow green region of color tone, x=0.434 and color tone, y=0.543. The oxynitride phosphor of Example 3 has a luminescence color at a yellow green region of color tone, x=0.349 and color tone, y=0.608. Any of the oxynitride phosphors of Examples 1 to 5 exhibited higher luminescence efficiency than a conventional phosphor.

Further, temperature properties were excellent. The temperature properties are shown by relative brightness in which luminescence brightness at 25° C. is 100%. The particle diameter is a value according to an air transmission process called F.S.S.No. (Fisher Sub Sieve Sizer's No.). The temperature properties of Examples 1 to 5 are 95 to 100% at 100° C. They were 65 to 90% at 200° C.

When the X-ray diffraction images of the above-mentioned these oxynitride phosphors were measured, any image shows a sharp diffraction peak, and it was cleared that the phosphors obtained were crystalline compounds having regularity.

Examples 6 to 15

Table 2 shows the properties of Examples 6 to 15 of the oxynitride phosphors related to the present invention.

Figure 8:
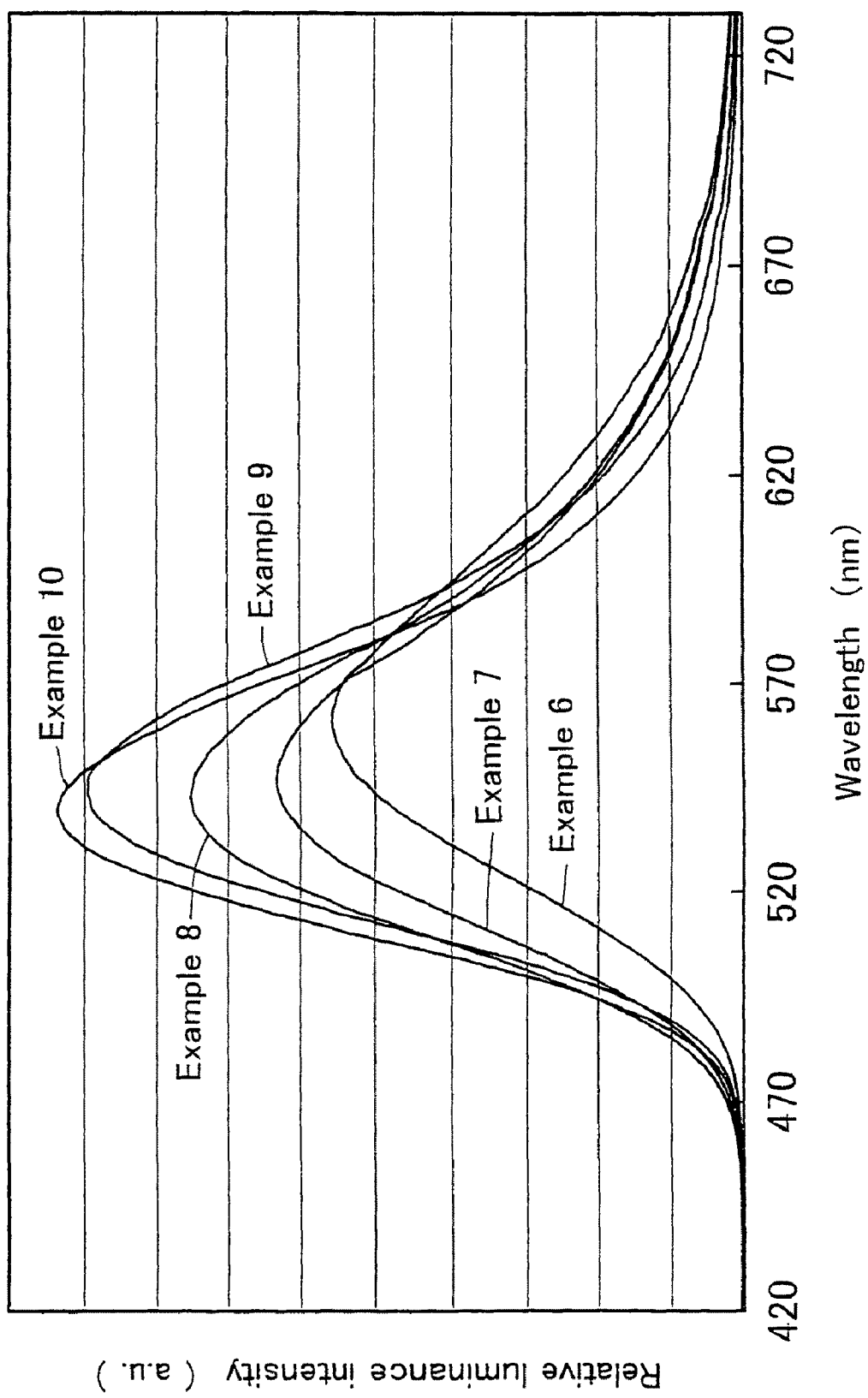
FIG. 8 is a chart showing the luminescence spectra when the oxynitride phosphors of Examples 6 to 10 were excited at Ex=400 nm.
Figure 9:
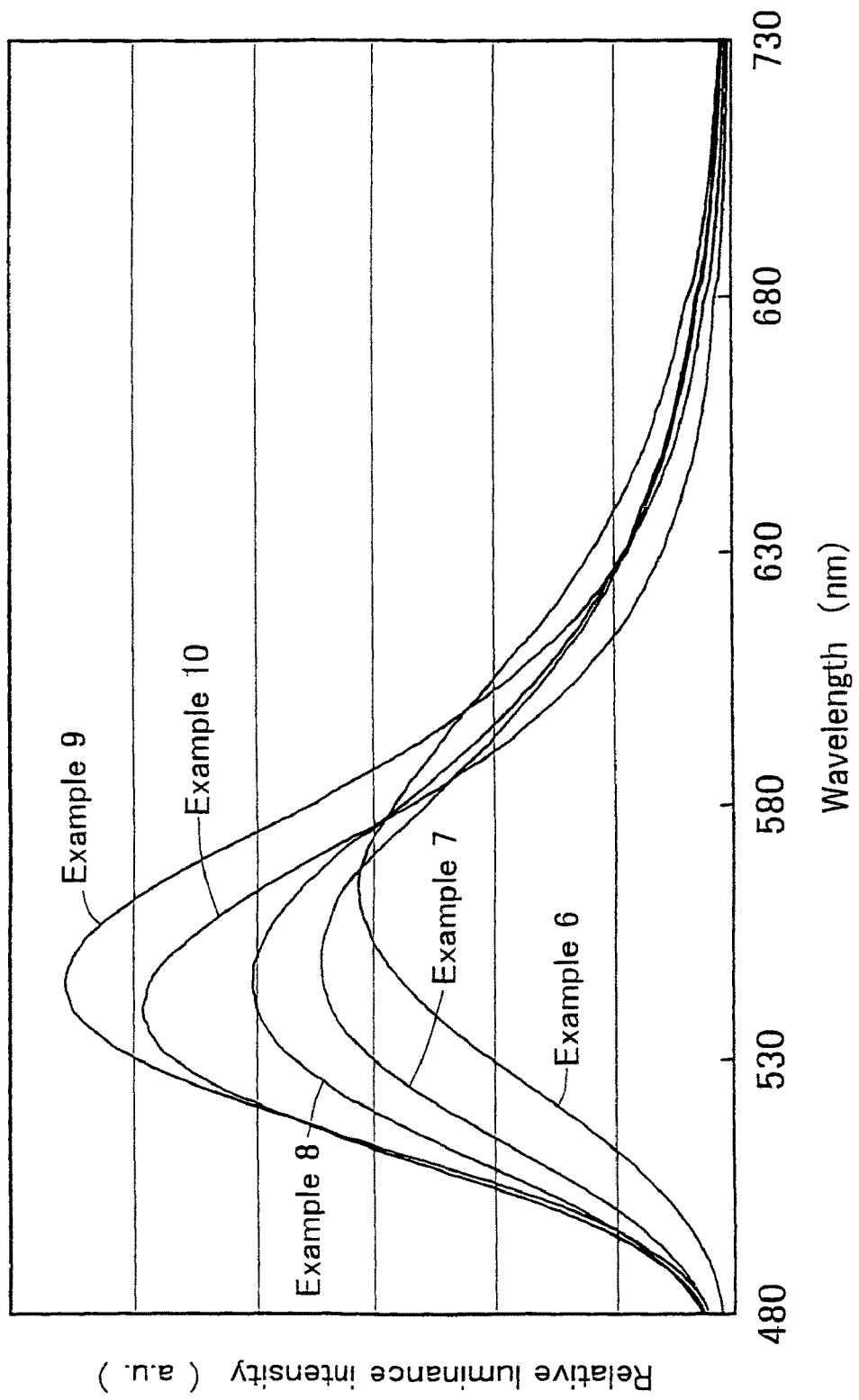
FIG. 9 is a chart showing the luminescence spectra when the oxynitride phosphors of Examples 6 to 10 were excited at Ex=460 nm.
Figure 10:
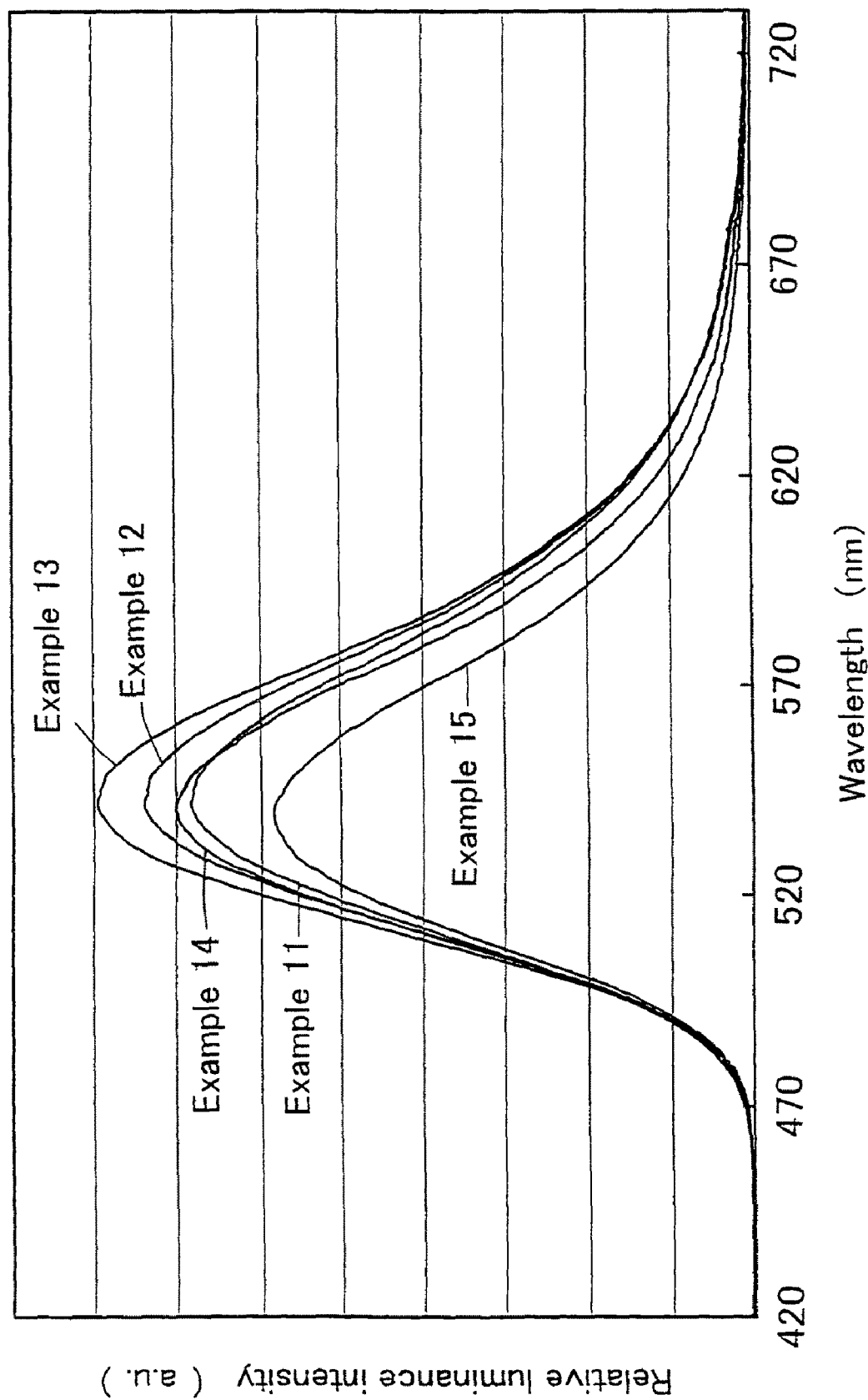
FIG. 10 is a chart showing the luminescence spectra when the oxynitride phosphors of Examples 11 to 15 were excited at Ex=400 nm.
Figure 11:
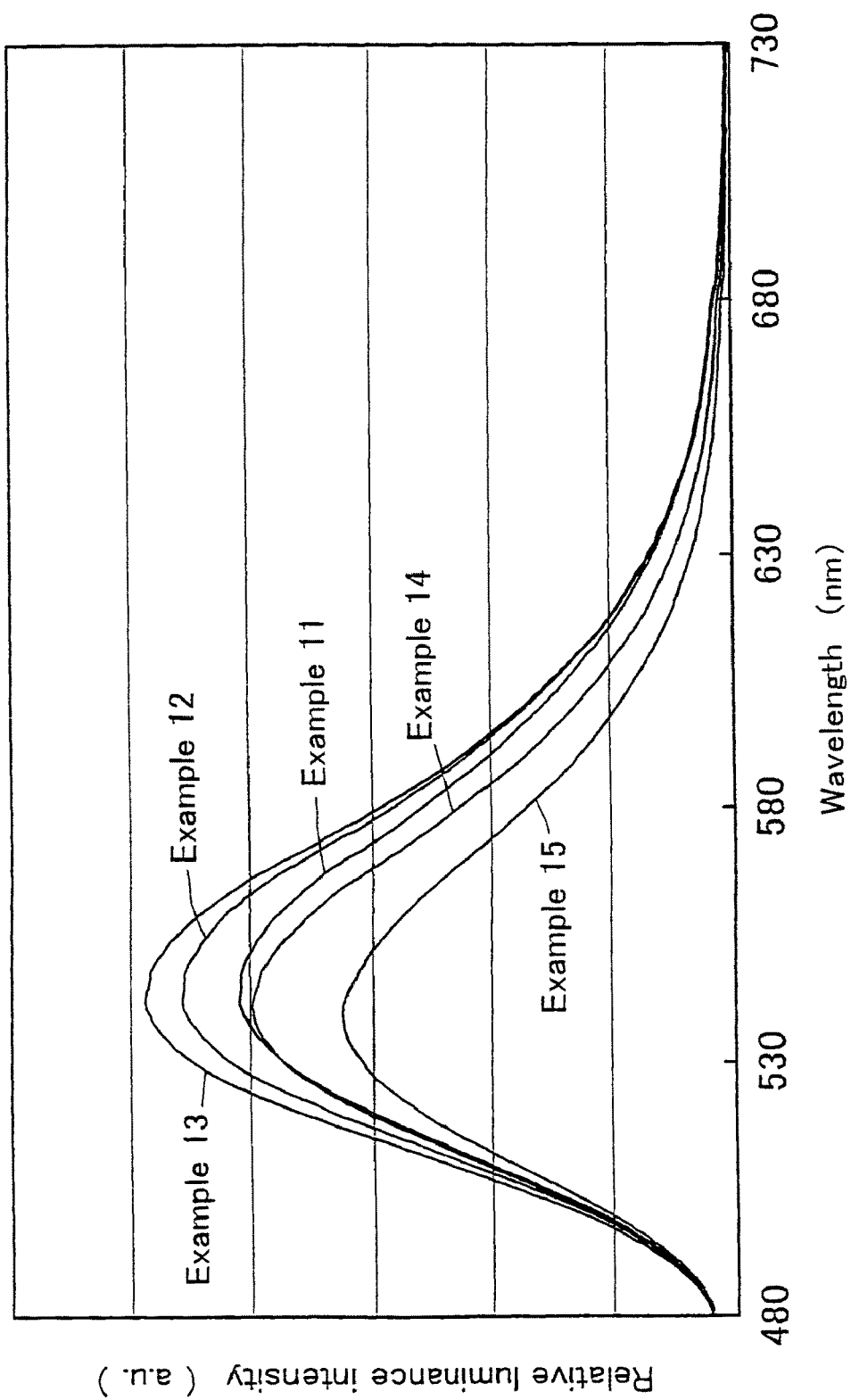
FIG. 11 is a chart showing the luminescence spectra when the oxynitride phosphors of Examples 11 to 15 were excited at Ex=460 nm.
Figure 12:
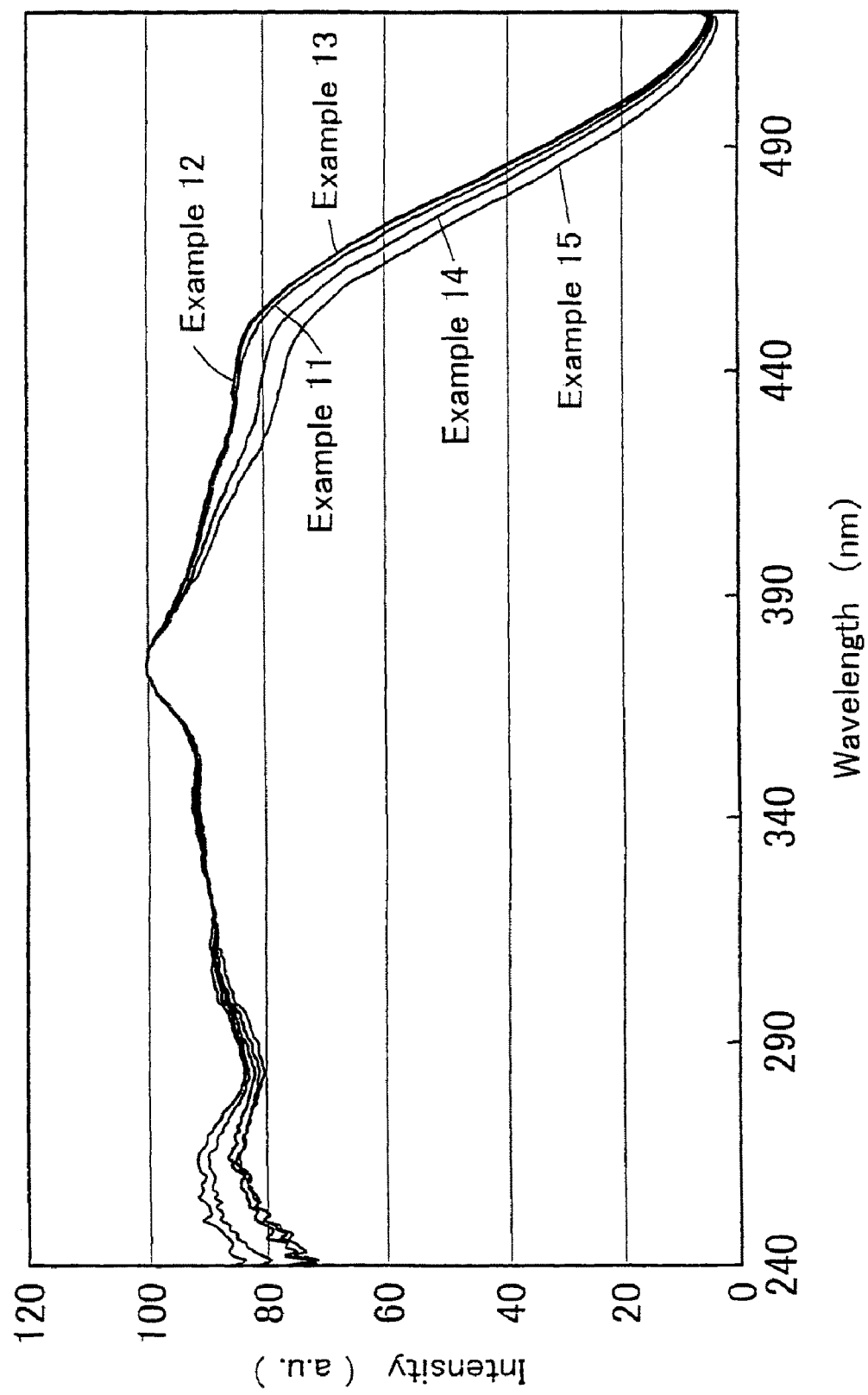
FIG. 12 is a chart showing the excitation spectra of the oxynitride phosphors of Examples 11 to 15.
Figure 13:
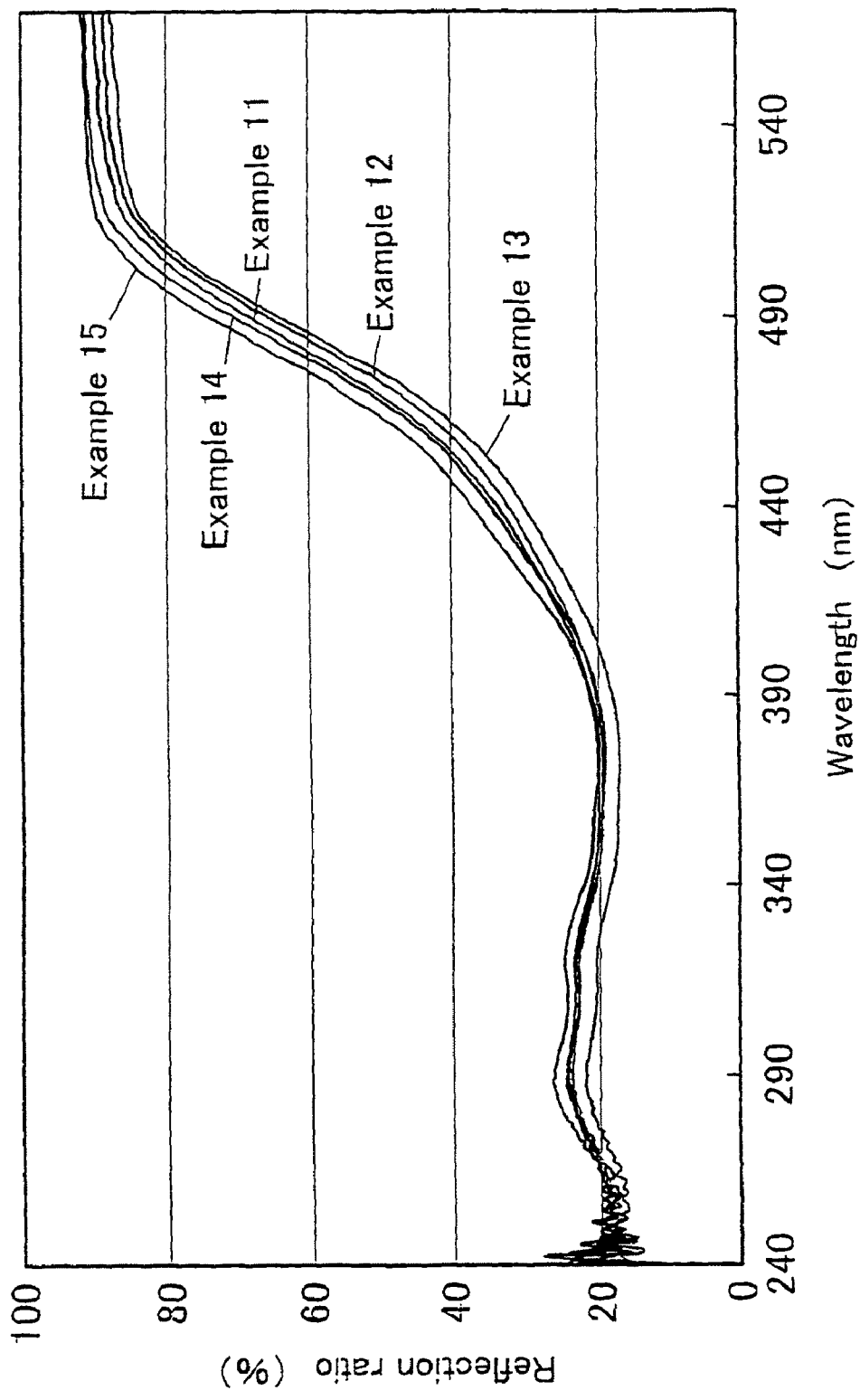
FIG. 13 is a chart showing the reflection spectra of the oxynitride phosphors of Examples 11 to 15.

Further, FIG. 8 is a chart showing the luminescence spectra when the oxynitride phosphors of Examples 6 to 10 were excited at Ex=400 nm. FIG. 9 is a chart showing the luminescence spectra when the oxynitride phosphors of Examples 6 to 10 were excited at Ex=460 nm. FIG. 10 is a chart showing the luminescence spectra when the oxynitride phosphors of Examples 11 to 15 were excited at Ex=400 nm. FIG. 11 is a chart showing the luminescence spectra when the oxynitride phosphors of Examples 11 to 15 were excited at Ex=460 nm. FIG. 12 is a chart showing the excitation spectra of the oxynitride phosphors of Examples 11 to 15. FIG. 13 is a chart showing the reflection spectra of the oxynitride phosphors of Examples 11 to 15.

TABLE 2

|  | Sr/Ca Molar ratio | Luminescence peak wavelength (nm) | Color tone x | Color tone y | Luminescence brightness (%) | Quantum efficiency (%) |
| --- | --- | --- | --- | --- | --- | --- |
| | | Excitation at Ex = 400 nm | | | | |
| Example 6 | 0/10 | 561 | 0.434 | 0.543 | 100.0 | 100.0 |
| Example 7 | 3/7 | 543 | 0.388 | 0.570 | 111.0 | 106.3 |

TABLE 2-continued

|  | Sr/Ca Molar ratio | Luminescence peak wavelength (nm) | Color tone x | Color tone y | Luminescence brightness (%) | Quantum efficiency (%) |
| --- | --- | --- | --- | --- | --- | --- |
| Example 8 | 5/5 | 546 | 0.375 | 0.579 | 135.9 | 128.6 |
| Example 9 | 7/3 | 544 | 0.372 | 0.593 | 148.0 | 131.8 |
| Example 10 | 10/0 | 539 | 0.349 | 0.608 | 145.8 | 127.3 |
| Excitation at Ex = 460 nm | | | | | | |
| Example 6 | 0/10 | 564 | 0.437 | 0.545 | 100.0 | 100.0 |
| Example 7 | 3/7 | 549 | 0.391 | 0.578 | 109.4 | 103.1 |
| Example 8 | 5/5 | 545 | 0.378 | 0.588 | 125.4 | 116.9 |
| Example 9 | 7/3 | 545 | 0.371 | 0.600 | 162.8 | 142.7 |
| Example 10 | 10/0 | 540 | 0.347 | 0.616 | 138.8 | 119.2 |
| Excitation at Ex = 400 nm | | | | | | |
| Example 11 | 6/4 | 542 | 0.366 | 0.593 | 124.4 | 128.1 |
| Example 12 | 7/3 | 541 | 0.366 | 0.595 | 133.3 | 135.8 |
| Example 13 | 8/2 | 542 | 0.363 | 0.599 | 142.0 | 143.4 |
| Example 14 | 9/1 | 540 | 0.353 | 0.605 | 122.7 | 123.2 |
| Example 15 | 10/0 | 540 | 0.342 | 0.611 | 100.0 | 100.0 |
| Excitation at Ex = 460 nm | | | | | | |
| Example 11 | 6/4 | 542 | 0.365 | 0.603 | 134.5 | 137.8 |
| Example 12 | 7/3 | 542 | 0.364 | 0.605 | 148.5 | 151.1 |
| Example 13 | 8/2 | 542 | 0.360 | 0.609 | 156.8 | 158.4 |
| Example 14 | 9/1 | 541 | 0.351 | 0.615 | 125.9 | 126.8 |
| Example 15 | 10/0 | 539 | 0.339 | 0.622 | 100.0 | 100.0 |

Examples 6 to 10 are the oxynitride phosphors represented by $Sr_xCa_{(1-x)}Si_2O_2N_2$:Eu ($0 \leq X \leq 1$), and carry out production changing a molar ratio of Sr to Ca.

Examples 6 to 10 carried out the production of the oxynitride phosphors under almost the same condition as Example 1. $Sr_3N_2$, $Ca_3N_2$, $Si_3N_4$, $SiO_2$ and $Eu_2O_3$ were used as raw materials. After weighing the fixed amounts of said raw materials, $Sr_3N_2$, $Ca_3N_2$, $Si_3N_4$, $SiO_2$ and $Eu_2O_3$ were mixed under nitrogen atmosphere in a glove box until uniformity. The concentration of Eu is 0.43% by mol in Examples 6 to 15.

The above-mentioned compounds were mixed, the mixture was charged in a boron nitride crucible in ammonia atmosphere, and calcination was carried out at about 1450° C. for about 5 hours.

The objective oxynitride phosphor was obtained thereby.

The luminescence brightness and quantum efficiency of Examples 6 to 10 are represented with a relative value on the basis of Example 6.

From this result, when Examples 6 to 10 are exited by a light source nearby 400 nm, the phosphors mixing Sr and Ca exhibited higher luminescence brightness and quantum efficiency than those using only Ca. On the other hand, when Example 6 to 10 are exited by a light source nearby 460 nm, the phosphor of S:Ca=7:3 exhibited the highest luminescence efficiency. Further, the luminescence efficiency can be improved by substituting the portion of ca and increasing Sr. Further, the color tone can be changed by changing a molar ratio of Sr to Ca.

Examples 11 to 15 are the oxynitride phosphors represented by $Sr_xCa_{(10-x)}Si_2O_2N_2$:Eu ($0 \leq X \leq 1$), and carry out production changing a molar ratio of Sr to Ca.

Examples 11 to 15 carried out the production of the oxynitride phosphors under almost the same condition as Example 1. $Sr_3N_2$, $Ca_3N_2$, $Si_3N_4$, $SiO_2$ and $Eu_2O_3$ were used as raw materials. After weighing the fixed amounts of said raw materials, $Sr_3N_2$, $Ca_3N_2$, $Si_3N_4$, $SiO_2$ and $Eu_2O_3$ were mixed under nitrogen atmosphere in a glove box until uniformity. The concentration of Eu is 0.43% by mol in Examples 6 to 15.

The above-mentioned compounds were mixed, the mixture was charged in a boron nitride crucible in ammonia atmosphere, and calcination was carried out at about 1550° C. for about 5 hours.

The objective oxynitride phosphor was obtained thereby.

The luminescence brightness and quantum efficiency of Examples 11 to 15 are represented with a relative value on the basis of Example 15.

From this result, when Examples 11 to 15 are exited by a light source nearby 400 nm, the phosphors mixing Sr and Ca exhibited higher luminescence brightness and quantum efficiency than those using only Sr. Further, when a molar ratio of S:Ca is S:Ca=6:4 to 9:1, the luminescence efficiency can be improved. In particular, the high values of luminescence brightness and quantum efficiency are exhibited in case of Sr:Ca=7:3 to 8:2. Further, the color tone can be changed by changing the molar ratio of Sr to Ca.

Examples 16 to 20

Table 3 shows the properties of Examples 10, 16 to 20 of the oxynitride phosphors related to the present invention.

Figure 14:
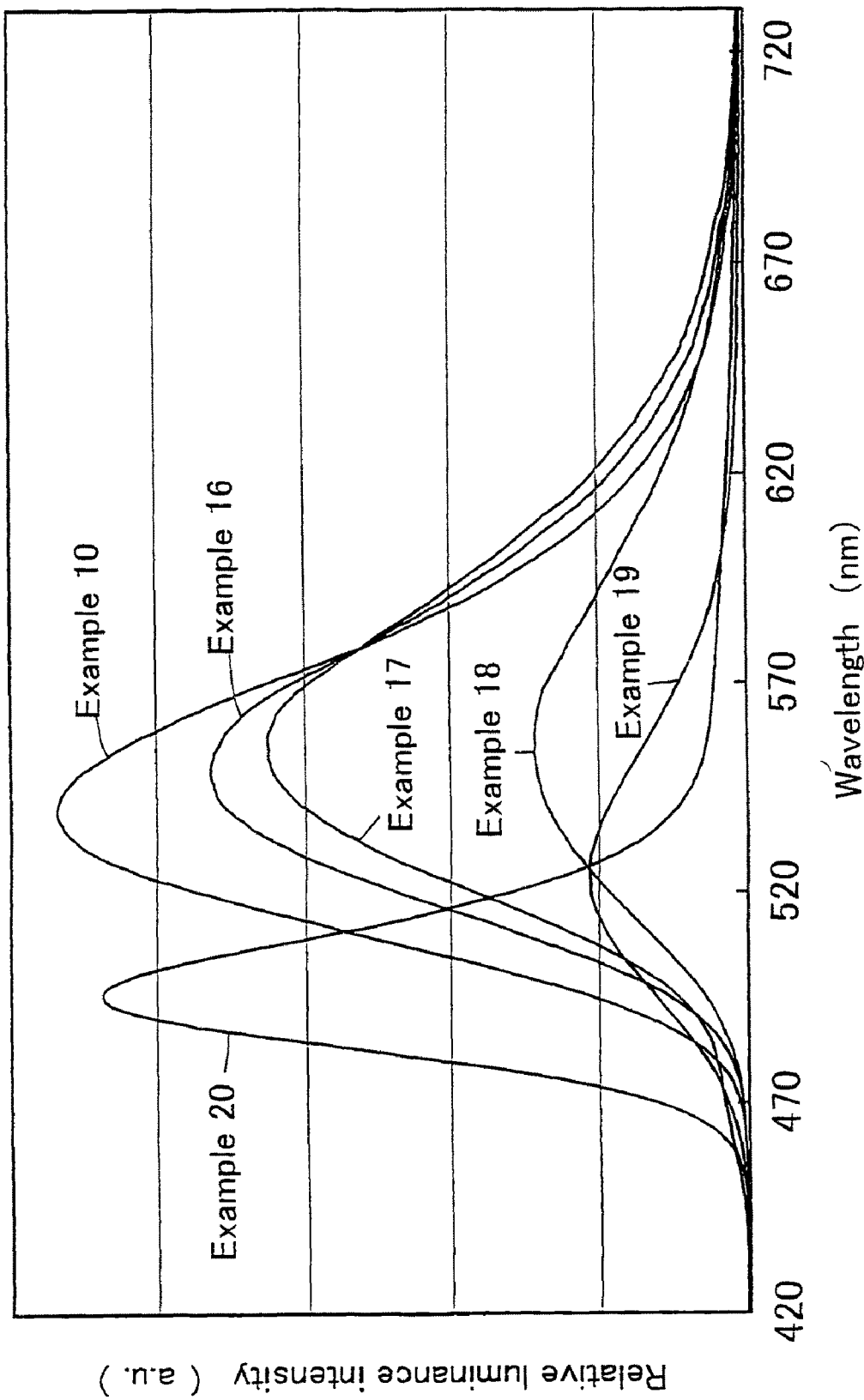
FIG. 14 is a chart showing the luminescence spectra when the oxynitride phosphors of Examples 10 and 16 to 20 were excited at Ex=400 nm.
Figure 15:
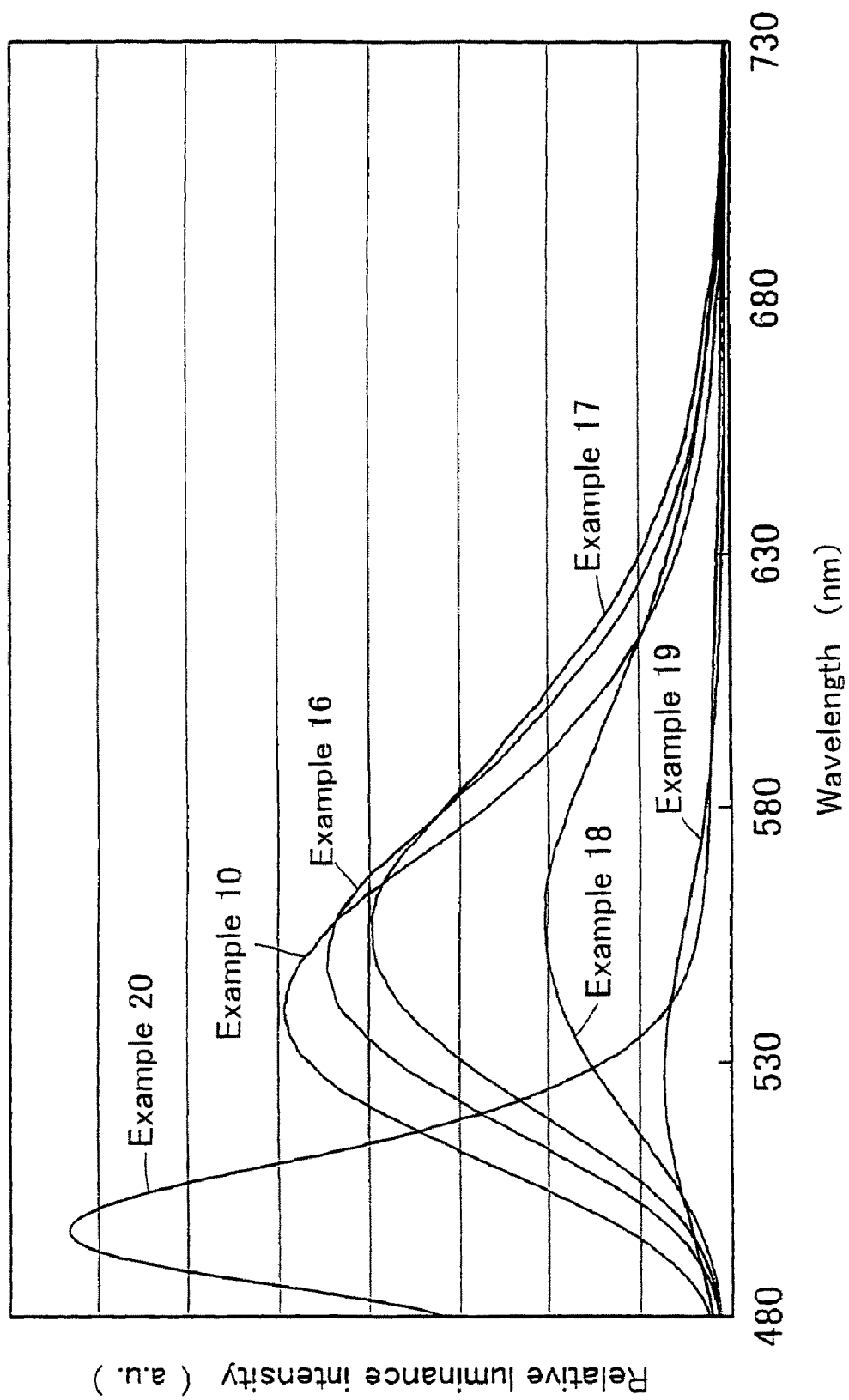
FIG. 15 is a chart showing the luminescence spectra when the oxynitride phosphors of Examples 10 and 16 to 20 were excited at Ex=460 nm.
Figure 16:
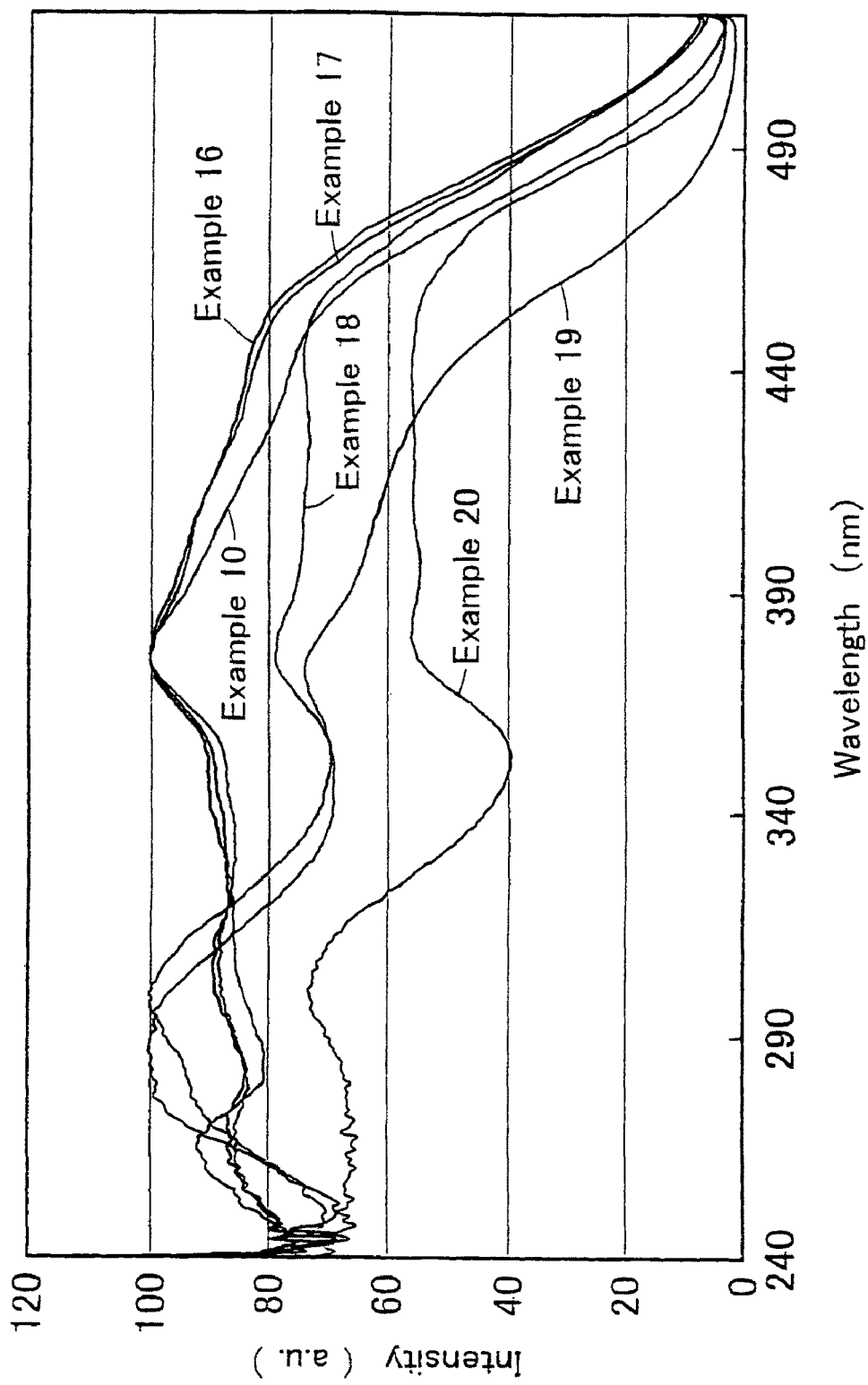
FIG. 16 is a chart showing the excitation spectra of the oxynitride phosphors of Examples 10 and 16 to 20.
Figure 17:
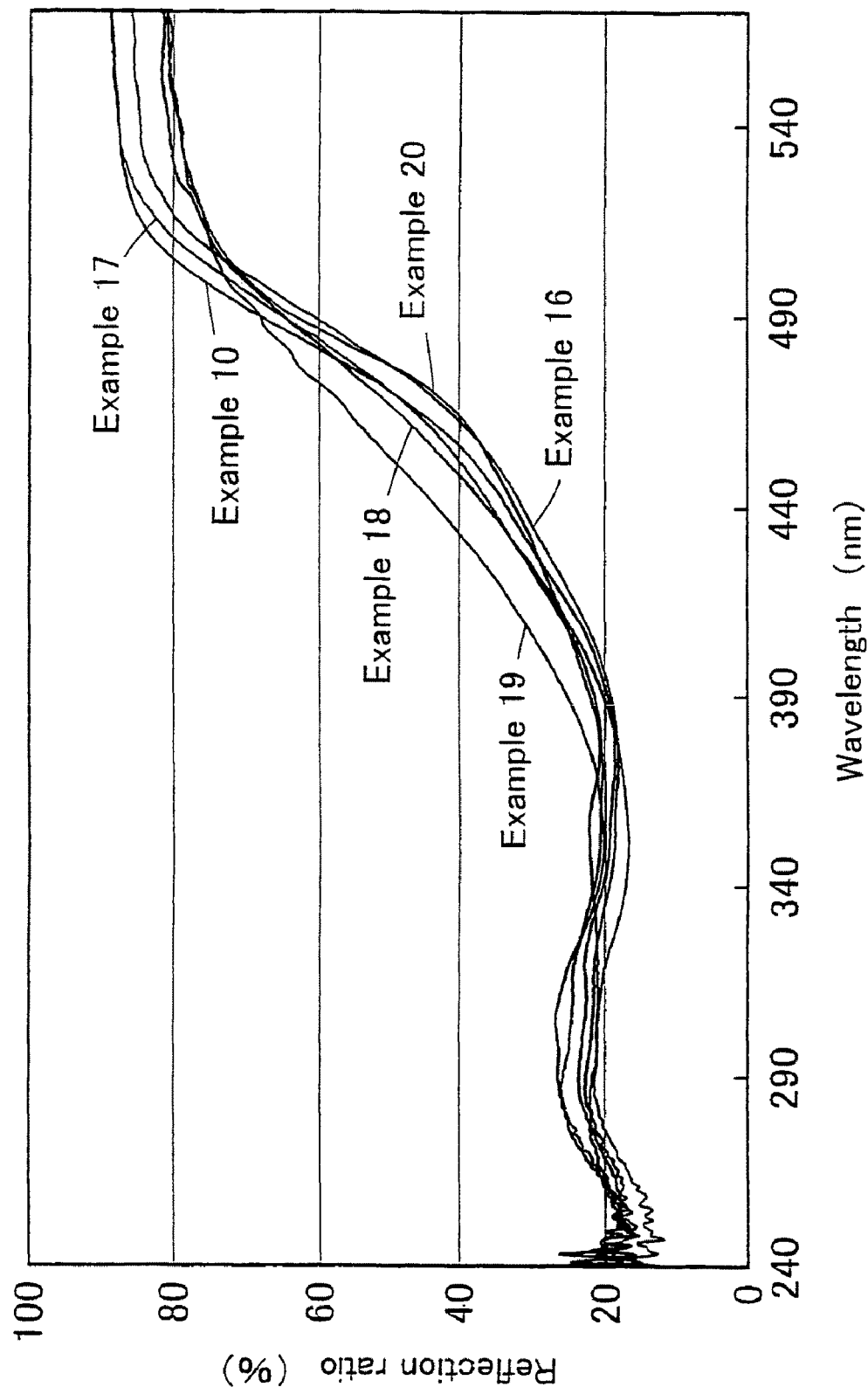
FIG. 17 is a chart showing the reflection spectra of the oxynitride phosphors of Examples 10 and 16 to 20.

Further, FIG. 14 is a chart showing the luminescence spectra when the oxynitride phosphors of Examples 10 and 16 to 20 were excited at Ex=400 nm. FIG. 15 is a chart showing the luminescence spectra when the oxynitride phosphors of Examples 10 and 16 to 20 were excited at Ex=460 nm. FIG. 16 is a chart showing the excitation spectra of the oxynitride phosphors of Examples 10 and 16 to 20. FIG. 17 is a chart showing the reflection spectra of the oxynitride phosphors of Examples 10 and 16 to 20.

TABLE 3

|  | Sr/Ba Molar ratio | Luminescence peak wavelength (nm) | Color tone x | Color tone y | Luminescence brightness (%) | Quantum efficiency (%) |
|---|---|---|---|---|---|---|
| | | Excitation at Ex = 400 nm | | | | |
| Example 10 | 10/0 | 539 | 0.349 | 0.608 | 100.0 | 100.0 |
| Example 16 | 8/2 | 549 | 0.388 | 0.581 | 84.3 | 86.6 |
| Example 17 | 6/4 | 556 | 0.404 | 0.556 | 77.5 | 83.2 |
| Example 18 | 4/6 | 553 | 0.411 | 0.552 | 36.1 | 40.9 |
| Example 19 | 2/8 | 524 | 0.269 | 0.595 | 19.9 | 22.5 |
| Example 20 | 0/10 | 496 | 0.142 | 0.464 | 25.9 | 45.8 |
| | | Excitation at Ex = 460 nm | | | | |
| Example 10 | 10/0 | 540 | 0.347 | 0.616 | 100.0 | 100.0 |
| Example 16 | 8/2 | 548 | 0.386 | 0.590 | 95.8 | 97.8 |
| Example 17 | 6/4 | 558 | 0.408 | 0.571 | 87.6 | 92.7 |
| Example 18 | 4/6 | 558 | 0.417 | 0.559 | 47.4 | 53.5 |
| Example 19 | 2/8 | 527 | 0.293 | 0.621 | 13.6 | 15.2 |
| Example 20 | 0/10 | 497 | 0.120 | 0.532 | 37.8 | 64.2 |

Examples 10, 16 to 20 are the oxynitride phosphors represented by $Sr_xBa_{(1-x)}Si_2O_2N_2:Eu$ ($0 \leq X \leq 1$), and carry out production changing a molar ratio of Sr to Ba.

Examples 10, 16 to 20 carried out the production of the oxynitride phosphors under almost the same condition as Example 1. $Sr_3N_2$, $Ba_3N_2$, $Si_3N_4$, $SiO_2$ and $Eu_2O_3$ were used as raw materials. After weighing the fixed amounts of said raw materials, $Sr_3N_2$, $Ba_3N_2$, $Si_3N_4$, $SiO_2$ and $Eu_2O_3$ were mixed under nitrogen atmosphere in a glove box until uniformity. The concentration of Eu is 0.43% by mol in Examples 10, 16 to 20.

The above-mentioned compounds were mixed, the mixture was charged in a boron nitride crucible in ammonia atmosphere, and calcination was carried out at about 1450° C. for about 5 hours.

The objective oxynitride phosphors were obtained thereby.

The luminescence brightness and quantum efficiency of Examples 10, 16 to 20 are represented with a relative value on the basis of Example 10.

From this result, when Examples 10, 16 to 20 are exited by a light source nearby 400 nm and 460 nm, the phosphors being mixed at Sr:Ba=6:4 to 8:2 exhibited higher luminescence brightness and quantum efficiency than those being mixed at Sr:Ba=2:8. Further, the luminescence efficiency can be improved by substituting the portion of Ba and increasing Sr. Further, the color tone can be changed by changing a molar ratio of Sr to Ba. Further, the $BaSi_2N_2O_2$:Eu of Example 20 has the luminescence peak wavelength nearby 496 nm and exhibits the high luminescence efficiency. The color rendering of the white light-emitting device can be improved by using the oxynitride phosphor related to Example 20.

Examples 21 to 24

Table 4 shows the properties of Examples 21 to 24 of the oxynitride phosphors related to the present invention.

Figure 18:
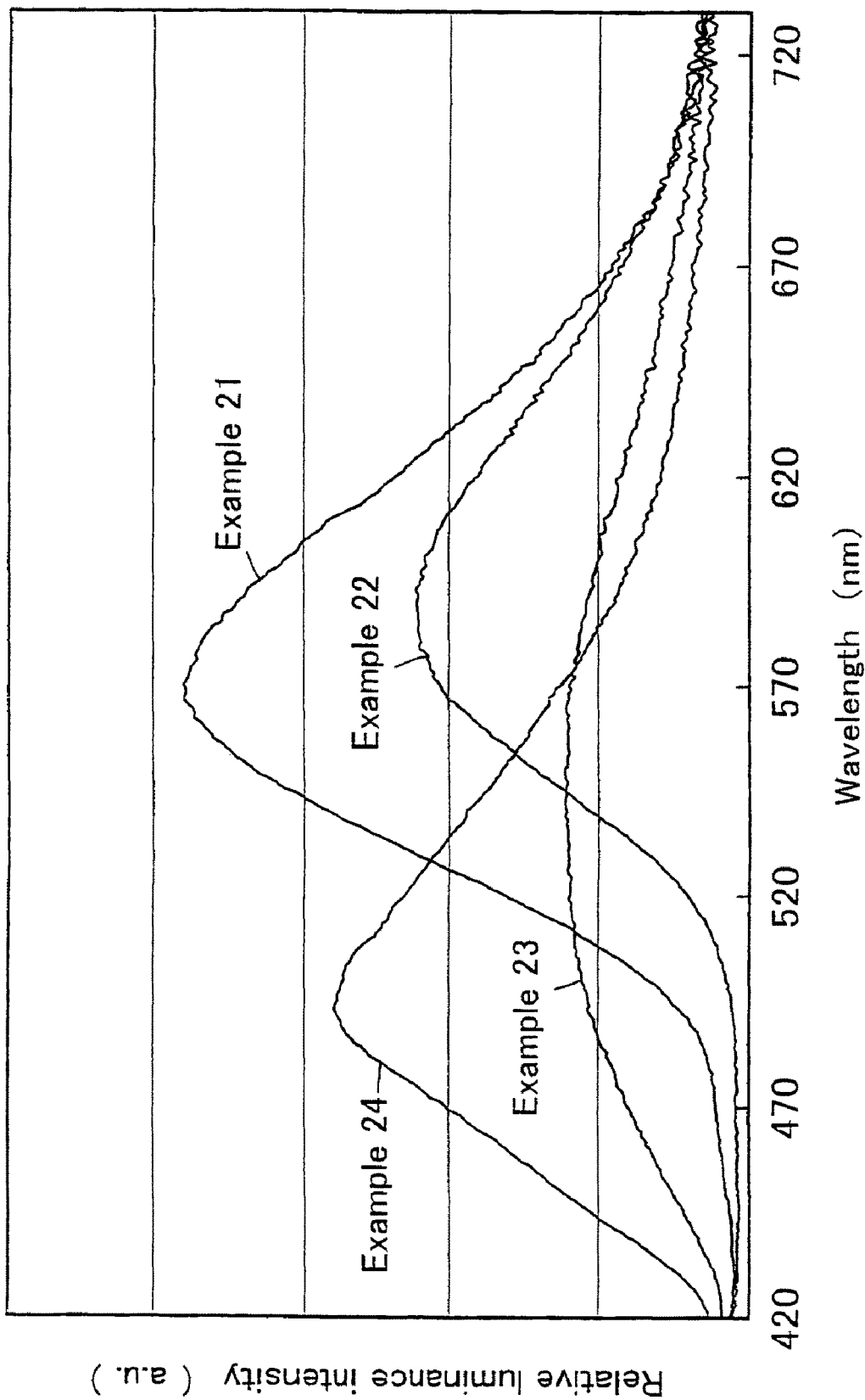
FIG. 18 is a chart showing the luminescence spectra when the oxynitride phosphors of Examples 21 to 24 were excited at Ex=400 nm.
Figure 19:
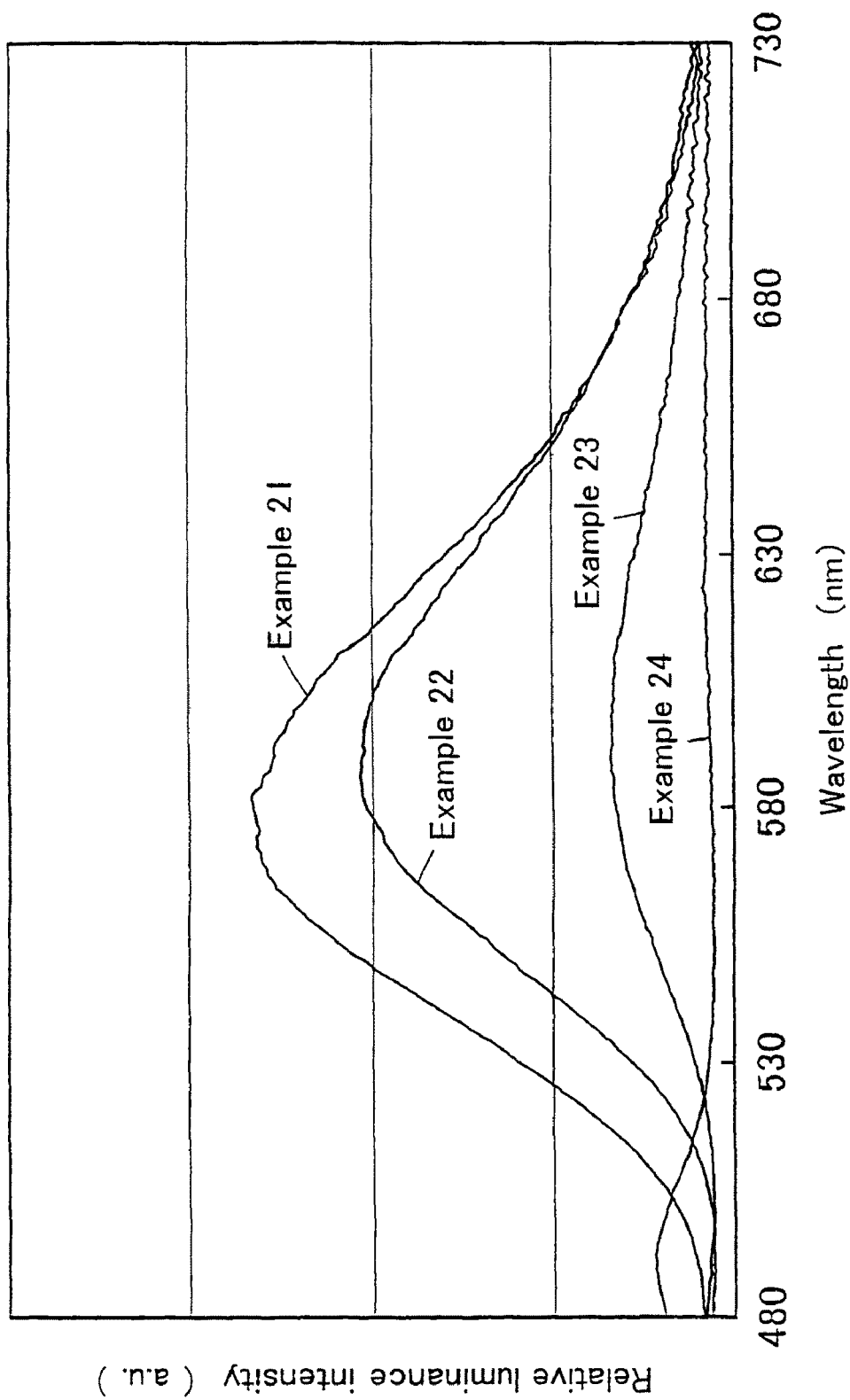
FIG. 19 is a chart showing the luminescence spectra when the oxynitride phosphors of Examples 21 to 24 were excited at Ex=460 nm.
Figure 20:
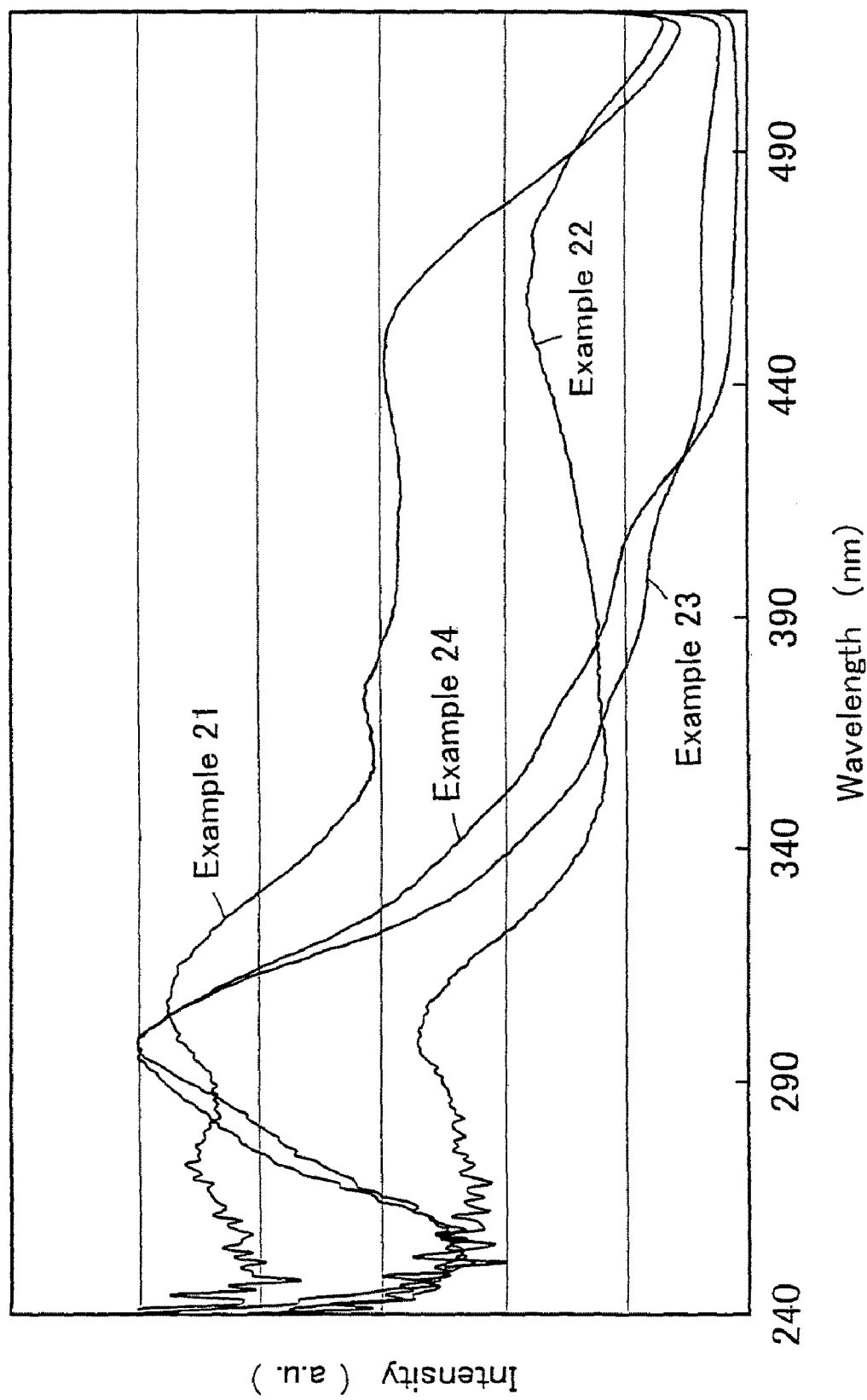
FIG. 20 is a chart showing the excitation spectra of the oxynitride phosphors of Examples 21 to 24.
Figure 21:
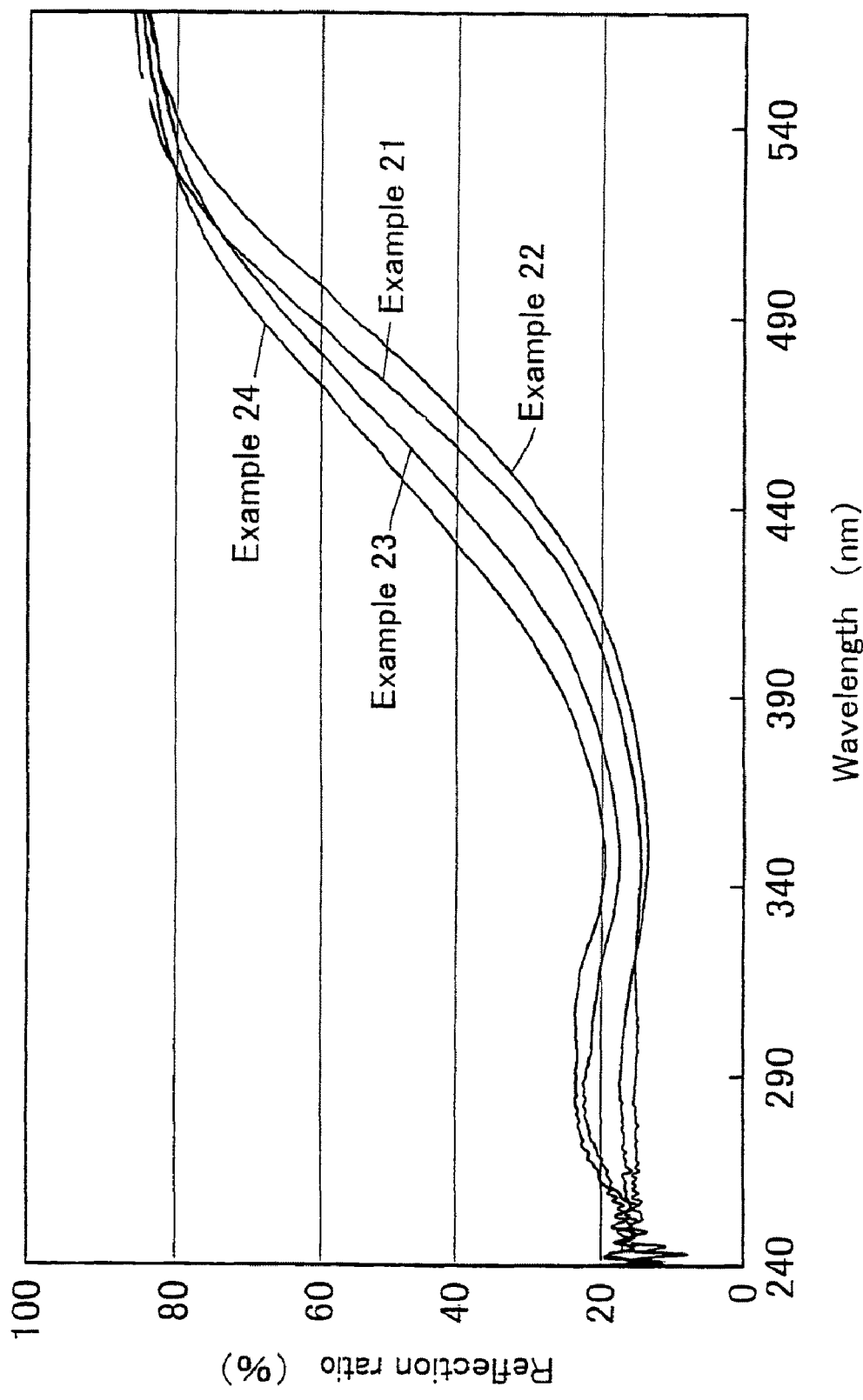
FIG. 21 is a chart showing the reflection spectra of the oxynitride phosphors of Examples 21 to 24.

Further, FIG. 18 is a chart showing the luminescence spectra when the oxynitride phosphors of Examples 21 to 24 were excited at Ex=400 nm. FIG. 19 is a chart showing the luminescence spectra when the oxynitride phosphors of Examples 21 to 24 were excited at Ex=460 nm. FIG. 20 is a chart showing the excitation spectra of the oxynitride phosphors of Examples 21 to 24. FIG. 21 is a chart showing the reflection spectra of the oxynitride phosphors of Examples 21 to 24.

TABLE 4

|  | Ca/Ba Molar ratio | Luminescence peak wavelength (nm) | Color tone x | Color tone y | Luminescence brightness (%) | Quantum efficiency (%) |
|---|---|---|---|---|---|---|
| | | Excitation at Ex = 400 nm | | | | |
| Example 21 | 8/2 | 570 | 0.456 | 0.502 | 100.0 | 100.0 |
| Example 22 | 6/4 | 593 | 0.508 | 0.462 | 54.5 | 63.2 |
| Example 23 | 4/6 | 542 | 0.353 | 0.425 | 42.6 | 52.1 |
| Example 24 | 2/8 | 493 | 0.254 | 0.389 | 56.4 | 69.2 |
| | | Excitation at Ex = 460 nm | | | | |
| Example 21 | 8/2 | 570 | 0.456 | 0.502 | 100.0 | 100.0 |
| Example 22 | 6/4 | 593 | 0.508 | 0.462 | 54.5 | 63.2 |
| Example 23 | 4/6 | 542 | 0.353 | 0.425 | 42.6 | 52.1 |
| Example 24 | 2/8 | 493 | 0.254 | 0.389 | 56.4 | 69.2 |

Examples 21 to 24 are the oxynitride phosphors represented by $Ca_xBa_{(1-x)}Si_2O_2N_2:Eu$ ($0 \leq X \leq 1$), and carry out production changing a molar ratio of Ca to Ba.

Examples 21 to 24 carried out the production of the oxynitride phosphors under almost the same condition as Example 1. $Ca_3N_2$, $Ba_3N_2$, $Si_3N_4$, $SiO_2$ and $Eu_2O_3$ were used as raw materials. After weighing the fixed amounts of said raw materials, $Ca_3N_2$, $Ba_3N_2$, $Si_3N_4$, $SiO_2$ and $Eu_2O_3$ were mixed under nitrogen atmosphere in a glove box until uniformity. The concentration of Eu is 20.43% by mol in Examples 21 to 24.

The above-mentioned compounds were mixed, the mixture was charged in a boron nitride crucible in ammonia atmosphere, and calcination was carried out at about 1450° C. for about 5 hours.

The objective oxynitride phosphors were obtained thereby.

The luminescence brightness and quantum efficiency of Examples 21 to 24 are represented with a relative value on the basis of Example 21.

From this result, when Examples 21 to 24 are exited by a light source nearby 400 nm, the phosphors being mixed at Ca:Ba=8:2 exhibited higher luminescence brightness and quantum efficiency than those being mixed at Ca:Ba=4:6. On the other hand, when Examples 21 to 24 are excited by a light source nearby 460 nm, the phosphor being mixed at Ca:Ba=8:2 exhibited the higher luminescence brightness and quantum efficiency than that being mixed at Ca:Ba=2:8. Further, the color tone can be changed by changing the molar ratio of Ca to Ba.

Examples 25 to 27

Figure 22:
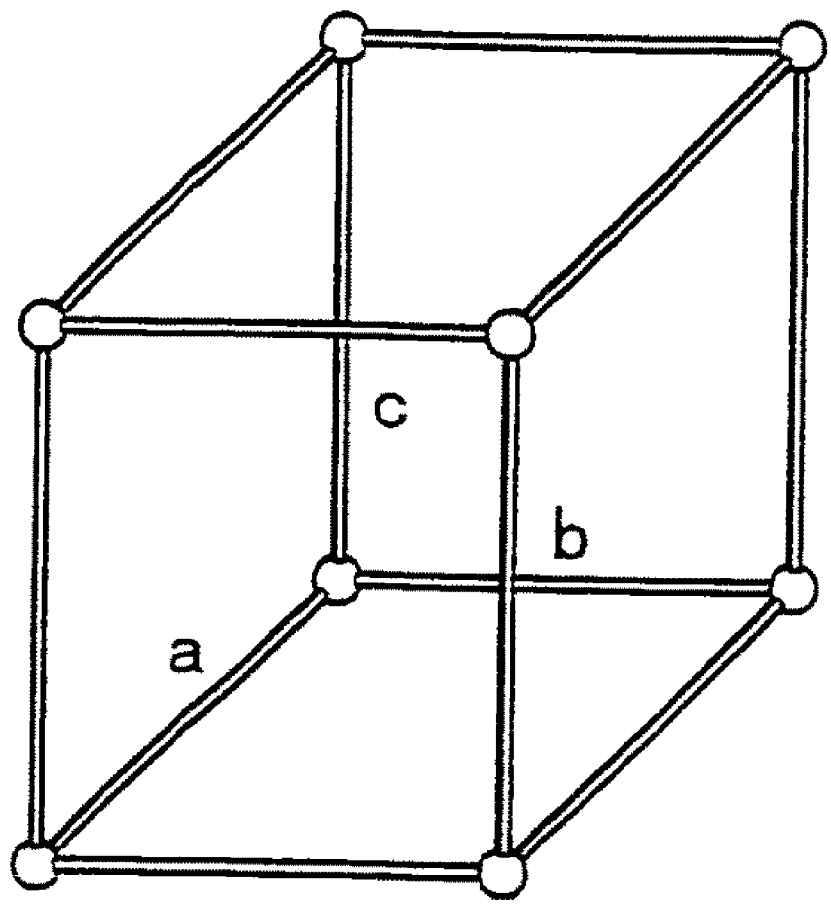
FIG. 22 is a schematic view showing the orthorhombic system.
Figure 23:
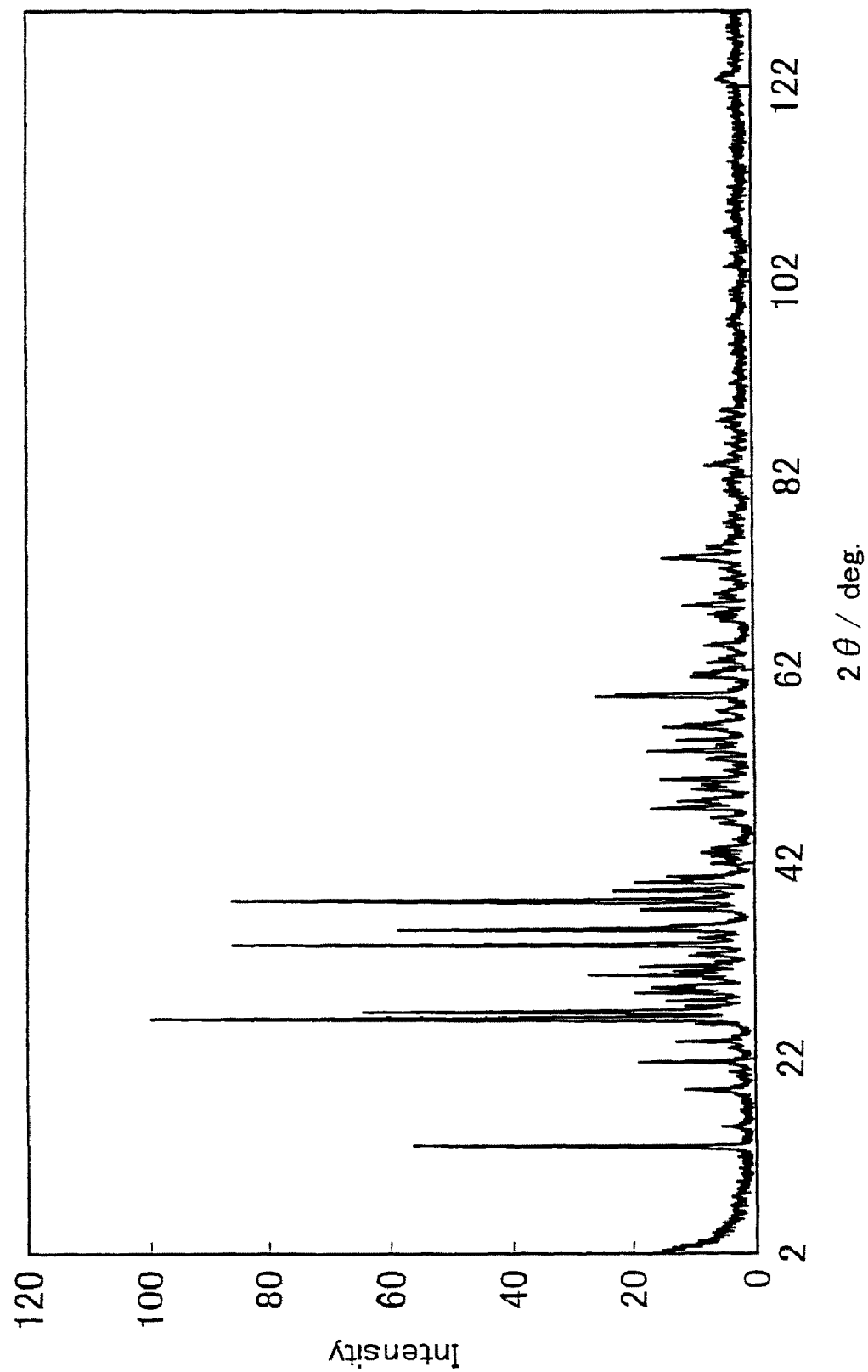
FIG. 23 is a chart showing the X-ray diffraction pattern of the oxynitride phosphor of Example 25.
Figure 24:
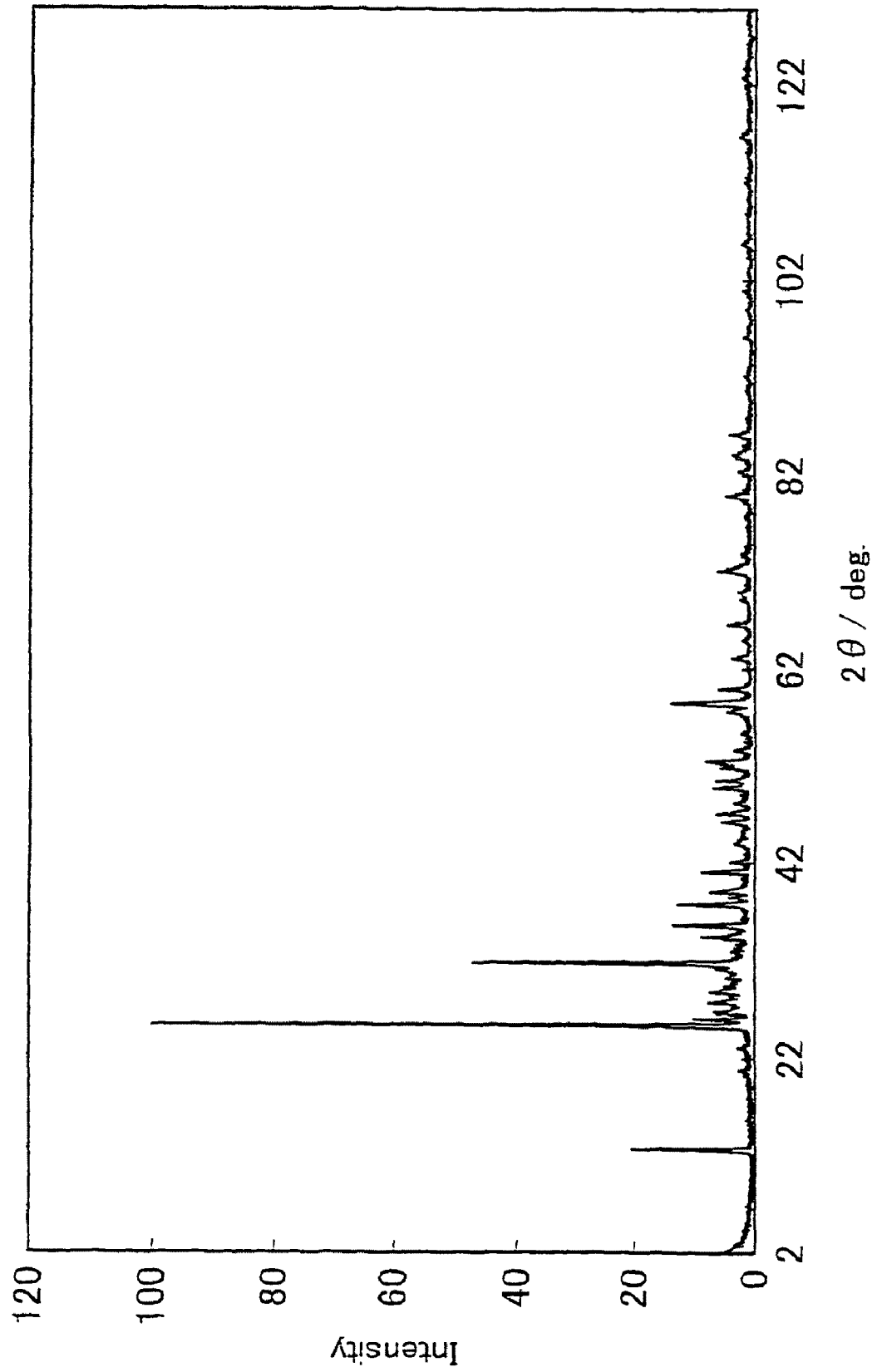
FIG. 24 is a chart showing the X-ray diffraction pattern of the oxynitride phosphor of Example 26.
Figure 25:
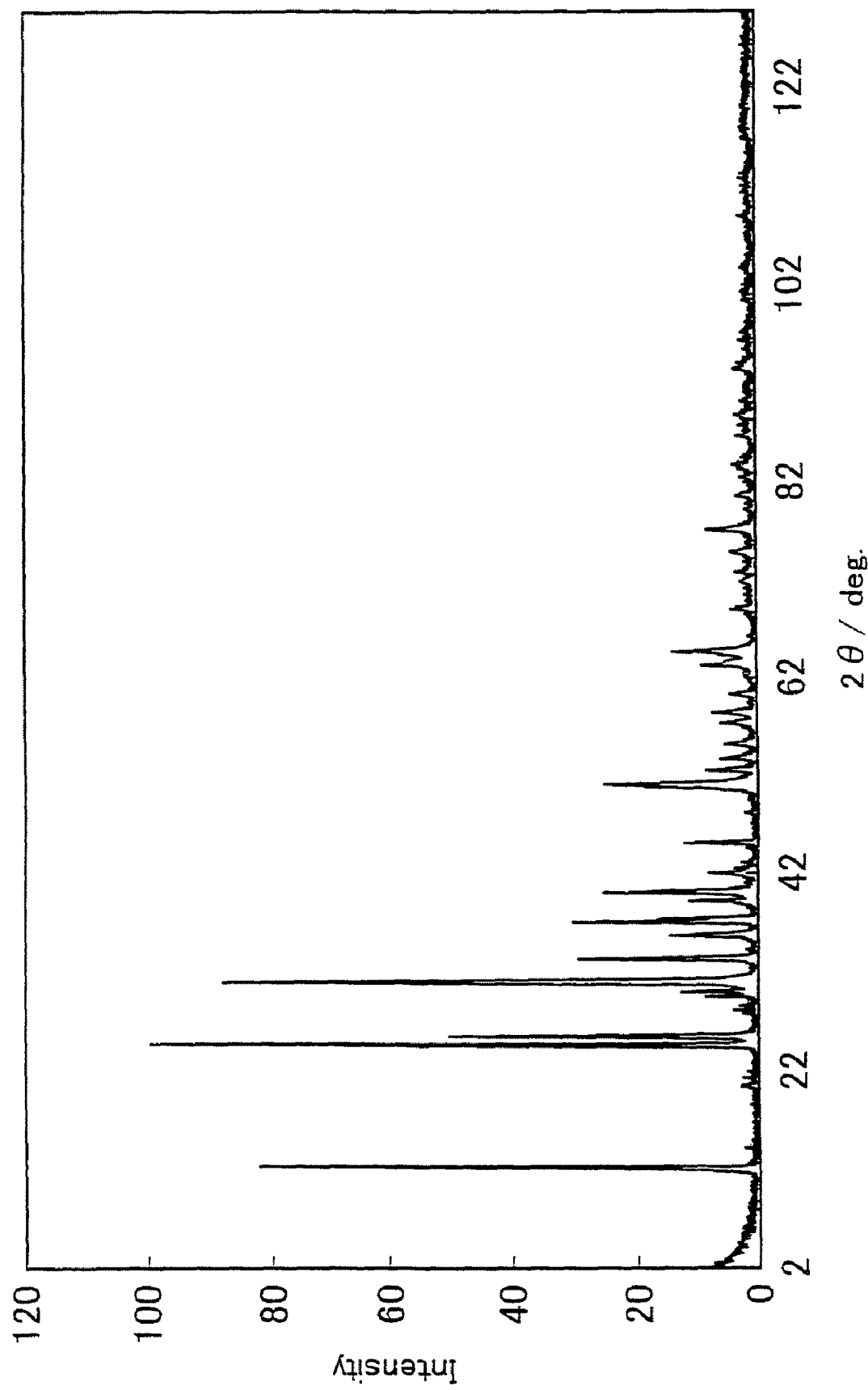
FIG. 25 is a chart showing the X-ray diffraction pattern of the oxynitride phosphor of Example 27.

The structural analysis of the oxynitride phosphors of Examples 25 to 27 was carried out. The composition of Example 25 is $CaSi_2O_2N_2$. The composition of Example 26 is $SrSi_2O_2N_2$. The composition of Example 27 is $BaSi_2O_2N_2$. FIG. 22 is a schematic view showing the orthorhombic system. FIG. 23 is a chart showing the X-ray diffraction pattern of the oxynitride phosphor of Example 25. FIG. 24 is a chart showing the X-ray diffraction pattern of the oxynitride phosphor of Example 26. FIG. 25 is a chart showing the X-ray diffraction pattern of the oxynitride phosphor of Example 27.

From this result, the unit lattice of crystals of the oxynitride phosphor is attributed to the orthorhombic system. The orthorhombic rhombic-system is $a \neq b \neq c$ and $\alpha=\beta=\gamma=90°$, and has 3 of mutually perpendicular diads or two symmetry planes which cross with the diad.

Example 28

Light-Emitting Device

Figure 26:
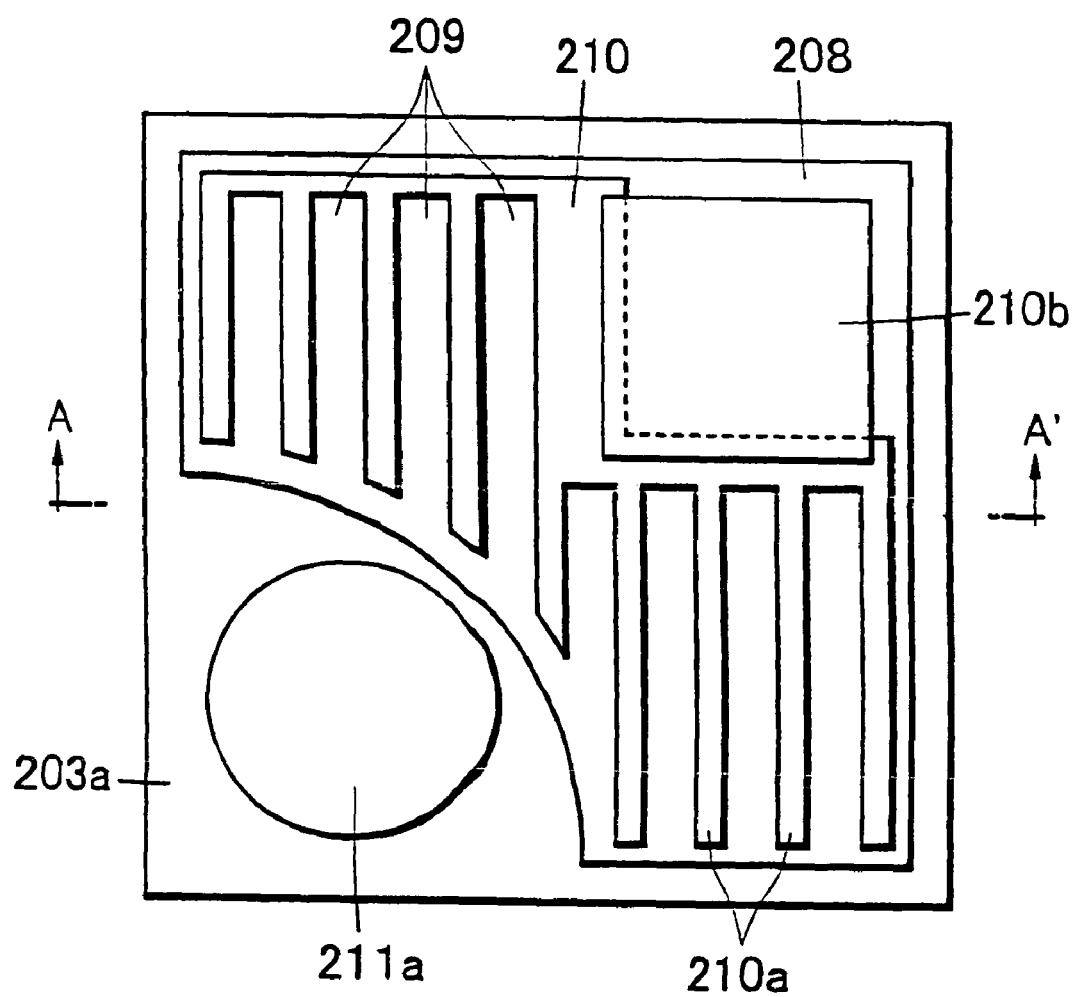
FIG. 26 is a plane view showing the light-emitting element related to the present invention.
Figure 27:
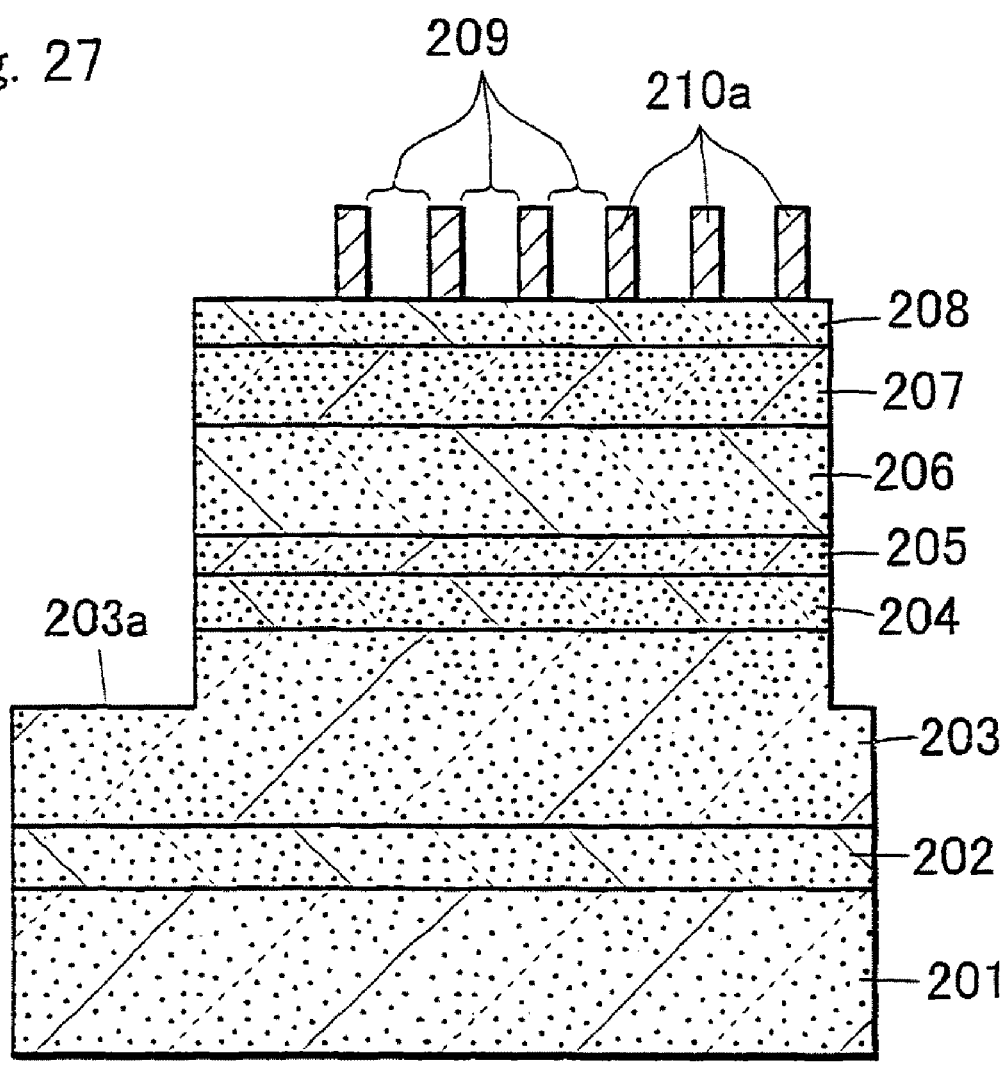
FIG. 27 is a section view showing the A-A' of the light-emitting element related to the present invention.
Figure 28:
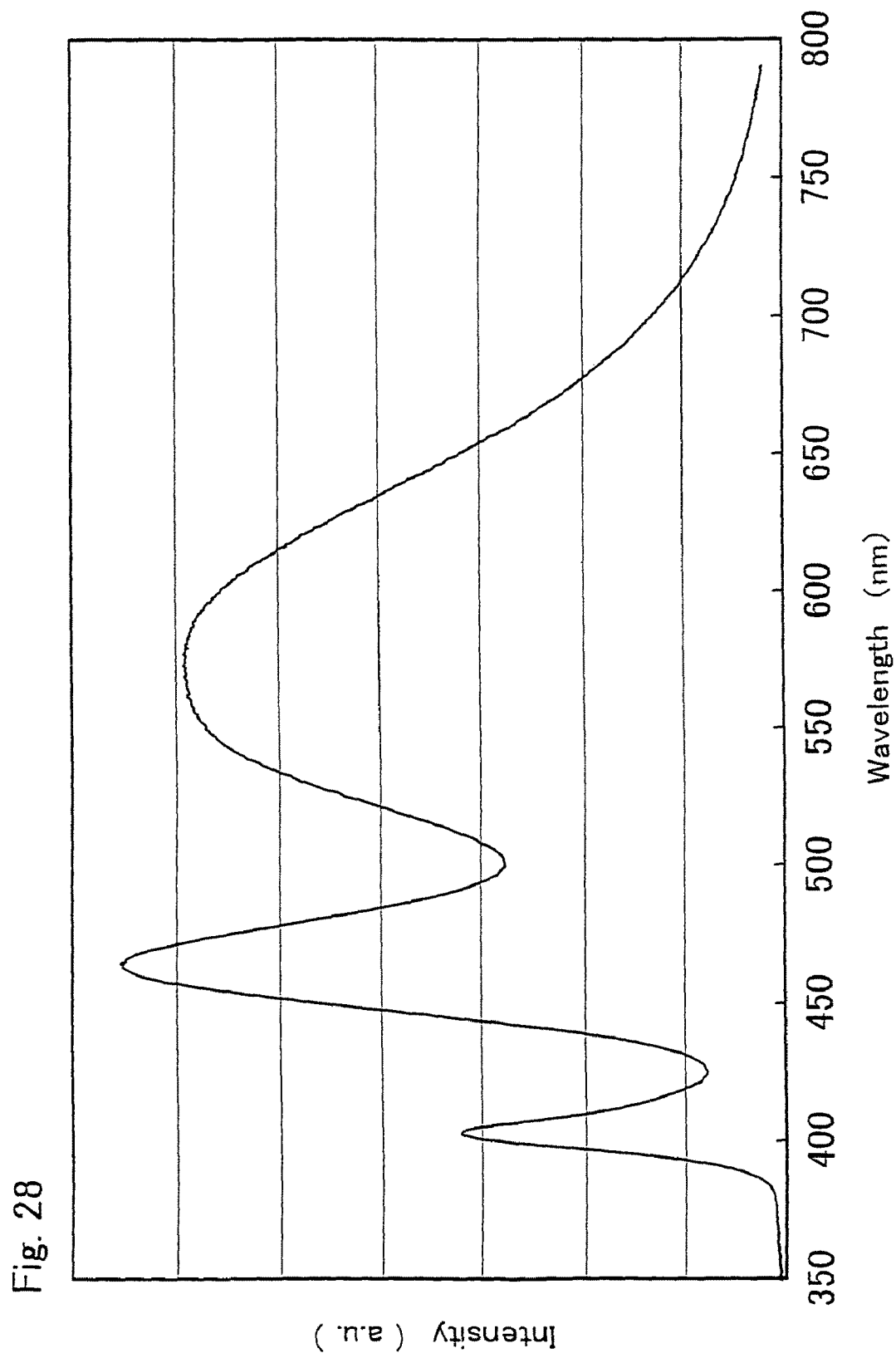
FIG. 28 is a chart showing the luminescence spectrum of the light-emitting device of Example 28 related to the present invention.
Figure 29:
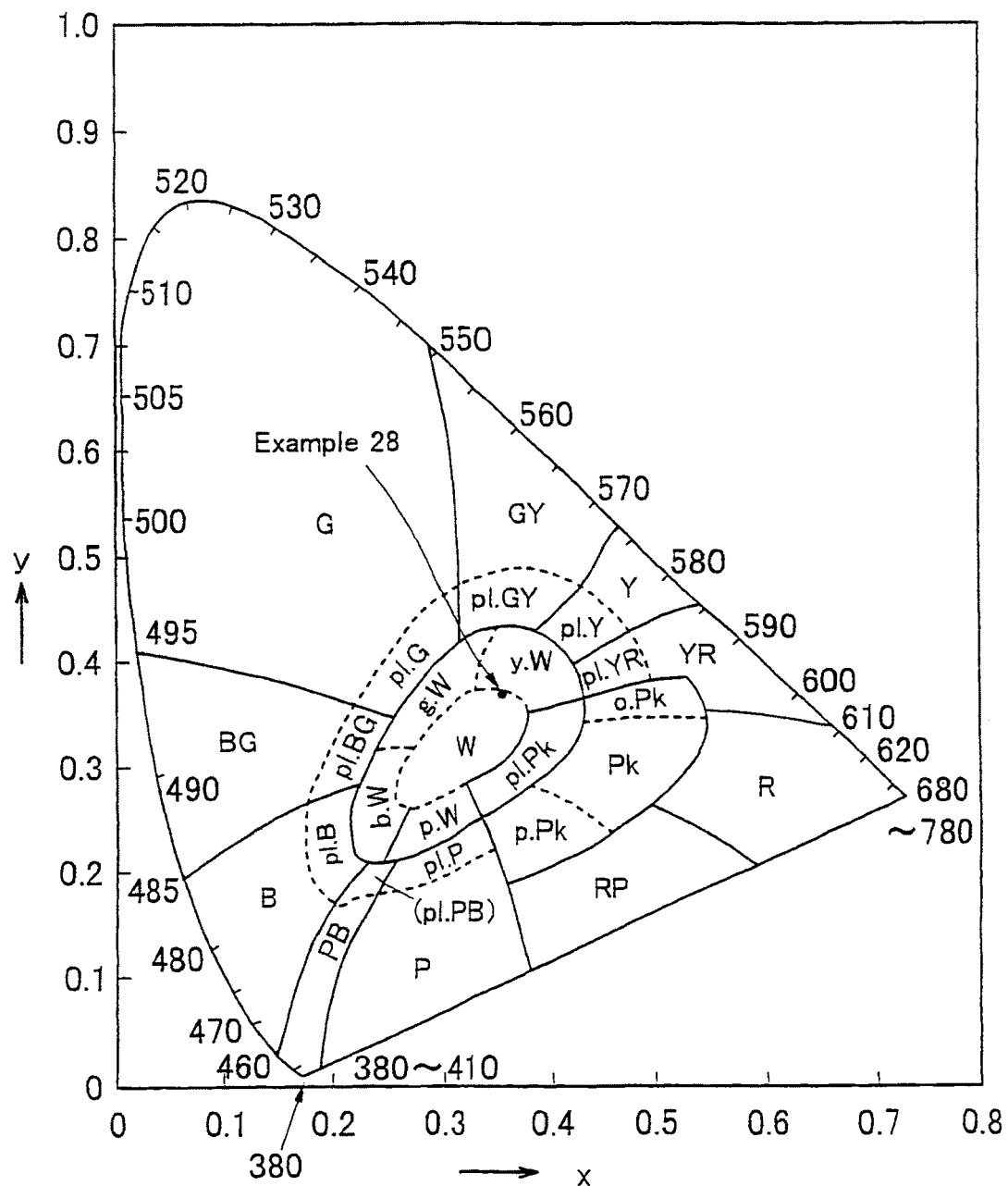
FIG. 29 is a view showing the chromaticity coordinate of the light-emitting device of Example 28 related to the present invention.

The light-emitting device of Example 28 (FIG. 1) was produced using the above-mentioned oxynitride phosphor. As the phosphor, $CaSi_2O_2N_2$:Eu of Example 1, $Ca_2Si_5N_8$:Eu and $(Ca_{0.93}, Eu_{0.05}, Mn_{0.02})_{10}(PO_4)_8Cl_2$ are used. FIG. 26 is a plane view showing the light-emitting element related to the present invention. FIG. 27 is a section view showing the A-A' of the light-emitting element related to the present invention. FIG. 28 is a chart showing the luminescence spectrum of the light-emitting device of Example 28 related to the present invention. FIG. 29 is a chart showing the chromaticity coordinate of the light-emitting device of Example 28 related to the present invention.

The light-emitting element of Example 28 is specifically illustrated.

(Light-Emitting Element)

The substrate 201 comprising sapphire (c plane) was set in the reaction vessel of MOVPE, and the temperature of the substrate 201 was raised until about 1050° C. while flowing hydrogen to clean the substrate 201.

Wherein a sapphire substrate is used for the substrate 201 in the present Example 28, but there may be used different kind substrates different from a nitride semiconductor substrate, namely nitride semiconductor substrates such as AlN, AlGaN and GaN, as the substrate 201. As the different kind substrates, for example, there can be used insulating substrate such as sapphire in which either of a C plane, R plane and A plane is a main plane, and spinel ($MgAl_2O_4$); oxide substrates which lattice-coordinate with SiC (including 6H, 4H and 3C), ZnS, ZnO, GaAs, Si and a nitride semiconductor; substrate materials which can grow a nitride semiconductor and are different from the nitride semiconductor. As the preferable different kind substrates, sapphire and spinel are mentioned. Further, the different kind substrates may be off-angled, and in this case, when a substrate which was off-angled in a stepwise shape is used, the growth of the groundwork layer 202 comprising GaN is grown in good crystallinity, therefore it is preferable. Further, when the different kind substrate is used, a nitride semiconductor which becomes the groundwork layer 202 before formation of element structure is grown on the different kind substrate, then the different kind substrate is removed by processes such as polishing, and an element structure may be formed as the single body substrate of the nitride semiconductor. Further, there may be a process of removing the different kind substrate after forming the element structure. The substrate of the nitride semiconductor such as AlN may be used in addition to a GaN substrate.

(Buffer Layer)

Successively, the temperature of the substrate 201 is lowered to 510° C., and a buffer layer (not illustrated) comprising GaN is grown on the substrate 201 at a film thickness of about 100 angstroms using hydrogen as a carrier gas and ammonia and TMG (trimethylgallium) as the raw material gases.

(Groundwork Layer)

After forming the buffer layer, only TMG is stopped, and the temperature of the substrate 201 is raised to 1050° C. When it reached at 1050° C., an undoped GaN layer is grown at a film thickness of 2 μm similarly using ammonia gas and TMG as the raw material gases.

(n-Type Layer)

Successively, an n-type layer 203 comprising GaN in which Si was doped by $4.5 \times 10^{18}/cm^3$ is grown at a thickness of 3 μm at 1050° C. similarly using ammonia gas and TMG as the raw material gases and silane gas as impurity gas, as a n-side contact layer which forms the n-side electrode 211a as the n type layer.

(Active Layer)

A barrier layer comprising Si-doped GaN is grown at a film thickness of 50 angstroms, and successively, a well layer comprising undoped $In_{0.1}Ga_{0.7}N$ is grown at a film thickness of 50 angstroms at 800° C. using TMG, TMI and ammonia. Then, 4 layers of the barrier layer and 3 layers of well layer are alternatively laminated in order of barrier+well+barrier+well • • • +barrier, and the active layer 204 comprising a multiple quantum well structure having a total film thickness of 350 angstroms is grown.

(p-Side Carrier Confining Layer)

Then, the p-side carrier confining layer 205 comprising $Al_{0.3}Ga_{0.7}N$ in which Mg was doped by $5 \times 10^{19}/cm^3$ is grown at a film thickness of 100 angstroms using TMG, TMA, ammonia and $Cp_2Mg$ (cyclopentadienylmagnesium).

(The First p-Layer)

Successively, the first p-layer 206 comprising GaN in which p-type impurities were doped is grown at a film thickness of 0.1 μm using TMG, ammonia and $Cp_2Mg$.

(The Second p-Layer)

As the second p-layer, a p-side contact layer 208 on whose surface a p-side electrode 210 is formed is formed. The p-side contact layer 208 is obtained by growing a p-type GaN in which Mg was doped by $1 \times 10^{20}/cm^3$ on the current diffusion layer, at a film thickness of 150 angstroms. Since the p-side contact layer 208 is a layer on which the p-side electrode 210 is formed, it is preferably a high carrier concentration with $1 \times 10^{17}/cm^3$ or more. When it is lower than $1 \times 10^{17}/cm^3$, it is apt to be difficult to obtain a preferable contact with the electrode. Further, when the composition of the contact layer is GaN, it is easy to obtain a preferable contact with the electrode material.

After completion of the reaction forming the above element structure, the temperature is lowered to room temperature, and annealing is carried out at 700° C. charging a wafer in the reaction vessel under nitrogen atmosphere, and the resistance of the p-layer is further lowered. The wafer on which the element structure was formed is taken out from the equipment, and an electrode forming step described below is carried out.

After the annealing, the wafer is taken out from the reaction vessel, a fixed mask is formed on the surface of the p-side contact layer 208 being the uppermost layer, etching is carried out from the p-side contact layer 208 side with an RIE (reactive ion etching) equipment to expose the surface of the n-side contact layer, and an electrode forming surface is formed.

As a p-side electrode 210, Ni and Au are laminated in order, and the p-side contact layer comprising Ni/Au is formed. Further, the p-side electrode 210 becomes an ohmic electrode which is brought in contact with the second p-layer and the p-side contact layer 208. At this time, the electrode branch 210a formed has a width of the stripe shape luminescent portion 209 of about 5 μm and a width of the stripe shape electrode branch 210 of about 3 μm, and the stripe shape luminescent portion 209 and the stripe shape electrode branch 210 are alternately formed. Only the portion of the p-side electrode 210 is formed at a region where the p-pat electrode is formed, and formed over the p-pat electrode to be electrically conducted. At this time, only the portion of the p-side electrode 210 is formed at a region where the p-pat electrode is formed, the p-pat pat electrode 210b is formed on the surface of the p-side contact layer 208, the portion is formed over the p-side electrode 210 to be electrically conducted. At this time, there is obtained a structure in which the surface of the p-side contact layer 208 where the p-side pat electrode 210b is provided is not brought in contact with the p-side electrode 210 and the p-side contact layer 208, a shot key barrier is formed between both, current does not directly run in the element from the forming portion of the p-side pat electrode 210b, and current is injected in the inside of the element through the electrode branch 210a which was electrically connected.

Successively, an n-electrode 211a is formed on the exposed plane 203a on which the n-layer 203 was exposed. The n-electrode 211a is formed by laminating Ti and Al.

Hereat, the n-electrode 211a is an ohmic electrode which was brought in ohmic contact with the exposed face 203a of the n-type layer 203. After forming the p-side electrode 210 and the n-side electrode 211a for ohmic, the respective electrodes are brought in ohmic contact by being annealed by heat treatment. The p-side ohmic electrode (not shown) which was obtained at this time becomes an opaque film which hardly transmit the luminescence of the active layer 204.

Successively, an insulation film comprising $SiO_2$ is formed on the portion or the whole surface excluding the whole of the above-mentioned p-side electrode 210 and the n-side electrode 211a, namely, the insulation film comprising $SiO_2$ is formed on the whole element surfaces such as the exposed face 203a of the n-type layer 203 and the side face of said exposed face 203a. After formation of the insulation film, the pat electrodes for bonding are respectively formed on the surfaces of the p-side electrode 210 and the n-side electrode 211a which were exposed from the insulation film, and electrically conducted with the respective electrodes for ohmic. The p-side pat electrode 210b and the n-side pat electrode 211b are respectively formed by laminating Ni, Ti and Au on the respective electrodes for ohmic.

Finally, the light-emitting elements having a length of 300 μm at one side are obtained by dividing the substrate 201.

The luminescence peak wavelength is about 400 nm.

The properties of the light-emitting device of Example 28 are shown in Table 5.

TABLE 5

| | Current If (mA) | Voltage Vf (V) | Radiation analysis Radiometric (mW) | Luminous intensity measurement Photometric (lm) | Peak wavelength Peak (nm) |
|---|---|---|---|---|---|
| Light emitting device | 20 | 3.4 | 6.2 | 1.84 | 464 |

| | Color tone x | Color tone y | Color temperature Tcp (K) | Average color rendering Ra | Lamp efficiency (lm/W) |
|---|---|---|---|---|---|
| Light emitting device | 0.356 | 0.368 | 4690 | 82.2 | 27.1 |

The light-emitting device of Example 28 exhibits a luminescence color at a white region. The light-emitting device of Example 28 exhibits a luminescence spectrum having the luminescence peak wavelengths at 360 to 430 nm, 430 to 500 nm and 500 to 730 nm. More specifically, it exhibits a luminescence spectrum having the luminescence peak wavelengths at 390 to 410 nm, 455 to 475 nm and 550 to 600 nm. The phosphors excited by the light-emitting element at 400 nm excitation have respectively the luminescence peak wavelengths at a green region in case of $CaSi_2O_2N_2$:Eu of Example 1, at a yellow to red region in case of $Ca_2Si_5N_8$:Eu, and at a blue region in case of $(Ca_{0.93}, Eu_{0.05}, Mn_{0.02})_{10}(PO_4)_6Cl_2$. It exhibits a luminescence color at a white region by the color mixture of lights from these phosphors. It emits white light with various color tastes by changing the compounding amounts of these phosphors. Accordingly, when a light-emitting device having a fixed white light using ultraviolet light as an excitation light source is produced, the luminescence color can be changed by only changing the kind of phosphors, compounding ratio and the like.

Example 29

Light-Emitting Device

The light-emitting device of Example 29 is a white light-emitting device using a light-emitting element having the luminescence peak wavelength at 460 nm, as an excitation light source. The light-emitting device of Example 29 has also a structure shown in FIG. 1.

Namely, in the light-emitting device of Example 29, the semiconductor layer 2 of an n-type GaN layer and p-type GaN layer is formed on the sapphire substrate 1, the electrode 3 is provided at said n-type and p-type semiconductor layers 2, said electrode 3 is electrically connected with the lead frame 13 by the electroconductive wire 14. The upper portion of the light-emitting device 10 is covered with the phosphor 11 and the coating member 12, and the outer peripheral portions of the lead frame 13, the phosphor 11 and the coating member 12 are covered with the mold member 15. The semiconductor layer 2 is obtained by laminating n$^+$GaN:Si, n-AlGaN:Si, n-GaN, GaInN QWs, p-GaN:Mg, p-AlGaN:Mg, and p-GaN:Mg in order on the sapphire substrate 1. The portion of said n$^+$GaN:Si is etched and an n-type electrode is formed. A p-type electrode is formed on said p-GaN:Mg layer. Copper with Fe is used for the lead frame 13. A cup for mounting the light-emitting device 10 is provided on the upper portion of the mount lead 13a, and the light-emitting element 10 is die-bonded at about the central part bottom of said cup. Gold is used for the electroconductive wire 14, and Ni plating is carried out on the bump 4 for electrically connecting the electrode 3 with the electroconductive wire 14. As the coating member 12, a mixture which mixed an epoxy resin and a dispersant, barium titanate, titanium oxide and the fore-mentioned phosphor 11 at a fixed proportion is used. The epoxy resin is used for the mold member 15. The cannonball type light-emitting device 1 is a column in which the mold member 15 is a radius of 2 to 4 mm, height is about 7 to 10 mm, and the upper part is a hemisphere.

When current is run in the light-emitting device of Example 29, the blue light-emitting element 10 having the luminescence spectrum with a peak wave length of about 460 nm emits light. The phosphor 11 which covers the semiconductor layer 2 carries out the conversion of color tone. As a result, there can be provided the light-emitting device of Example 29 which emits white light.

The phosphor 11 of the light-emitting device of Example 29 related to the present invention uses the phosphor 11 which mixed the oxynitride phosphor of Example 1 and the nitride phosphor represented by CaSrSi$_5$N$_8$:Eu. Said phosphor 11 is mixed with the coating member 12.

The portion of light from the light-emitting element 10 transmits the light-emitting device of Example 29. Further, the portion of light from the light-emitting element 10 excites the phosphor 11, the phosphor 11 carries out the wavelength conversion, and red light is emitted from the green color of the oxynitride phosphor and the yellow red color of the nitride phosphor. There can be provided the light-emitting device which emits white light, by the color mixture of blue light from these light-emitting elements 10, green light from the oxynitride phosphor, and yellow red to red light from the nitride phosphor.

Example 30

Light-Emitting Device

Figure 30:
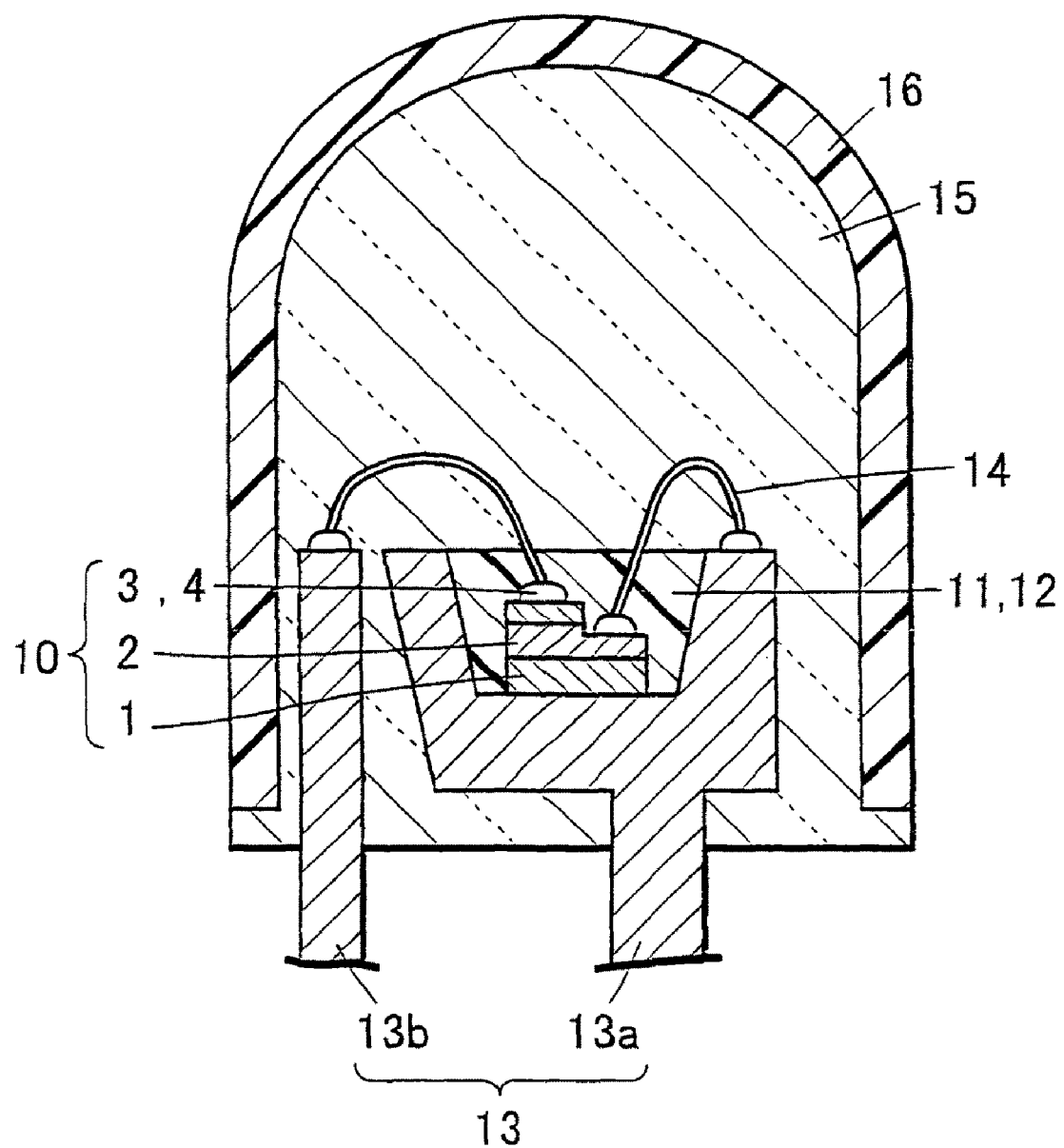
FIG. 30 is a chart showing the cap type light-emitting device of Example 30 related to the present invention.

FIG. 30 is a view showing the cap type light-emitting device of Example 30 related to the present invention.

In FIG. 30 showing the light-emitting device of Example 30, the same codes are imparted for the same members as those in the light-emitting device of Example 28, and illustrations thereof are abbreviated. As the light-emitting element 10, a light-emitting element having the luminescence peak wavelength at 400 nm is used.

The light-emitting device of Example 30 is constituted by covering the cap 16 comprising a transparent resin in which phosphors (not illustrated) were dispersed on the surface of the mold member of the light-emitting device of Example 28.

A cup for mounting the light-emitting device 10 is provided on the upper portion of the mount lead 13a, and said light-emitting element 10 is die-bonded at about the central part bottom of said cup. The phosphor 11 is provided on the upper part of said cap so as to cover the light-emitting element 10 in the light-emitting device of Example 30, but the phosphor may be contained only in the cap 16 in the light-emitting device of Example 30. When the phosphor 11 is not provided on the light-emitting element 10, the phosphor is able not to directly receive the influence of heat generated from the light-emitting element 10.

Further, the phosphor is homogeneously dispersed in a transparent resin in case of the cap 16. The transparent resin containing the phosphor is molded in a shape which is fitted for the shape of the mold member 15. Alternatively, there is also possible a process of charging the transparent resin containing the phosphor into a fixed mold, then pushing the light-emitting device 1 into said mold and molding it. As the specific example of the transparent resin of the cap 16, there are used transparent resins excellent in temperature properties and weather resistance such as an epoxy resin, a urea resin and a silicone resin; silica sol, glass, an inorganic binder and the like. In addition to the resins mentioned above, there can be also used thermosetting resins such as a melamine resin and a phenol resin. Further, there can be also used thermoplastic resins such as a polyethylene, a polypropylene, a poly (vinyl chloride) and a polystyrene; thermoplastic rubbers such as a styrene-butadiene block copolymer and a segmented polyurethane, etc. Further, a dispersant, barium titanate, titanium oxide, aluminum oxide and the like may be contained together with the phosphor. Further, a light stabilizer and a coloring agent may be contained. The nitride phosphor of Ca$_2$Si$_5$N$_8$:Eu and the phosphor of (Ca$_{0.95}$, Eu$_{0.05}$)$_{10}$(PO$_4$)$_8$Cl$_2$ are used for the phosphors contained in the cap 16. The nitride phosphor of Example 3 is used for the phosphor 11 used in the cap of the mount lead 13a. However, since the phosphors are used in the cap 16, there may be a structure in which the cap 16 contains the oxynitride phosphor and only the coating member 12 exists in the cap of the mount lead 13a.

In the light-emitting device thus constituted, the portion of light emitted from the light-emitting element 10 excites the oxynitride phosphor of the phosphor 11 and green light is emitted from the oxynitride phosphor. Further, the portion of light emitted from the light-emitting element 10 or the portion of light emitted from the oxynitride phosphor excites the phosphor of the cap 16, and red light is emitted from blue and yellow. The green light of the oxynitride phosphor is mixed with the red light from the blue color and yellow color of the phosphor of the cap 16, and as a result, white light is released from the surface of the cap 16.

Examples 31 to 79 below are Examples related to the oxynitride phosphor related to the present invention, respectively.

Examples 31 to 56

Table 6 shows the properties of Examples 31 to 56 of the oxynitride phosphor related to the present invention.

Figure 32:
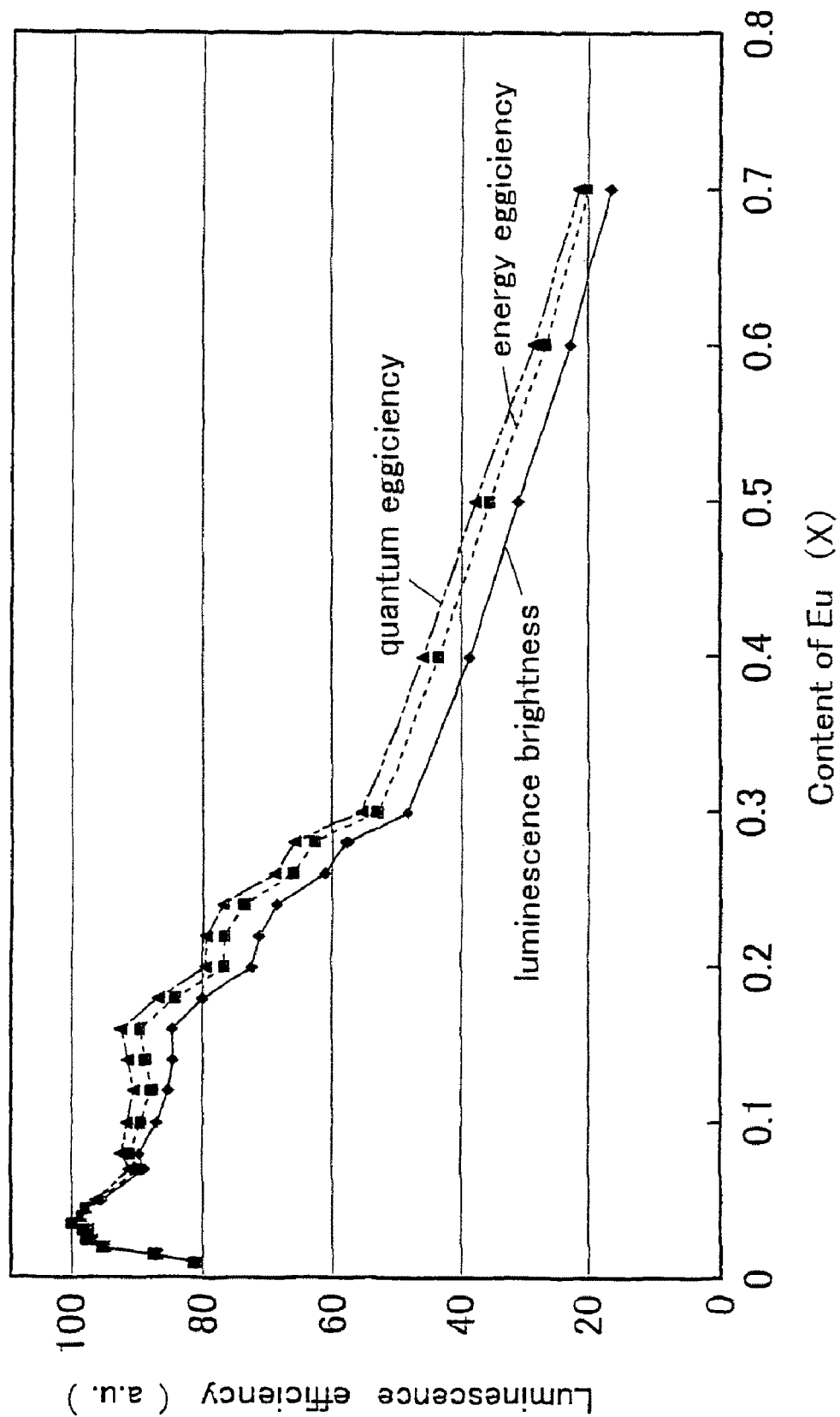
FIG. 32 is a chart showing the change of the luminescence efficiency caused by the change of the content of the activator R contained in the composition of the oxynitride phosphor.
Figure 33:
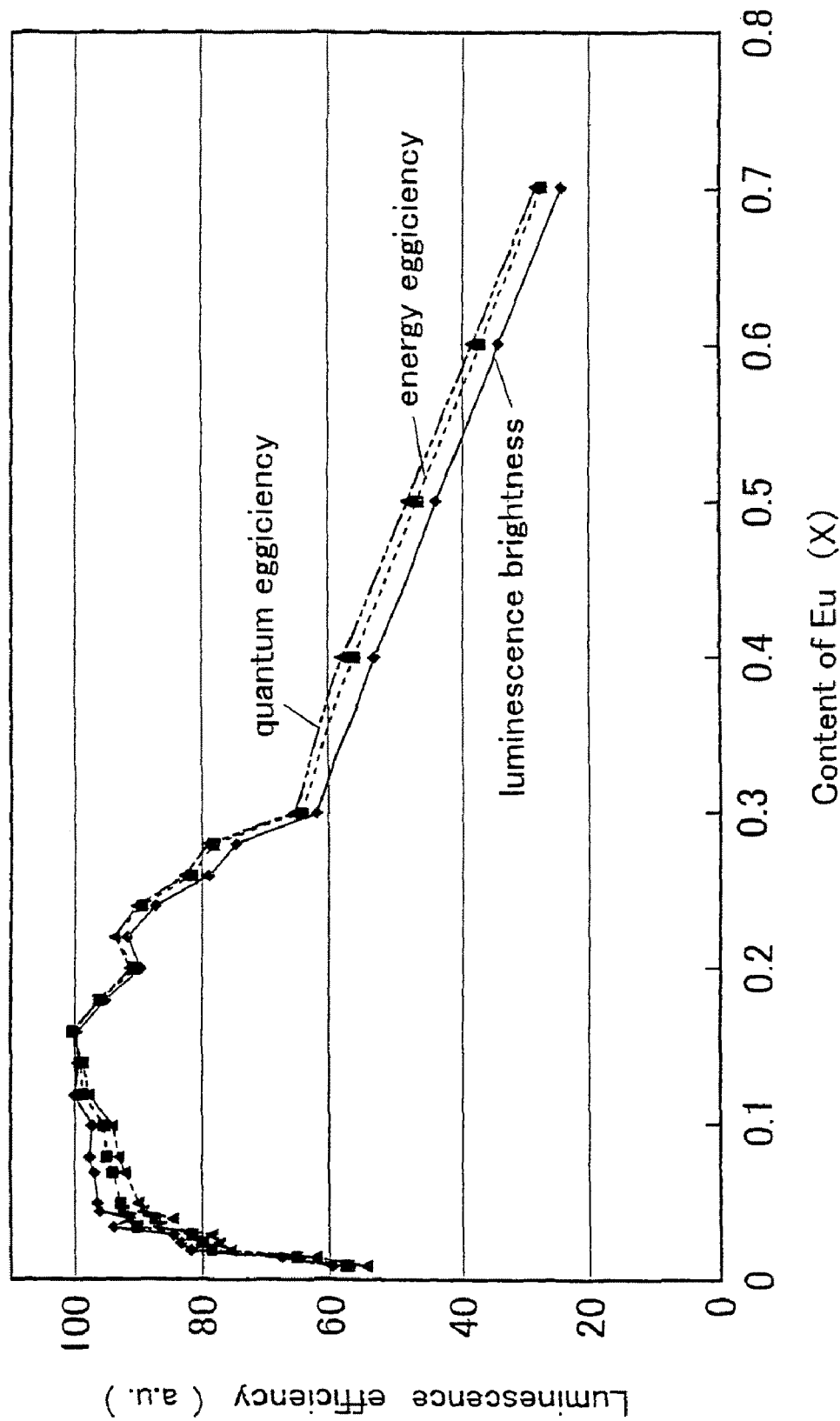
FIG. 33 is a chart showing the change of the luminescence efficiency caused by the change of the content of the activator R contained in the composition of the oxynitride phosphor.
Figure 34:
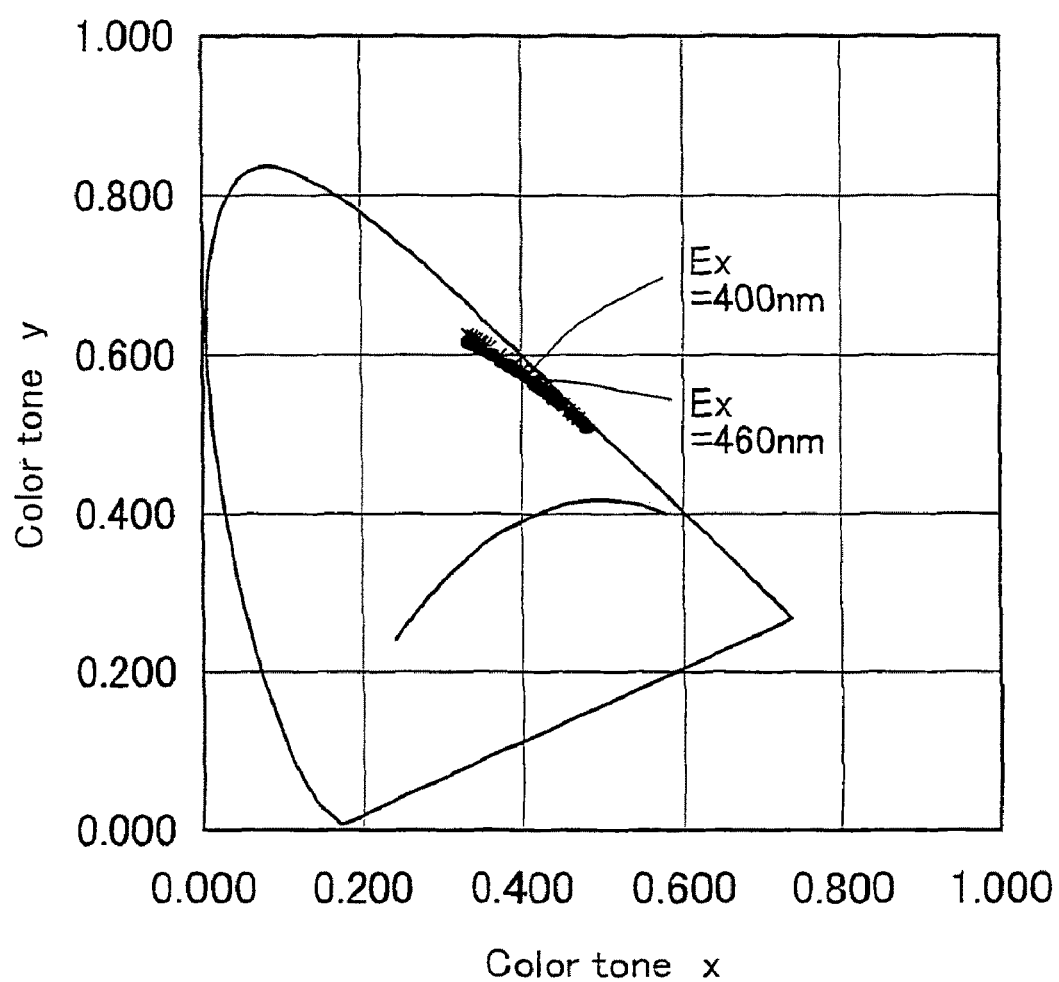
FIG. 34 is a CIE chromaticity chart showing the change of the color tone caused by the change of the content of the activator R contained in the composition of the oxynitride phosphor.
Figure 35:
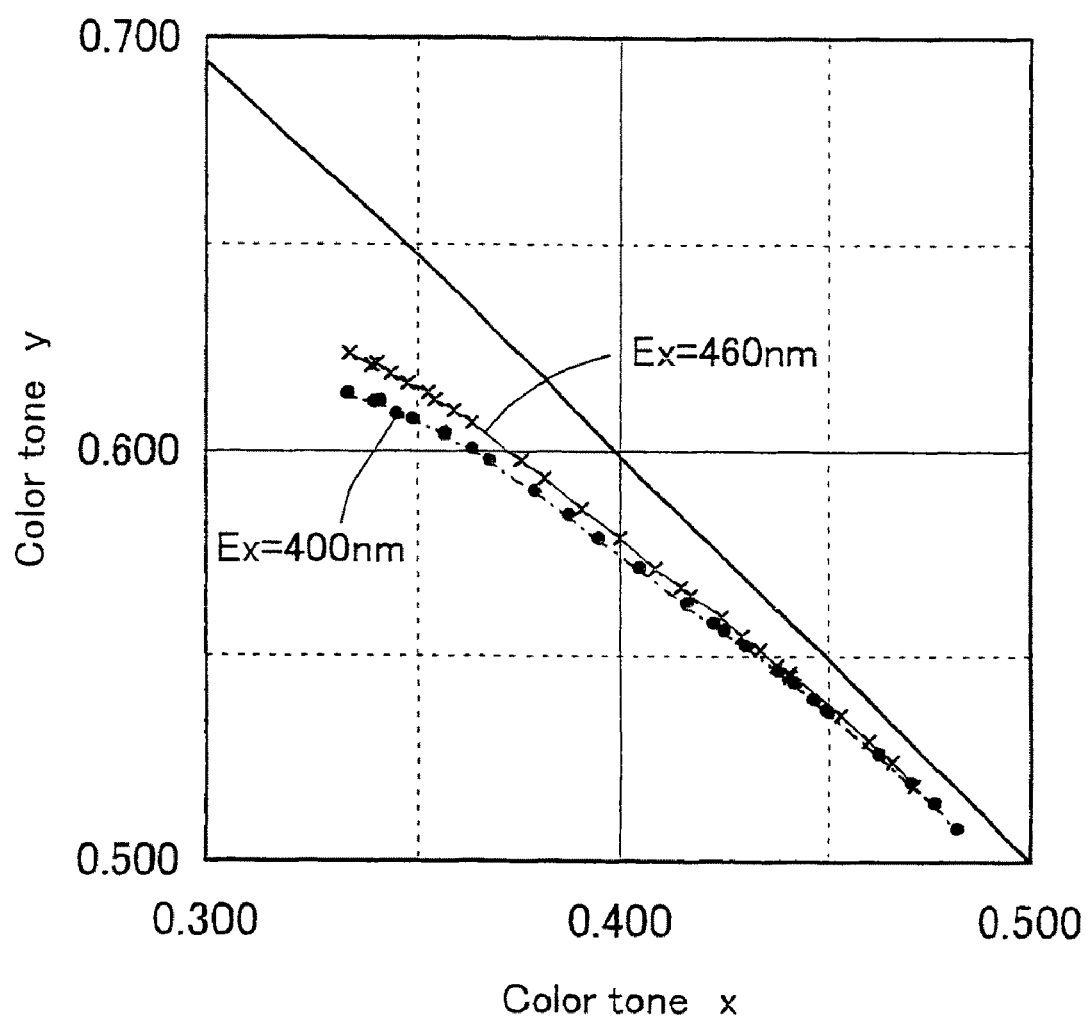
FIG. 35 is an expanded CIE chromaticity chart of FIG. 34.
Figure 36:
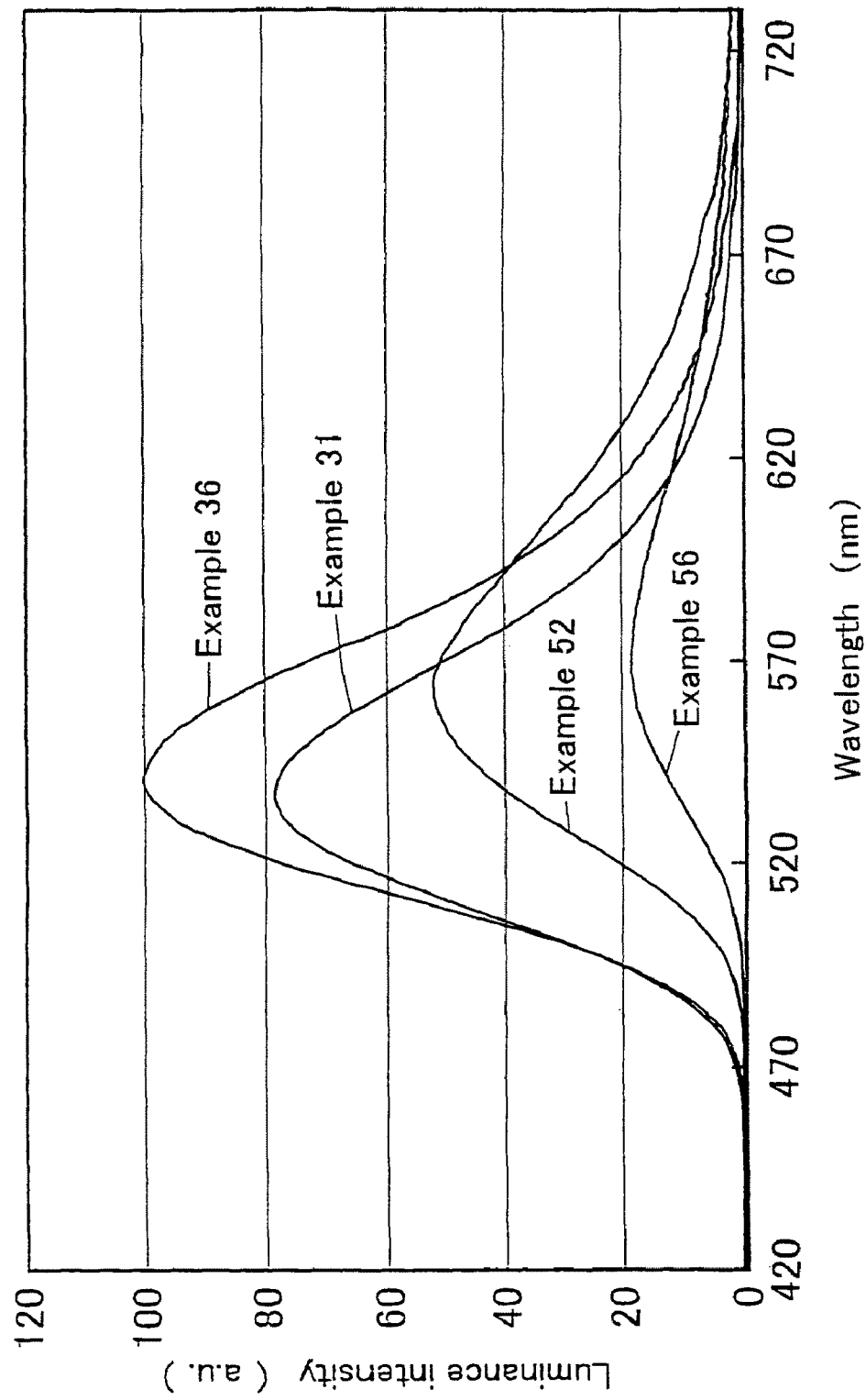
FIG. 36 is a chart showing the luminescence spectrum when the oxynitride phosphor was excited at Ex=400 nm.
Figure 37:
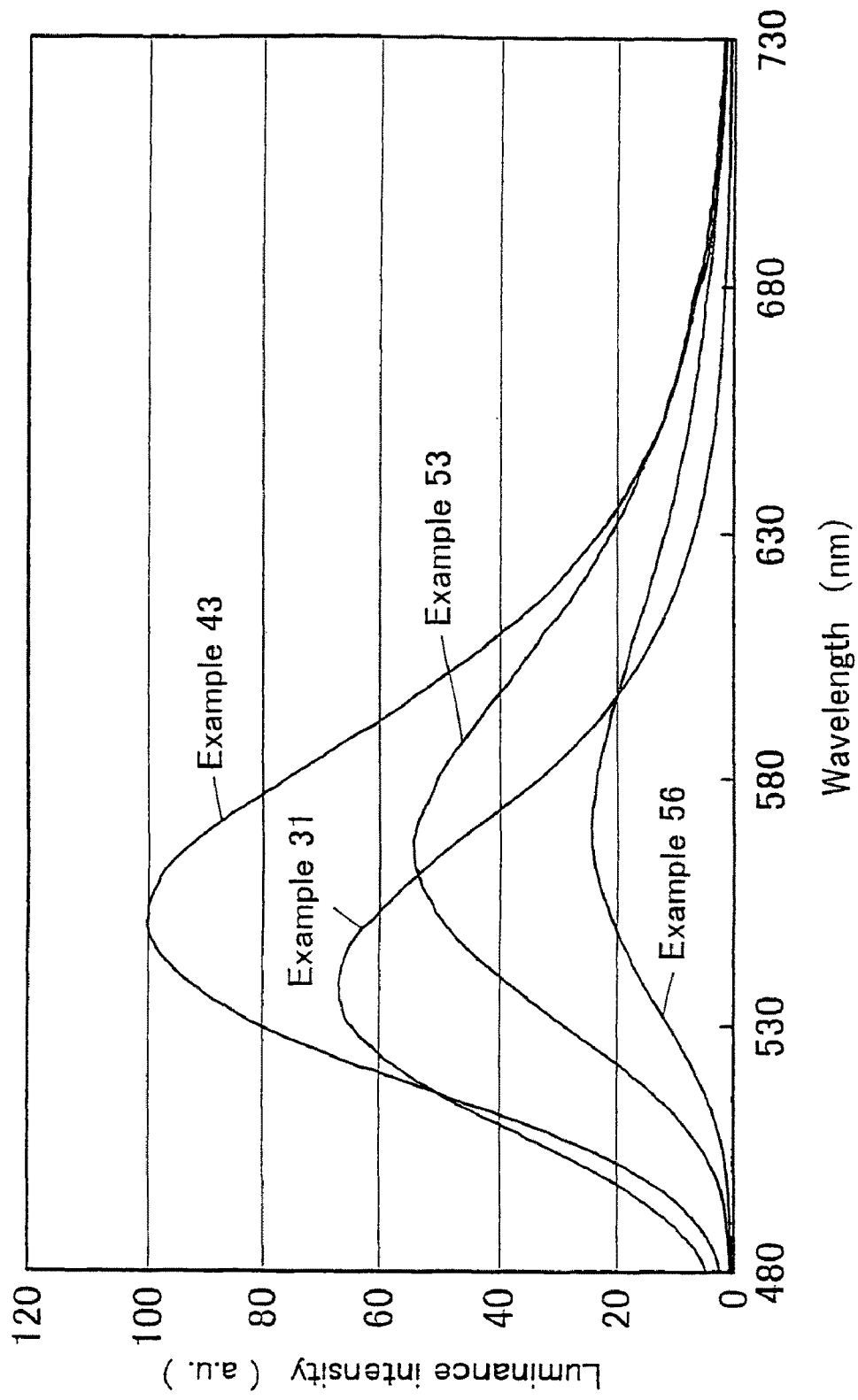
FIG. 37 is a chart showing the luminescence spectrum when the oxynitride phosphor was excited at Ex=460 nm.
Figure 38:
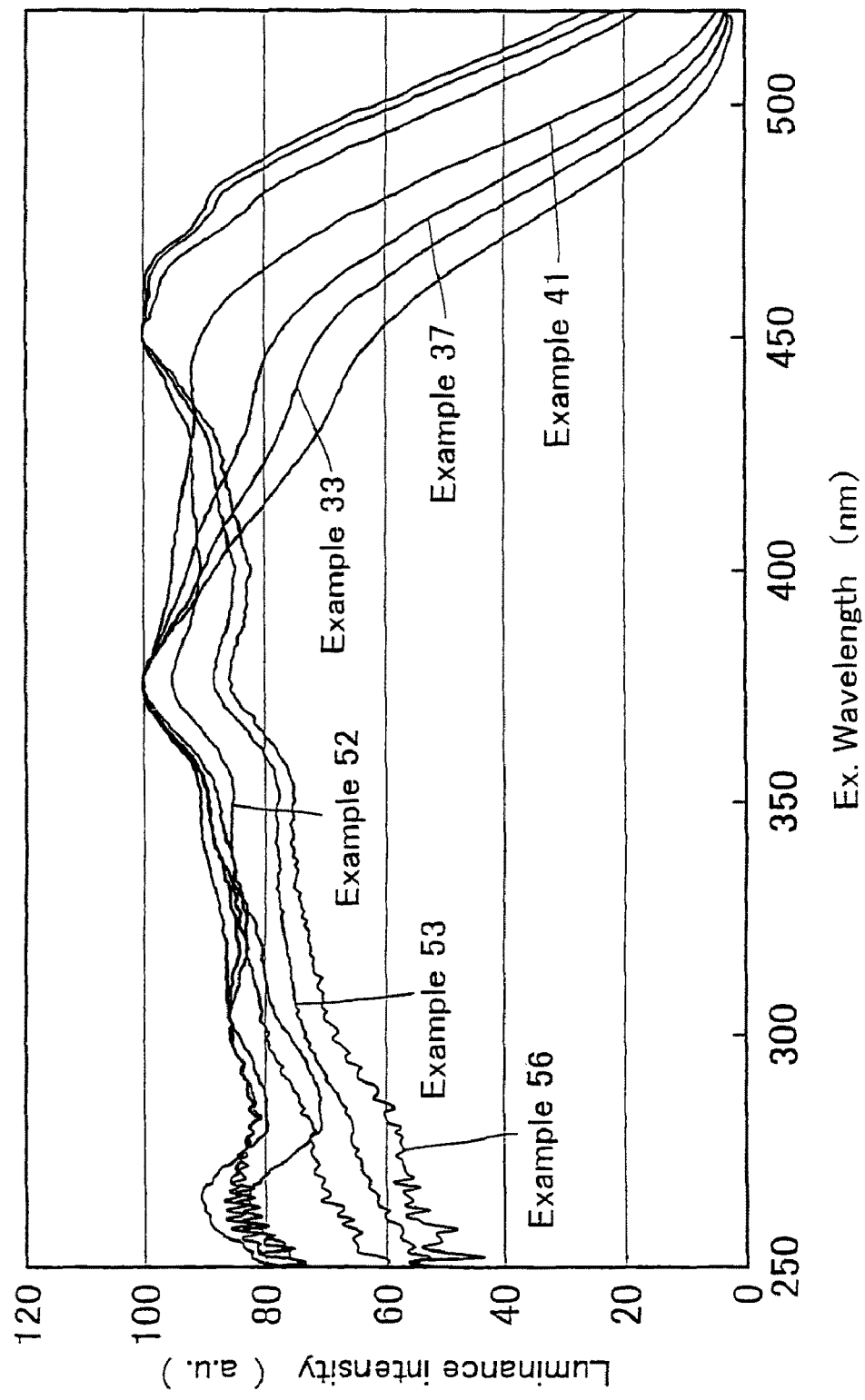
FIG. 38 is a chart showing the normalized excitation spectrum of the oxynitride phosphor.
Figure 39:
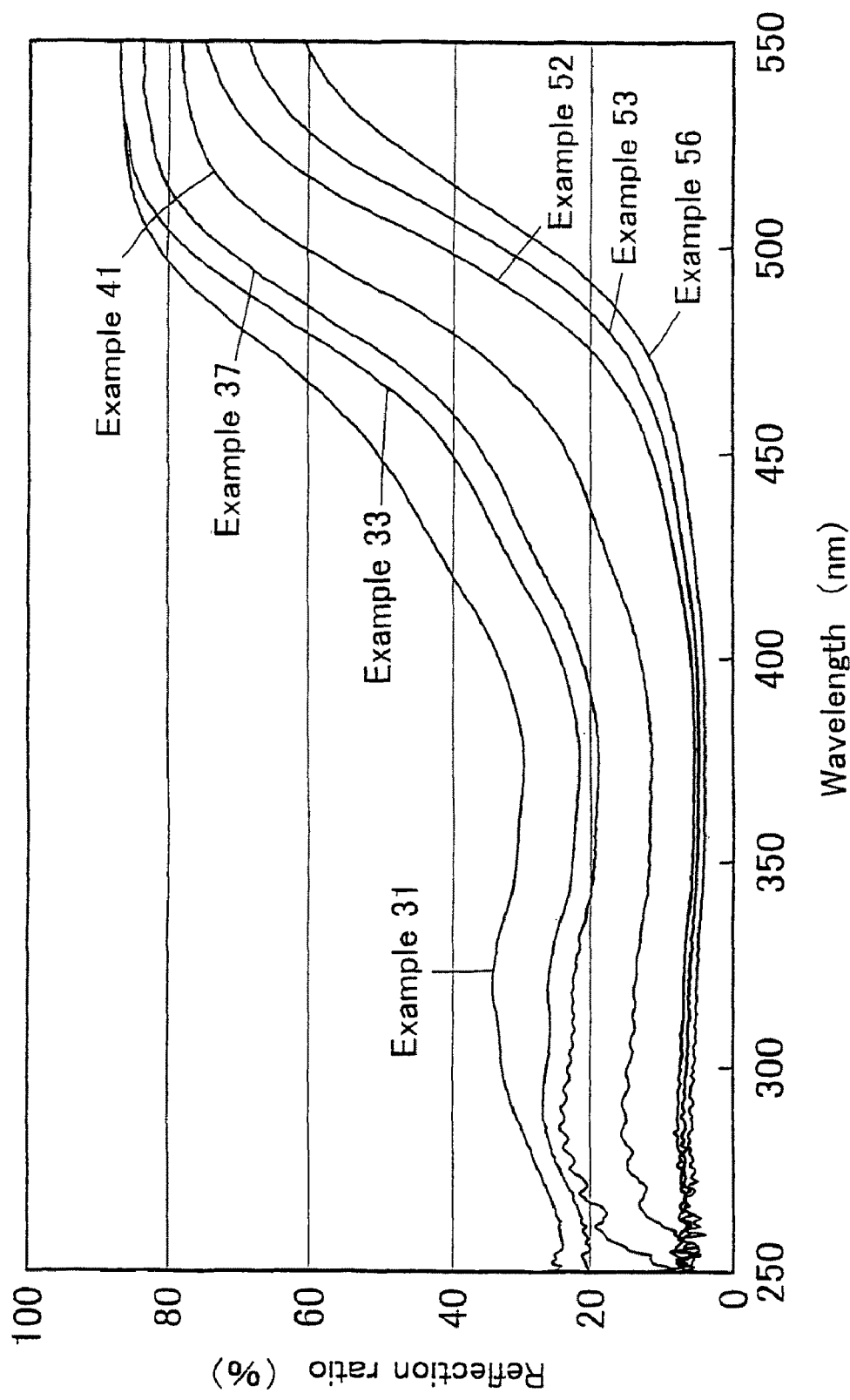
FIG. 39 is a chart showing the reflection spectrum of the oxynitride phosphor.
Figure 40:
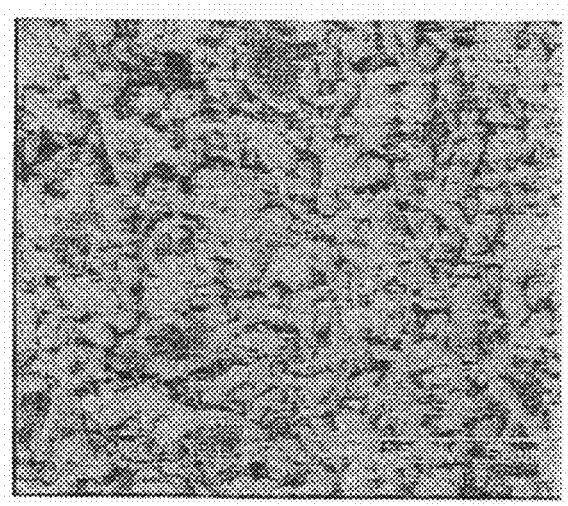
FIG. 40A is an SEM photo photographed the oxynitride phosphor of Example 36 at a magnification of 1000-fold.
FIG. 40B is an SEM photo photographed the oxynitride phosphor of Example 36 at a magnification of 5000-fold.
FIG. 40C is an SEM photo photographed the oxynitride phosphor of Example 36 at a magnification of 10000-fold.
Figure 40:
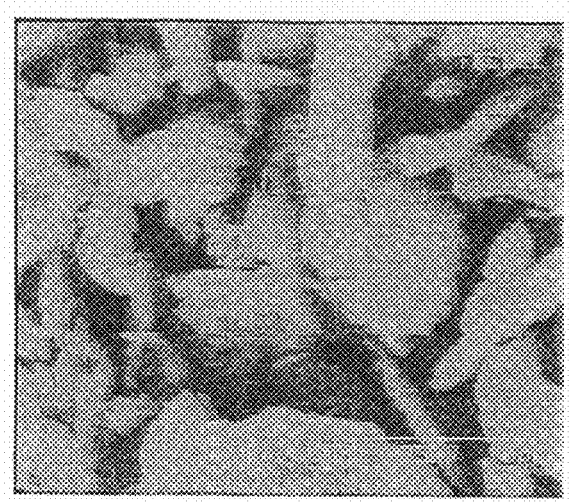
Figure 40:

Further, FIG. 32 is a chart showing the change of the luminescence efficiency caused by the change of the content of the activator R contained in the composition of the oxynitride phosphor. The excitation light source is light nearby 400 nm. FIG. 33 is a chart showing the change of the luminescence efficiency caused by the change of the content of the activator R contained in the composition of the oxynitride phosphor. The excitation light source is light nearby 460 nm. FIG. 34 is a CIE chromaticity chart showing the change of the color tone caused by the change of the content of the activator R contained in the composition of the oxynitride phosphor. FIG. 35 is an expanded CIE chromaticity chart of FIG. 34. FIG. 36 is a chart showing the luminescence spectrum when the oxynitride phosphor was excited at Ex=400 nm. FIG. 37 is a chart showing the luminescence spectrum when the oxynitride phosphor was excited at Ex=460 nm. FIG. 38 is a chart showing the normalized excitation spectrum of the oxynitride phosphor. FIG. 39 is a chart showing the reflection spectrum of the oxynitride phosphor. FIG. 40A is an SEM photo photographed the oxynitride phosphor of Example 36 at a magnification of 1000-fold, FIG. 40B is an SEM (scanning electron microscope) photo photographed the oxynitride phosphor of Example 36 at a magnification of 5000-fold, and FIG. 40C is an SEM photo photographed the oxynitride phosphor of Example 36 at a magnification of 10000-fold.

TABLE 6

|  | Compounding ratio x of Eu | Color tone x | Color tone y | Luminescence brightness Y (%) | Energy efficiency E (%) | Quantum efficiency Q (%) |
|---|---|---|---|---|---|---|
| | | | Ex = 400 nm | | | |
| Example 31 | 0.01 | 0.333 | 0.614 | 81.0 | 81.7 | 81.0 |
| Example 32 | 0.015 | 0.340 | 0.612 | 87.2 | 87.8 | 87.3 |
| Example 33 | 0.02 | 0.341 | 0.612 | 95.1 | 95.5 | 94.9 |
| Example 34 | 0.025 | 0.345 | 0.609 | 97.3 | 97.5 | 96.9 |
| Example 35 | 0.03 | 0.349 | 0.608 | 97.7 | 98.1 | 97.9 |
| Example 36 | 0.035 | 0.356 | 0.604 | 100.0 | 100.0 | 100.0 |
| Example 37 | 0.04 | 0.356 | 0.604 | 97.9 | 98.4 | 98.5 |
| Example 38 | 0.045 | 0.363 | 0.600 | 97.4 | 97.7 | 97.9 |
| Example 39 | 0.05 | 0.367 | 0.598 | 95.4 | 95.8 | 96.2 |
| Example 40 | 0.07 | 0.378 | 0.590 | 89.0 | 90.1 | 91.2 |
| Example 41 | 0.08 | 0.387 | 0.584 | 89.6 | 91.1 | 92.4 |
| Example 42 | 0.1 | 0.394 | 0.579 | 87.3 | 89.5 | 91.4 |
| Example 43 | 0.12 | 0.405 | 0.571 | 85.5 | 88.1 | 90.4 |
| Example 44 | 0.14 | 0.416 | 0.562 | 84.8 | 88.8 | 91.5 |
| Example 45 | 0.18 | 0.422 | 0.558 | 84.8 | 89.5 | 92.4 |
| Example 46 | 0.18 | 0.425 | 0.556 | 79.9 | 84.3 | 87.0 |
| Example 47 | 0.2 | 0.430 | 0.552 | 72.5 | 76.5 | 79.5 |
| Example 48 | 0.22 | 0.438 | 0.546 | 71.7 | 76.3 | 79.5 |
| Example 49 | 0.24 | 0.442 | 0.543 | 68.8 | 73.7 | 77.0 |
| Example 50 | 0.26 | 0.446 | 0.539 | 61.1 | 66.2 | 69.2 |
| Example 51 | 0.28 | 0.450 | 0.536 | 57.7 | 62.9 | 66.1 |
| Example 52 | 0.3 | 0.449 | 0.537 | 48.3 | 52.9 | 55.4 |
| Example 53 | 0.4 | 0.462 | 0.526 | 38.6 | 43.4 | 45.9 |
| Example 54 | 0.5 | 0.471 | 0.519 | 31.0 | 35.7 | 38.0 |
| Example 55 | 0.6 | 0.476 | 0.514 | 23.0 | 26.9 | 28.7 |
| Example 56 | 0.7 | 0.482 | 0.508 | 16.6 | 20.2 | 21.8 |
| | | | Ex = 460 nm | | | |
| Example 31 | 0.01 | 0.334 | 0.623 | 59.6 | 57.4 | 55.0 |
| Example 32 | 0.015 | 0.339 | 0.620 | 67.0 | 64.6 | 62.2 |
| Example 33 | 0.02 | 0.340 | 0.621 | 81.5 | 78.0 | 75.0 |
| Example 34 | 0.025 | 0.343 | 0.618 | 83.2 | 79.8 | 77.0 |
| Example 35 | 0.03 | 0.347 | 0.616 | 84.3 | 81.0 | 78.1 |
| Example 36 | 0.035 | 0.352 | 0.614 | 94.1 | 89.8 | 86.7 |

TABLE 6-continued

| | Compounding ratio x of Eu | Color tone x | Color tone y | Luminescence brightness Y (%) | Energy efficiency E (%) | Quantum efficiency Q (%) |
|---|---|---|---|---|---|---|
| Example 37 | 0.04 | 0.354 | 0.612 | 91.2 | 87.4 | 84.5 |
| Example 38 | 0.045 | 0.358 | 0.610 | 96.3 | 92.2 | 89.2 |
| Example 39 | 0.05 | 0.363 | 0.607 | 96.6 | 92.7 | 89.9 |
| Example 40 | 0.07 | 0.375 | 0.597 | 97.1 | 94.0 | 92.0 |
| Example 41 | 0.08 | 0.380 | 0.593 | 97.7 | 95.0 | 93.0 |
| Example 42 | 0.1 | 0.390 | 0.586 | 97.4 | 95.4 | 94.2 |
| Example 43 | 0.12 | 0.400 | 0.578 | 100.0 | 98.5 | 97.9 |
| Example 44 | 0.14 | 0.408 | 0.571 | 99.6 | 99.1 | 98.7 |
| Example 45 | 0.18 | 0.414 | 0.566 | 99.4 | 100.0 | 100.0 |
| Example 46 | 0.18 | 0.417 | 0.564 | 95.2 | 95.9 | 96.0 |
| Example 47 | 0.2 | 0.424 | 0.559 | 89.3 | 90.2 | 90.8 |
| Example 48 | 0.22 | 0.430 | 0.555 | 91.5 | 93.4 | 94.2 |
| Example 49 | 0.24 | 0.434 | 0.551 | 87.0 | 89.1 | 90.1 |
| Example 50 | 0.26 | 0.438 | 0.547 | 78.2 | 81.0 | 82.1 |
| Example 51 | 0.28 | 0.441 | 0.545 | 73.9 | 77.0 | 78.3 |
| Example 52 | 0.3 | 0.441 | 0.545 | 61.4 | 63.6 | 64.6 |
| Example 53 | 0.4 | 0.453 | 0.535 | 53.3 | 56.3 | 57.7 |
| Example 54 | 0.5 | 0.460 | 0.529 | 43.7 | 46.9 | 48.4 |
| Example 55 | 0.6 | 0.466 | 0.524 | 33.6 | 36.6 | 37.8 |
| Example 56 | 0.7 | 0.471 | 0.518 | 23.4 | 26.5 | 27.6 |

Examples 31 to 56 are $SrSi_2O_2N_2$:Eu. When Examples 31 to 56 were irradiated using the excitation light source around 400 nm, the luminescence brightness, energy efficiency and quantum efficiency of other Examples are shown with their relative values based on the basis of Example 36 in which the luminescence brightness, energy efficiency and quantum efficiency were highest. When Examples 31 to 56 were irradiated using the excitation light source around 460 nm, the luminescence brightness of other Examples are shown with their relative values based on the basis of Example 43 in which the luminescence brightness, energy efficiency and quantum efficiency were highest. Further, the energy efficiency and quantum efficiency of other Examples are shown with their relative values based on the basis of Example 45 in which the energy efficiency and quantum efficiency were highest.

Firstly, $Sr_3N_2$, $Si_3N_4$, $SiO_2$ and $Eu_2O_3$ were used as the raw materials. Said raw materials were crushed at 0.1 to 3.0 μm respectively. After the crushing, Examples 31 to 56 were weighed so as to be the fixed amounts. Since the portion of Sr is substituted with Eu, the oxynitride phosphor is represented by the general formula $Sr_{(1-x)}Eu_xSi_2O_2N_2$:Eu (0<X<1).

After weighing the above-mentioned amounts, fixed amounts of $Sr_3N_2$, $Si_3N_4$, $SiO_2$ and $Eu_2O_3$ were mixed under nitrogen atmosphere in a glove box until uniformity.

In Example 35, $Sr_3N_2$:$Si_3N_4$:$SiO_2$:$Eu_2O_3$ of the mix ratio (molar ratio) of the raw materials is Sr:Si:O:Eu=0.97:2:2:0.03. $Sr_3N_2$, $Si_3N_4$, $SiO_2$ and $Eu_2O_3$ were weighed so as to be the mixing ratio, and mixed. Examples 31 to 56 changed the Sr concentration of $Sr_{(1-x)}Eu_xSi_2O_2N_2$ and the compounding ratio of Eu so as to be a fixed molar ratio. The compounding ratio of Eu in Table shows the molar ratio of Eu.

The above-mentioned compounds were mixed, the mixture was charged in a boron nitride crucible in ammonia atmosphere, and calcination was carried out at about 1500° C. for about 5 hours.

The objective oxynitride phosphors were obtained thereby. The theoretical composition of the oxynitride phosphors obtained is $Sr_{(1-x)}Eu_xSi_2O_2N_2$ (0<X<1).

When the % by weight of O and N in the oxynitride phosphor of Example 35 was measured, O and N were contained by 15.3% by weight and 10.1% by weight respectively. The weight ratio of O to N is O:N=1:0.66.

The calcination of the oxynitride phosphors related to Examples 31 to 56 is carried out in ammonia atmosphere using a boron nitride crucible. A crucible made of a metal is not preferably used for the crucible. For example, when the crucible made of a metal is used, it is considered that the crucible is eroded and it causes the lowering of luminescence properties. Accordingly, it is preferable to use a crucible made of ceramics such as alumina.

Any of the calcined products of Examples 31 to 56 is crystalline powder or granules. The particle diameter was nearly 1 to 5 μm.

The excitation spectra of the oxynitride phosphors of Examples 31 to 56 were measured. As a result of the measurement, they are strongly excited at 290 nm to 490 nm.

The oxynitride phosphors of Examples 31 to 56 were excited by Ex=400 nm. The oxynitride phosphor of Example 31 has a luminescence color at a yellow green region of the color tone, x=0.333 and the color tone y=0.614. The oxynitride phosphor of Example 36 has a luminescence color at a yellow green region of the color tone, x=0.356 and the color tone y=0.604. When the compounding ratio of Eu is increased, the color tone x is shifted to a right direction and the color tone y is shifted to a down direction in the chromaticity coordinate. When the compounding ratio of Eu is increased, the luminescence brightness is gradually enhanced, and the luminescence brightness was highest in case of Example 36. When the compounding ratio of Eu is increased, the luminescence brightness is lowered. On the other hand, when the compounding ratio of Eu is increased, the quantum efficiency is gradually enhanced, and the quantum efficiency was highest in case of Example 36. When the compounding ratio of Eu is further increased, the quantum efficiency is lowered. Hereat, Examples 31 to 47 can provide the oxynitride phosphor having a desired color tone while keeping the high luminescence brightness and high quantum efficiency.

The oxynitride phosphors of Examples 31 to 56 were excited by Ex=460 nm. Since Ex=460 nm is a wavelength region which is often used in a blue light-emitting element, excitation was carried out at said wavelength region. As a result, the oxynitride phosphor of Example 31 has a luminescence color at a yellow green region of the color tone, x=0.334 and the color tone y=0.623. When the compounding ratio of Eu is increased, the color tone x is shifted to a right direction and the color tone y is shifted to a down direction in the chromaticity coordinate. The oxynitride phosphor of Example 43 has a luminescence color at a yellow green region of the color tone, x=0.400 and the color tone y=0.578. Further, when the compounding ratio of Eu is increased, the luminescence brightness is gradually enhanced, and the luminescence brightness was highest in case of Example 43. When the compounding ratio of Eu is further increased, the luminescence brightness is lowered. On the other hand, when the compounding ratio of Eu is increased, the quantum efficiency is gradually enhanced, and the quantum efficiency was highest in case of Example 45. When the compounding ratio of Eu is further increased, the quantum efficiency is lowered. Hereat, Examples 32 to 51 can provide the oxynitride phosphor having a desired color tone while keeping the high luminescence brightness and high quantum efficiency.

Further, the temperature properties of the oxynitride phosphors of Examples 31 to 56 were extremely good. The temperature properties are shown by relative brightness in which the luminescence brightness at 25° C. is 100%. The particle diameter is a value according to an air transmission process called F.S.S.No. (Fisher Sub Sieve Sizer's No.). The temperature properties of Examples 31 to 56 are 85% or more at 100° C. They were 55% or more at 200° C.

When the X-ray diffraction images of the above-mentioned these oxynitride phosphors were measured, any image shows a sharp diffraction peak, and it was cleared that the phosphors obtained were crystalline compounds having regularity. The crystal structure was the orthorhombic system.

Examples 57 to 70

Table 7 shows the properties of Examples 57 to 70 of the oxynitride phosphors related to the present invention.

Figure 41:
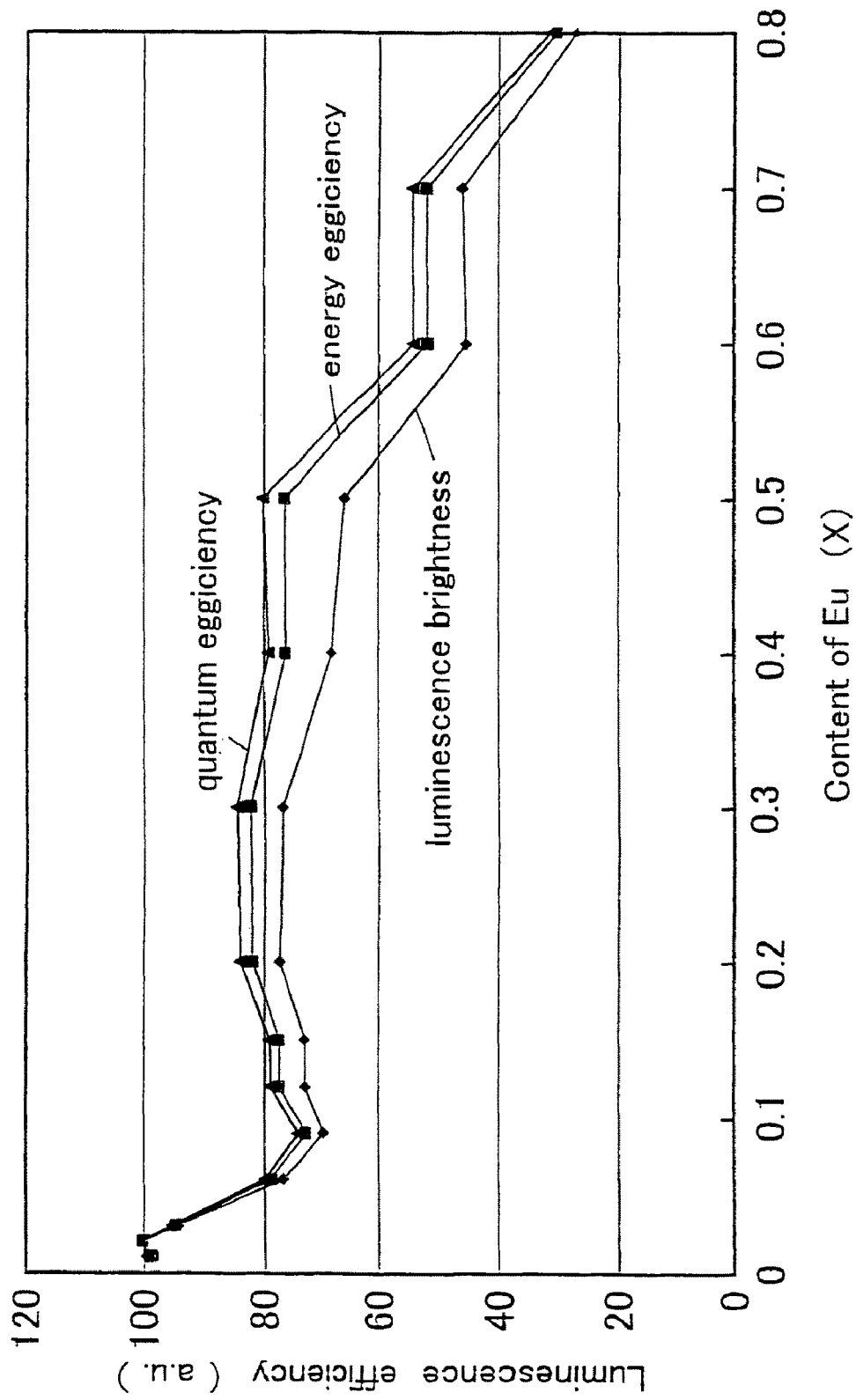
FIG. 41 is a chart showing the change of the luminescence efficiency caused by the change of the content of the activator R contained in the composition of the oxynitride phosphor.
Figure 42:
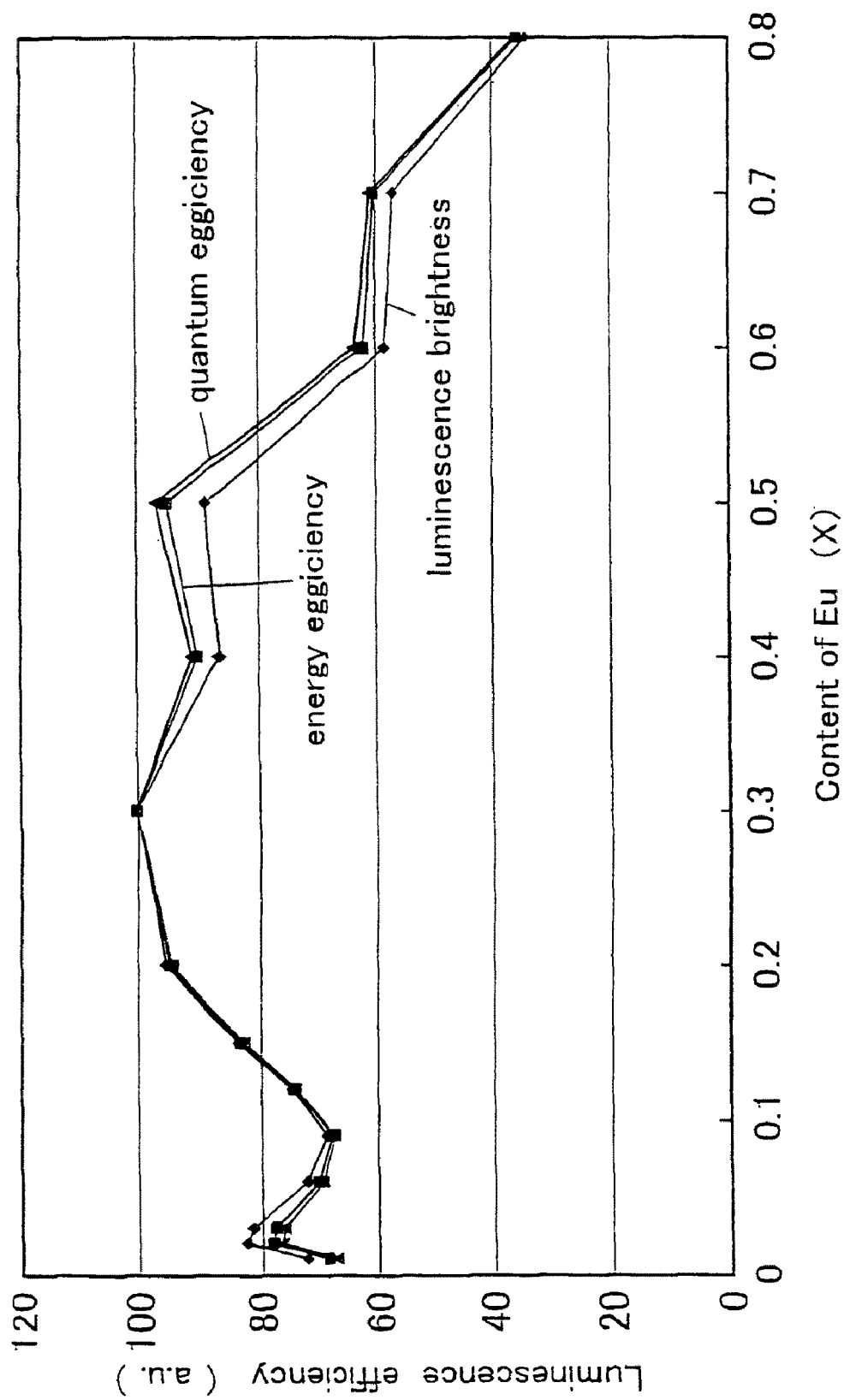
FIG. 42 is a chart showing the change of the luminescence efficiency caused by the change of the content of the activator R contained in the composition of the oxynitride phosphor.
Figure 43:
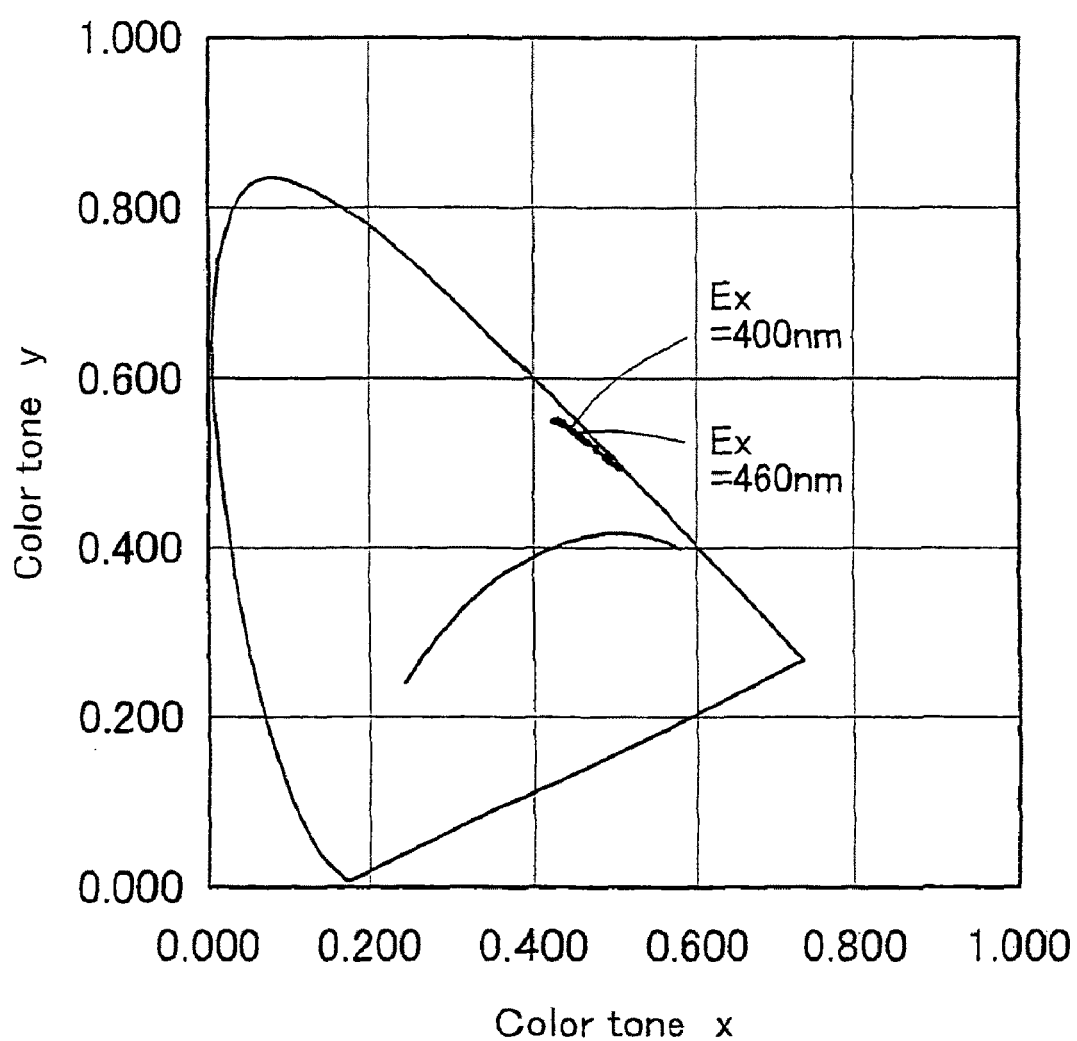
FIG. 43 is a CIE chromaticity chart showing the change of the color tone caused by the change of the content of the activator R contained in the composition of the oxynitride phosphor.
Figure 44:
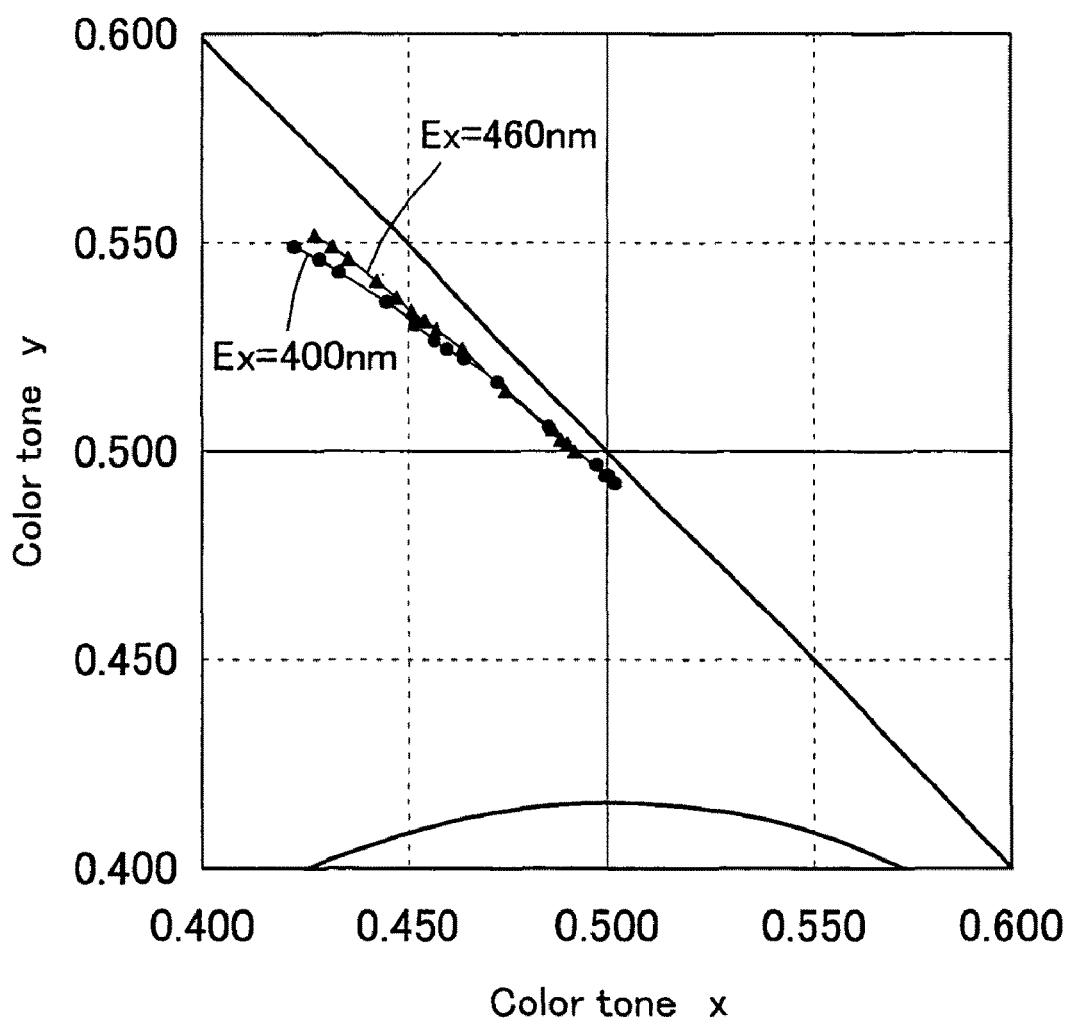
FIG. 44 is an expanded CIE chromaticity chart of FIG. 43.
Figure 45:
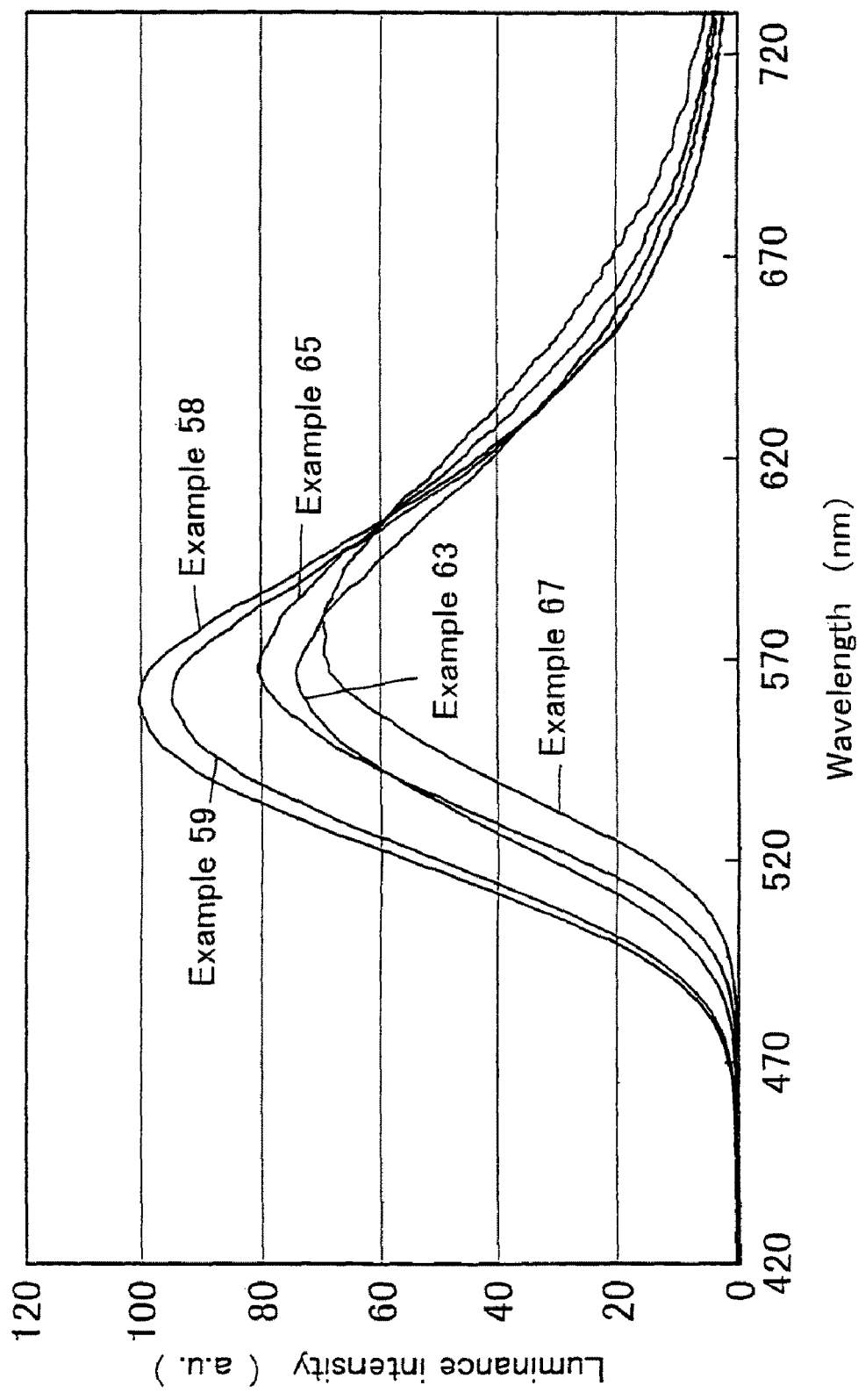
FIG. 45 is a chart showing the luminescence spectrum when the oxynitride phosphor was excited at Ex=400 nm.
Figure 46:
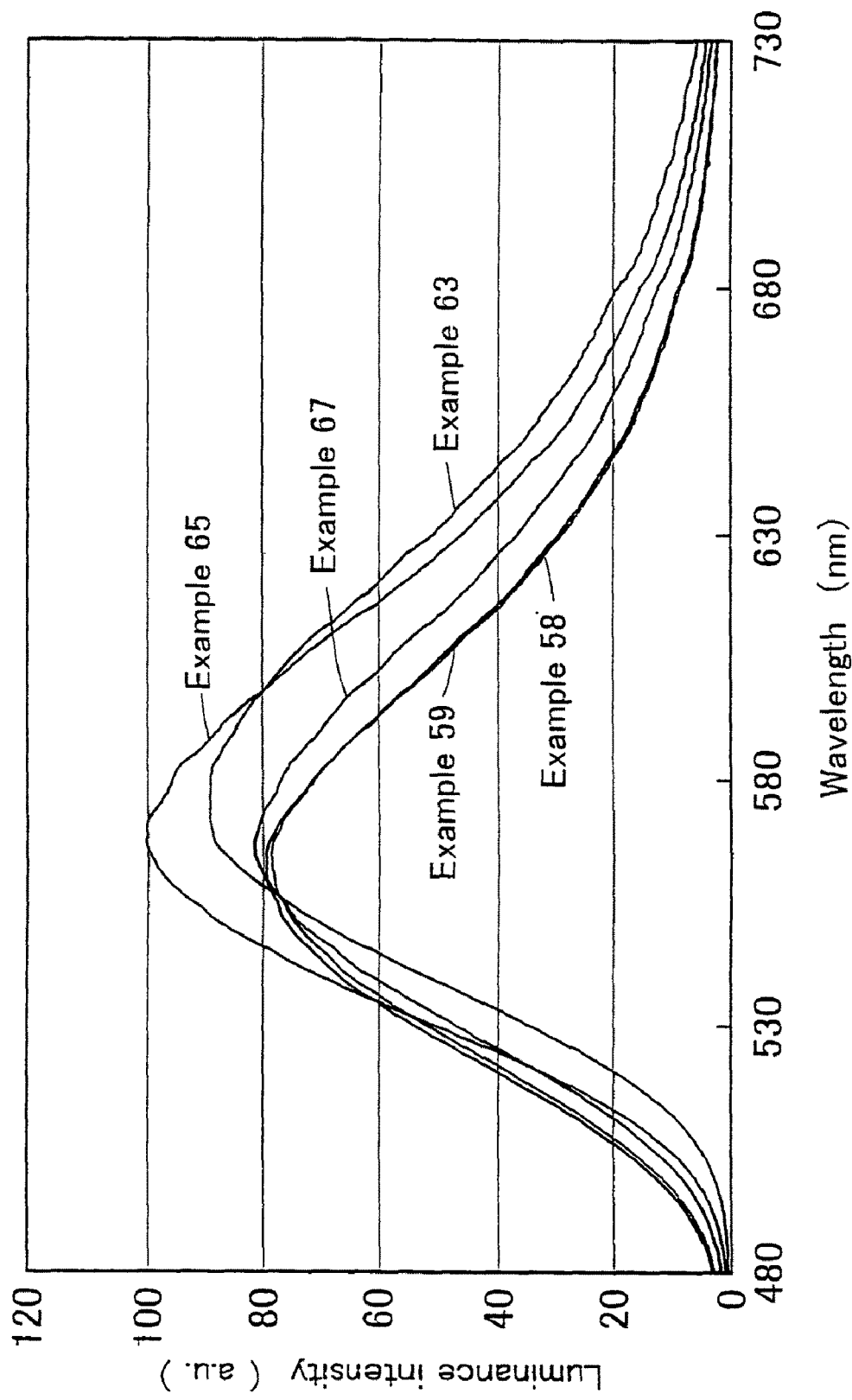
FIG. 46 is a chart showing the luminescence spectrum when the oxynitride phosphor was excited at Ex=460 nm.
Figure 47:
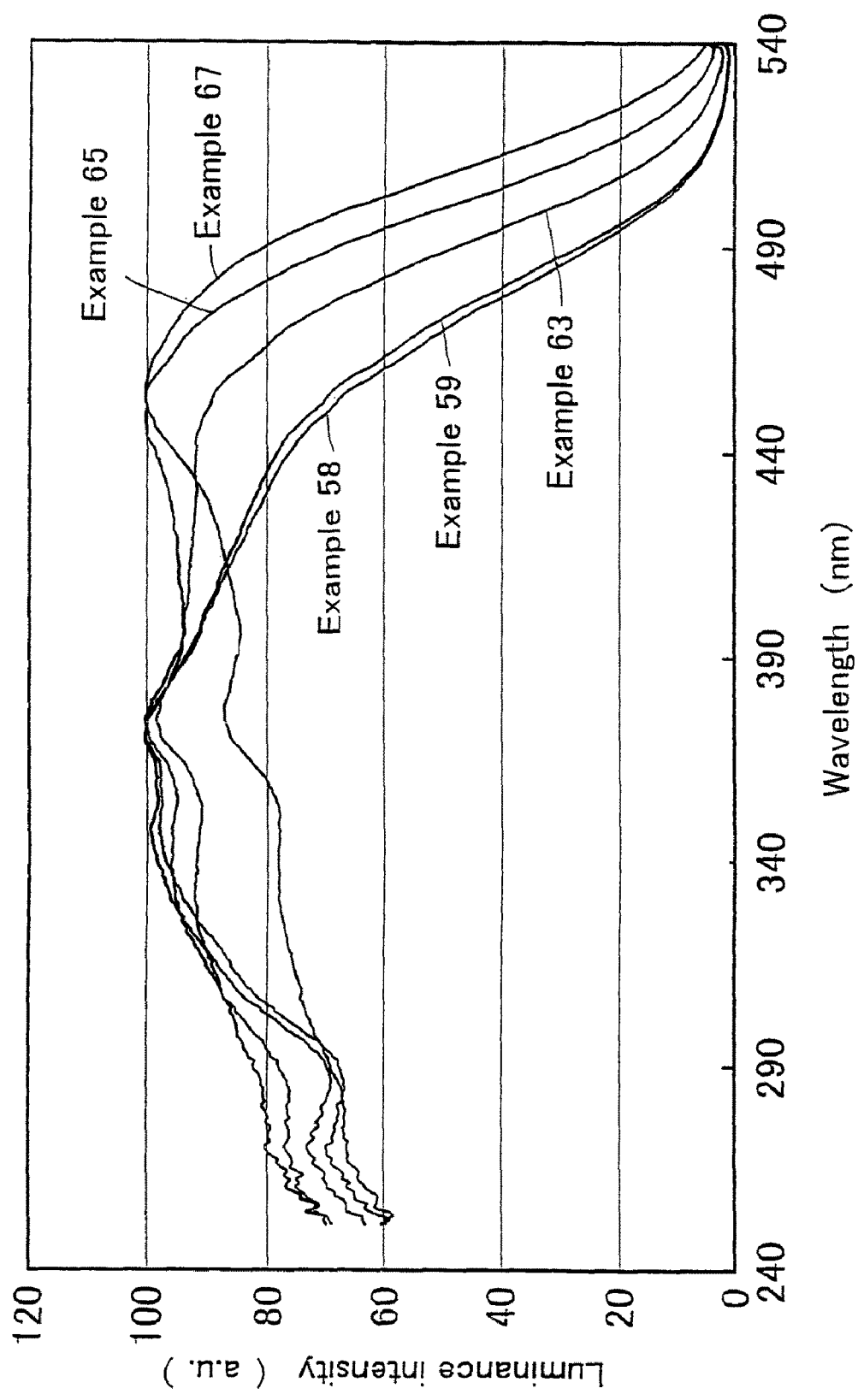
FIG. 47 is a chart showing the normalized excitation spectrum of the oxynitride phosphor.
Figure 48:
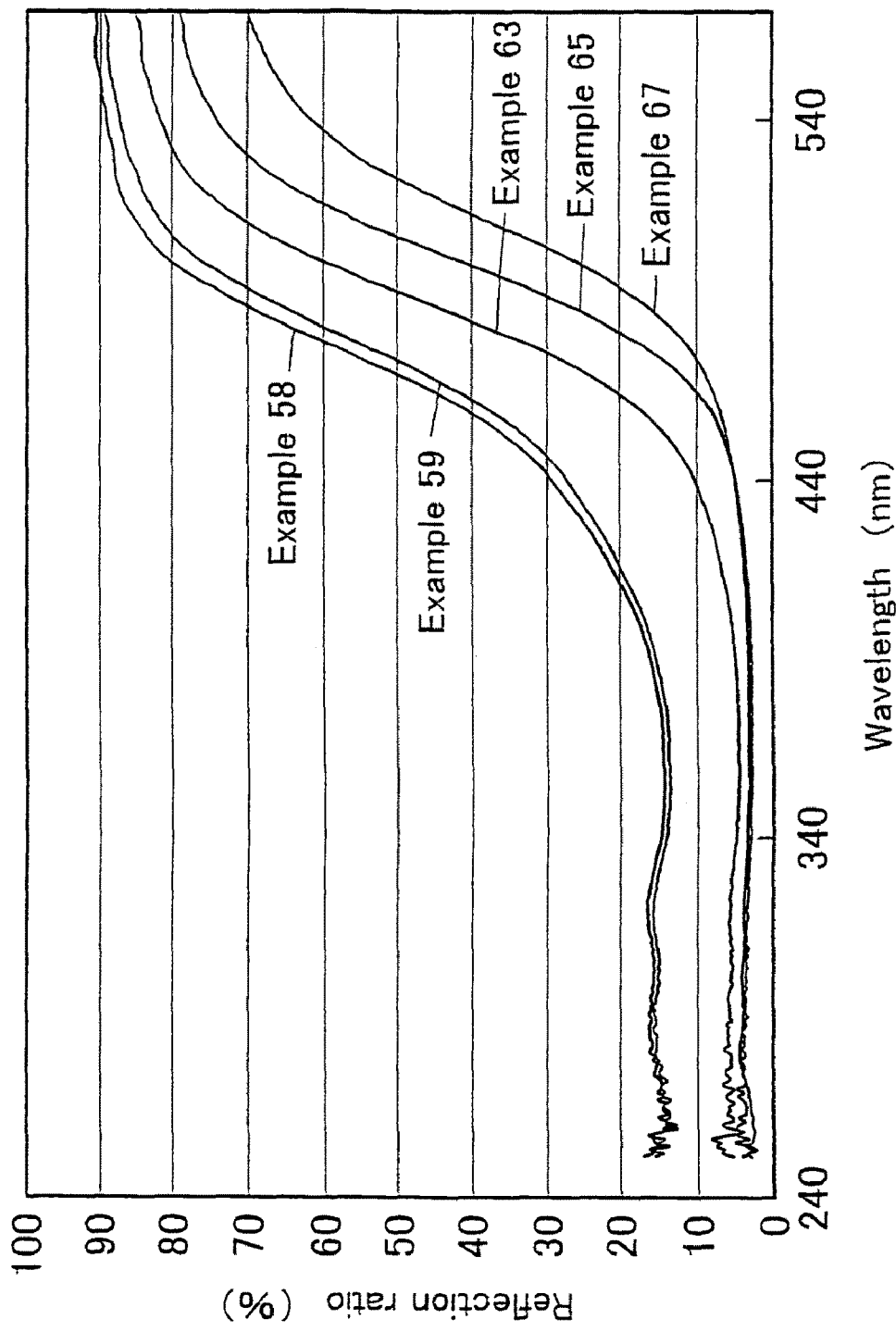
FIG. 48 is a chart showing the reflection spectrum of the oxynitride phosphor.

Further, FIG. 41 is a chart showing the change of the luminescence efficiency caused by the change of the content of the activator R contained in the composition of the oxynitride phosphor. The excitation light source is light nearby 400 nm. FIG. 42 is a chart showing the change of the luminescence efficiency caused by the change of the content of the activator R contained in the composition of the oxynitride phosphor. The excitation light source is light nearby 460 nm. FIG. 43 is a CIE chromaticity chart showing the change of the color tone caused by the change of the content of the activator R contained in the composition of the oxynitride phosphor. FIG. 44 is an expanded CIE chromaticity chart of FIG. 43. FIG. 45 is a chart showing the luminescence spectrum when the oxynitride phosphor was excited at Ex=400 nm. FIG. 46 is a chart showing the luminescence spectrum when the oxynitride phosphor was excited at Ex=460 nm. FIG. 47 is a chart showing the normalized excitation spectrum of the oxynitride phosphor. FIG. 48 is a chart showing the reflection spectrum of the oxynitride phosphor.

TABLE 7

| | | Ex = 400 nm | | |
|---|---|---|---|---|
| | Compounding ratio x of Eu | Luminescence peak (nm) | Color tone x | Color tone y |
| Example 57 | 0.01 | 558 | 0.442 | 0.549 |
| Example 58 | 0.02 | 559 | 0.428 | 0.546 |
| Example 59 | 0.03 | 559 | 0.433 | 0.543 |
| Example 60 | 0.06 | 565 | 0.444 | 0.536 |
| Example 61 | 0.09 | 566 | 0.451 | 0.530 |
| Example 62 | 0.12 | 564 | 0.456 | 0.526 |
| Example 63 | 0.15 | 566 | 0.460 | 0.524 |
| Example 64 | 0.2 | 567 | 0.464 | 0.522 |
| Example 65 | 0.3 | 567 | 0.473 | 0.516 |
| Example 66 | 0.4 | 570 | 0.485 | 0.506 |
| Example 67 | 0.5 | 580 | 0.499 | 0.494 |
| Example 68 | 0.6 | 572 | 0.502 | 0.492 |
| Example 69 | 0.7 | 574 | 0.500 | 0.494 |
| Example 70 | 0.8 | 572 | 0.497 | 0.496 |

| | Compounding ratio x of Eu | Peak intensity ( ) | Luminescence brightness Y (%) | Energy efficiency E (%) | Quantum efficiency Q (%) |
|---|---|---|---|---|---|
| Example 57 | 0.01 | 99.3 | 99.4 | 98.7 | 98.5 |
| Example 58 | 0.02 | 100.0 | 100.0 | 100.0 | 100.0 |
| Example 59 | 0.03 | 94.3 | 94.1 | 94.6 | 95.0 |
| Example 60 | 0.06 | 76.8 | 76.5 | 78.7 | 79.6 |
| Example 61 | 0.09 | 70.0 | 69.5 | 72.7 | 74.1 |
| Example 62 | 0.12 | 73.1 | 72.7 | 77.2 | 78.8 |
| Example 63 | 0.15 | 74.0 | 72.9 | 77.2 | 79.0 |
| Example 64 | 0.2 | 79.2 | 77.1 | 81.7 | 83.7 |
| Example 65 | 0.3 | 80.2 | 76.6 | 82.0 | 84.3 |
| Example 66 | 0.4 | 71.3 | 67.8 | 76.0 | 79.0 |
| Example 67 | 0.5 | 69.4 | 65.4 | 76.2 | 79.9 |
| Example 68 | 0.6 | 48.7 | 45.1 | 51.7 | 53.9 |
| Example 69 | 0.7 | 49.4 | 45.8 | 51.9 | 54.1 |
| Example 70 | 0.8 | 28.7 | 26.9 | 30.2 | 31.4 |

Examples 57 to 70 are the oxynitride phosphors represented by $CaSi_2O_2N_2$:Eu. When Examples 57 to 70 were irradiated using the excitation light source around 400 nm, the luminescence brightness, energy efficiency and quantum efficiency of other Examples are shown with their relative values based on the basis of Example 58 in which the luminescence brightness, energy efficiency and quantum efficiency were highest. When Examples 57 to 70 were irradiated using the excitation light source around 460 nm, the luminescence brightness of other Examples are shown with their relative values based on the basis of Example 65 in which the luminescence brightness, energy efficiency and quantum efficiency were highest.

$Ca_3N_2$, $Si_3N_4$, $SiO_2$ and $Eu_2O_3$ were used as the raw materials. The production of the oxynitride phosphors of Examples 57 to 70 was carried out using these raw materials and the similar production process as Example 31. The production was carried out so that said raw materials are a fixed molar ratio. The theoretical composition of the oxynitride phosphors obtained is $Ca_{(1-X)}Eu_XSi_2O_2N_2$ (0<X<1). The portion of Ca is substituted with Eu. The compounding molar ratio of Eu in Table shows the molar ratio of Eu.

When the % by weight of O and N in the oxynitride phosphor of Example 58 was measured, O and N were contained by 19.5% by weight and 17.5% by weight respectively. The weight ratio of O to N is O:N=1:0.90.

Any of the calcined products of Examples 57 to 70 is crystalline powder or granules. The particle diameter was nearly 1 to 8 μm.

The excitation spectra of the oxynitride phosphors of Examples 57 to 70 were measured. As a result of the measurement, they are strongly excited at 290 nm to 520 nm.

The oxynitride phosphors of Examples 57 to 70 were excited by Ex=400 nm. The oxynitride phosphor of Example 58 has a luminescence color at a yellow green region of the color tone, x=0.428 and the color tone y=0.546. The oxynitride phosphor of Example 57 has a luminescence color at a yellow green region of the color tone, x=0.422 and the color tone y=0.549. When the compounding ratio of Eu is increased, the color tone x is shifted to a right direction and the color tone y is shifted to a down direction in the chromaticity coordinate. The high luminescence brightness, energy efficiency and high quantum efficiency were highest in case of Example 58. Hereat, Examples 56 to 67 can provide the oxynitride phosphor having a desired color tone while keeping the high luminescence brightness and high quantum efficiency.

The oxynitride phosphors of Examples 57 to 70 were excited by Ex=460 nm. Since Ex=460 nm is a wavelength region which is often used in a blue light-emitting element, excitation was carried out at said wavelength region. As a result, the oxynitride phosphor of Example 65 has a luminescence color at a yellow green region of the color tone, x=0.464 and the color tone y=0.524. When the compounding ratio of Eu is increased, the color tone x is shifted to a right direction and the color tone y is shifted to a down direction in the chromaticity coordinate.

Further, when the compounding ratio of Eu is increased, the luminescence brightness, energy efficiency and quantum efficiency are gradually enhanced, and the luminescence brightness was highest in case of Example 65. Further, when the compounding ratio of Eu is further increased, the luminescence brightness is lowered. Hereat, Examples 57 to 69 can provide the oxynitride phosphor having a desired color tone while keeping the high luminescence brightness and high quantum efficiency.

When the X-ray diffraction images of the above-mentioned these oxynitride phosphors were measured, any image shows a sharp diffraction peak, and it was cleared that the phosphors obtained were crystalline compounds having regularity. The crystal structure was the orthorhombic system.

Examples 71 to 78

Table 8 shows the properties of Examples 71 to 78 of the oxynitride phosphors related to the present invention.

Figure 49:
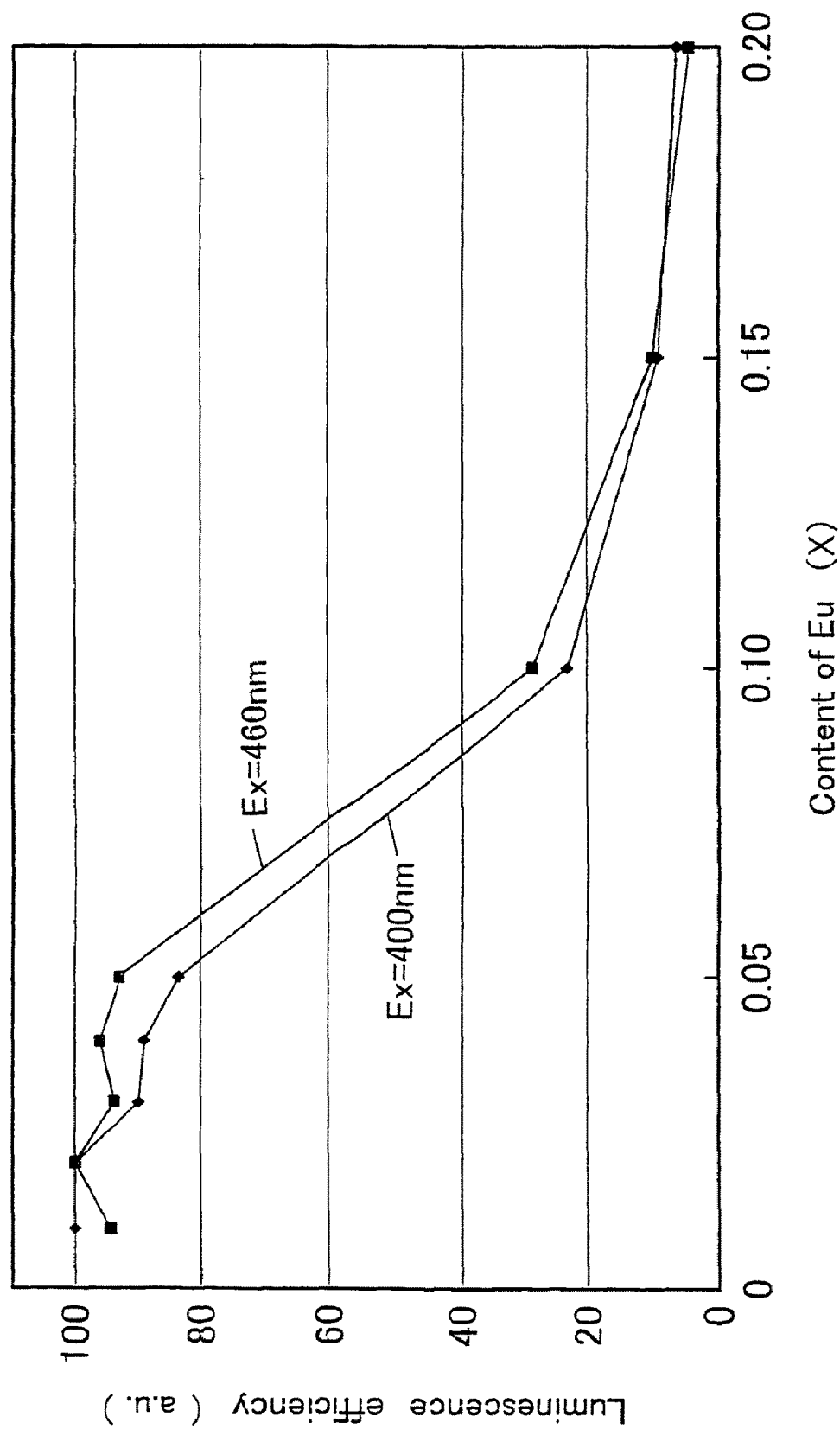
FIG. 49 is a chart showing the change of the peak intensity caused by the change of the content of the activator R contained in the composition of the oxynitride phosphors.
Figure 50:
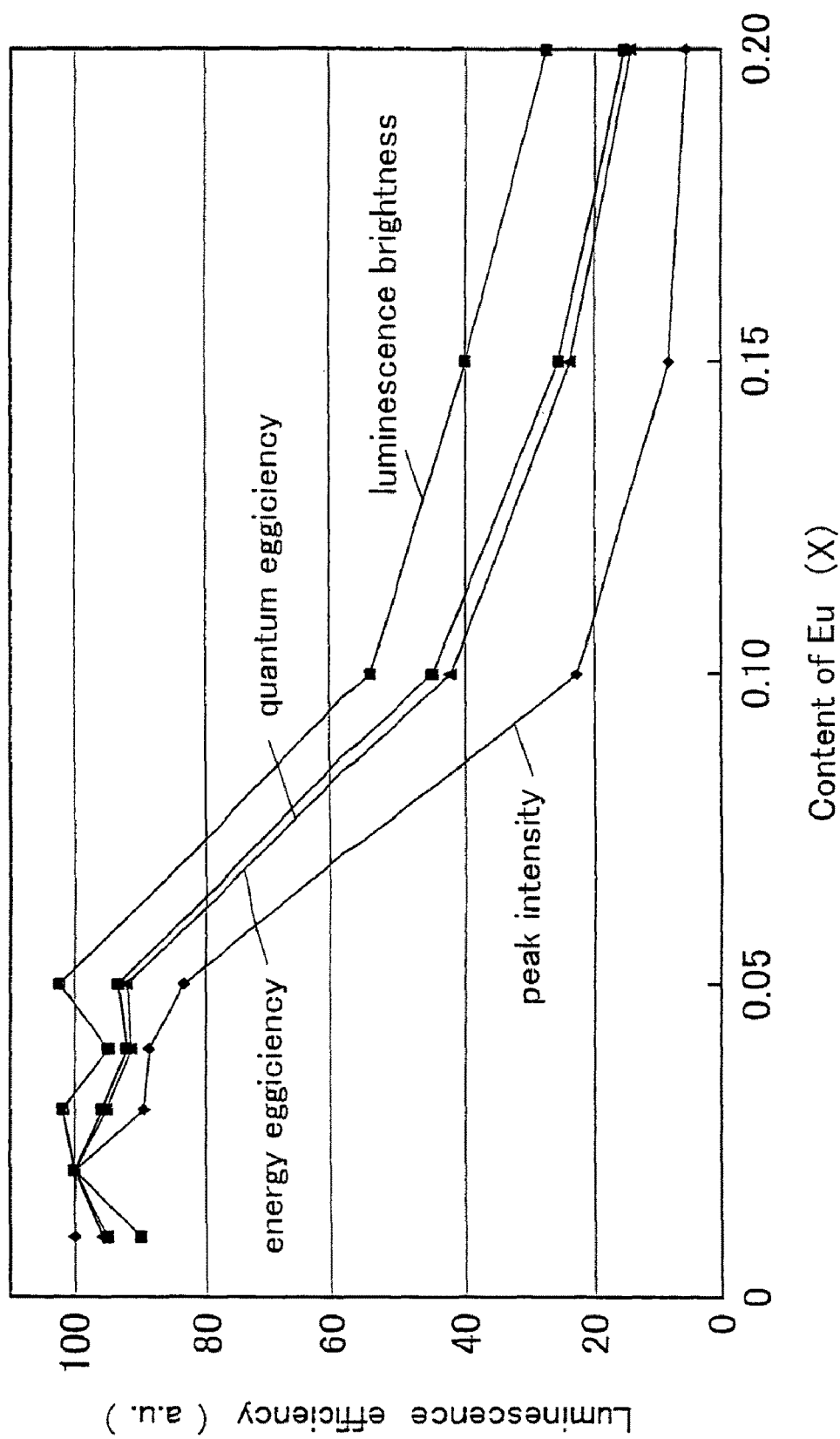
FIG. 50 is a chart showing the change of the luminescence efficiency caused by the change of the content of the activator R contained in the composition of the oxynitride phosphors.
Figure 51:
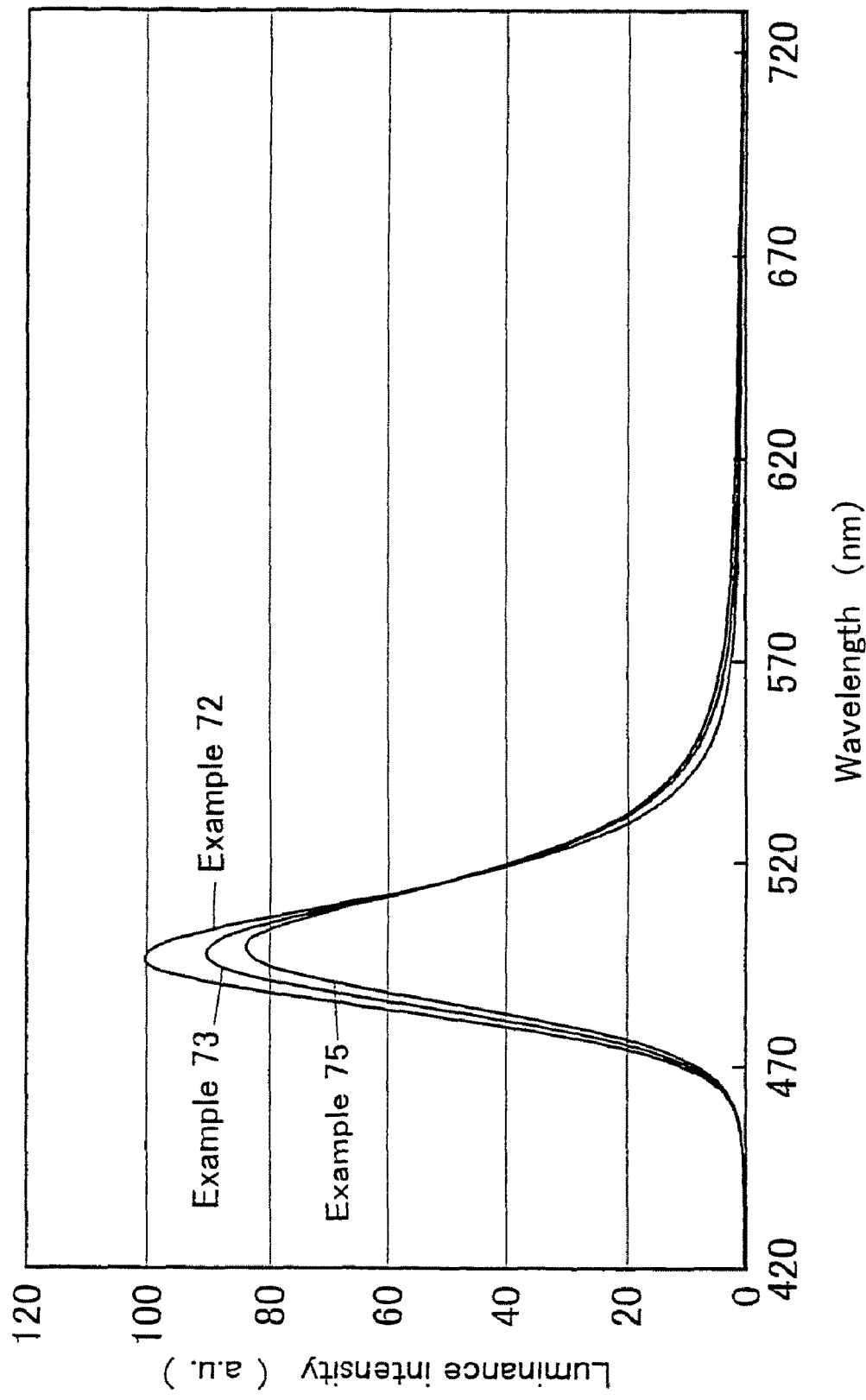
FIG. 51 is a chart showing the luminescence spectra when the oxynitride phosphors were excited at Ex=400 nm.
Figure 52:
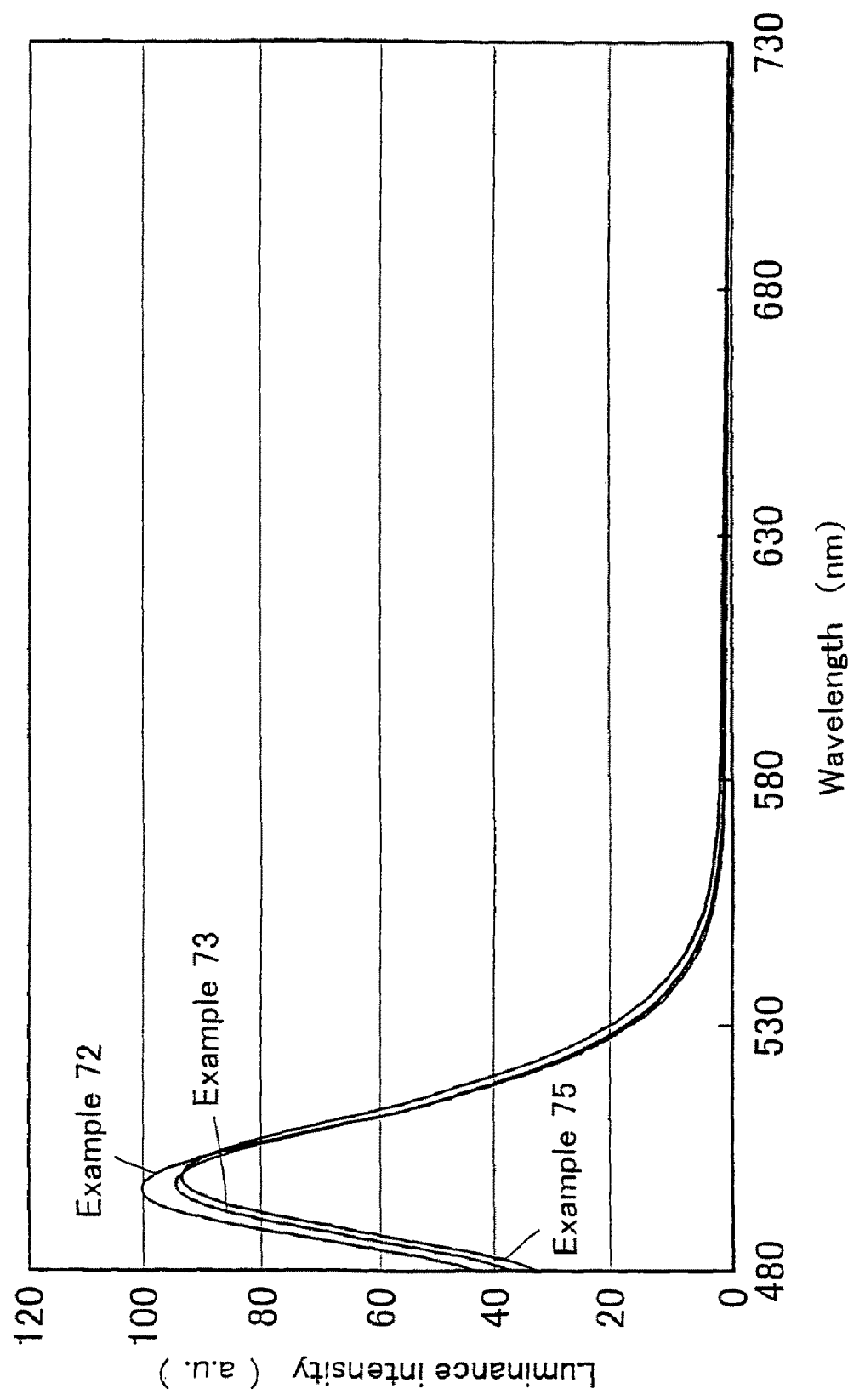
FIG. 52 is a chart showing the luminescence spectra when the oxynitride phosphors were excited at Ex=460 nm.
Figure 53:
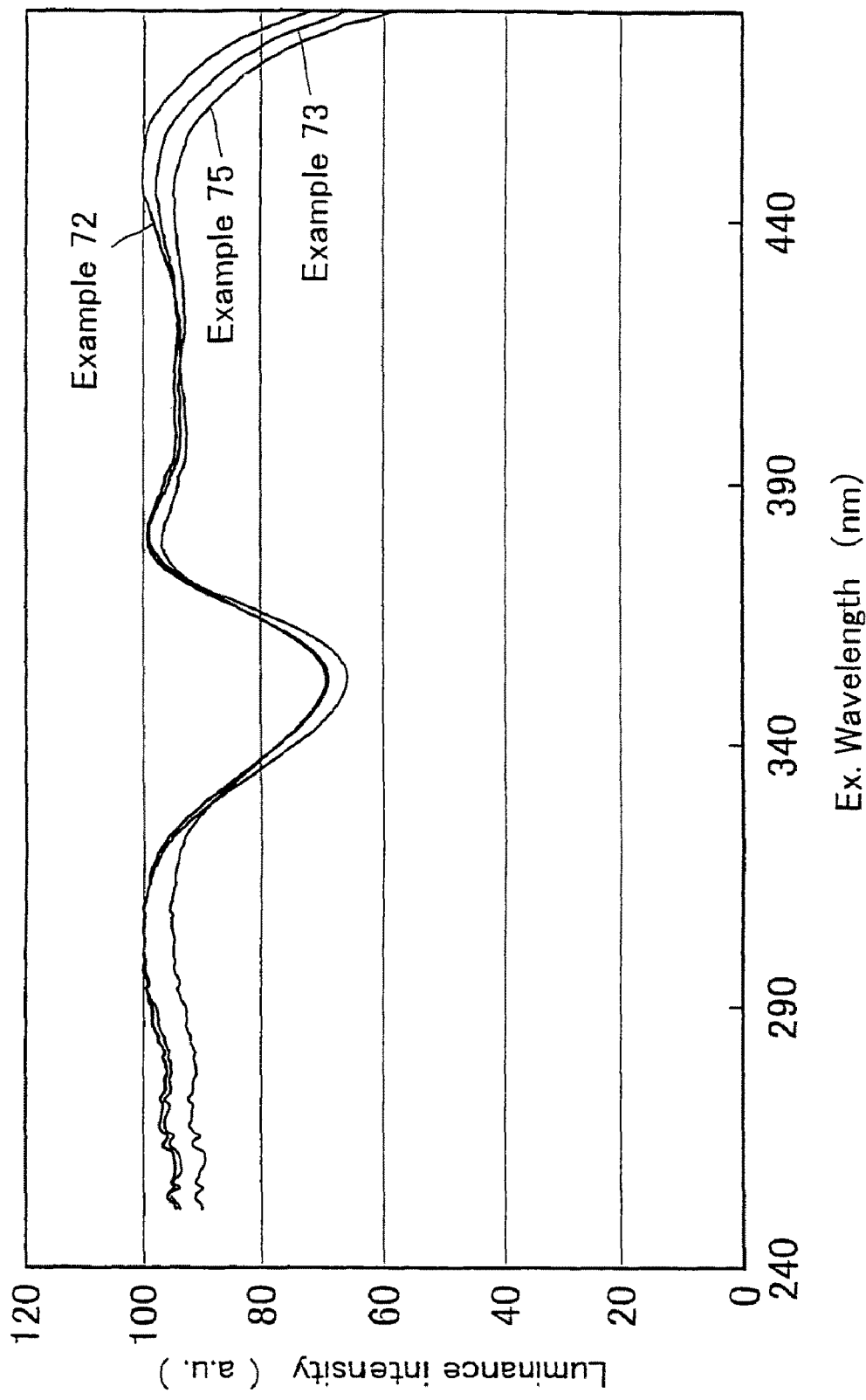
FIG. 53 is a chart showing the normalized excitation spectra of the oxynitride phosphors.
Figure 54:
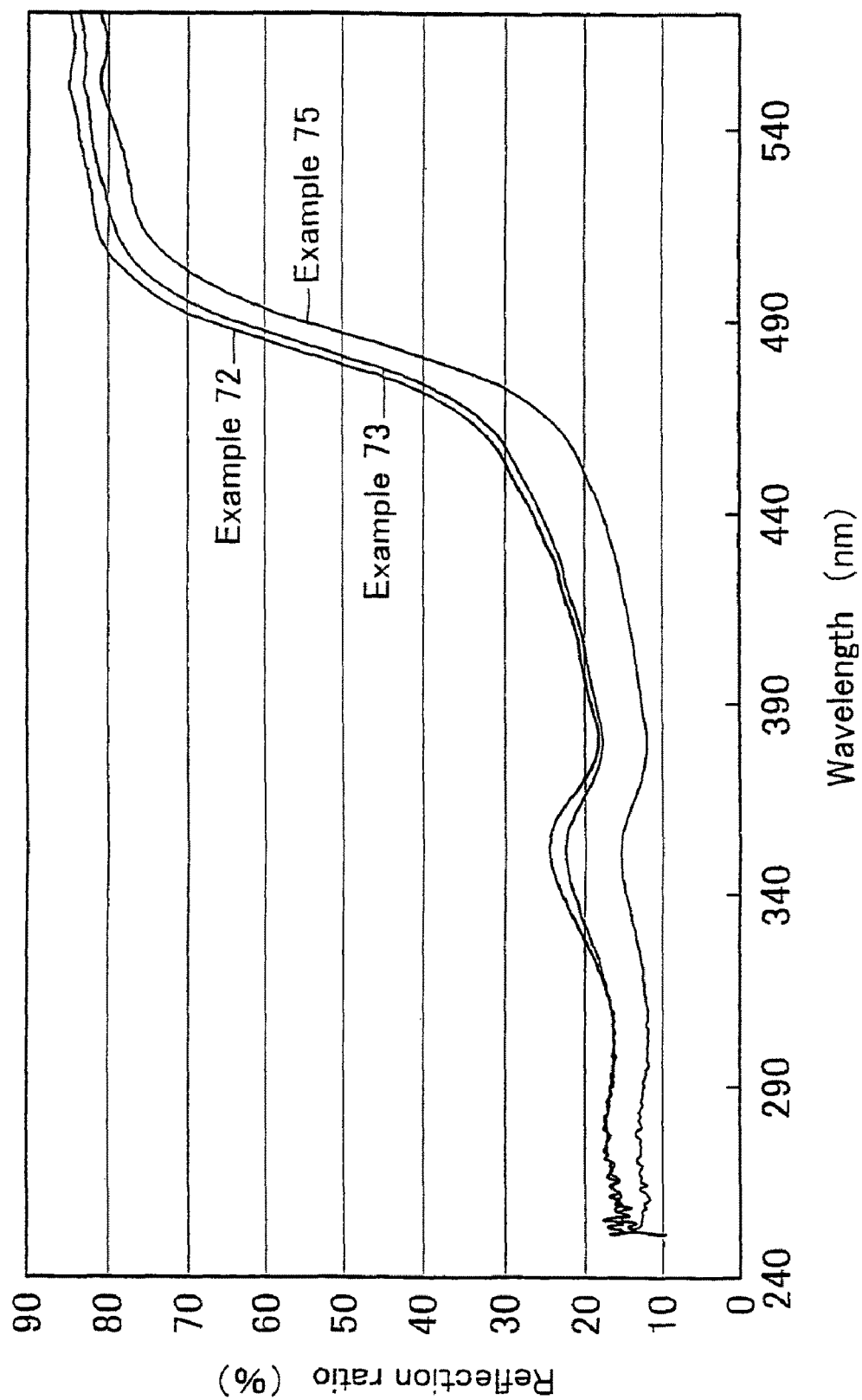
FIG. 54 are a chart showing the reflection spectra of the oxynitride phosphors.

Further, FIG. 49 is a chart showing the change of the peak intensity caused by the change of the content of the activator R contained in the composition of the oxynitride phosphors. The excitation light sources are lights nearby 400 nm and 460 nm. FIG. 50 is a chart showing the change of the luminescence efficiency caused by the change of the content of the activator R contained in the composition of the oxynitride phosphors. The excitation light source is light nearby 400 nm. FIG. 51 is a chart showing the luminescence spectra when the oxynitride phosphors were excited at Ex=400 nm. FIG. 52 is a chart showing the luminescence spectra when the oxynitride phosphors were excited at Ex=460 nm. FIG. 53 is a chart showing the normalized excitation spectra of the oxynitride phosphors. FIG. 54 are a chart showing the reflection spectra of the oxynitride phosphors.

TABLE 8

|  | | Ex = 400 nm | | | |
| --- | --- | --- | --- | --- | --- |
|  | Compounding ratio x of Eu | Luminescence peak (nm) | Color tone x | Color tone y | Peak intensity ( ) |
| Example 71 | 0.01 | 495 | 0.090 | 0.458 | 100.3 |
| Example 72 | 0.02 | 496 | 0.101 | 0.485 | 100.0 |
| Example 73 | 0.03 | 497 | 0.116 | 0.507 | 90.1 |
| Example 74 | 0.04 | 498 | 0.113 | 0.504 | 89.2 |
| Example 75 | 0.05 | 499 | 0.132 | 0.521 | 83.6 |
| Example 76 | 0.1 | 498 | 0.247 | 0.477 | 22.5 |
| Example 77 | 0.15 | 518 | 0.289 | 0.556 | 8.4 |
| Example 78 | 0.2 | 531 | 0.317 | 0.599 | 5.7 |
|  | Compounding ratio x of Eu | Luminescence brightness Y (%) | Energy efficiency E (%) | Quantum efficiency Q (%) | |
| Example 71 | 0.01 | 90.8 | 96.6 | 96.0 | |
| Example 72 | 0.02 | 100.0 | 100.0 | 100.0 | |
| Example 73 | 0.03 | 102.3 | 96.0 | 96.5 | |
| Example 74 | 0.04 | 95.7 | 92.1 | 92.6 | |
| Example 75 | 0.05 | 102.9 | 92.9 | 94.1 | |
| Example 76 | 0.1 | 54.4 | 42.3 | 45.0 | |
| Example 77 | 0.15 | 40.3 | 23.7 | 25.5 | |
| Example 78 | 0.2 | 27.7 | 14.2 | 15.3 | |
|  | Compounding ratio x of Eu | Ex = 460 nm | | | |
|  |  | Luminescence peak (nm) | Peak intensity ( ) | | |
| Example 71 | 0.01 | 495 | 95.2 | | |
| Example 72 | 0.02 | 496 | 100.0 | | |
| Example 73 | 0.03 | 498 | 94.2 | | |
| Example 74 | 0.04 | 498 | 96.7 | | |
| Example 75 | 0.05 | 499 | 93.3 | | |
| Example 76 | 0.1 | 500 | 28.2 | | |
| Example 77 | 0.15 | 504 | 9.1 | | |
| Example 78 | 0.2 | 536 | 4.0 | | |

Examples 71 to 78 are $BaSi_2O_2N_2$:Eu. When Examples 71 to 78 were irradiated using the excitation light source around 400 nm, the luminescence brightness, energy efficiency and quantum efficiency of other Examples are shown with their relative values based on the basis of Example 72 in which the luminescence brightness, energy efficiency and quantum efficiency were highest. When Examples 71 to 78 were irradiated using the excitation light source around 460 nm, the peak intensity of other Examples is shown with their relative values based on the basis of Example 72.

$Ba_3N_2$, $Si_3N_4$, $SiO_2$ and $Eu_2O_3$ were used as the raw materials. The production of the oxynitride phosphors of Examples 71 to 78 was carried out using these raw materials and the similar production process as Example 31. The production was carried out so that said raw materials are a fixed molar ratio. The theoretical composition of the oxynitride phosphors obtained is $Ba_{(1-X)}Eu_XSi_2O_2N_2$ (0<X<1). The portion of Ba is substituted with Eu. The compounding molar ratio of Eu in Table shows the molar ratio of Eu.

When the % by weight of O and N in the oxynitride phosphor of Example 72 was measured, O and N were contained by 11.3% by weight and 10.6% by weight respectively. The weight ratio of O to N is O:N=1:0.94.

Any of the calcined products of Examples 71 to 78 is crystalline powder or granules. The particle diameter was nearly 1 to 8 μm.

The excitation spectra of the oxynitride phosphors of Examples 71 to 78 were measured. As a result of the measurement, they are strongly excited at 290 nm to 480 nm.

The oxynitride phosphors of Examples 71 to 78 were excited by Ex=400 nm. The oxynitride phosphor of Example 72 has a luminescence color at a green region of the color tone, x=0.101 and the color tone y=0.485. The oxynitride phosphor of Example 75 has a luminescence color at a green region of the color tone, x=0.132 and the color tone y=0.521. When the compounding ratio of Eu is increased, the color tone x is shifted to a right direction and the color tone y is shifted to an up direction in the chromaticity coordinate. The high luminescence brightness was highest in case of Example 75, and the energy efficiency and quantum efficiency were highest in case of Example 72. Hereat, Examples 71 to 75 can provide the oxynitride phosphor having a desired color tone while keeping the high luminescence brightness and high quantum efficiency.

The oxynitride phosphors of Examples 71 to 78 were excited by Ex=460 nm. Since Ex=460 nm is a wavelength region which is often used in a blue light-emitting element, excitation was carried out at said wavelength region. As a result, the oxynitride phosphor of Example 72 has the highest peak intensity.

Further, the temperature properties of Examples 71 to 78 were excellent. The temperature properties of Examples 71 to 78 were 90% or more at 100° C. They were 65% or more at 200° C.

When the X-ray diffraction images of these oxynitride phosphors were measured, any image shows a sharp diffraction peak, and it was cleared that the phosphors obtained were crystalline compounds having regularity. The crystal structure was the orthorhombic system.

Example 79

Figure 55:
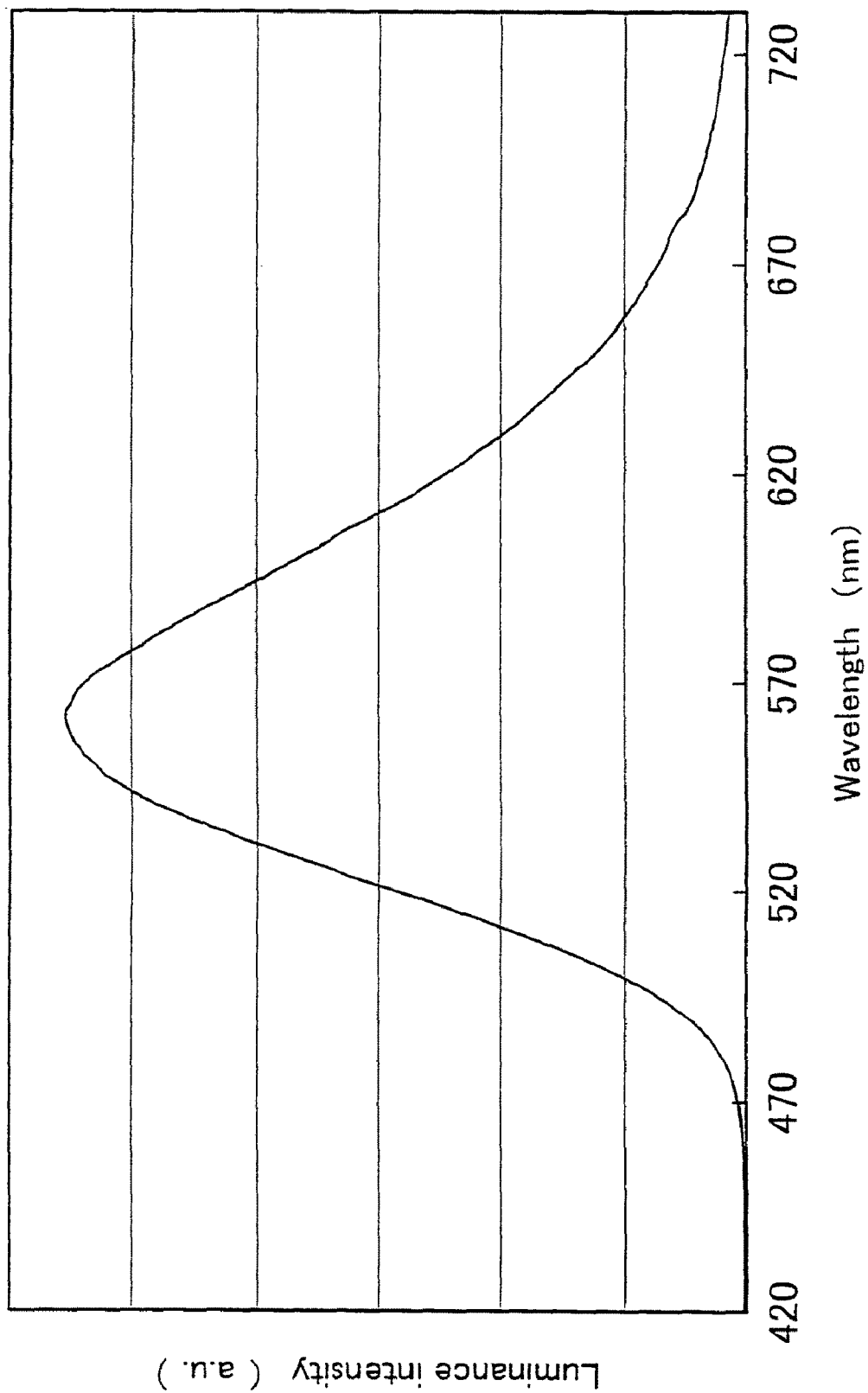
FIG. 55 is a chart showing the luminescence spectrum when the oxynitride phosphor of Example 79 was excited at Ex=400 nm.
Figure 56:
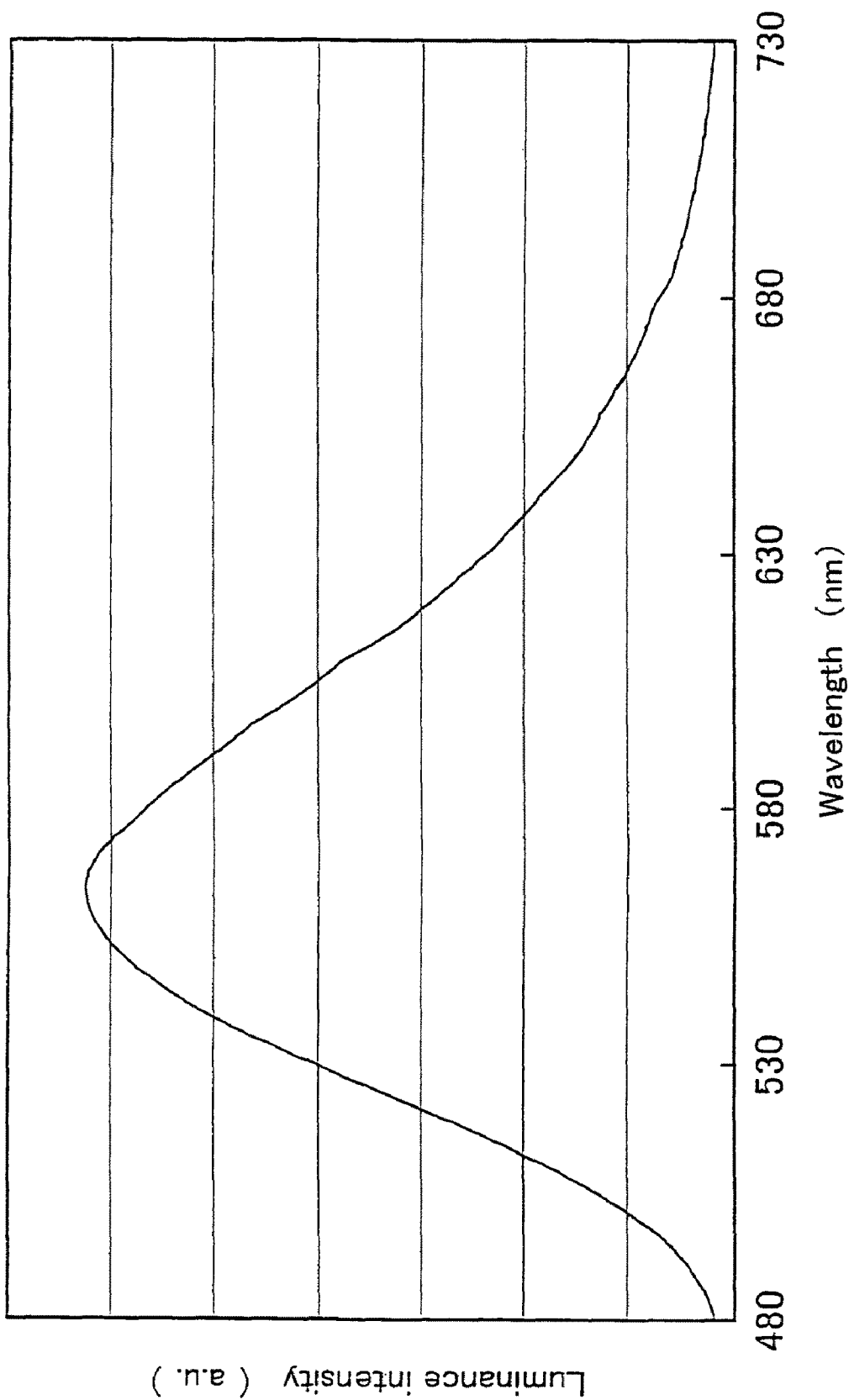
FIG. 56 is a chart showing the luminescence spectrum when the oxynitride phosphor of Example 79 was excited at Ex=460 nm.
Figure 57:
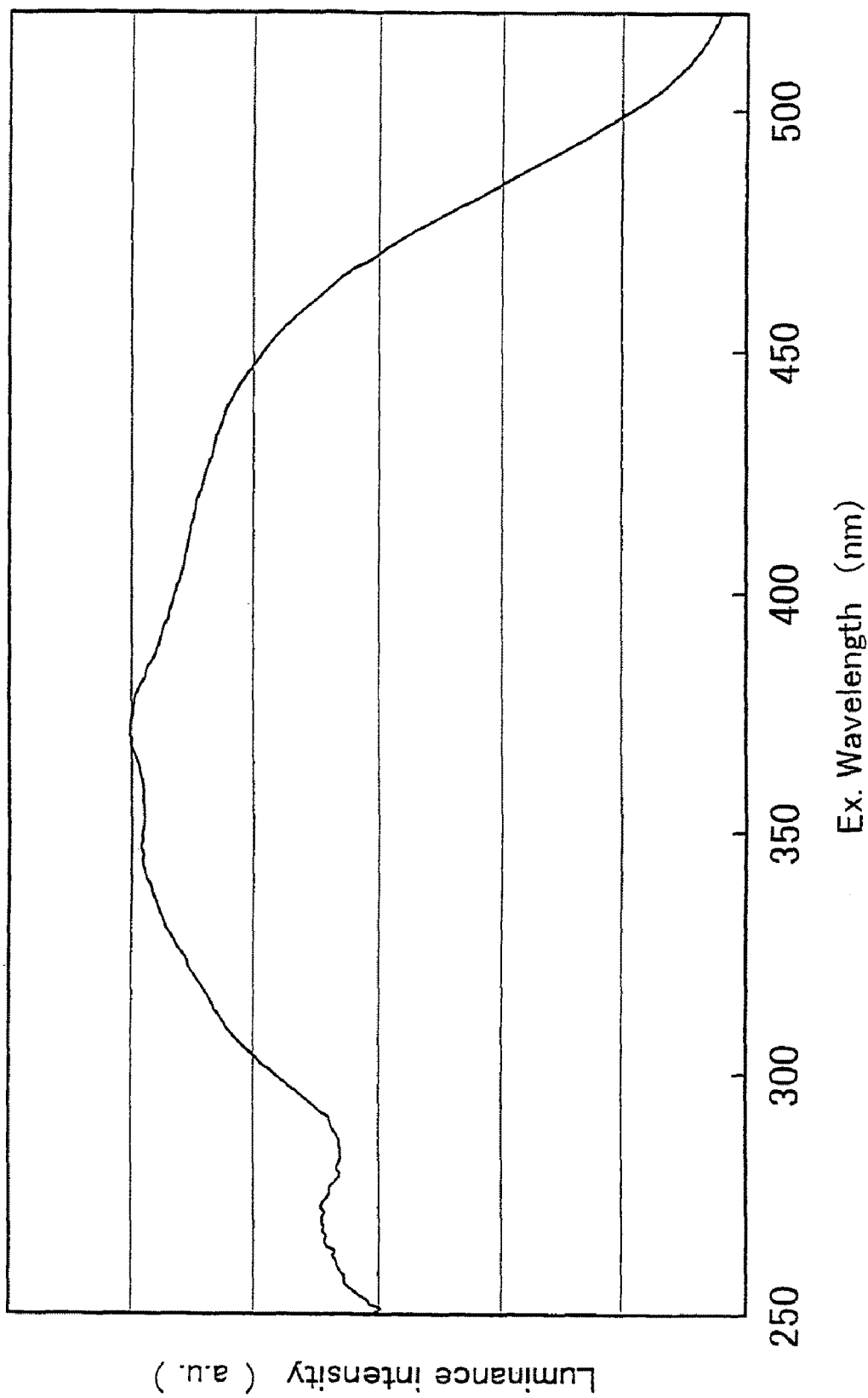
FIG. 57 is a chart showing the normalized excitation spectrum of the oxynitride phosphor of Example 79.
Figure 58:
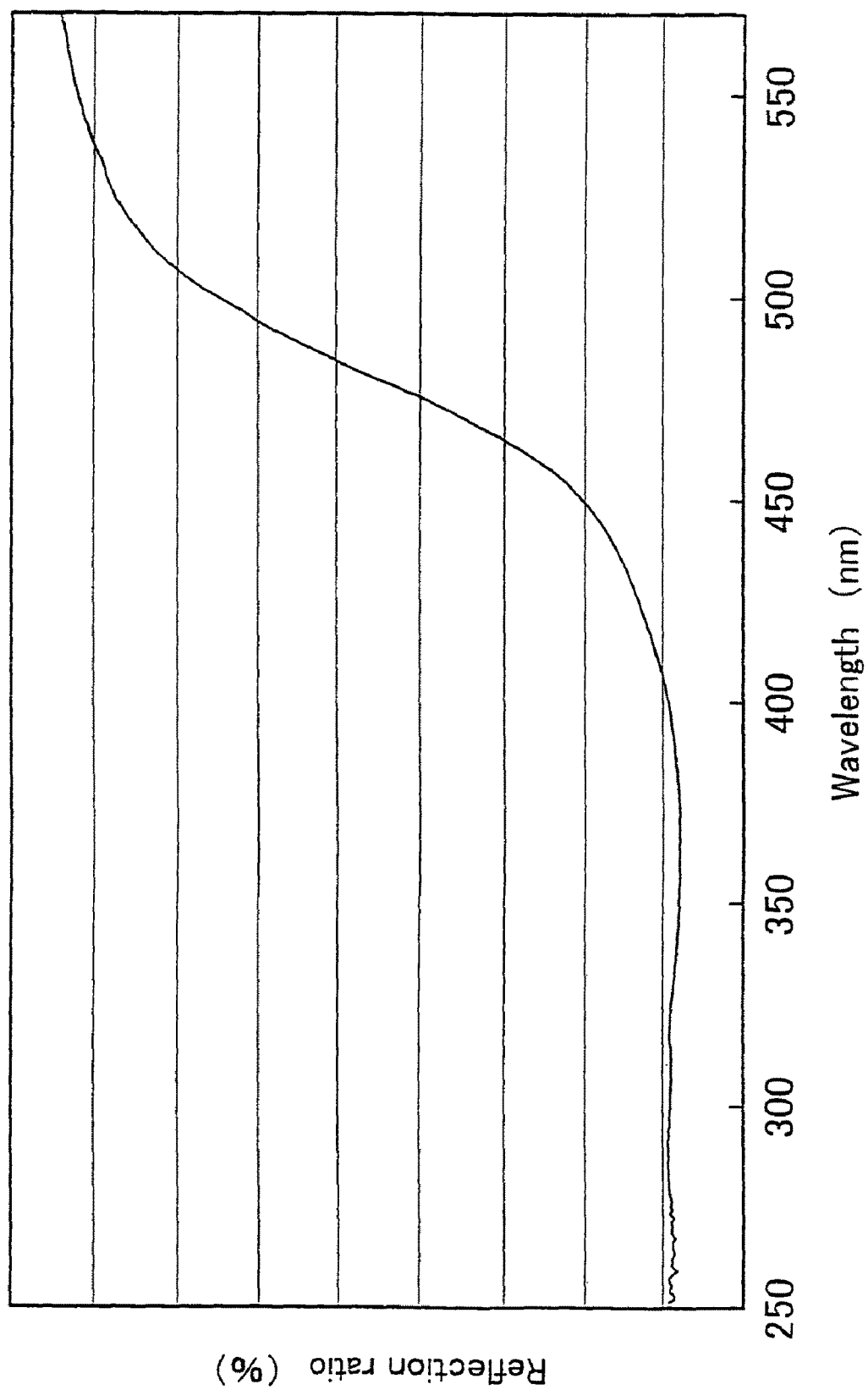
FIG. 58 is a chart showing the reflection spectrum of the oxynitride phosphor of Example 79.
Figure 59:
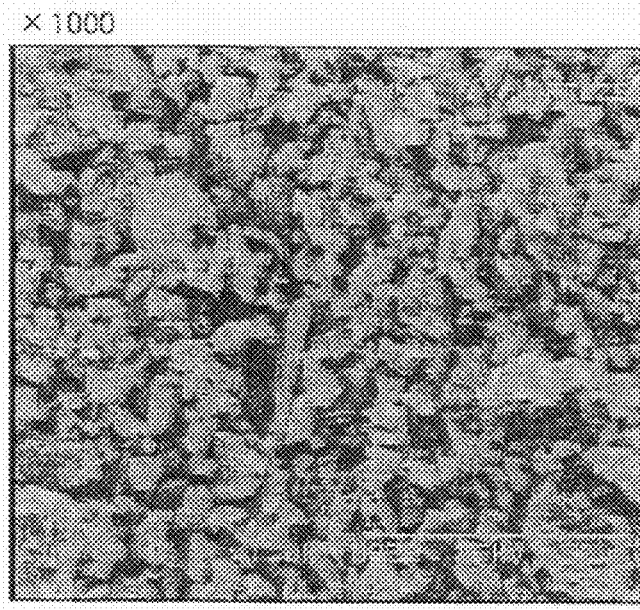
FIG. 59A is an SEM photo photographed the oxynitride phosphor of Example 79 at a magnification of 1000-fold.
FIG. 59B is an SEM photo photographed the oxynitride phosphor of Example 79 at a magnification of 10000-fold.
Figure 59:
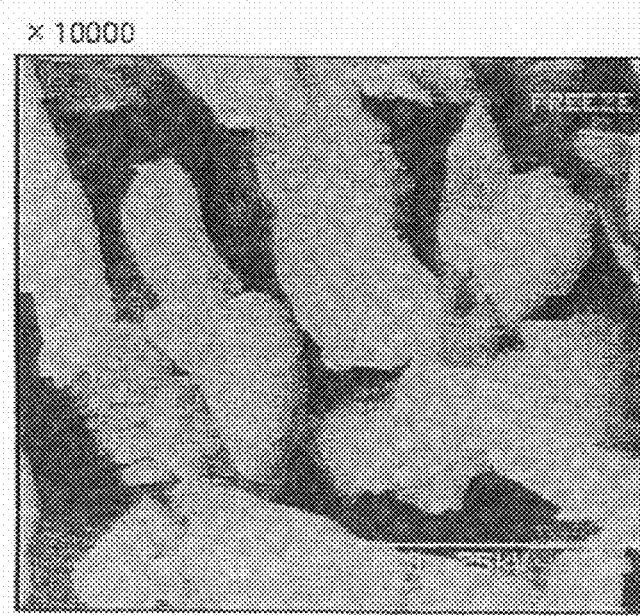
Figure 60:
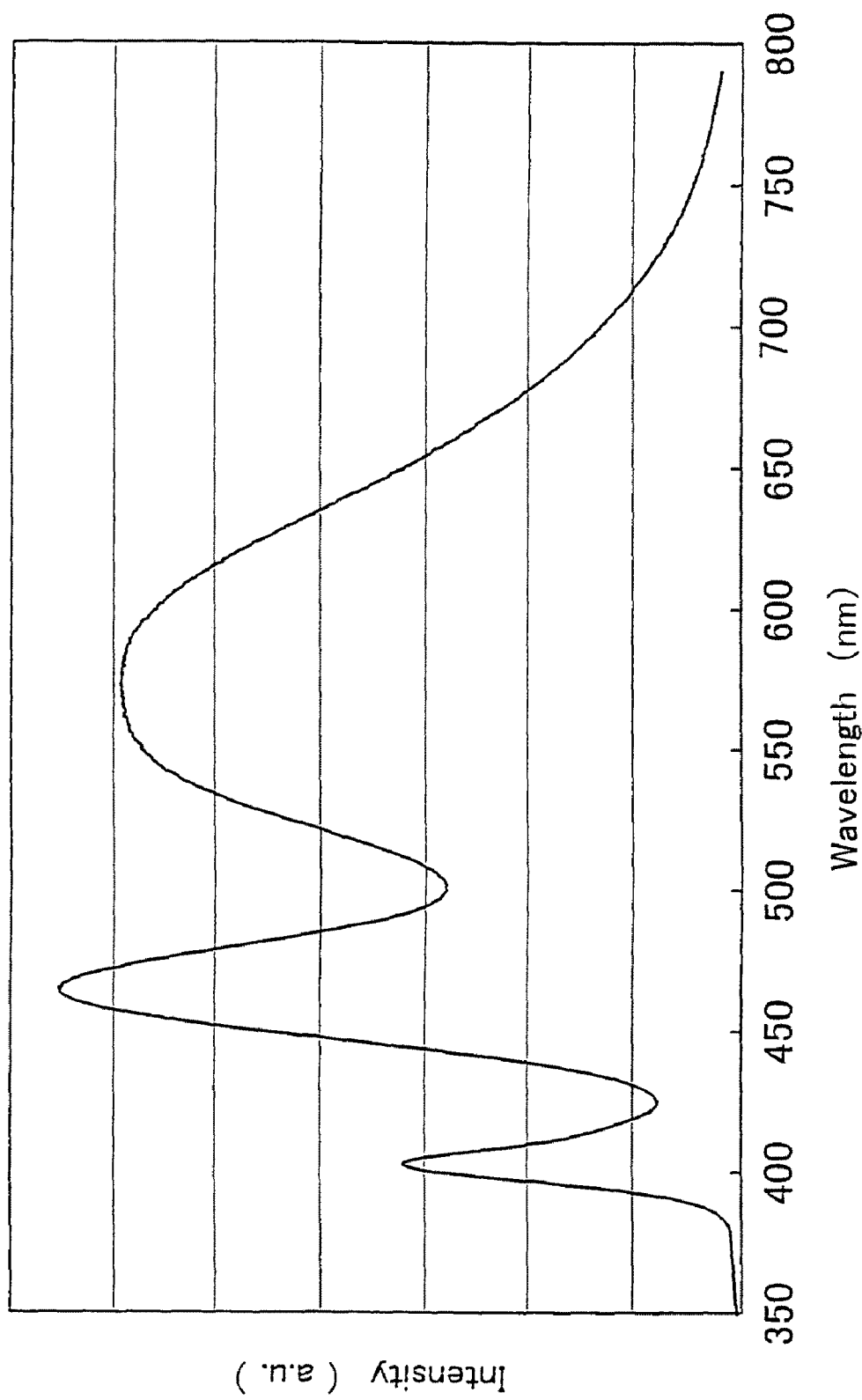
FIG. 60 is a chart showing the luminescence spectrum of the light-emitting device 1 related to the present invention.

FIG. 55 is a chart showing the luminescence spectrum when the oxynitride phosphor of Example 79 was excited at Ex=400 nm. FIG. 56 is a chart showing the luminescence spectrum when the oxynitride phosphor of Example 79 was excited at Ex=460 nm. FIG. 57 is a chart showing the excitation spectrum of the oxynitride phosphor of Example 79. FIG. 58 is a chart showing the reflection spectrum of the oxynitride phosphor of Example 79. FIG. 59A is an SEM photo photographed the oxynitride phosphor of Example 79 at a magnification of 1000-fold. FIG. 59B is an SEM photo photographed the oxynitride phosphor of Example 79 at a magnification of 10000-fold.

Example 79 is $CaSi_2O_2N_2$:Eu.

Firstly, $Ca_3N_2$, $Si_3N_4$, $SiO_2$ and $Eu_2O_3$ were used as the raw materials. Said raw materials were respectively crushed at 0.1 to 3.0 μm. After the crushing, Example 79 used the undermentioned amounts of raw materials.

$Ca_3N_2$: 6.01 g
$Si_3N_4$: 5.99 g
$SiO_2$: 7.36 g
$Eu_2O_3$: 0.66 g

After weighing the above-mentioned amounts, production was carried out by the similar production process as Examples 31 to 56. The compounding ratio of Eu of Example 79 is 0.43% by mol.

In Example 79, the mix ratio (molar ratio) of the raw materials is $Ca_3N_2:Si_3N_4:SiO_2:Eu_2O_3=1:1.05:3.02:0.046$.

The objective oxynitride phosphor was obtained thereby. The theoretical composition of the oxynitride phosphor obtained is $CaSi_2O_2N_2$:Eu.

When the % by weight of O and N in the oxynitride phosphor of Example 79 was measured, O and N were contained by 18.8% by weight and 17.1% by weight respectively. The weight ratio of O to N is O:N=1:0.94.

The oxynitride phosphors of Example 79 was excited by Ex=400 nm. The oxynitride phosphor of Example 79 has a luminescence color at a yellow green region of the color tone, x=0.434 and the color tone y=0.543. Further, the temperature properties of Example 79 were excellent.

When the X-ray diffraction images of these oxynitride phosphors were measured, any image shows a sharp diffraction peak, and it was cleared that the phosphors obtained were crystalline compounds having regularity. The crystal structure was the orthorhombic system.

Example 80

Light-Emitting Device

Figure 61:
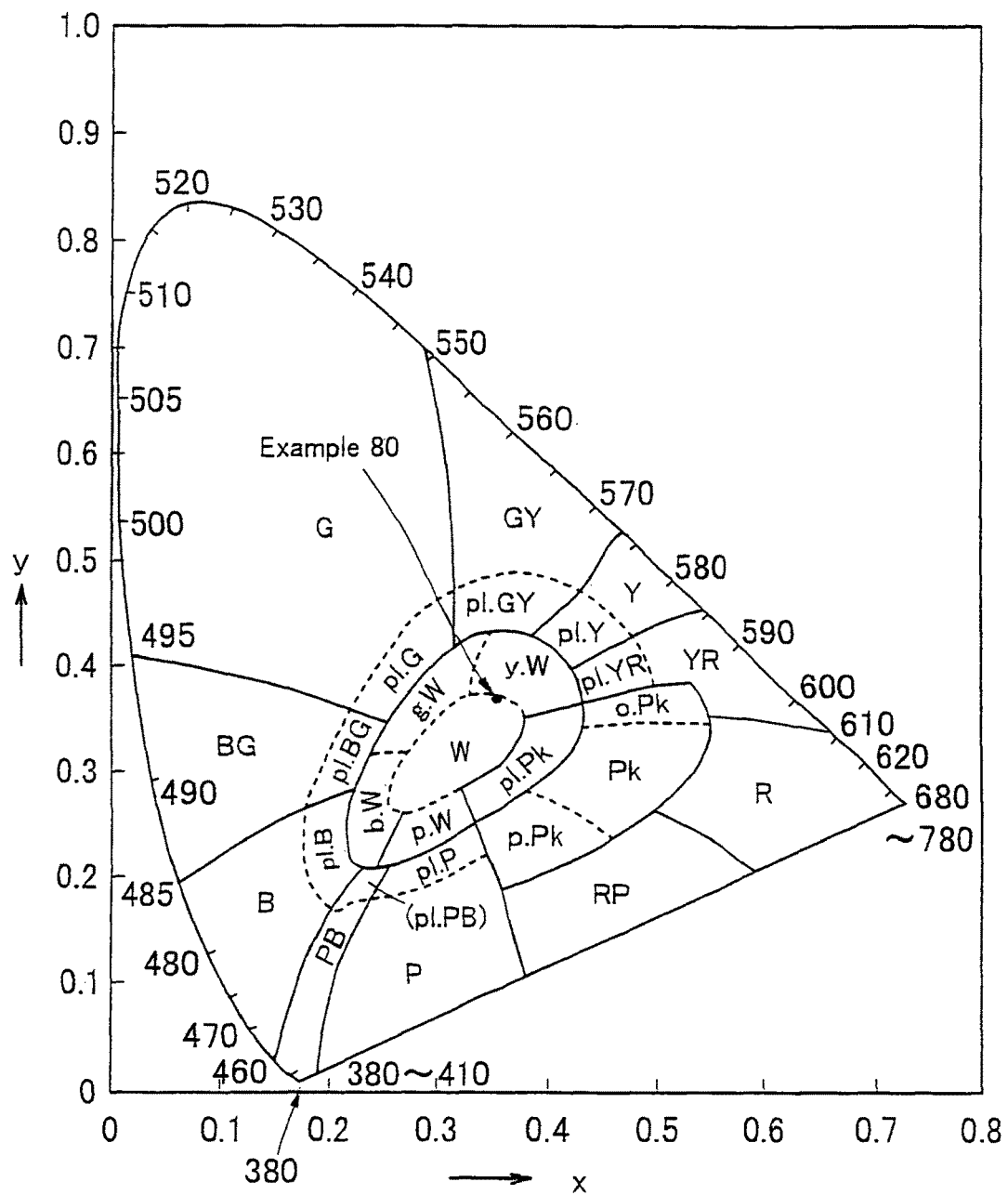
FIG. 61 is a chromaticity chart showing the chromaticity coordinate of the light-emitting device 1 related to the present invention.

The light-emitting device of Example 80 was produced using the above-mentioned oxynitride phosphor. As the excitation light source, the light-emitting element having the luminescence spectrum of 400 nm. As the phosphor, $CaSi_2O_2N_2$:Eu of Example 79, $Ca_2Si_5N_8$:Eu and $(Ca_{0.93}, Eu_{0.05}, Mn_{0.02})_{10}(PO_4)_6Cl_2$ are used. The light-emitting device of Example 80 is a structure shown in FIG. 1. FIG. 26 is a plane view showing the light-emitting element related to the present invention. FIG. 27 is a section view showing the A-A' of the light-emitting element related to the present invention. FIG. 61 is a chromaticity chart (JIS Z8110) showing the chromaticity coordinate of the light-emitting device 1 related to the present invention.

In the light-emitting device of Example 80, the similar light-emitting element as that used in the light-emitting device of Example 28 was used.

The properties of the light-emitting device 1 of Example 80 are shown in Table 9.

TABLE 9

| | Current If (mA) | Voltage Vf (V) | Radiation analysis Radiometric (mW) | Luminous intensity measurement Photometric (lm) | Peak wavelength Peak (nm) |
|---|---|---|---|---|---|
| Light emitting device | 20 | 3.4 | 6.2 | 1.84 | 464 |

| | Color tone x | Color tone y | Color temperature Tcp(K) | Average color rendering Ra | Lump efficiency (lm/W) |
|---|---|---|---|---|---|
| Light emitting device | 0.356 | 0.368 | 4690 | 82.2 | 27.1 |

The light-emitting device of Example 80 constituted as above exhibits a luminescence color at a white region. The light-emitting device of Example 80 exhibits a luminescence spectrum having the luminescence peak wavelengths at 360 to 430 nm, 430 to 500 nm and 500 to 730 nm. More specifically, it exhibits a luminescence spectrum having the luminescence peak wavelengths at 390 to 410 nm, 455 to 475 nm and 550 to 600 nm. The phosphors excited by the light-emitting element at 400 nm excitation have respectively the luminescence peak wavelengths at a green region in case of $CaSi_2O_2N_2$:Eu of Example 79, at a yellow to red region in case of $Ca_2Si_5N_8$:Eu, and at a blue region in case of $(Ca_{0.93}, Eu_{0.05}, Mn_{0.02})_{10}(PO_4)_6Cl_2$. It exhibits a luminescence color at a white region by the color mixture of lights from these phosphors. It emits white light with various color tastes by changing the compounding amounts of these phosphors. Accordingly, when the light-emitting device having a fixed white light using ultraviolet light as an excitation light source is produced, the luminescence color can be changed by only changing the kind of phosphors, compounding ratio and the like.

Example 81

Light-Emitting Device

The light-emitting device of Example 81 relates to a white color light-emitting device using a light-emitting element having the luminescence peak wavelength at 460 nm, as an excitation light source, and is constituted in like manner as Example 29, except for using the phosphor 11 which mixes the oxynitride phosphor of Example 31 and the nitride phosphor represented by $CaSrSi_5N_8$:Eu, in the light-emitting device of Example 29 (the structure of FIG. 1).

When current is run in the light-emitting device of Example 81, the blue light-emitting element 10 having the luminescence spectrum with a peak wave length at about 460 nm emits light. The phosphor 11 which covers the semiconductor layer 2 carries out the conversion of color tone. As a result, there can be provided the light-emitting device of Example 81 which emits white light.

Namely, the portion of light from the light-emitting element 10 transmits the light-emitting device of Example 81. Further, the portion of light from the light-emitting element 10 excites the phosphor 11, the phosphor 11 carries out the wavelength conversion, and red light is emitted from the green color of the oxynitride phosphor and the yellow red color of the nitride phosphor. There can be provided the light-emitting device which emits white light, by the color mixture of blue light from these light-emitting elements 10, green light from the oxynitride phosphor, and yellow red to red light from the nitride phosphor.

Example 82

Light-Emitting Device

The light-emitting device of Example 82 is constituted in like manner as the light-emitting device of Example 30 except for changing the phosphors below in the light-emitting device of Example 30.

Namely, in the light-emitting device of Example 82, the nitride phosphor of $Ca_2Si_5N_8$:Eu and the phosphor of $(Ca_{0.95}, Eu_{0.05})_{10}(PO_4)_6Cl_2$ are introduced in the cap 16, and the oxynitride phosphor of Example 33 is used as the phosphor 11 in the cup of the mount lead 13a. Further, it is similar as Example 30 that all of the phosphors may be contained in the cap 16.

In the light-emitting device of Example 82 thus constituted, the portion of light released from the light-emitting element 10 excites the oxynitride phosphor of the phosphor 11 to emit green light. Further, the portion of light emitted from the light-emitting element 10 or the portion of light emitted from the oxynitride phosphor excites the phosphor of the cap 16, and red light is emitted from blue and yellow. The green light of the oxynitride phosphor is mixed with the red light from the blue color and yellow color of the phosphor of the cap 16, and as a result, white light is released from the surface of the cap 16.

Examples 83 to 87 below are Examples related to Embodiment 6 related to the present invention.

Examples 83 to 87

Figure 63:
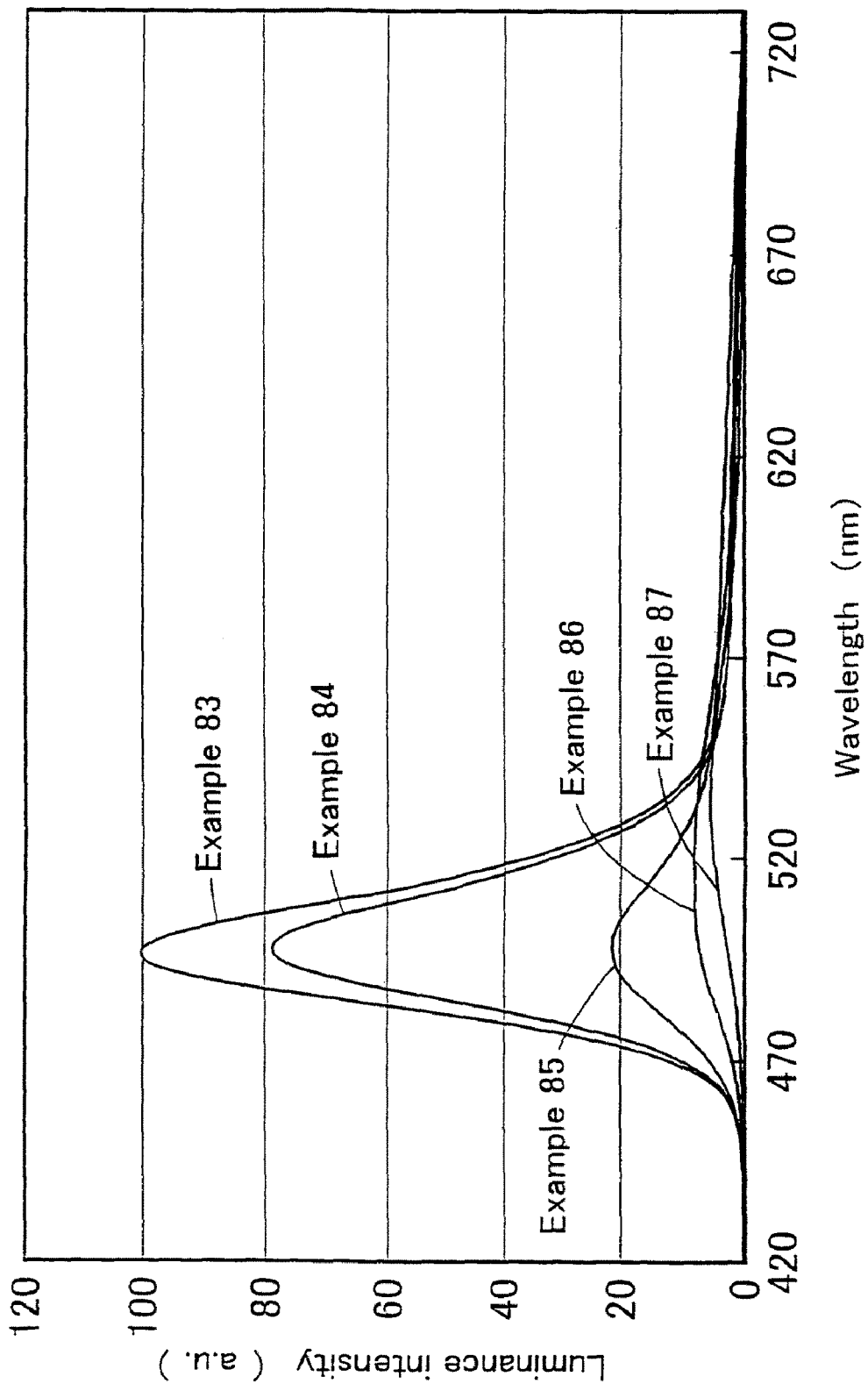
FIG. 63 is a chart showing the luminescence spectra when the oxynitride phosphors of Examples 83 to 87 were excited at Ex=400 nm.
Figure 64:
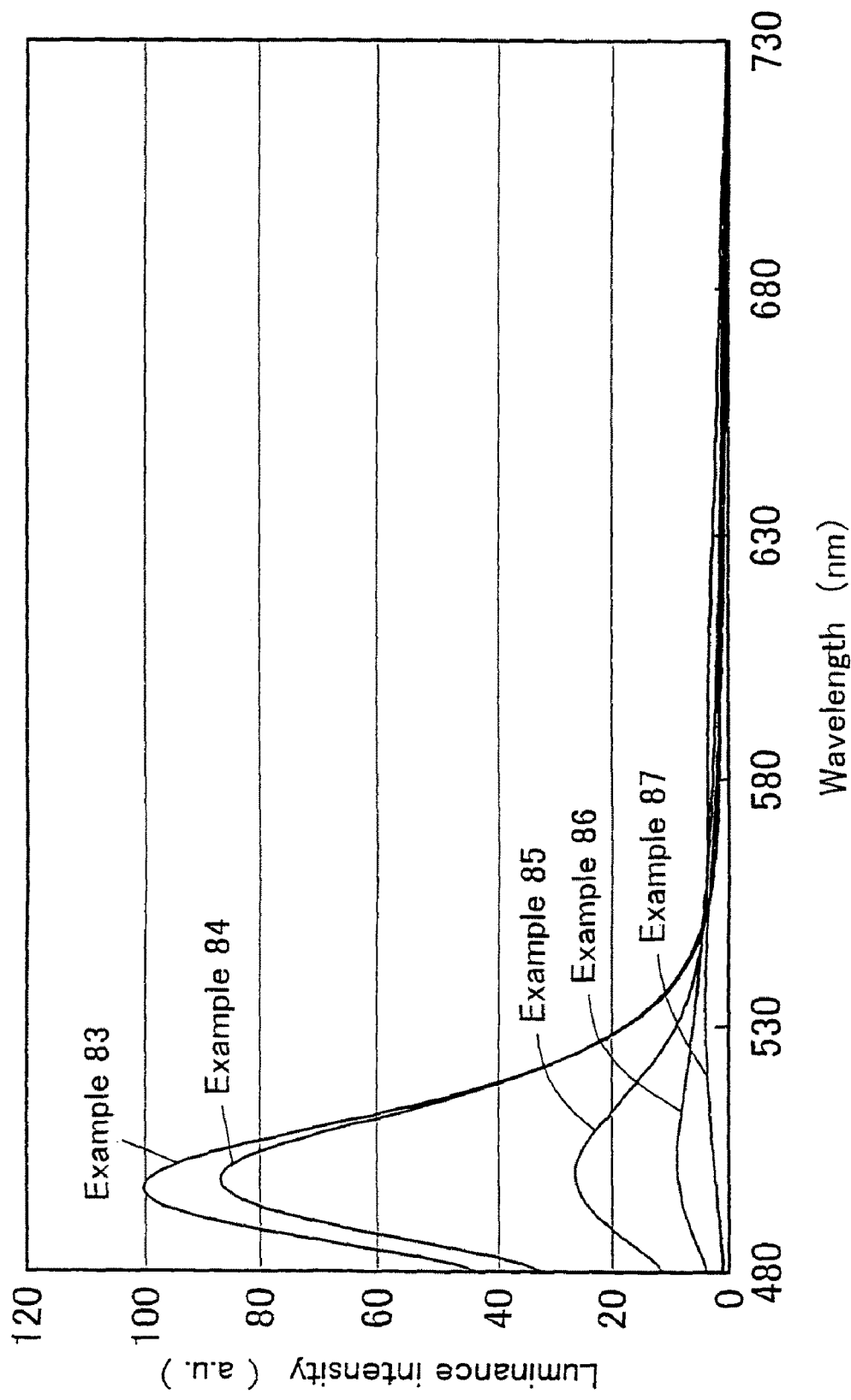
FIG. 64 is a chart showing the luminescence spectra when the oxynitride phosphors of Examples 83 to 87 were excited at Ex=460 nm.
Figure 65:
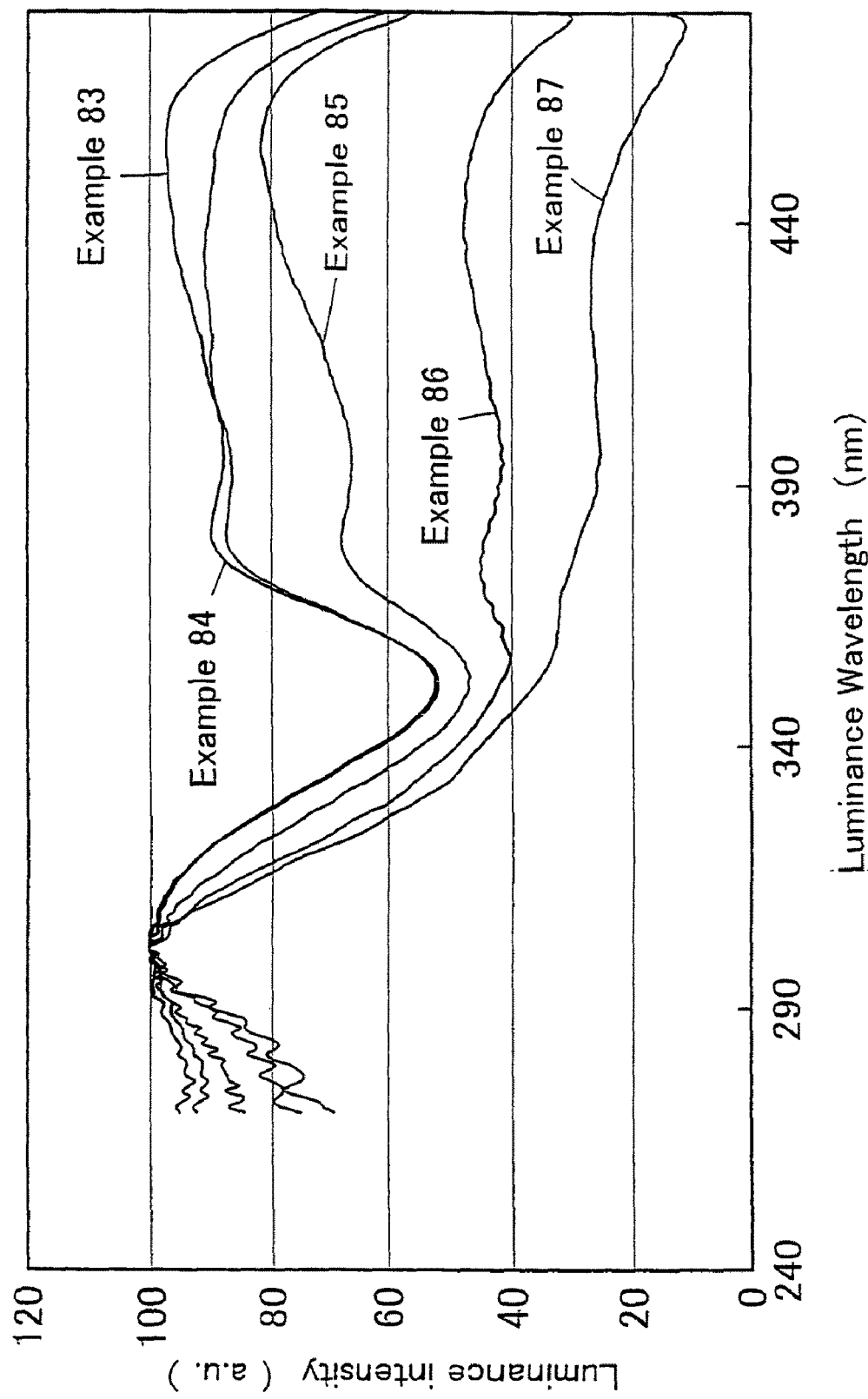
FIG. 65 is a chart showing the excitation spectra of the oxynitride phosphors of Examples 83 to 87.
Figure 66:
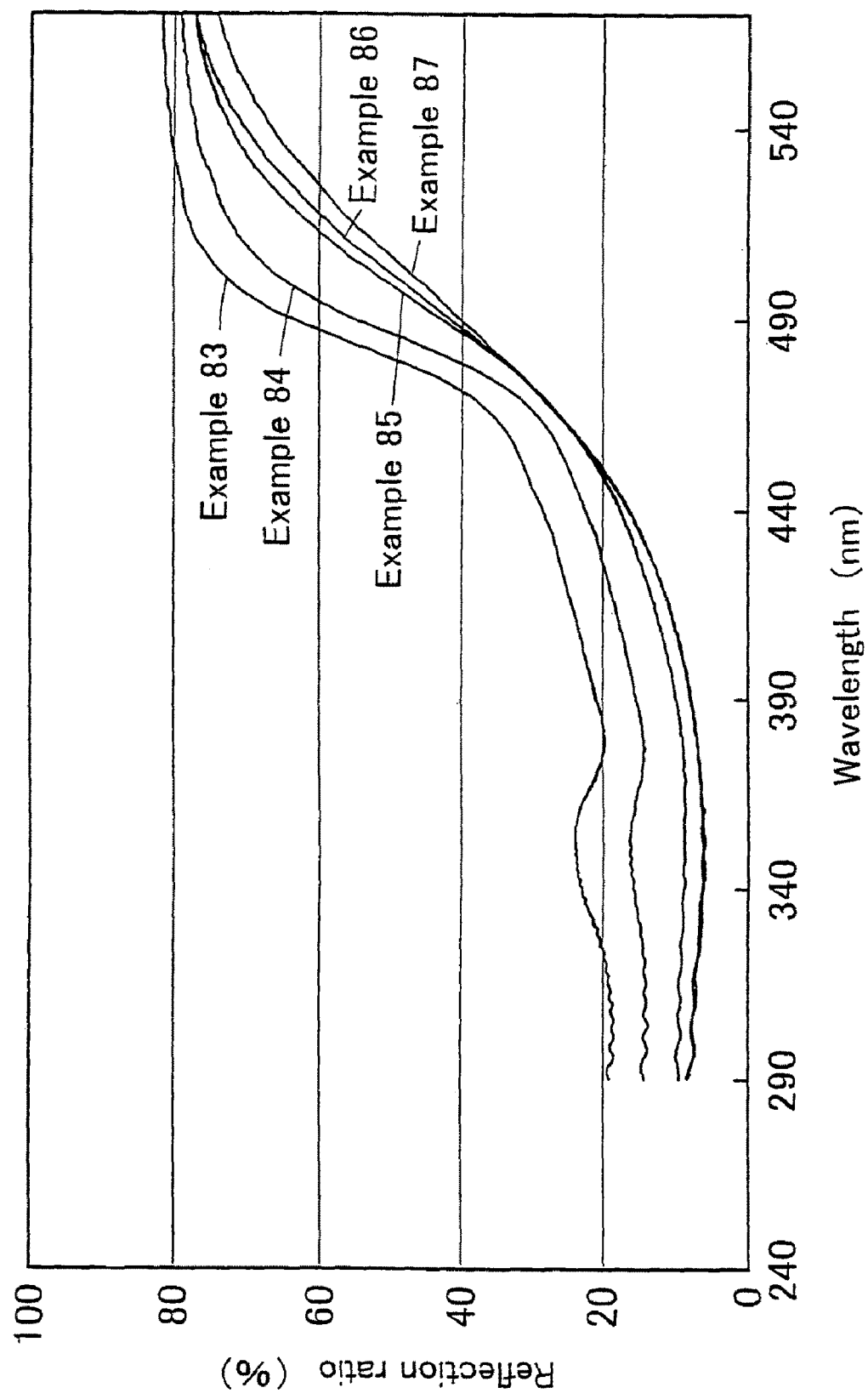
FIG. 66 is a chart showing the reflection spectra of the oxynitride phosphors of Examples 83 to 87.
Figure 67:
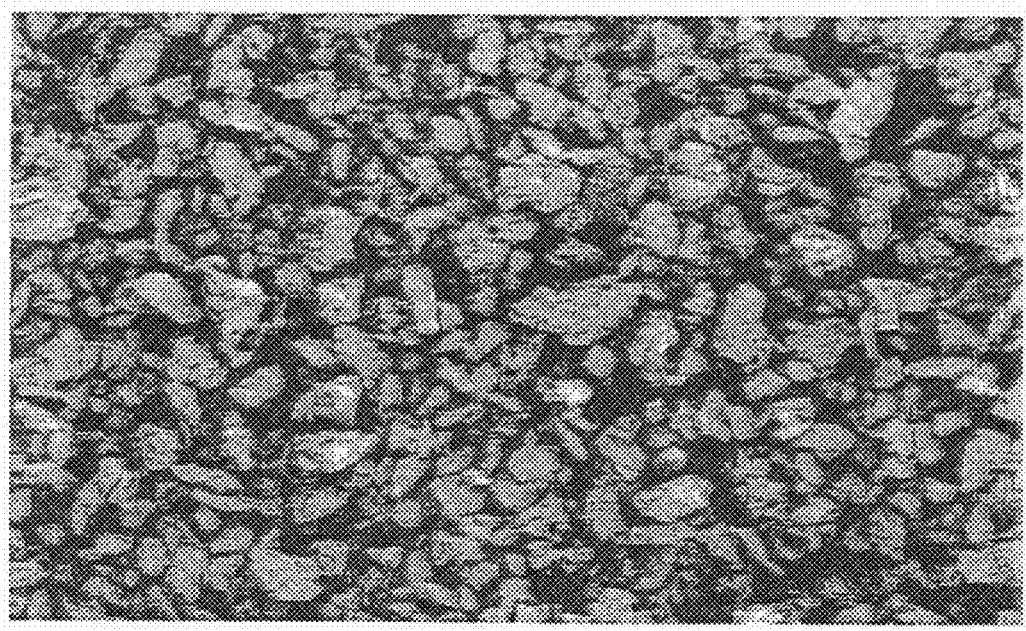
FIG. 67 is an SEM photo photographing the oxynitride phosphor of Example 83.
Figure 67:

FIG. 63 is a chart showing the luminescence spectra when the oxynitride phosphors of Examples 83 to 87 were excited at Ex=400 nm. FIG. 64 is a chart showing the luminescence spectra when the oxynitride phosphors of Examples 83 to 87 were excited at Ex=460 nm. FIG. 65 is a chart showing the excitation spectra of the oxynitride phosphors of Examples 83 to 87. FIG. 66 is a chart showing the reflection spectra of the oxynitride phosphors of Examples 83 to 87. FIG. 67 is an SEM photo photographing the oxynitride phosphor of Example 83. FIG. 67(a) is an SEM photo photographed at a magnification of 1000-fold, and FIG. 67(b) is an SEM photo photographed at a magnification of 5000-fold.

In Examples 83 to 87, the portion of Ba is substituted with Eu, and said Eu concentration is changed. Example 83 is $Ba_{0.97}Eu_{0.03}Si_2O_2N_2$. Example 84 is $Ba_{0.95}Eu_{0.05}Si_2O_2N_2$. Example 85 is $Ba_{0.90}Eu_{0.10}Si_2O_2N_2$. Example 86 is $Ba_{0.85}Eu_{0.15}Si_2O_2N_2$. Example 87 is $Ba_{0.80}Eu_{0.20}Si_2O_2N_2$.

Firstly, $Ba_3N_2$, $Si_3N_4$, $SiO_2$ and $Eu_2O_3$ were used as the raw materials. Said raw materials were crushed at 0.1 to 3.0 µm. Example 83 used the under-mentioned amounts of the raw materials so as to be the above-mentioned composition after crushing. Wherein a molar ratio of Eu to Ba is Ba:Eu=0.97:0.03.

$Ba_3N_2$: 5.60 g
$Si_3N_4$: 1.88 g
$SiO_2$: 2.31 g
$Eu_2O_3$: 0.21 g

After weighing the above-mentioned amounts, $Ba_3N_2$, $Si_3N_4$, $SiO_2$ and $Eu_2O_3$ were mixed until uniformity.

The above-mentioned compounds were mixed, the mixture was charged in a boron nitride crucible in ammonia atmosphere, and calcination was carried out at about 1500° C. for about 5 hours.

The objective oxynitride phosphor was obtained thereby. The theoretical composition of the oxynitride phosphor obtained is $BaSi_2O_2N_2$:Eu.

When the % by weight of O and N in the oxynitride phosphor of Example 83 was measured, O and N were contained by 12.1% by weight and 8.9% by weight respectively. The weight ratio of O to N is O:N=1:0.74.

The calcination of the oxynitride phosphor related to Examples is carried out in ammonia atmosphere using a boron nitride crucible. A crucible made of a metal is not preferably used for the crucible. When the crucible made of a metal is used, it is considered that the crucible is eroded and it causes the lowering of luminescence properties. Accordingly, it is preferable to use a crucible made of ceramics such as alumina.

Example 84 changes the compounding ratio of Eu. Example 84 is the oxynitride phosphor in which the portion of Ba was substituted with Eu. The under-mentioned amounts of crushed powders were weighed. Wherein a molar ratio of Eu to Ba is Ba:Eu=0.95:0.05.
$Ba_3N_2$: 5.48 g
$Si_3N_4$: 1.91 g
$SiO_2$: 2.28 g
$Eu_2O_3$: 0.35 g
Said raw materials were mixed and calcination was carried out under the same conditions as Example 83.

Example 85 changes the compounding ratio of Eu. Example 85 is the oxynitride phosphor in which the portion of Ba was substituted with Eu. The under-mentioned amounts of crushed powders were weighed. Wherein a molar ratio of Eu to Ba is Ba:Eu=0.90:0.10.
$Ba_3N_2$: 5.18 g
$Si_3N_4$: 1.97 g
$SiO_2$: 2.18 g
$Eu_2O_3$: 0.69 g
Said raw materials were mixed and calcination was carried out under the same conditions as Example 83.

Example 86 changes the compounding ratio of Eu. Example 86 is the oxynitride phosphor in which the portion of Ba was substituted with Eu. The under-mentioned amounts of crushed powders were weighed. Wherein a molar ratio of Eu to Ba is Ba:Eu=0.85:0.15.
$Ba_3N_2$: 4.87 g
$Si_3N_4$: 2.03 g
$SiO_2$: 2.09 g
$Eu_2O_3$: 1.03 g
Said raw materials were mixed and calcination was carried out under the same conditions as Example 83.

Example 87 changes the compounding ratio of Eu. Example 87 is the oxynitride phosphor in which the portion of Ba was substituted with Eu. The under-mentioned amounts of crushed powders were weighed. Wherein a molar ratio of Eu to Ba is Ba:Eu=0.80:0.20.
$Ba_3N_2$: 4.57 g
$Si_3N_4$: 2.10 g
$SiO_2$: 1.99 g
$Eu_2O_3$: 1.37 g
Said raw materials were mixed and calcination was carried out under the same conditions as Example 83.

Any of the calcined products of Examples 83 to 87 is crystalline powder or particles. The particle diameter was about 1 to 5 μm.

Table 10 shows the luminescence properties when the oxynitride phosphors of Examples 83 to 87 were excited by Ex=400 nm.

The measurement of the excitation spectra of the oxynitride phosphors of Examples 83 to 87 was carried out. As a result of the measurement, Examples 83 to 86 are more strongly excited at from 370 nm to 470 nm than nearby 350 nm.

The measurement of the reflection spectra of the oxynitride phosphors of Examples 83 to 87 was carried out. As a result of the measurement, Examples 83 to 87 exhibit high absorption rate at from 290 nm to 470 nm. Accordingly, they absorb efficiently light from the excitation light source from 290 nm to 470 nm and can carry out wavelength conversion.

Light nearby Ex=400 nm as the excitation light source was irradiated to the oxynitride phosphors of Examples 83 to 87 to be excited. The oxynitride phosphor of Example 83 has a luminescence color at a green region of the color tone, x=0.106 and the color tone y=0.471, and the luminescence peak wavelength λp=496 nm. The oxynitride phosphor of Example 84 has a luminescence color at a green region of the color tone, x=0.121 and the color tone y=0.481, and λp=498 nm. The oxynitride phosphor of Example 85 has a luminescence color at a green region of the color tone, x=0.247 and the color tone y=0.477, and λp=500 nm. Any of the oxynitride phosphors of Examples 83 to 85 exhibited higher luminescence efficiency than a conventional phosphor. In particular, the oxynitride phosphors of Examples 83 to 86 exhibited higher luminescence efficiency than Example 87. Further, Examples 84 to 87 are represented by the relative value on the basis that the luminescence brightness and quantum efficiency of Example 83 is 100%.

Table 11 shows the temperature properties of the oxynitride phosphor of Example 83. The temperature properties are shown by the relative brightness on the basis that the luminescence brightness at 25° C. is 100%. The excitation light source is light nearby Ex=400 nm.

TABLE 11

| Temperature (° C.) | Luminescence brightness (%) | Quantum efficiency (%) |
| --- | --- | --- |
| 25 | 100.0 | 100.0 |
| 50 | 97.0 | 97.4 |
| 100 | 88.8 | 90.2 |
| 150 | 79.2 | 81.7 |
| 200 | 64.7 | 68.2 |

As a result, when the oxynitride phosphor was raised to 100° C., it was 88.8% and keeps extremely high luminescence brightness, and even if the temperature was further raised to 200° C., it is 64.7% and keeps extremely high

TABLE 10

| | Eu concentration (mol) | Color tone x | Color tone y | Luminescence brightness (%) | Quantum efficiency (%) | Luminescence peak wavelength (nm) |
| --- | --- | --- | --- | --- | --- | --- |
| Example 83 | 0.03 | 0.106 | 0.471 | 100.0 | 100.0 | 496 |
| Example 84 | 0.05 | 0.121 | 0.481 | 85.5 | 83.9 | 498 |
| Example 85 | 0.10 | 0.247 | 0.477 | 45.2 | 40.1 | 500 |
| Example 86 | 0.15 | 0.289 | 0.556 | 33.4 | 22.8 | 504 |
| Example 87 | 0.20 | 0.317 | 0.599 | 23.0 | 13.7 | 536 | luminescence brightness. The oxynitride phosphor exhibits extremely good temperature properties.

When the X-ray diffraction images of the above-mentioned these oxynitride phosphors were measured, any image shows a sharp diffraction peak, and it was cleared that the phosphors obtained were crystalline compounds having regularity.

Example 88

Light-Emitting Device

The light-emitting device of Example 88 was produced using the above-mentioned oxynitride phosphor. As the excitation light source, a light-emitting element having a luminescence spectrum of 400 nm. As the phosphor, it is constituted in like manner as Example 28 except for using $BaSi_2O_2N_2$:Eu of Example 83, $(Y, Gd)_3(Al, Ga)_5O_{12}$:Ce, $SrCaSi_5N_8$:Eu and $(Ca_{0.93}, Eu_{0.05}, Mn_{0.02})_{10}(PO_4)_6Cl_2$ are used.

Figure 68:
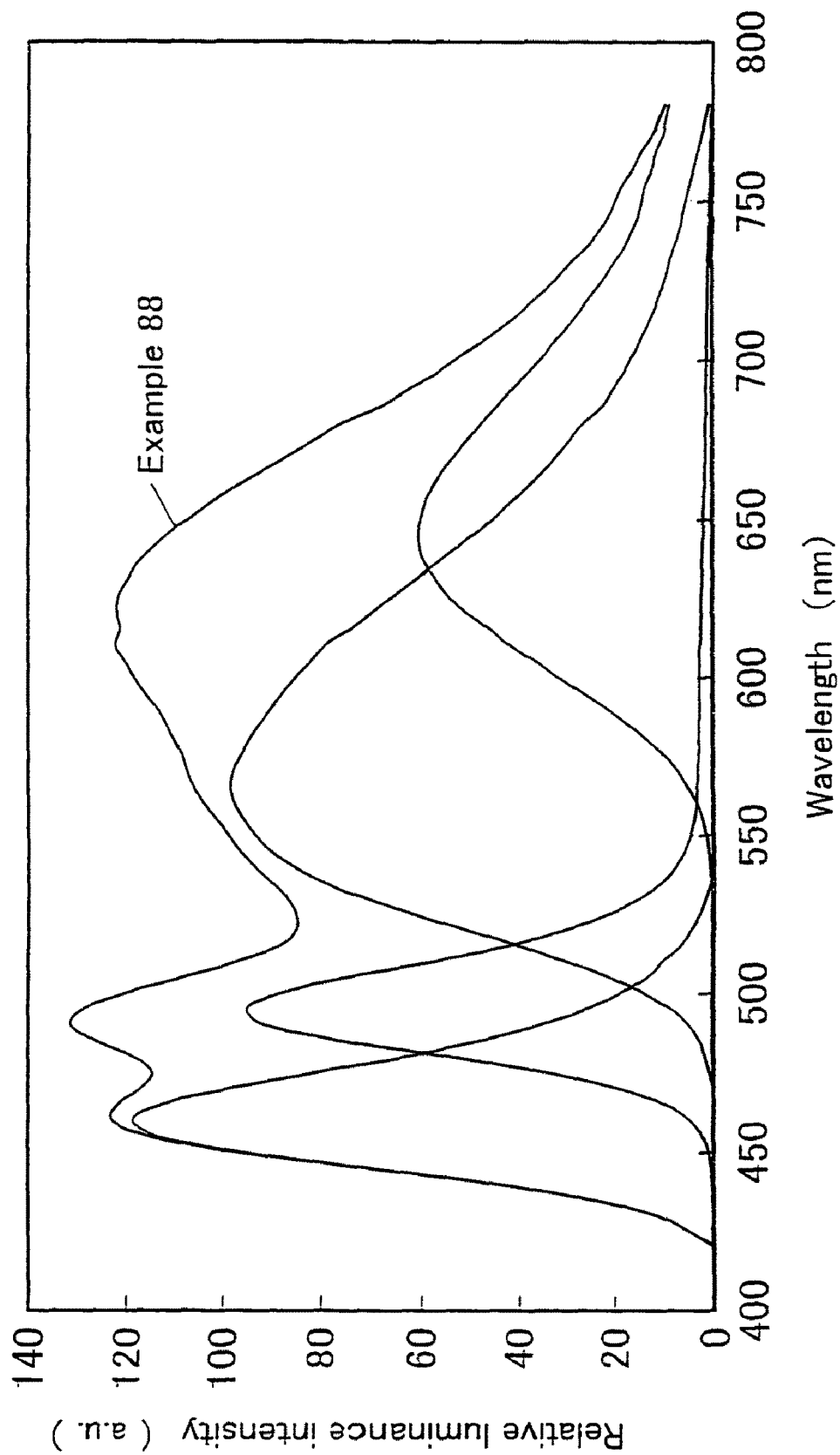
FIG. 68 is a chart showing the luminescence spectrum (simulation) of the light-emitting device of Example 88.
Figure 69:
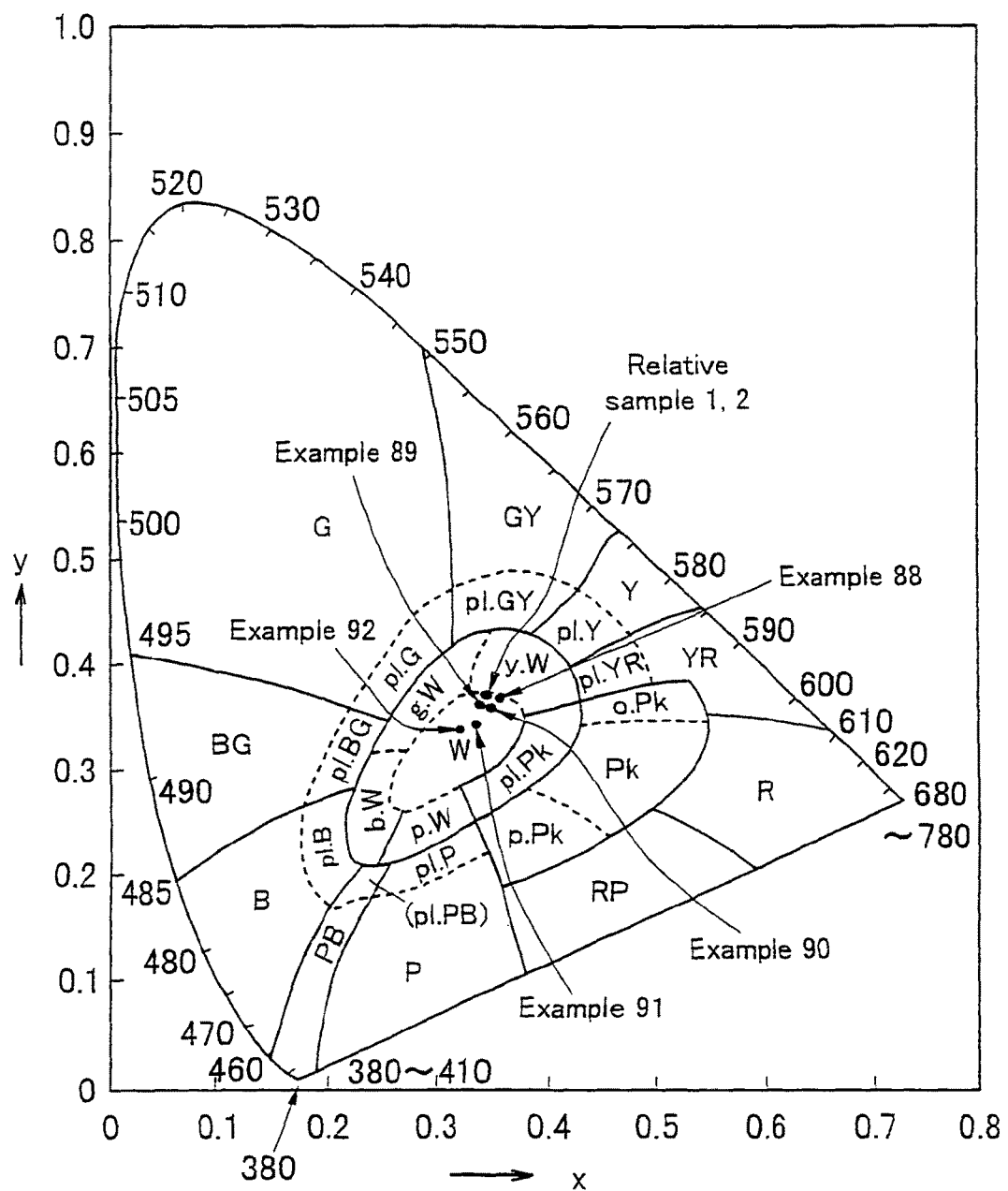
FIG. 69 is a chart showing the chromaticity coordinates (simulation) of the light-emitting devices of Examples 88 to 90.

FIG. 68 is a chart showing the luminescence spectrum (simulation) of the light-emitting device of Example 88. FIG. 69 is a chart showing the chromaticity coordinates (simulation) of the light-emitting devices of Examples 88 to 90. Said light-emitting device of Example 88 adjusts a color temperature at 4000 to 5000K.

$BaSi_2O_2N_2$:Eu of Example 83, $(Ca_{0.93}, Eu_{0.05}, Mn_{0.02})_{10}(PO_4)_6Cl_2$, $(Y, Gd)_3(Al, Ga)_5O_{12}$:Ce and $SrCaSi_5N_8$:Eu are used for the light-emitting devices of Examples 88, but the compounding ratio can be appropriately varied. These phosphors are irradiated using the excitation light source of Ex=400 nm. These phosphors absorb light from the excitation light source, carry out wavelength conversion, and have a fixed luminescence wavelength. $BaSi_2O_2N_2$:Eu of Example 83 has the luminescence peak wavelength at 470 nm to 530 nm. $(Ca_{0.93}, Eu_{0.05}, Mn_{0.02})_{10}(PO_4)_6Cl_2$ has the luminescence peak wavelength at 440 to 500 nm. $(Y, Gd)_3(Al, Ga)_5O_{12}$:Ce has the luminescence peak wavelength at 500 to 650 nm. $SrCaSi_5N_8$:Eu has the luminescence peak wavelength at 580 nm to 730 nm.

Table 12 shows the properties and color rendering of the light-emitting device of Example 88. However, the properties and color rendering of the light-emitting device of Example 88 are simulation, and when the light-emitting device is practically produced, it is considered that self absorption occurs and the deviation of wavelength is generated. As the light-emitting device of Comparative Example 1, the excitation light source of Ex=400 nm is used and $(Ca_{0.93}, Eu_{0.05}, Mn_{0.02})_{10}(PO_4)_6Cl_2$ and $(Y, Gd)_3(Al, Ga)_5O_{12}$:Ce are used.

TABLE 12

| | Luminescence properties (Ex = 400 nm) | | | |
|---|---|---|---|---|
| | Color tone x | Color tone y | Color temperature (K) | Visual sensitivity efficiency (%) |
| Light emitting device of Comparative Example 1 | 0.356 | 0.371 | 4693 | 100 |
| Light emitting device of Example 88 | 0.363 | 0.365 | 4449 | 81.5 |

TABLE 12-continued

| | Average color rendering index | Specific color rendering index | | | | | | |
|---|---|---|---|---|---|---|---|---|
| | Ra | R1 | R2 | R3 | R4 | R5 | R6 | R7 |
| Light emitting device of Comparative Example 1 | 76.0 | 74.7 | 90.9 | 92.8 | 60.2 | 69.9 | 82.0 | 78.9 |
| Light emitting device of Example 88 | 88.2 | 94.6 | 89.3 | 84.6 | 85.9 | 92.0 | 86.2 | 84.8 |

| | Specific color rendering index | | | | | | | |
|---|---|---|---|---|---|---|---|---|
| | R8 | R9 | R10 | R11 | R12 | R13 | R14 | R15 |
| Light emitting device of Comparative Example 1 | 58.3 | −1.9 | 71.8 | 52.2 | 41.9 | 79.8 | 96.4 | 70.1 |
| Light emitting device of Example 88 | 88.1 | 96.1 | 75.7 | 89.9 | 75.3 | 92.4 | 91.3 | 92.4 |

The phosphors excited by the light-emitting element at 400 nm excitation have respectively the luminescence peak wavelengths at a blue green to green region in case of $BaSi_2O_2N_2$:Eu of Example 83, at a blue purple to blue region in case $(Ca_{0.93}, Eu_{0.05}, Mn_{0.02})_{10}(PO_4)_6Cl_2$, at a green to yellow red region in case of $(Y, Gd)_3(Al, Ga)_5O_{12}$:Ce and at a yellow red to red region in case of $SrCaSi_5N_8$:Eu. It exhibits a luminescence color at a white region by the color mixture of lights from these phosphors. The light-emitting device of Example 88 exhibits a luminescence color at a white region. Further, since the excitation light source nearby 400 nm having low visual sensitivity property is used, the color tone can be easily changed by changing the compounding ratio of the phosphors. In particular, the average color rendering index (Ra) was 76.0 for a white light-emitting device which was shown in Comparative Example 1, but the average color rendering index (Ra) was 88.1 for the white light-emitting device related to Example 88, which was extremely good. Color rendering is improved thereby. Further, the color rendering is improved at almost all of color chips with respect to the specific color rendering index (R1 to R15). Furthermore, the specific color rendering index (R9) is −1.9 for a white light-emitting device which was shown in Comparative Example 1, but the specific color rendering index (R9) is 96.1 for the white light-emitting device related to Example 88, which was extremely good. The specific color rendering index (R9) is a red color chip having comparatively high chroma. Visual sensitivity efficiency is represented by a relative value when the white light-emitting device of Comparative Example 1 was 100%.

Examples 89 and 90

Light-Emitting Device

Figure 70:
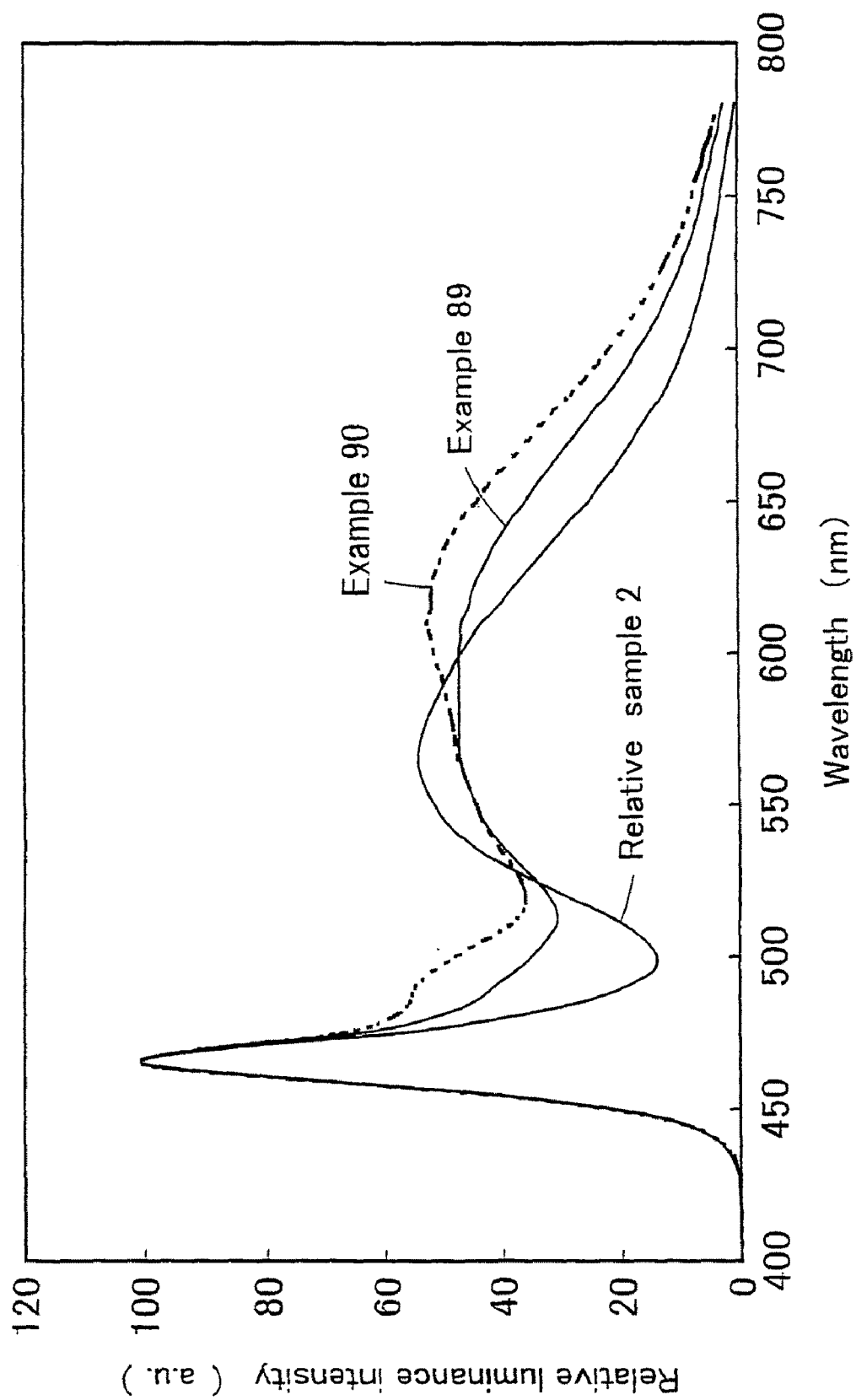
FIG. 70 is a chart showing the luminescence spectra (simulation) of the light-emitting devices of Examples 89 and 90.

The light-emitting devices of Examples 89 and 90 relate to a white light-emitting device using a light-emitting element having a luminescence spectrum of 460 nm the excitation light source. The light-emitting devices of Examples 89 and 90 are constituted in like manner as Example 29 except for using phosphors below as the phosphor 11 in the light-emitting devices of Example 29 (the basic constitution is FIG. 1). FIG. 70 is a chart showing the luminescence spectra (simulation) of the light-emitting devices of Examples 89 and 90.

(Phosphors in Light-Emitting Devices of Examples 89 and 90)

The phosphor 11 used in the light-emitting devices of Example 89 and 90 related to the present invention is a phosphor mixing the oxynitride phosphor of Example 83, a YAG phosphor represented by $(Y, Gd)_3(Al, Ga)_5O_{12}:Ce$, and a nitride phosphor represented by $CaSrSi_5N_8:Eu$. Said phosphor 11 is mixed together with the coating member 12. The compounding ratio can be varied. These phosphors are irradiated using the excitation light source of Ex=460 nm. These phosphors 11 absorb light from said excitation light source, carry out the wavelength conversion, and have a fixed luminescence wavelength. The $BaSi_2O_2N_2:Eu$ of Example 83 has the luminescence peak wavelength at 470 nm to 530 nm. $(Y, Gd)_3(Al, Ga)_5O_{12}:Ce$ has the luminescence peak wavelength at 500 to 650 nm. $SrCaSi_5N_8:Eu$ has the luminescence peak wavelength at 580 nm to 730 nm.

When current is run in the light-emitting devices of Examples 89 and 90, the blue light-emitting element 10 having the luminescence peak wavelength nearby 460 nm emits light. The portion of the light of the light-emitting element 10 transmits in the light-emitting devices of Examples 89 and 90. Further, the portion of the light of the light-emitting element 10 excites the phosphor 11, carries out the wavelength conversion, and said phosphor 11 have a fixed luminescence wavelength. There can be provided the light-emitting device which emits white light, by the color mixture of the blue light from these light-emitting element 10 and the light from the phosphor 11.

Namely, the phosphors 11 which covers the semiconductor layer convert the color tone of the portion of blue light from the light-emitting elements. As a result, the light-emitting devices of Examples 89 and 90 which emit white light can be provided.

(Properties of Light-Emitting Devices of Examples 89 and 90)

Table 13 shows the properties and color rendering of the light-emitting devices of Examples 89 and 90. However, the properties and color rendering of the light-emitting devices of Examples 89 and 90 are simulation, and when the light-emitting device is practically produced, it is considered that self absorption occurs and the deviation of wavelength is generated. As the light-emitting device of Comparative Example 2, the excitation light source of Ex=460 nm is used and $(Y, Gd)_3(Al, Ga)_5O_{12}:Ce$ is used. Further, Examples 89 and 90 are the luminescence spectrum when the peak values are the same.

TABLE 13

| | Luminescence properties (Ex = 460 nm) | | | |
|---|---|---|---|---|
| | Color tone x | Color tone y | Color temperature (K) | Visual sensitivity efficiency (%) |
| Light emitting device of Comparative Example 2 | 0.356 | 0.371 | 4693 | 100 |
| Light emitting device of Example 89 | 0.352 | 0.358 | 4773 | 86.1 |
| Light emitting device of Example 90 | 0.356 | 0.360 | 4643 | 81.8 |

TABLE 13-continued

| | Average color rendering index | Specific color rendering index | | | | | | |
|---|---|---|---|---|---|---|---|---|
| | Ra | R1 | R2 | R3 | R4 | R5 | R6 | R7 |
| Light emitting device of Comparative Example 2 | 76.0 | 74.7 | 90.9 | 92.8 | 60.2 | 69.9 | 82.0 | 78.9 |
| Light emitting device of Example 89 | 84.5 | 93.9 | 92.3 | 85.2 | 72.4 | 86.5 | 91.3 | 77.5 |
| Light emitting device of Example 90 | 83.1 | 93.5 | 86.0 | 79.9 | 96.0 | 88.0 | 83.2 | 96.6 |

| | Specific color rendering index | | | | | | |
|---|---|---|---|---|---|---|---|
| | R8 | R9 | R10 | R11 | R12 | R13 | R14 | R15 |
| Light emitting device of Comparative Example 2 | 58.3 | −1.9 | 71.8 | 52.2 | 41.9 | 79.8 | 96.4 | 70.1 |
| Light emitting device of Example 89 | 77.1 | 70.7 | 87.0 | 73.8 | 63.1 | 97.9 | 92.4 | 88.0 |
| Light emitting device of Example 90 | 81.5 | 94.1 | 70.5 | 81.3 | 65.0 | 90.8 | 89.2 | 88.3 |

The luminescence spectra of the phosphors excited by light of 460 nm from the light-emitting element have respectively the luminescence peak wavelengths at a blue green to green region in case of $BaSi_2O_2N_2:Eu$ of Example 83, at a green to yellow red region in case of $(Y, Gd)_3(Al, Ga)_5O_{12}:Ce$ and at a yellow red to red region in case of $SrCaSi_5N_8:Eu$. It exhibits a luminescence color at a white region by the color mixture of lights from these phosphors. The light-emitting devices of Examples 89 and 90 exhibit a luminescence color at a white region as a whole. Further, since visual light nearby 460 nm as the excitation light source is used and the phosphor emitting blue light is not used, there is little loss of luminescence efficiency in accordance with the wavelength conversion. Further, the color tone can be easily changed by changing the compounding ratio of the phosphors. In particular, the average color rendering index (Ra) was 76.0 for a white light-emitting device which was shown in Comparative Example 2, but the average color rendering indices (Ra) were 84.5 and 83.1 for the white light-emitting devices related to Examples 89 and 90, which was extremely good. Color rendering is improved thereby. Further, the color rendering is improved at almost all of color chips with respect to the specific color rendering index (R1 to R15). Furthermore, the specific color rendering index (R9) is −1.9 for a white light-emitting device which was shown in Comparative Example 2, but the specific color rendering indices (R9) are 70.7 and 94.1 for the white light-emitting devices related to Examples 89 and 90, which were extremely good. The specific color rendering indices (R9) are a red color chip having comparatively high chroma. Visual sensitivity efficiency is represented by a relative value when the white light-emitting device of Comparative Example was 100%.

Example 91

Light-Emitting Device

Figure 71:
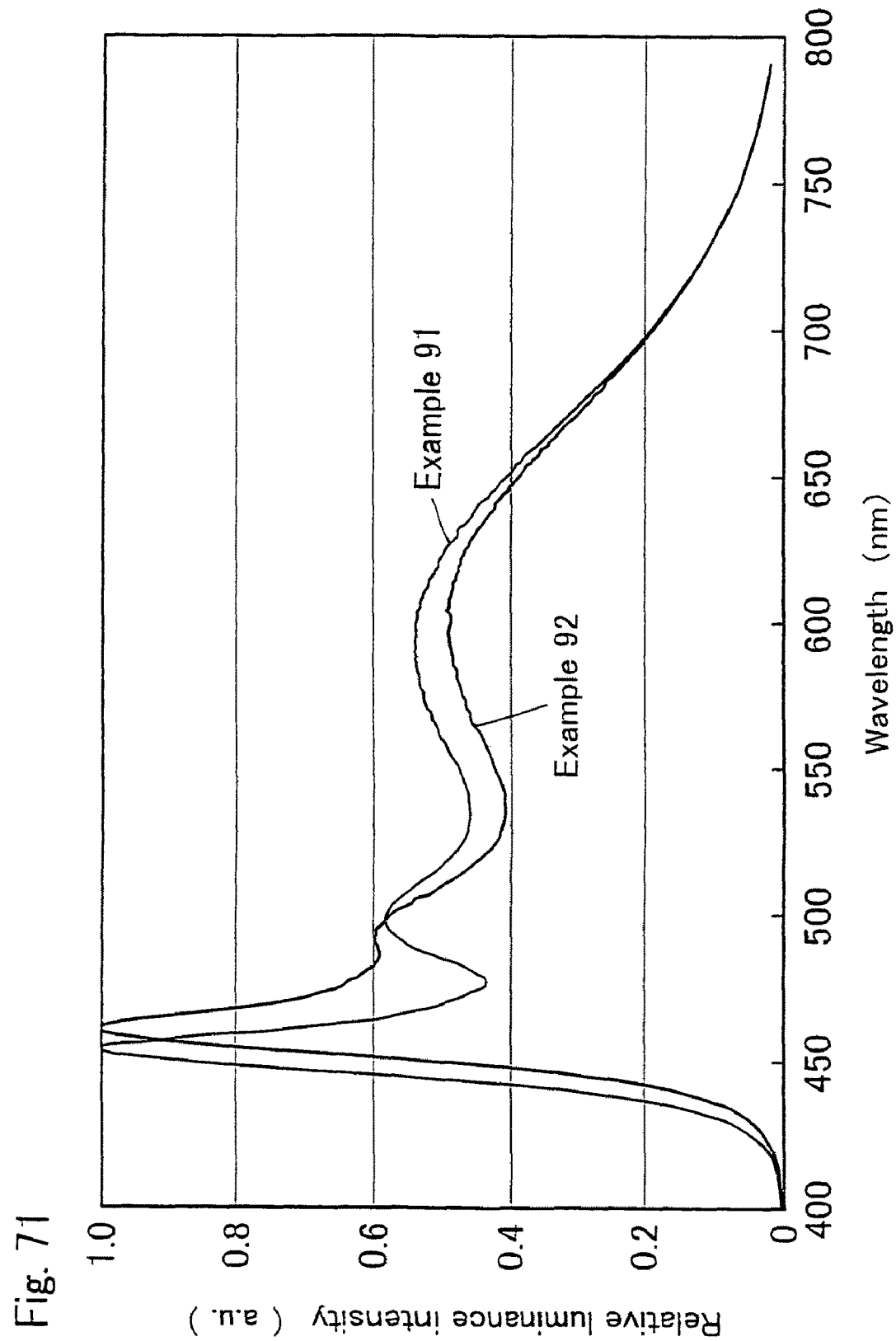
FIG. 71 is a chart showing the luminescence spectra of the light-emitting devices of Examples 91 and 92.

The light-emitting device of Example 91 relates to a white light-emitting device using a light-emitting element having the luminescence peak wavelength at 457 nm, as an excitation light source. The basic structure is the structure shown in FIG. 1. FIG. 71 is a chart showing the luminescence spectra of the light-emitting devices of Examples 91 and 92.

and have a fixed wavelength. $BaSi_2O_2N_2$:Eu of Example 83 has the luminescence peak wavelength at 470 nm to 530 nm. $(Y, Gd)_3(Al, Ga)_5O_{12}$:Ce has the luminescence peak wavelength at 500 to 650 nm. $SrCaSi_5N_8$:Eu has the luminescence peak wavelength at 580 nm to 730 nm.

The portion of light of the light-emitting element 10 transmits the light-emitting device of Example 91. Further, the portion of the light of the light-emitting element 10 excites the phosphors 11 and carries out the wavelength conversion, and said phosphors 11 have a fixed luminescence wavelength. There can be provided the light-emitting device which emits white light, by the color mixture of the blue light from these light-emitting elements 10 and the light from the phosphors 11.

(Properties of Light-Emitting Device of Example 91)

Table 14 shows the properties and color rendering of the light-emitting device of Example 91.

TABLE 14

| | Luminescence properties (Ex = 457 nm) | | | | | | | | |
|---|---|---|---|---|---|---|---|---|---|
| | Current If (mA) | Voltage Vf (V) | Radiation analysis (mW) | Brightness (beam) (lm) | Luminescence peak wavelength (nm) | Color tone x | Color tone y | Color temperature (K) | Lamp efficiency (lm/W) |
| Light emitting device of Example 91 | 20 | 3.38 | 6.3 | 1.69 | 453 | 0.334 | 0.340 | 5443 | 25.0 |

| | Average color rendering index Ra | Specific color rendering index | | | | | | |
|---|---|---|---|---|---|---|---|---|
| | | R1 | R2 | R3 | R4 | R5 | R6 | R7 |
| Light emitting device of Example 91 | 92.7 | 96.6 | 94.8 | 90.5 | 93.8 | 95.7 | 91.6 | 89.8 |

| | Specific color rendering index | | | | | | |
|---|---|---|---|---|---|---|---|
| | R8 | R9 | R10 | R11 | R12 | R13 | R14 |
| Light emitting device of Example 91 | 89.0 | 83.0 | 88.7 | 96.4 | 81.0 | 96.8 | 94.4 |

(Light-Emitting Element)

When current is run in the light-emitting device of Example 91, the blue light-emitting element 10 having a peak wave length at about 457 nm emits light. The phosphor 11 which covers the semiconductor layer 2 carries out the conversion of color tone. As a result, there can be provided the light-emitting device of Example 91 which emits white light.

(Phosphor)

The phosphor 11 used for the light-emitting device of Example 91 related to the present invention uses the phosphors 11 which mixed the oxynitride phosphor of Example 83, the YAG phosphor represented by $(Y, Gd)_3(Al, Ga)_5O_{12}$:Ce and the nitride phosphor represented by $SrCaSi_5N_8$:Eu. Said phosphor 11 is mixed with the coating member 12. The compounding ratio can be appropriately changed. These phosphors 11 are irradiated using the excitation light source of Ex=457 nm. These phosphors 11 absorb light from said excitation light source, carry out the wavelength conversion, The phosphors excited by the light-emitting element of 457 nm excitation have respectively the luminescence peak wavelengths at a blue green to green region in case of $BaSi_2O_2N_2$:Eu of Example 83, at a green to yellow red region in case of $(Y, Gd)_3(Al, Ga)_5O_{12}$:Ce and at a yellow red to red region in case of $SrCaSi_5N_8$:Eu. The light-emitting device of Example 91 exhibits a luminescence color at a white region by the color mixture of lights from these phosphors. Further, since visual light nearby 457 nm as the excitation light source is used and the phosphor emitting blue light is not used, there is little loss of luminescence efficiency accompanied with the wavelength conversion. Further, the color tone can be easily changed by changing the compounding ratio of the phosphors. The white light-emitting device of Example 91 exhibits extremely high luminescence efficiency in which lamp efficiency is 25.0 lm/W. The average color rendering index (Ra) was 92.7 for the white light-emitting device related to Example 91, which was extremely good. Color rendering is improved thereby.

Further, the color rendering is improved at almost all of color chips with respect to the specific color rendering index (R1 to R15). Furthermore, the specific color rendering index (R9) is 83.0 for the white light-emitting device related to Example 91, which was extremely good.

Therefore, the white light-emitting device of Example 91 can provide a light-emitting device with superior color rendering.

Example 92

Light-Emitting Device

The light-emitting device of Example 92 relates to a white light-emitting device using a light-emitting element having the luminescence peak wavelength at 463 nm, as an excitation light source. The basic structure is the structure shown in FIG. 1. FIG. 71 is a chart showing the luminescence spectra of the light-emitting devices of Examples 91 and 92.

absorb light from said excitation light source, carry out the wavelength conversion, and have a fixed wavelength. $BaSi_2O_2N_2$:Eu of Example 83 has the luminescence peak wavelength at 470 nm to 530 nm. $(Y, Gd)_3(Al, Ga)_5O_{12}$:Ce has the luminescence peak wavelength at 500 nm to 650 nm. $SrCaSi_5N_8$:Eu has the luminescence peak wavelength at 580 to 730 nm.

The portion of light of the light-emitting element 10 transmits the light-emitting device of Example 92. Further, the portion of the light of the light-emitting element 10 excites the phosphors 11 and carries out the wavelength conversion, and said phosphors 11 have a fixed luminescence wavelength. There can be provided the light-emitting device which emits white light, by the color mixture of the blue light from these light-emitting elements 10 and the light from the phosphors 11.

(Properties of Light-Emitting Device of Example 92)

Table 15 shows the properties and color rendering of the light-emitting device of Example 92.

TABLE 15

| | Luminescence properties (Ex = 463 nm) | | | | | | | | |
|---|---|---|---|---|---|---|---|---|---|
| | Current If (mA) | Voltage Vf (V) | Radiation analysis (mW) | Brightness (beam) (lm) | Luminescence peak wavelength (nm) | Color tone x | Color tone y | Color temperature (K) | Lamp efficiency (lm/W) |
| Light emitting device of Example 92 | 20 | 3.28 | 5.4 | 1.397 | 460 | 0.327 | 0.334 | 5751 | 21.3 |

| | Average color rendering index Ra | Specific color rendering index | | | | | | |
|---|---|---|---|---|---|---|---|---|
| | | R1 | R2 | R3 | R4 | R5 | R6 | R7 |
| Light emitting device of Example 92 | 84.9 | 90.9 | 86.3 | 81.6 | 83.2 | 88.1 | 82.2 | 81.4 |

| | Specific color rendering index | | | | | | |
|---|---|---|---|---|---|---|---|
| | R8 | R9 | R10 | R11 | R12 | R13 | R14 |
| Light emitting device of Example 92 | 85.8 | 91.0 | 69.9 | 88.0 | 70.7 | 88.9 | 89.6 |

(Light-Emitting Element)

When current is run in the light-emitting device of Example 92, the blue light-emitting element 10 having a peak wave length at about 463 nm emits light. The phosphor 11 which covers the semiconductor layer 2 converts the color tone of the blue light. As a result, there can be provided the light-emitting device of Example 92 which emits white light.

(Phosphor)

The phosphor 11 used for the light-emitting device of Example 92 uses the phosphors 11 which mixed the oxynitride phosphor of Example 83, the YAG phosphor represented by $(Y, Gd)_3(Al, Ga)_5O_{12}$:Ce and the nitride phosphor represented by $CaSrSi_5N_8$:Eu. Said phosphors 11 are mixed with the coating member 12. The compounding ratio can be appropriately changed. These phosphors 11 are irradiated using the excitation light source of Ex=463 nm. These phosphors 11

The phosphors excited by the light-emitting element of 463 nm excitation have respectively the luminescence peak wavelengths at a blue green to green region in case of $BaSi_2O_2N_2$:Eu of Example 83, at a green to yellow red region in case of $(Y, Gd)_3(Al, Ga)_5O_{12}$:Ce and at a yellow red to red region in case of $SrCaSi_5N_8$:Eu. The light-emitting device of Example 92 exhibits a luminescence color at a white region by the color mixture of lights from these phosphors. Thus, the light-emitting device of Example 92 exhibits a luminescence color at a white region. Further, since visual light nearby 463 nm as the excitation light source is used and the phosphor emitting blue light is not used, there is little loss of luminescence efficiency accompanied with the wavelength conversion. Further, the color tone can be easily changed by changing the compounding ratio of the phosphors. The white light-emitting device of Example 92 exhibits extremely high luminescence properties in which lamp efficiency is 21.3 lm/W. The average color rendering index (Ra) was 84.9 for the white light-emitting device related to Example 92, which was extremely good. Color rendering is improved thereby. Further, the color rendering is improved at almost all of color chips with respect to the specific color rendering index (R1 to R15). Furthermore, the specific color rendering index (R9) is 91.0 for the white color light-emitting device related to Example 92, which was extremely good.

The white color light-emitting device of Example 92 can provide a light-emitting device with superior color rendering, thereby.

Example 93

Light-Emitting Device

The light-emitting device of Example 93 is a cap type light-emitting device in like manner as the light-emitting device of Example 30, and is constituted in like manner as Example 30 except for setting the phosphor 11 as below in the light-emitting device of Example 30. Further, as the light-emitting element 10, a light-emitting element having the luminescence peak wavelength at 400 nm is used.

The phosphor of $(Y, Gd)_3(Al, Ga)_5O_{12}$:Ce, the nitride phosphor of $Ba_2Si_5N_8$:Eu and the phosphor of $BaSi_2O_2N_2$:Eu are contained in the cap 16. The phosphor of $(Ca_{0.95}, Eu_{0.05})_{10}(PO_4)_6Cl_2$ is contained in the coating member 12 in the cup of the mount lead 13a. Further, since the phosphors can be contained in the cap 16, the cap 16 may contain the oxynitride phosphor and only the coating member 12 exists in the cup of the mount lead 13a.

In the light-emitting device thus constituted, the portion of light released from the light-emitting element 10 excites the oxynitride phosphor of the phosphor 11 and green light is emitted. Further, the portion of light emitted from the light-emitting element 10 or the portion of light emitted from the oxynitride phosphor excites the phosphors of the cap 16, and red light is emitted from blue and yellow. The green light of the oxynitride phosphor is mixed with the red light from the blue color and yellow color of the phosphor of the cap 16 thereby, and as a result, white light is externally released from the surface of the cap 16.

INDUSTRIAL APPLICABILITY

As specifically illustrated above, the present invention relates to an oxynitride phosphor which absorbs light from an excitation light source having a luminescence wavelength at an ultraviolet to visible light region and has a luminescence color different from the luminescence color from said excitation light source; and said oxynitride phosphor has a luminescence peak wavelength at a blue green to yellow region and extremely high luminescence efficiency. Further, said oxynitride phosphor is extremely superior in temperature properties. Further, the present invention is a production process by which the oxynitride phosphor can be simply produced in good reproducibility. Furthermore, the present invention relates to a light-emitting device having the above-mentioned oxynitride phosphor and a light-emitting element, and said light-emitting device can realize a desired luminescence color. Furthermore, there can be produced a light-emitting device combining the above-mentioned oxynitride phosphor with a phosphor being the second phosphor which emits light with a blue color, green color, red color, yellow color and the like. A light-emitting device superior in color rendering which emits white light can be provided thereby. Further, there can be produced a light-emitting device combining said oxynitride phosphor, a YAG phosphor being the second phosphor and a blue light-emitting element. A light-emitting device superior in color rendering and having extremely high luminescence efficiency which emits white light can be provided thereby. Accordingly, the present invention has an extremely important meaning that the above-mentioned light-emitting devices can be provided.

The invention claimed is:

1. An oxynitride phosphor represented by a general formula of $L_XM_YO_ZN_{(2/3)X+(4/3)Y-(2/3)Z}$:R (L is Ba. M is Si. O is an oxygen element. N is a nitrogen element. R is Eu. $0.5<x<1.5$, $1.5<y<2.5$, and $1.5<z<2.5$), the oxynitride phosphor having a crystal structure of the orthorhombic system,
wherein the at least part of said L is substituted by said R in a molar ratio of (a mix amount of said L and said R):(the amount of said R)=1:0.01 to 1:0.05.

2. The oxynitride phosphor according to claim 1, wherein said X, said Y and said Z are X=1, Y=2, and Z=2.

3. The oxynitride phosphor according to claim 1, which is excited by light from an excitation light source having a luminescence peak wavelength in a range not less than 360 nm nor more than 420 nm or in a range not less than 450 nm nor more than 470 nm, and have a luminescence peak wavelengths at a longer wavelength side than said luminescence peak wavelength.

4. The oxynitride phosphor according to claim 1, which has a peak wavelength in a range from blue green to green.

5. A light-emitting device comprising:
an excitation light source; and a phosphor converting the wavelength of at least the portion of light from said excitation light source, the phosphor including the oxynitride phosphor according to claim 1.

6. The light-emitting device according to claim 5,
wherein said phosphor includes a second phosphor together with said oxynitride phosphor, said second phosphor carrying out the wavelength conversion of at least a portion of light from said excitation light source and light from said oxynitride phosphor, said second phosphor having a luminescence spectrum including a peak wavelengths in visible region.

7. The light-emitting device according to claim 6,
wherein said second phosphor has a luminance spectrum including at least one or more luminescence peak wavelengths from a blue region to red region.

8. The light-emitting device according to claim 6,
wherein a mixed light that at least two lights selected from a group consisting of a portion of the light from said excitation light source, a light from said oxynitride phosphor and a light from said second phosphor are mixed is emitted.

9. The light-emitting device according to claim 6,
which has a luminescence color being set at an intermediate luminescence color from the peak wavelength of said excitation light source to the peak wavelength of said oxynitride phosphor or the peak wavelength of said second phosphor.

10. The light-emitting device according to claim 9, wherein the luminescence color is white color.

11. The light-emitting device according to claim 6, wherein the luminescence spectrum has at least one or more of luminescence peak wavelengths in the ranges consisting of a range of 430 to 500 nm and a range of 500 to 730 nm.

12. The light-emitting device according to claim 5, wherein the excitation light source is a light emitting element.

13. The light-emitting device according to claim 6, wherein the excitation light source is a light emitting element.

14. The light-emitting device according to claim 12, wherein said light-emitting element has a nitride semiconductor containing In.

15. The light-emitting device according to claim 13, wherein said light-emitting element has a nitride semiconductor containing In.

16. The light-emitting device according to claim 5, wherein the second phosphor is a rare earth aluminate phosphor.

* * * * *